US008151705B2

(12) United States Patent
Taguchi et al.

(10) Patent No.: US 8,151,705 B2
(45) Date of Patent: Apr. 10, 2012

(54) METHOD OF PREPARING LITHOGRAPHIC PRINTING PLATE

(75) Inventors: Yoshinori Taguchi, Shizuoka (JP); Koji Wariishi, Shizuoka (JP); Atsushi Sugasaki, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/566,213

(22) Filed: Sep. 24, 2009

(65) Prior Publication Data

US 2010/0081771 A1 Apr. 1, 2010

(30) Foreign Application Priority Data

Sep. 24, 2008 (JP) ................................ 2008-244451

(51) Int. Cl.
*B41N 3/00* (2006.01)

(52) U.S. Cl. ..................... 101/465; 101/457; 430/284.1; 430/281.1; 430/288.1; 430/300; 430/302; 528/482

(58) Field of Classification Search ............... 430/284.1, 430/281.1, 288.1, 302, 300, 906; 101/457, 101/465; 528/492
See application file for complete search history.

(56) References Cited

U.S. PATENT DOCUMENTS

2002/0136987 A1 9/2002 Oshima
2004/0072101 A1 4/2004 Sugasaki et al.
2005/0196698 A1 9/2005 Sugasaki
2005/0266349 A1 12/2005 Van Damme et al.
2009/0202948 A1* 8/2009 Simpson et al. ............. 430/302

FOREIGN PATENT DOCUMENTS

EP 1868036 A1 12/2007
JP 11065126 A 3/1999
JP 2004-318053 A 11/2004
JP 2005-250158 A 9/2005
JP 2007-538279 A 12/2007
WO WO2008/034592 * 3/2008

OTHER PUBLICATIONS

Mohan, C.; Calbiochem® Buffers, 2003, p. 1-32.*
European Search Report dated Jan. 15, 2010 in European Application No. 09171239.8-1251.

* cited by examiner

*Primary Examiner* — David W Wu
*Assistant Examiner* — Robert Jones, Jr.
(74) *Attorney, Agent, or Firm* — Sughrue Mion, PLLC

(57) ABSTRACT

A method for preparing a lithographic printing plate includes treating a lithographic printing plate precursor including a hydrophilic support and an image-forming layer containing the following (i) to (iii) with an aqueous solution having a buffering ability: (i) a binder polymer comprising a repeating unit having a structure represented by the following formula (1); (ii) an ethylenically unsaturated compound; and (iii) a polymerization initiator, $$P\text{-}L\text{-}(CO_2H)_n \quad (1)$$

wherein P represents a part constituting a main chain skeleton of the polymer, L represents an (n+1) valent connecting group, and n represents an integer of 1 or more.

8 Claims, 1 Drawing Sheet

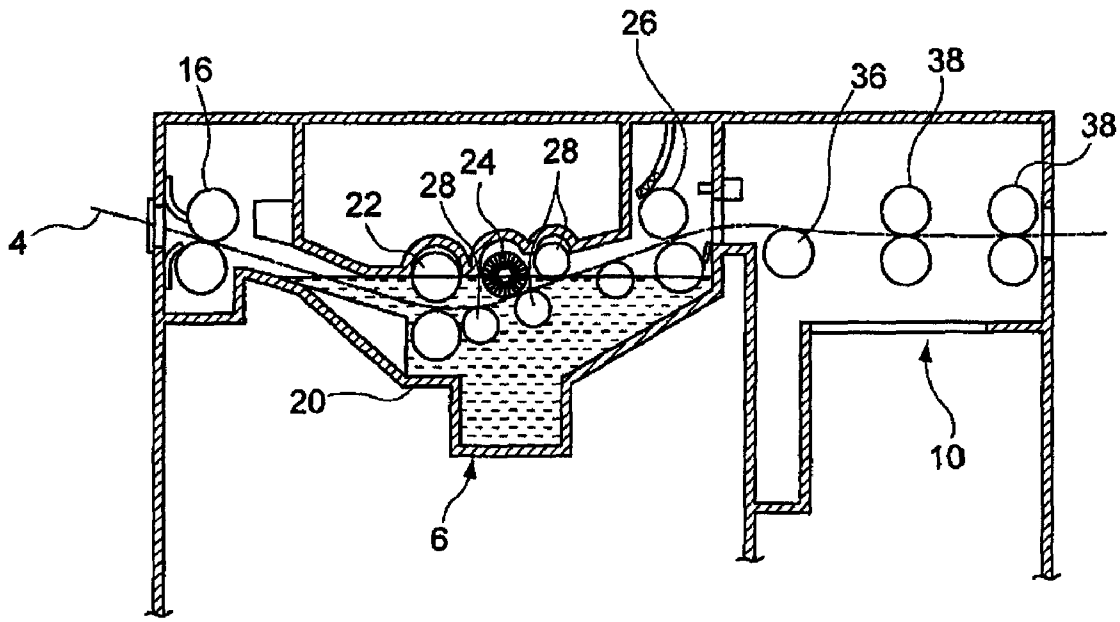
26
16
36
38
38
28
24
28
22
4
20
10
6

METHOD OF PREPARING LITHOGRAPHIC PRINTING PLATE

FIELD OF THE INVENTION

The present invention relates to a method of preparing a lithographic printing plate.

BACKGROUND OF THE INVENTION

In general, a lithographic printing plate is composed of an oleophilic image area accepting ink and a hydrophilic non-image area accepting dampening water in the process of printing. Lithographic printing is a printing method which comprises rendering the oleophilic image area of the lithographic printing plate to an ink-receptive area and the hydrophilic non-image area thereof to a dampening water-receptive area (ink unreceptive area), thereby making a difference in adherence of ink on the surface of the lithographic printing plate, and depositing the ink only on the image area by utilizing the nature of water and printing ink to repel with each other, and then transferring the ink to a printing material, for example, paper.

In order to prepare the lithographic printing plate, a lithographic printing plate precursor (PS plate) comprising a hydrophilic support having provided thereon an oleophilic photosensitive resin layer (also referred to as a photosensitive layer or an image-recording layer) has heretofore been broadly used. Ordinarily, the lithographic printing plate is obtained by conducting plate making according to a method of exposing the lithographic printing plate precursor through an original, for example, a lith film, and then removing the unnecessary portion of the image-recording layer by dissolving with an alkaline developer or an organic solvent thereby revealing the hydrophilic surface of support to form the non-image area while leaving the image-recording layer for forming the image area.

Thus, in the hitherto known plate making process of lithographic printing plate precursor, after exposure, the step of removing the unnecessary portion of the image-recording layer by dissolving, for example, with a developer is required. However, in view of the environment and safety, a processing with a developer closer to a neutral range and a small amount of waste liquid are problems to be solved. Particularly, since disposal of waste liquid discharged accompanying the wet treatment has become a great concern throughout the field of industry in view of the consideration for global environment in recent years, the demand for the resolution of the above-described problems has been increased more and more.

On the other hand, digitalized technique of electronically processing, accumulating and outputting image information using a computer has been popularized in recent years, and various new image outputting systems responding to the digitalized technique have been put into practical use. Correspondingly, attention has been drawn to a computer-to-plate (CTP) technique of carrying digitalized image information on highly converging radiation, for example, laser light and conducting scanning exposure of a lithographic printing plate precursor with the light thereby directly preparing a lithographic printing plate without using a lith film. Thus, it is one of important technical subjects to obtain a lithographic printing plate precursor adaptable to the technique described above.

As described above, the decrease in alkali concentration of developer and the simplification of processing step have been further strongly required from both aspects of the consideration for global environment and the adaptation for space saving and low running cost. However, since hitherto known development processing comprises three steps of developing with an aqueous alkali solution having pH of 11 or more, washing of the alkali agent with a water-washing bath and then treating with a gum solution mainly comprising a hydrophilic resin as described above, an automatic developing machine per se requires a large space and problems of the environment and running cost, for example, disposal of the development waste liquid, water-washing waste liquid and gum waste liquid still remain.

In response to the above situation, for instance, a developing method of processing with a developer having pH of 8.5 to 11.5 and a dielectric constant of 3 to 30 mS/cm and containing an alkali metal carbonate and an alkali metal hydrogen carbonate is proposed in JP-A-11-65126 (the term "JP-A" as used herein means an "unexamined published Japanese patent application"). However, since the developing method is required a water-washing step and a treatment step with a gum solution, it does not resolve the problems of the environment and running cost.

Also, processing with a processing solution having pH of 11.9 to 12.1 and containing a water-soluble polymer compound is described in the example of EP-A-1868036. However, since the printing plate obtained by the processing is left in the state that the alkali of pH 12 adheres on the surface thereof, a problem in view of safety of an operator arises and with the lapse of long time after the preparation of the printing plate until the initiation of printing, the image area gradually dissolves to result in deterioration in printing durability or ink-receptive property. In JP-T-2007-538279 (the term "JP-T" as used herein means a published Japanese translation of a PCT patent application), processing with a processing solution having pH of 3 to 9 and containing a water-soluble polymer compound is described. However, since the processing solution does not contain a basic component, it is necessary to enable development by making a polymer used in a photosensitive layer hydrophilic and thus, a problem occurs in that printing durability severely degrades.

On the other hand, in order to achieve good compatibility between developing property and printing durability, a technique of using a binder polymer in which an acid group is connected to a polymer chain with a straight chain connecting group to increase dispersion property in a developer and alkali-solubility (alkali-responsiveness) in an aqueous solution is proposed as described in JP-A-2004-318053 and JP-A-2005-250158. However, in a low alkali range, specifically, in a region of pH of 11 or lower, a problem in that the developing property severely degraded may arise even when such a binder polymer is used, because of decrease in the alkali-responsiveness.

SUMMARY OF THE INVENTION

Therefore, an object of the present invention is to provide a method of preparing a lithographic printing plate which overcomes the problems of the prior art. More specifically, it is to provide a method of preparing a lithographic printing plate in which sufficient characteristics are achieved in developing property, sensitivity, printing durability, stain resistance and development scum in a low pH region, for example, pH of 11.0 or lower.

The present invention includes the following items.

(1) A method of preparing a lithographic printing plate comprising treating a lithographic printing plate precursor comprising a hydrophilic support having thereon an image-forming layer containing (i) to (iii) shown below with an aqueous solution having a buffering ability:

(i) a binder polymer containing a repeating unit having a structure represented by formula (1) shown below,
(ii) an ethylenically unsaturated compound,
(iii) a polymerization initiator, $$\text{P-L-(CO}_2\text{F)}_n \quad (1)$$

wherein P represents a part constituting a main chain skeleton of the polymer, L represents an (n+1) valent connecting group, and n represents an integer of 1 or more.
(2) The method of preparing a lithographic printing plate as described in (1) above, wherein pH of the aqueous solution having a buffering ability is from 7.0 to 11.0.
(3) The method of preparing a lithographic printing plate as described in (1) or (2) above, wherein the aqueous solution having a buffering ability contains a carbonate ion and a hydrogen carbonate ion.
(4) The method of preparing a lithographic printing plate as described in any one of (1) to (3) above, wherein the binder polymer (i) is polyurethane.
(5) The method of preparing a lithographic printing plate as described in (4) above, wherein the polyurethane is synthesized using a compound represented by formula (2) shown below as one of starting materials:

(2)

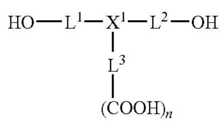

wherein $X^1$ represents a trivalent or higher valent atom, $L^1$ and $L^2$ each independently represents a single bond or an alkylene group, provided that both of $L^1$ and $L^2$ are not single bonds at the same time, $L^3$ represents an (n+1) valent connecting group, and n represents an integer of 1 to 5.

According to the present invention, a method of preparing a lithographic printing plate in which sufficient characteristics are achieved in developing property, sensitivity, printing durability, stain resistance and development scum in a low pH region, for example, pH of 11.0 or lower can be provided.

Although the function mechanism according to the invention is not quite clear, it is presumed as follows. The use of the aqueous solution having a buffering ability as a developer and the specific binder polymer according to the invention as described below as a binder polymer makes it possible to remarkably improve the dispersion property in the developer and responsiveness to an aqueous low alkali solution (solubility in the aqueous low alkali solution) in comparison with the case of development with an aqueous solution having no buffering ability or the case of not using the specific binder polymer, thereby improving the developing property. The reason for this is believed to be that since the developer is an aqueous solution having a buffering ability, a base is rapidly supplemented even when the base is consumed at the development.

It is also believed that the lithographic printing plate precursor containing the specific binder polymer in its photosensitive layer is able to maintain high developing property while restraining damage due to penetration of developer based on the acid content in the binder polymer. Therefore, a lithographic printing plate prepared according to the method of preparing a lithographic printing plate according to the invention exhibits excellent properties in that the damage due to penetration of developer is prevented in the exposed area and the image area formed by curing the surface in the exposed area maintains high strength and dissolving rate into the developer is high to prevent the occurrence of stain in the unexposed area. Therefore, it is believed that even under severe development condition that the developer has a low pH range, a lithographic printing plate excellent in compatibility between the developing property in the non-image area and the printing durability in the image area can be provided.

BRIEF DESCRIPTION OF THE DRAWINGS

FIG. 1 is a configuration diagram of an automatic development processor.

DESCRIPTION OF REFERENCE NUMERALS AND SIGNS

| | |
|---|---|
| 4: | Lithographic printing plate precursor |
| 6: | Developing unit |
| 10: | Drying unit |
| 16: | Transport roller |
| 20: | Developing tank |
| 22: | Transport roller |
| 24: | Brush roller |
| 26: | Squeeze roller |
| 28: | Backup roller |
| 36: | Guide roller |
| 38: | Skewer roller |

DETAILED DESCRIPTION OF THE INVENTION

The lithographic printing plate precursor for use in the method of preparing a lithographic printing plate according to the invention will be described in detail below. At first, an image-forming layer of the lithographic printing plate precursor is described below.

[Image-Forming Layer]

The lithographic printing plate precursor for use in the invention has an image-forming layer (hereinafter, also referred to as a photosensitive layer) on a support. The image-forming layer contains (i) a binder polymer containing a repeating unit having a structure represented by formula (1), (ii) an ethylenically unsaturated compound, and (iii) a polymerization initiator, as the essential components.

(Binder Polymer)

The binder polymer (hereinafter, also referred to as a specific binder polymer) for use in the invention is not particularly restricted other than that it contains a repeating unit having a structure represented by formula (1).

$$\text{P-L-(CO}_2\text{H)}_n \quad (1)$$

wherein P represents a part constituting a main chain skeleton of the polymer, L represents an (n+1) valent connecting group, preferably an (n+1) valent connecting group comprising an atom selected from a carbon atom, a hydrogen atom, a nitrogen atom, an oxygen atom and a sulfur atom or an atomic group comprising a combination of these atoms, and n represents an integer of 1 or more, preferably 1 or 2.

In formula (1), a number of atoms constituting the main skeleton of the connecting group represented by L is preferably from 1 to 30, more preferably from 3 to 25, still more preferably from 4 to 20, and most preferably from 5 to 10. The term "main skeleton of the connecting group" as used herein means an atom or an atomic group only used for connecting P and COOH at the terminal in formula (1) and when plural connecting routes are present, it means an atom or an atomic group constituting the route in which the number of atoms included is smallest.

Examples of a bond constituting the main skeleton of the connecting group represented by L preferably includes an ester bond, an amido bond, an ether bond, a thioether bond, a urethane bond, a urea bond and a thiourethane bond and the connecting group represented by L is preferably formed, for example, by a combination of the bond with an aliphatic hydrocarbon group which may have a substituent or an aromatic hydrocarbon group which may have a substituent.

Examples of such a binder polymer include acrylic resins described in JP-A-2004-318053, urethane resins described in JP-A-2005-250158, and itaconic acid copolymers, crotonic acid copolymers, maleic acid copolymers and partially esterified maleic acid copolymers among polymers described in JP-A-59-44615, JP-B-54-34327 (the term "JP-B" as used herein means an "examined Japanese patent publication"), JP-B-58-12577, JP-B-54-25957, JP-A-54-92723, JP-A-59-53836 and JP-A-59-71048.

Also, acidic cellulose derivatives having a carboxylic acid group in its side chain and polymers obtained by adding a cyclic acid anhydride to an addition polymer having a hydroxy group are exemplified.

As the binder polymer, an acrylic resin, a methacrylic resin or a urethane resin is preferably used and from the standpoint of printing durability a urethane resin is particularly preferred.

The binder polymer according to the invention contains the repeating unit having a structure represented by formula (1) in such a way that the content of the carboxylic acid in formula (1) is preferably from 0.1 to 10.0 mmol, more preferably from 0.2 to 5.0 mmol, most preferably from 0.3 to 3.0 mmol, per g of the binder polymer.

As one preferable embodiment of the binder polymer according to the invention, the acrylic resin and methacrylic resin described above are exemplified and these resins having a functional group containing a carboxylic acid group represented by —CO-A-$R^2$—$(COOH)_n$ (wherein A, $R^2$ and n have the same meanings as those defined in formula (3) below) in the side chain thereof are preferable. Specifically, the binder polymer preferably has as P in formula (1), a residue constituting a main chain skeleton of the polymer derived from an acrylic resin or methacrylic resin and as L in formula (1), a structure represented by —CO-A-$R^2$—. In order to introduce such a functional group into a side chain of an alkali-soluble polymer, a method of introducing a repeating unit having a structure represented by formula (3) below is exemplified. Further, a repeating unit having a radical polymerizable group which is a preferable embodiment as described hereinafter or other copolymerization component unit may be used in combination.

The content of the carboxylic acid group of the repeating unit represented by formula (3) is preferably from 0.1 to 10.0 mmol, more preferably from 0.2 to 5.0 mmol, most preferably from 0.3 to 3.0 mmol, per g of the binder polymer. The binder polymer may contain one kind or two or more kinds of the repeating units represented by formula (3).

(3)

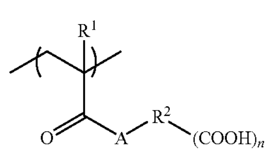

In formula (3), $R^1$ represents a hydrogen atom or a methyl group, particularly preferably a methyl group. $R^2$ represents an (n+1) valent connecting group. The connecting group includes an (n+1) valent organic connecting group constituting from at least one atom selected from a carbon atom, a hydrogen atom, an oxygen atom, a nitrogen atom, a sulfur atom and a halogen atom and containing an ester group represented by —O(C═)—. A represents an oxygen atom or —$NR_3$—, wherein $R_3$ represents a hydrogen atom or a hydrocarbon group having from 1 to 10 carbon atoms. n represents an integer of 1 to 5.

The connecting group represented by $R^2$ is more preferably that containing 5 to 20 carbon atoms, and from the standpoint of structure, that has a chain structure and contains an ester bond in the chain structure.

As the substituent which can be introduced into the connecting group represented by $R^2$, a monovalent non-metallic atomic group exclusive of a hydrogen atom is exemplified. Examples thereof include a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group and its conjugated base group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and its conjugated base group, an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and its conjugated base group, an N-alkylsulfonylsulfamoyl group (—$SO_2NHSO_2$(alkyl)) and its conjugated base group, N-arylsulfonylsulfamoyl group (—$SO_2NHSO_2$(aryl)) and its conjugated base group, N-alkylsulfonylcarbamoyl group (—$CONHSO_2$(alkyl)) and its conjugated base group, N-arylsulfonylcarbamoyl group (—$CONHSO_2$(aryl)) and its conjugated base group, an alkoxysilyl group (—$Si(Oalkyl)_3$), an aryloxysilyl group (—$Si(Oaryl)_3$), a hydroxysilyl group (—$Si(OH)_3$) and its conjugated base group, a phosphono group (—$PO_3H_2$) and its conjugated base group, a dialkylphosphono group (—$PO_3$(alkyl)$_2$), a diarylphosphono group (—$PO_3$(aryl)$_2$), an alkylarylphosphono group (—$PO_3$(alkyl)(aryl)), a monoalkylphosphono group (—$PO_3$H(alkyl)) and its conjugated base group, a monoarylphosphono group (—$PO_3$H(aryl)) and its conjugated base group, a phosphonooxy group (—$OPO_3H_2$) and its conjugated base group, a dialkylphosphonooxy group (—$OPO_3$(alkyl)$_2$), a diarylphosphonooxy group (—$OPO_3$(aryl)$_2$), an alkylarylphosphonooxy group (—$OPO_3$(alkyl)(aryl)), a monoalkylphosphonooxy group (—$OPO_3$H(alkyl)) and its conjugated base group, a monoarylphosphonooxy group (—$OPO_3$H(aryl)) and its conjugated base group, a cyano group, a nitro group, a dialkylboryl group (—B(alkyl)$_2$), a diarylboryl group (—B(aryl)$_2$), an alkylarylboryl group (—B(alkyl)(aryl)), a dihydroxyboryl group (—B(OH)$_2$) and its conjugated base group, an alkylhydroxyboryl group (—B(alkyl)(OH)) and its conjugated base group, an arylhydroxyboryl group (—B(aryl)(OH)) and its conjugated base group, an aryl group, a an alkenyl group and an alkynyl group.

In case of using the alkali-soluble polymer according to the invention, a substituent having a hydrogen atom capable of forming a hydrogen bond, particularly, a substituent having an acidity of acid dissociation constant (pKa) smaller than a carboxylic acid is not preferable because such a substituent tends to decrease printing durability, although it depends on the design of the image-forming layer. On the contrary, a hydrophobic substituent, for example, a halogen atom, a hydrocarbon group (e.g., an alkyl group, an aryl group, an alkenyl group or an alkynyl group), an alkoxy group or an aryloxy group is preferable because such a hydrophobic substituent tends to increase the printing durability. In particular, in case of a monocyclic aliphatic hydrocarbon wherein the cyclic structure is a six-membered or less, for example, cyclopentane or cyclohexane, it is preferred to have such a hydrophobic substituent. The substituents may be connected with each other to form a ring or may be connected with the hydrocarbon group on which the substituent is present to form a ring, if possible. Also, the substituent may further be substituted.

In formula (3), when $R^2$ contains a cyclic structure, n is preferably from 2 to 5, more preferably from 2 to 4, most preferably 2, in view of the balance between developing property and printing durability.

When A in formula (3) represents —$NR^3$—, $R^3$ represents a hydrogen atom or a monovalent hydrocarbon group having from 1 to 10 carbon atoms. The monovalent hydrocarbon group having from 1 to 10 carbon atoms represented by $R^3$ includes, for example, an alkyl group, an aryl group, an alkenyl group or an alkynyl group.

Specific examples of the alkyl group include a straight-chain, branched or cyclic alkyl group having from 1 to 10 carbon atoms, for example, a methyl group, an ethyl group, a propyl group, a butyl group, a pentyl group, a hexyl group, a heptyl group, an octyl group, a nonyl group, a decyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclopentyl group, a cyclohexyl group, 1-adamantyl group or a 2-norbornyl group.

Specific examples of the aryl group include an aryl group having 10 or less carbon atoms, for example, a phenyl group, a naphthyl group or an indenyl group and a heteroaryl group having 10 or less carbon atoms and containing at least one hetero atom selected from a nitrogen atom, an oxygen atom and a sulfur atom, for example, furyl group, a thienyl group, a pyrrolyl group, a pyridyl group or a quinolyl group.

Specific examples of the alkenyl group include a straight-chain, branched or cyclic alkenyl group having 10 or less carbon atoms, for example, a vinyl group, a 1-propenyl group, a 1-butenyl group, a 1-methyl-1-propenyl group, a 1-cyclopnetenyl group or 1-cyclohexyenyl group.

Specific examples of the alkynyl group include an alkynyl group having 10 or less carbon atoms, for example, an ethynyl group, a 1-propynyl group, a 1-butynyl group or a 1-octynyl group.

The substituent which $R^3$ may have includes the substituents which can be introduced into $R^2$. However, the number of carbon atoms contained in $R^3$ including the carbon atoms contained in the substituent is from 1 to 10.

A in formula (3) is preferably an oxygen atom or —NH— because of easiness in the synthesis.

n in formula (3) represents an integer of 1 to 5, and in view of the printing durability it is preferably 1.

Preferable specific examples of the repeating unit represented by formula (3) are set forth below, but the invention should not be construed as being limited thereto.

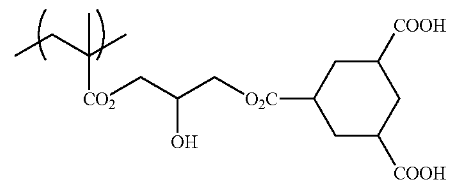

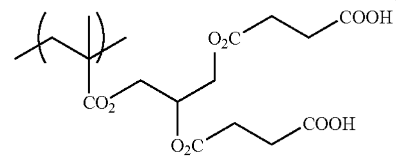

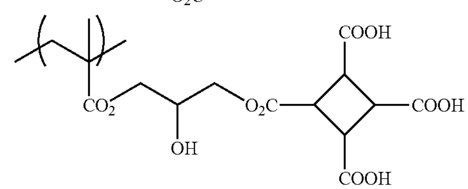

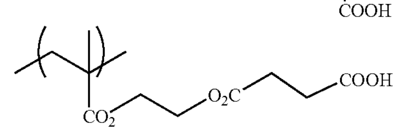

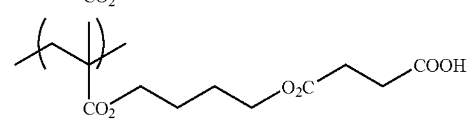

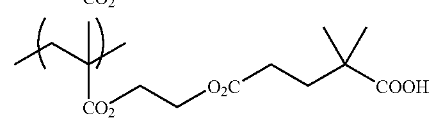

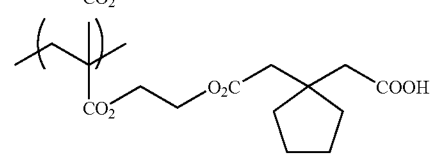

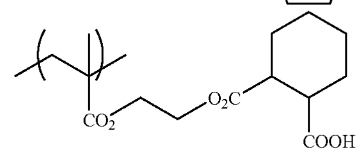

-continued
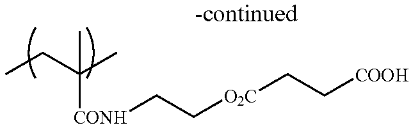
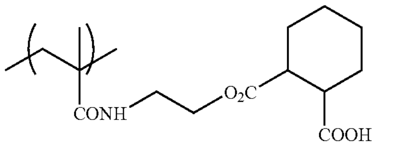
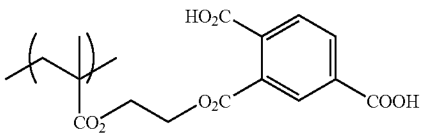
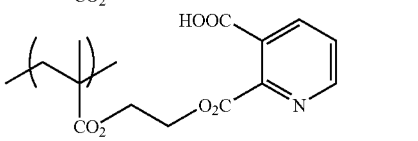
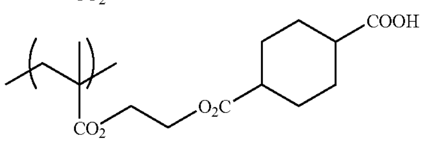
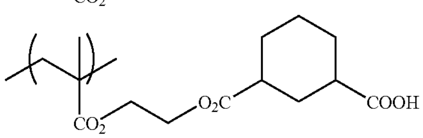
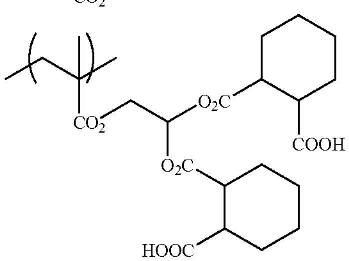
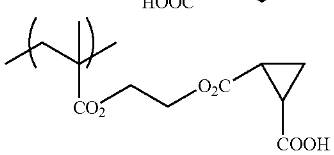
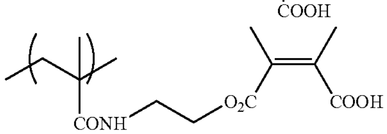
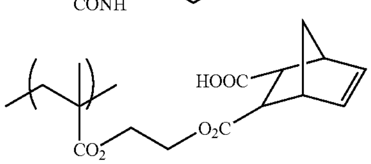
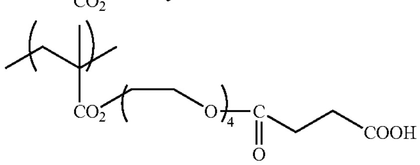
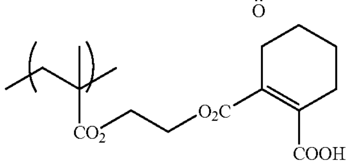
-continued
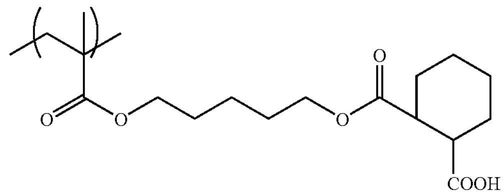
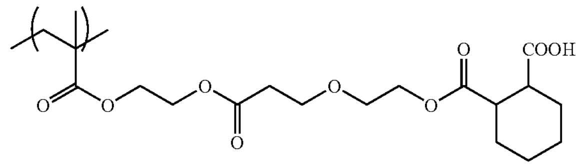
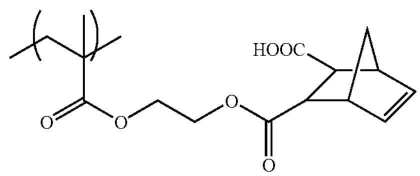
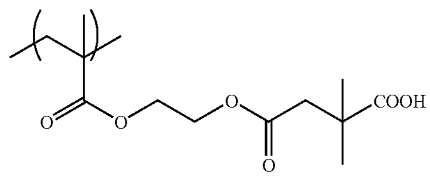
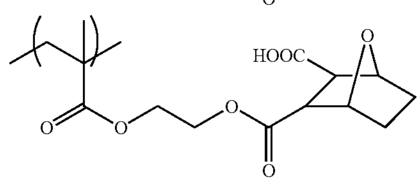
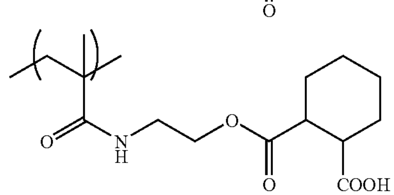
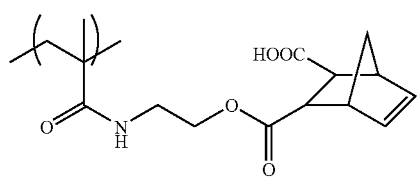
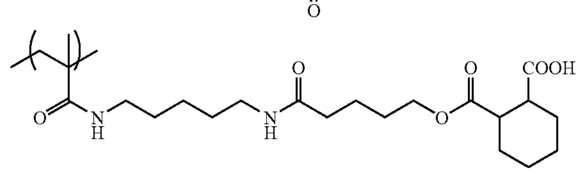
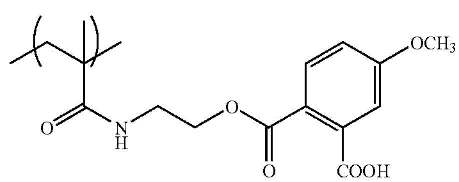
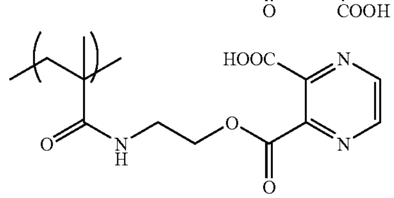

-continued
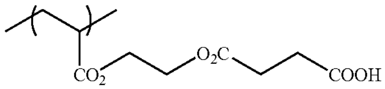
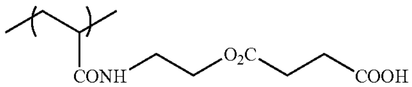
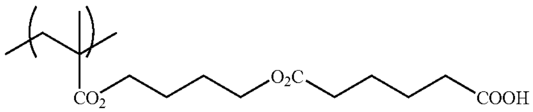
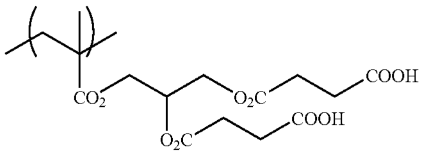
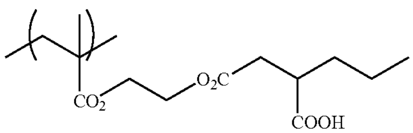
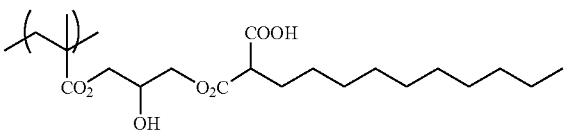
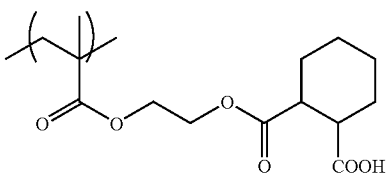
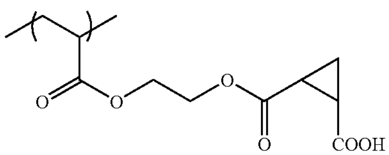
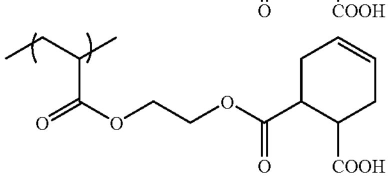
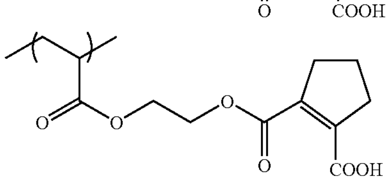
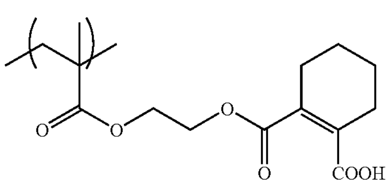
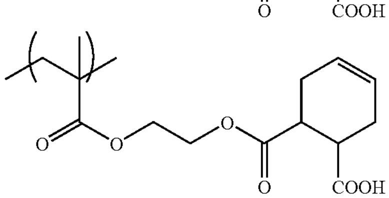
-continued
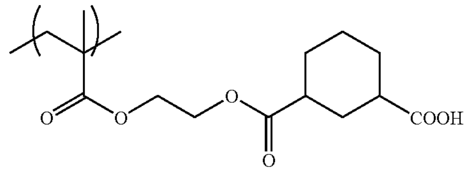
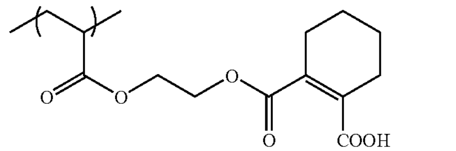
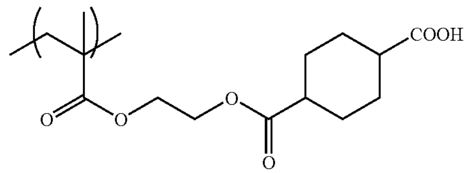
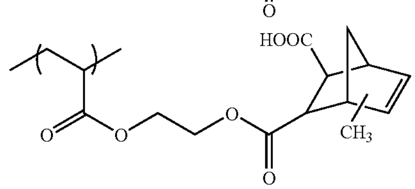
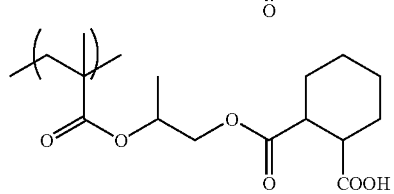
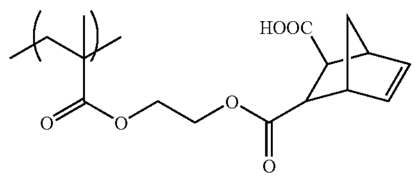
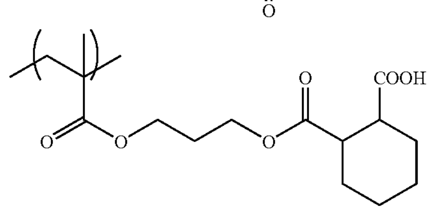
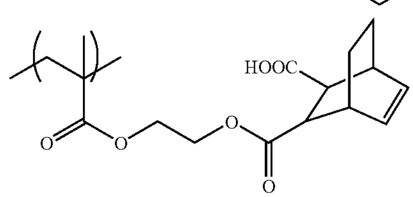
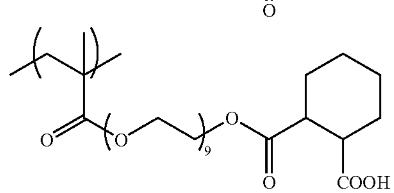
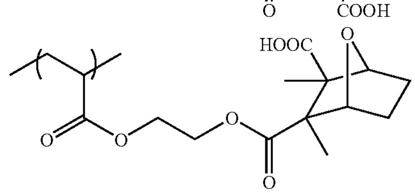

-continued

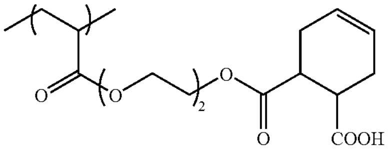

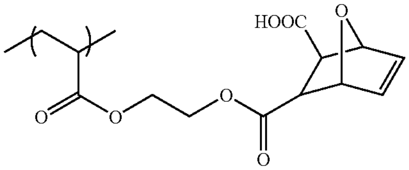

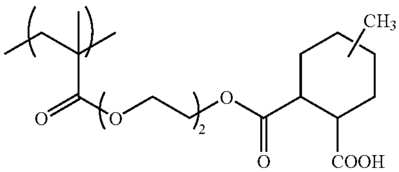

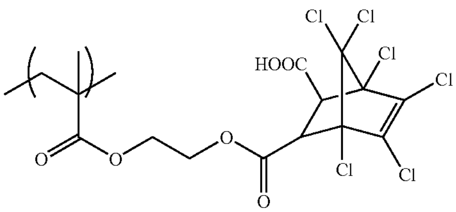

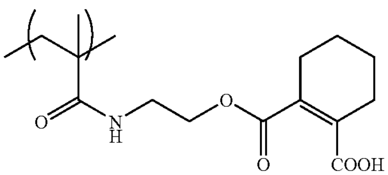

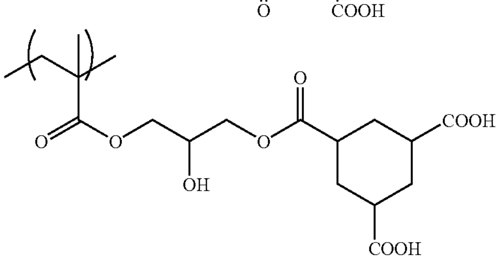

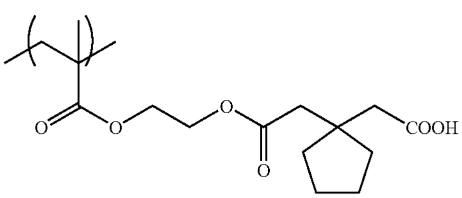

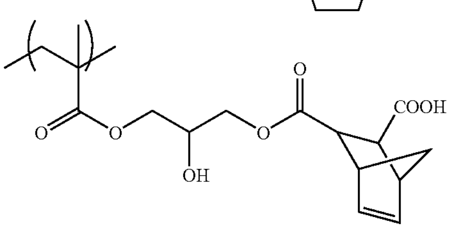

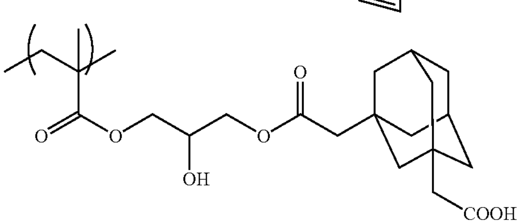

-continued

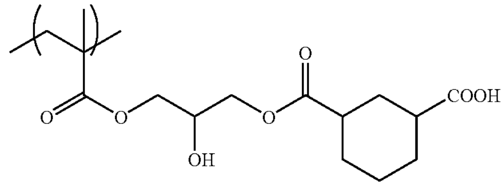

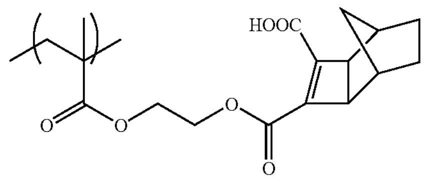

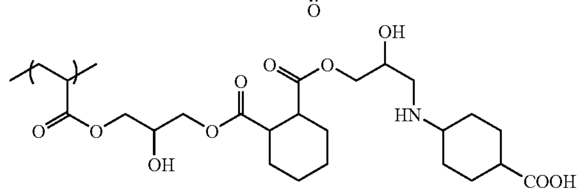

It is preferred that the binder polymer for use in the invention further has an ethylenically unsaturated double bond (hereinafter, appropriately referred to as a "radical polymerizable group") in the side chain thereof In order to introduce the radical polymerizable group into the side chain of binder polymer according to the invention, a method of using a repeating unit having a radical polymerizable group of a structure represented by any one of formulae (A) to (C) shown below in combination with the repeating unit having a structure represented by formula (1) is exemplified. The content of the radical polymerizable group (content of radical-polymerizable unsaturated double bond determined by iodine titration) in the binder polymer is preferably from 0.1 to 10.0 mmol, more preferably from 1.0 to 8.0 mmol, most preferably from 1.5 to 7.0 mmol, per g of the binder polymer. The binder polymer may contain one kind or two or more kinds of the repeating units having a radical polymerizable group.

(A)

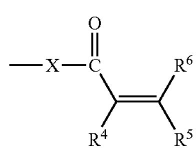

(B)

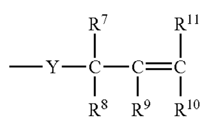

(C)

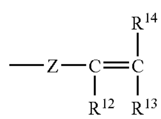

In formulae (A) to (C), $R^4$ to $R^{14}$ each independently represents a hydrogen atom or a monovalent substituent, X and Y each independently represents an oxygen atom, a sulfur atom or —N($R^{15}$)—, Z represents an oxygen atom, a sulfur atom, —N($R^{15}$)— or a phenylene group, and $R^{15}$ represents a hydrogen atom or a monovalent organic group.

In formula (A), $R^4$ to $R^6$ each independently represents a hydrogen atom or a monovalent substituent. $R^4$ includes a hydrogen atom and an organic group, for example, an alkyl group which may have a substituent. Among them, a hydrogen atom, a methyl group, a methylalkoxy group or methylester group is preferable. $R^5$ and $R^6$ each includes, for example, a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent and an aryl group which may have a substituent are preferable. Examples of the substituent capable of being introduced include a methoxycarbonyl group, an ethoxycarbonyl group, an isopropoxycarbonyl group, a methyl group, an ethyl group and a phenyl group.

X represents an oxygen atom, a sulfur atom or —N($R^{15}$)—, and $R^{15}$ includes, for example, an alkyl group which may have a substituent.

In formula (B), $R^7$ to $R^{11}$ each independently represents a hydrogen atom or a monovalent substituent. $R^7$ to $R^{11}$ each includes, for example, a hydrogen atom, a halogen atom, an amino group, a dialkylamino group, a carboxyl group, an alkoxy carbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent and an aryl group which may have a substituent are preferable.

Examples of the substituent capable of being introduced include those illustrated as the substituent capable of being introduced in formula (A).

Y represents an oxygen atom, a sulfur atom or —N($R^{15}$)—. $R^{15}$ has the same meaning as defined in formula (A).

In formula (C), $R^{12}$ to $R^{14}$ each independently represents a hydrogen atom or a monovalent substituent. $R^{12}$ to $R^{14}$ each specifically includes, for example, a hydrogen atom, a halogen atom, an amino group, a dialkylamino group, a carboxyl group, an alkoxy carbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent and an aryl group which may have a substituent are preferable.

Examples of the substituent capable of being introduced include those illustrated as the substituent capable of being introduced in formula (A).

Z represents an oxygen atom, a sulfur atom, —N($R^{15}$)— or a phenylene group. $R^{15}$ has the same meaning as defined in formula (A).

The specific binder polymer having a structure containing the unsaturated group represented by formula (A) according to the invention can be produced, for example, by at least any one of Synthesis methods 1 and 2 shown below.

<Synthesis Method 1>

A method in which polymerization is performed using a radical polymerizable compound corresponding to the repeating unit having a structure represented by formula (1) and at least one radical polymerizable compound represented by formula (a) shown below to synthesis a polymer compound and then a proton is withdrawn from the carbon adjacent to the carbonyl carbon using a base to cause elimination of $Z^1$, thereby obtaining the desired polymer compound.

(a)

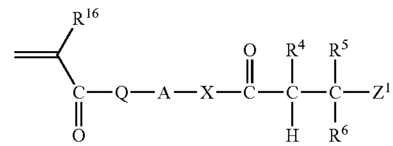

In formula (a), $R^4$ to $R^6$ and X have the same meanings as $R^4$ to $R^6$ and X defined in formula (A), respectively. $Z^1$ represents an anionic leaving group. Q represents an oxygen atom, —NH— or —N($R^{17}$)— (wherein $R^{17}$ represents an alkyl group which may have a substituent). $R^{16}$ represents a hydrogen atom or an alkyl group which may have a substituent. Among them, a hydrogen atom, a methyl group, a methylalkoxy group or methylester group is preferable for $R^{16}$. A represents a divalent organic connection group.

As the radical polymerizable compound represented by formula (a), the compounds shown below are illustrated, but the invention should not be construed as being limited thereto.

(M-1)

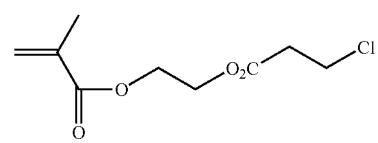

(M-2)

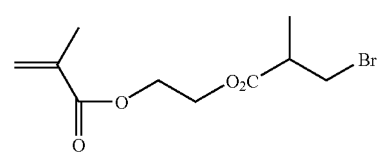

(M-3)

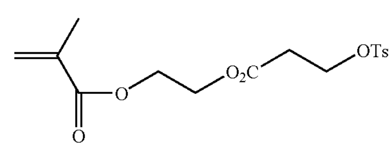

(M-4)

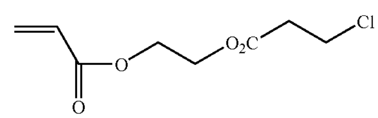

(M-5)

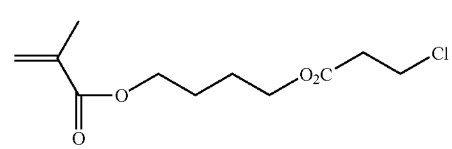

-continued (M-6)

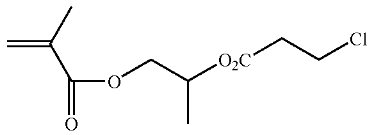

(M-7)

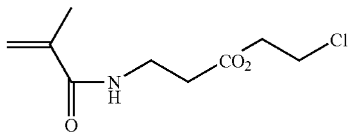

(M-8)

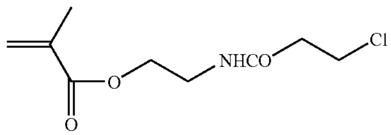

(M-9)

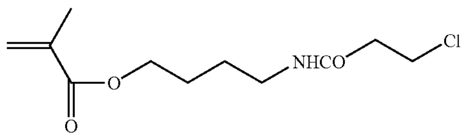

(M-10)

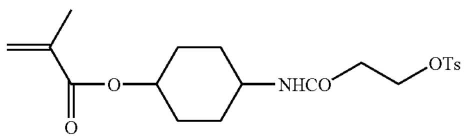

(M-11)

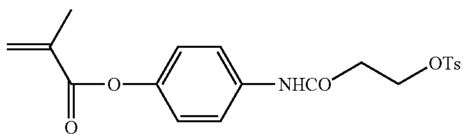

(M-12)

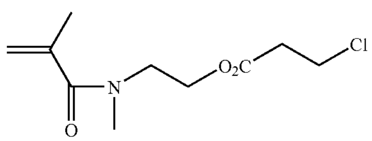

The radical polymerizable compound represented by formula (a) is easily available as a commercial product. At least one radical polymerizable compound represented by formula (a), a radical polymerizable compound corresponding to the repeating unit having a structure represented by formula (1) and, if desired, other radical polymerizable compound are polymerized by a conventional radical polymerization method to synthesis a polymer compound. Then, a desired amount of a base is added dropwise to a solution of the polymer compound under cooling or heating conditions to undergo reaction and, if desired, to conduct neutralization treatment with an acid, whereby the group represented by formula (A) can be introduced. For the production of the polymer compound, a conventionally known suspension polymerization method or solution polymerization method can be used. The base used may be any of inorganic compound (inorganic base) and organic compound (organic base). Preferable examples of the inorganic base include sodium hydroxide, potassium hydroxide, sodium carbonate, sodium hydrogen carbonate, potassium carbonate and potassium hydrogen carbonate. Preferable examples of the organic base include a metal alkoxide, for example, sodium methoxide, sodium ethoxide or potassium tert-butoxide and an organic amine compound, for example, triethylamine, pyridine or diisopropylamine.

<Synthesis Method 2>

A method in which polymerization is performed using a radical polymerizable compound corresponding to the repeating unit having a structure represented by formula (1) and at least one radical polymerizable compound having a reactive functional group to synthesis a backbone polymer compound (polymer compound constituting a main chain) and then the side chain reactive functional group of the backbone polymer compound is reacted with a compound having a structure represented by formula (b) shown below, thereby obtaining the desired polymer compound.

(b)

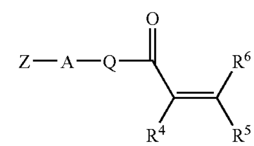

In formula (b), $R^4$ to $R^6$, A and Q have the same meanings as $R^4$ to $R^6$, A and Q defined in formula (a), respectively. Z represents a reactive functional group capable of reacting with the reactive functional group of the radical polymerizable compound described above.

Examples of the reactive functional group in the radical polymerizable compound having a reactive functional group for use in the synthesis of backbone polymer compound in Synthesis method 2 include a hydroxy group, a carboxyl group, a carboxylic acid halide group, a carboxylic acid anhydride group, an amino group, a halogenated alkyl group, an isocyanate group, an epoxy group and a sulfonic acid group. Specific examples of the radical polymerizable compound having such a functional group include 2-hydroxyethyl acrylate, 2-hydroxyethyl methacrylate, 4-hydroxybutyl acrylate, 4-hydroxybutyl methacrylate, acrylic acid, methacrylic acid, a monomer corresponding to the repeating unit represented by formula (3) described above, acrylic acid chloride, methacrylic acid chloride, methacrylic acid anhydride, N,N-dimethyl-2-aminoethyl methacrylate, 2-chloroethyl methacrylate, 2-isocyanic acid ethyl methacrylate, 2-isocyanic acid ethyl acrylate, glycidyl acrylate, glycidyl methacrylate, allyl alcohol, allylamine, diallylamine, 2-allyloxyethyl alcohol, 2-chloro-1-butene, allyl isocyanate and 2-acrylamido-2-methylpropanesulfonic acid.

At least one radical polymerizable compound having such a functional group, a radical polymerizable compound corresponding to the repeating unit having a structure represented by formula (1) and, if desired, other radical polymerizable compound are copolymerized to synthesis a backbone polymer compound. Then, a compound having a structure represented by formula (b) is reacted with the backbone polymer compound to obtain the desired polymer compound.

As a combination of preferable specific examples of the monomer for use in the backbone polymer compound with the compound represented by formula (b), a combination of a monomer for backbone polymer compound having a hydroxy group, for example, 2-hydroxyethyl acrylate or 2-hydroxyethyl methacrylate with a compound represented by formula (b) having an isocyanate group, for example, 2-isocyanic acid ethyl methacrylate, 2-isocyanic acid ethyl acrylate or allyl isocyanate, a combination of a monomer for backbone polymer compound having a carboxylic acid group, for example, acrylic acid, methacrylic acid or a monomer corresponding to the repeating unit represented by formula (3) described above with a compound represented by formula (b) having an epoxy group, for example, glycidyl acrylate, glycidyl methacrylate or allyl glycidyl ether, a combination of N,N-dimethyl-2-aminoethyl methacrylate for backbone polymer compound with a compound represented by formula (b) having a sulfonic acid group, for example, 2-acrylamido-2-methylpropanesulfonic acid, or a combination of N,N-dimethyl-2-aminoethyl methacrylate for backbone polymer compound with a compound represented by formula (b) having a halogenated alkyl group, for example, 2-chloroethyl methacrylate is preferable in view of reactivity and performances of printing plate.

The specific binder polymer having a structure containing the unsaturated group represented by formula (B) or the unsaturated group represented by formula (C) according to the invention can be produced by Synthesis method 3 shown below.

<Synthesis Method 3>

A method in which polymerization is performed using a radical polymerizable compound capable of forming the repeating unit having a structure represented by formula (1), at least one radical polymerizable compound having the unsaturated group represented by formula (B) or (C) and an ethylenically unsaturated group having addition polymerizability higher than the unsaturated group represented by formula (B) or (C), and if desired, other radical polymerizable compound are copolymerized to obtain a polymer compound. This method is a method using a compound containing plural ethylenically unsaturated groups different in the addition polymerizability, for example, allyl methacrylate.

Examples of the radical polymerizable compound having an ethylenically unsaturated group having addition polymerizability higher than the unsaturated group represented by formula (B) or (C) include allyl acrylate, allyl methacrylate, 2-allyloxyethyl acrylate, 2-allyloxyethyl methacrylate, propargyl acrylate, propargyl methacrylate, N-allyl acrylate, N-allyl methacrylate, N,N-diallyl acrylate, N,N-diallyl methacrylate, allyl acrylamide, allyl methacrylamide, vinyl acrylate, vinyl methacrylate, 2-phenylvinyl acrylate, 2-phenylvinyl methacrylate, 1-propenyl acrylate, 1-propenyl methacrylate, vinyl acrylamide and vinyl methacrylamide.

Preferable specific examples of the repeating unit having a structure containing the unsaturated group represented any one of formulae (A) to (C) are set forth below, but the invention should not be construed as being limited thereto.

1)

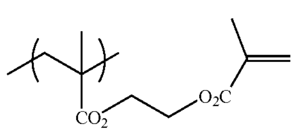

2)

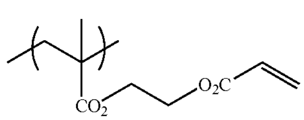

3)

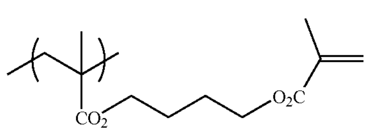

4)

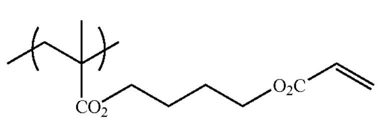

-continued

5)

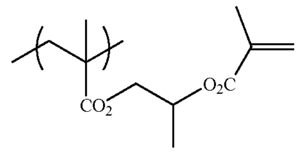

6)

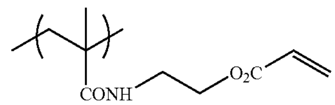

7)

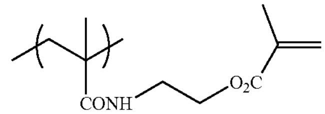

8)

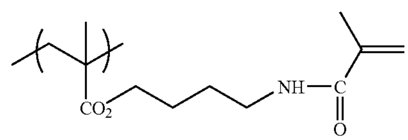

9)

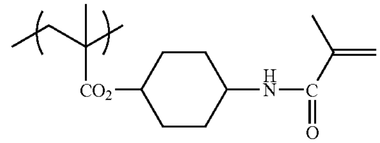

10)

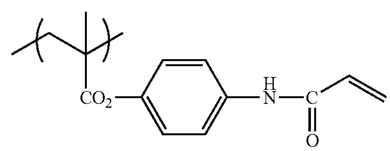

11)

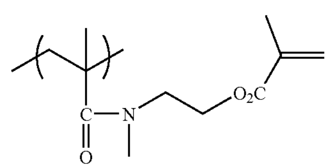

12)

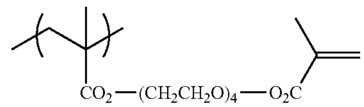

13)

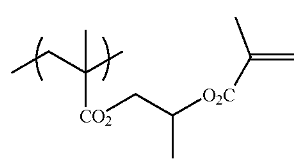

14)

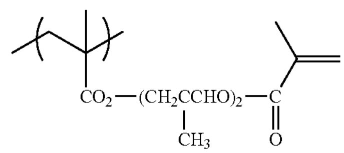

15)

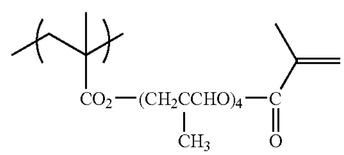

-continued
16)
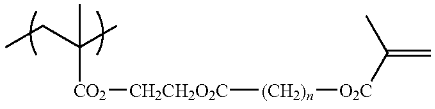
n is 4 or 5
17)
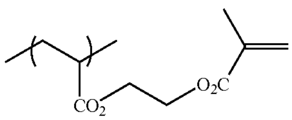
18)
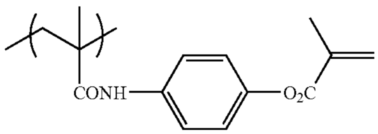
19)
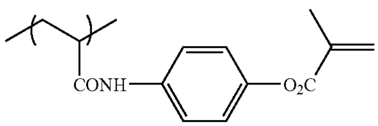
20)
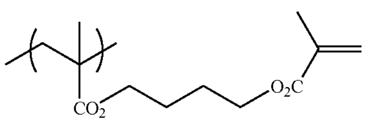
21)
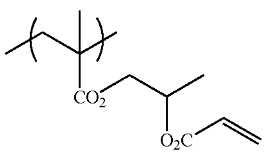
22)
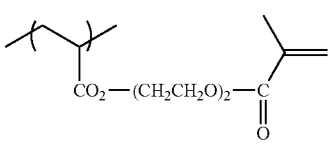
23)
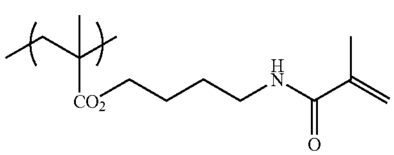
24)
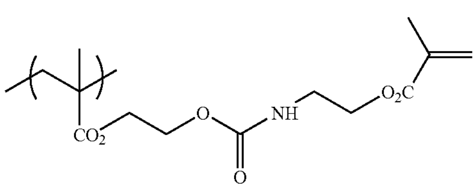
25)
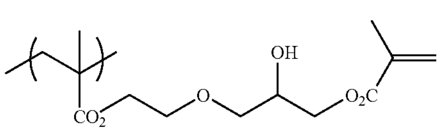
-continued
26)
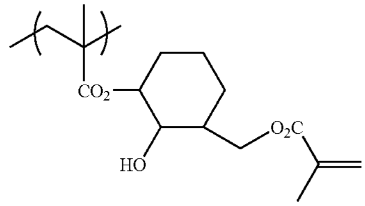
27)
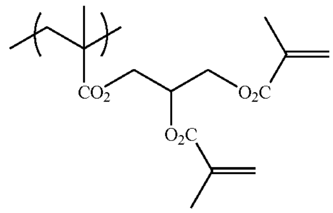
28)
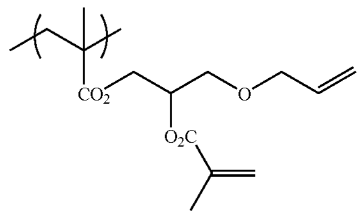
29)
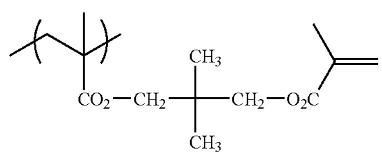
30)
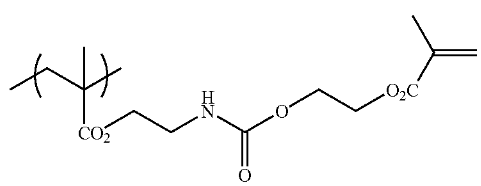
31)
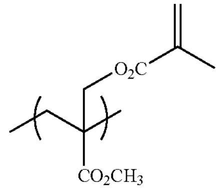
32)
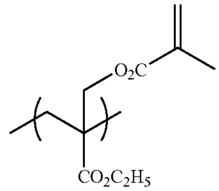
33)
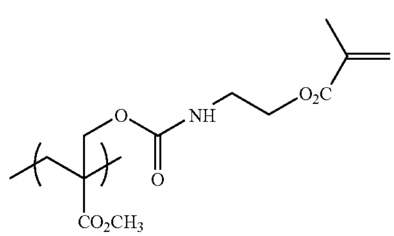

-continued
34)
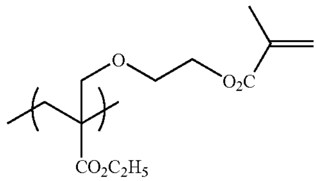
35)
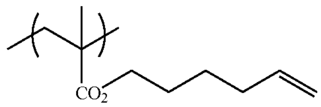
36)
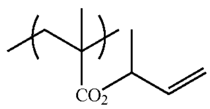
37)
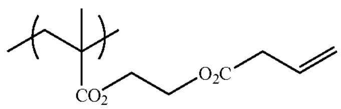
38)
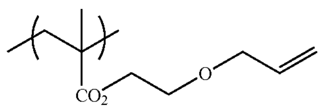
39)
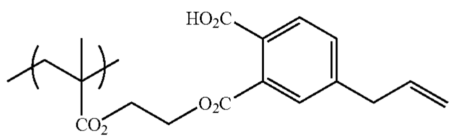
40)
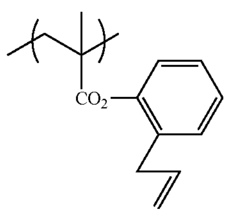
41)
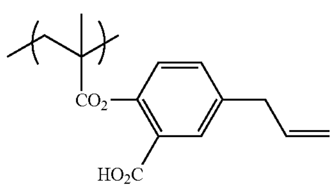
42)
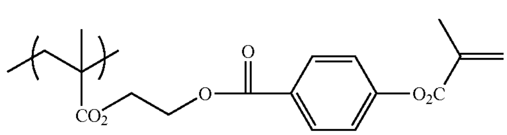
43)
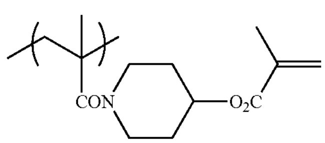
44)
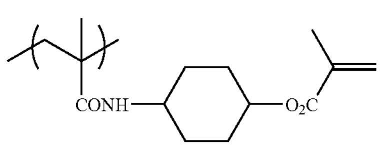
-continued
45)
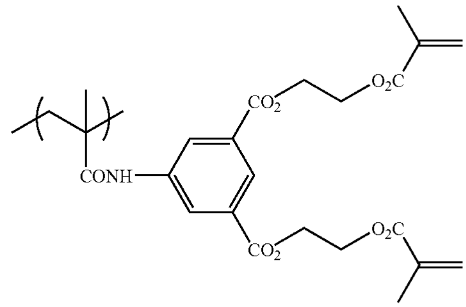
46)
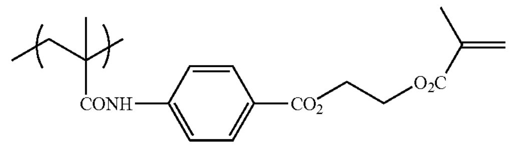
47)
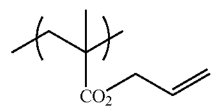
48)
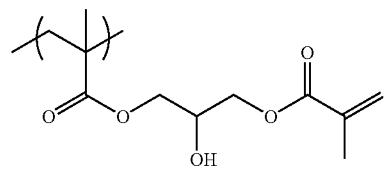
49)
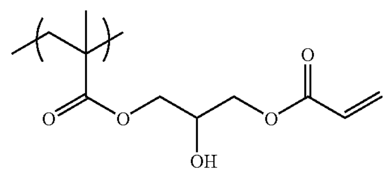
50)
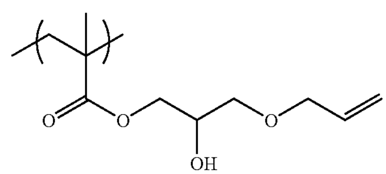
51)
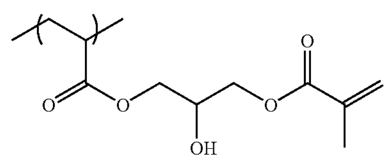
52)
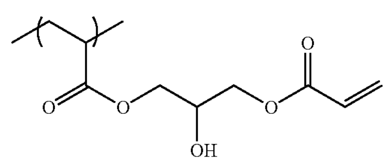
53)
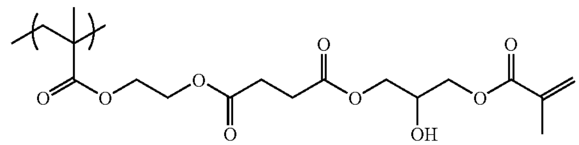

-continued

54)

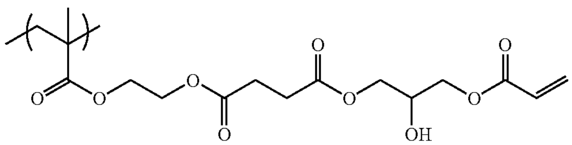

55)

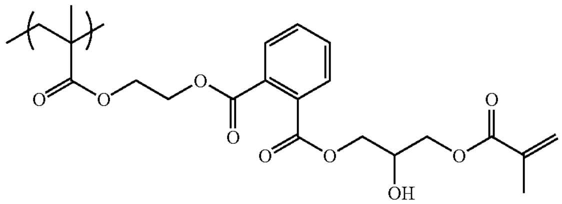

56)

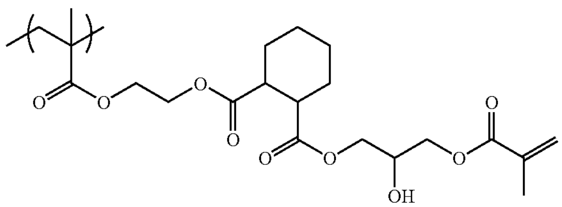

57)

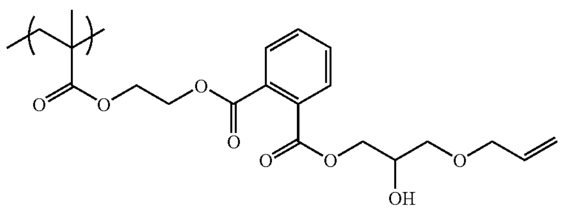

58)

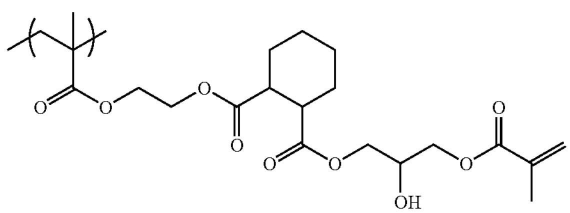

59)

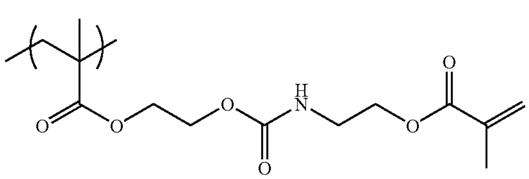

60)

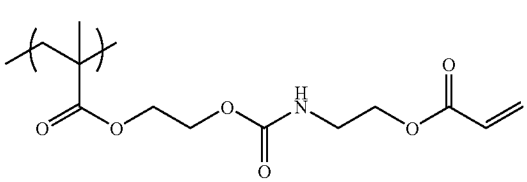

-continued

61)

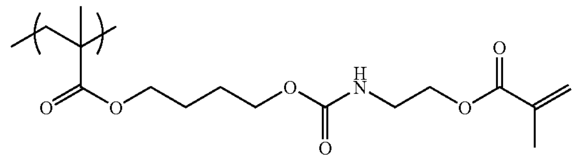

62)

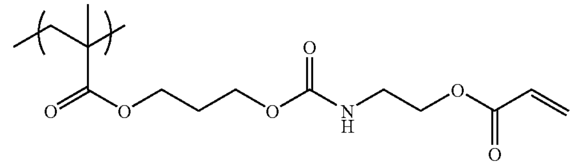

63)

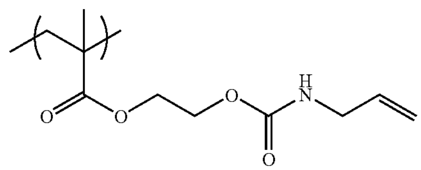

64)

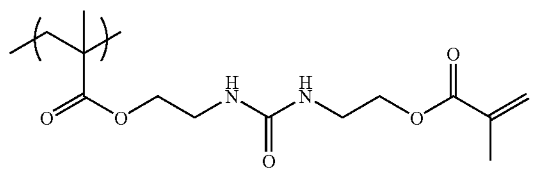

Synthesis methods 1 to 3 of the binder polymer containing a repeating unit having a structure containing the unsaturated group represented any one of formulae (A) to (C) have been described above. The specific binder polymer according to the invention can be obtained by copolymerization of a radical polymerizable compound corresponding to the repeating unit having a structure represented by formula (1), for example, a radical polymerizable compound corresponding to the repeating unit represented by formula (3) described above and a radical polymerizable compound contributing to form a repeating unit having a structure represented by any one of formulae (A) to (C) in a prescribed ratio at the polymerization of radical polymerizable compounds according to each of Synthesis methods 1 to 3.

Although Synthesis methods 1 to 3 are described as the synthesis method, Synthesis methods 2 and 3 are more preferable from the standpoint of production aptitude in that an operation, for example, reprecipitation of the polymer obtained is omittable.

Further, in the specific binder polymer according to the invention, a component described below may be copolymerized in addition to a component of the repeating unit having a carboxylic acid group described above which is the indispensable component, and a component of the repeating unit having the radical polymerizable group described above which is a preferable component. As such a copolymerization component, any conventionally known radical polymerizable monomer can be used without limitation. Specific examples thereof include monomers described in The Society of Polymer Science, Japan ed., *Kobunshi Data Handbook-Kisohen* (*Polymer Data Handbook-Fundamental Volume*), Baifukan Co., Ltd (1986). Further, from the standpoint of preventing development scum, a compound having an ester group hydrolyzable in an aqueous alkali solution described in JP-A-2005-47947 may be introduced as the copolymerization component. The copolymerization components may be used individually or in combination of two or more thereof.

Specific examples of the specific binder polymer according to the invention are set forth below as (PA-1) to (PA-109) having the radical polymerizable group described above and as (PB-1) to (PB-12) having no radical polymerizable group, but the invention should not be construed as being limited thereto.

PA-1

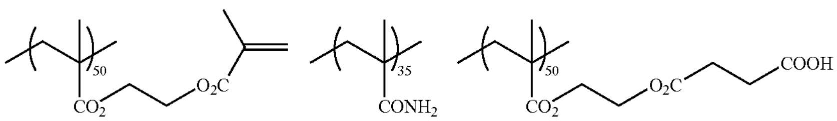

Mw 100,000

PA-2

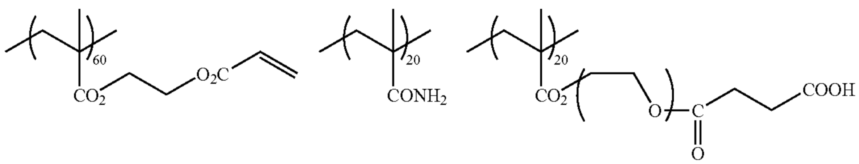

Mw 120,000

PA-3

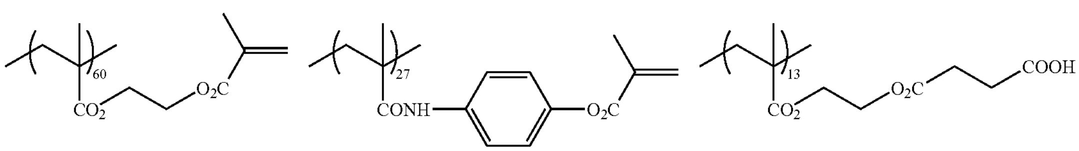

Mw 100,000

PA-4

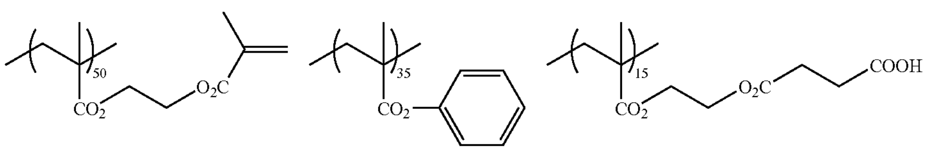

Mw 150,000

PA-5

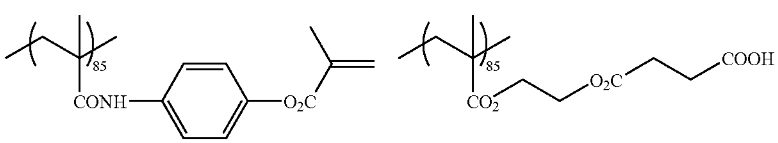

Mw 80,000

PA-6

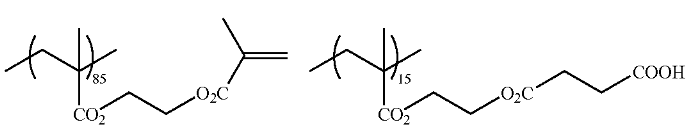

Mw 110,000

PA-7

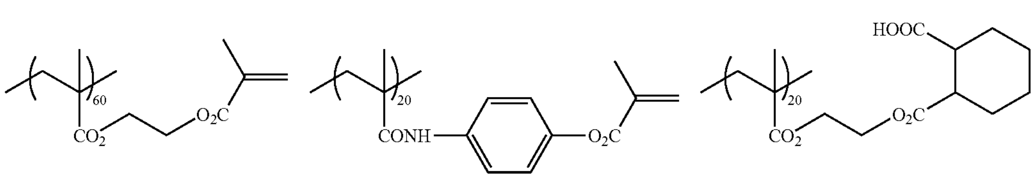

Mw 120,000

PA-8

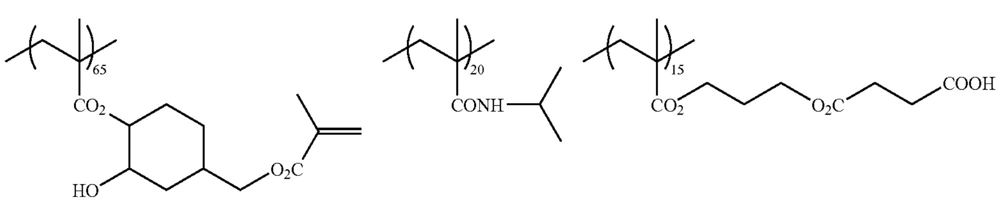

Mw 110,000

-continued
PA-9
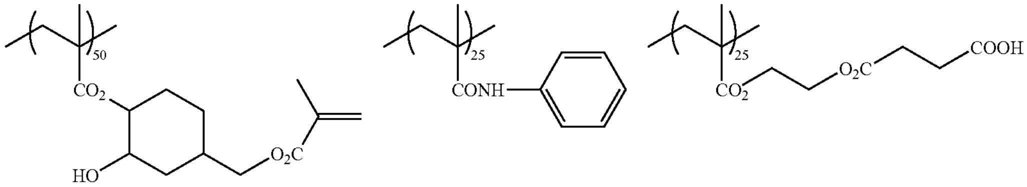
Mw 150,000
PA-10
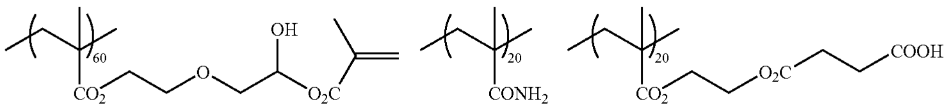
Mw 90,000
PA-11
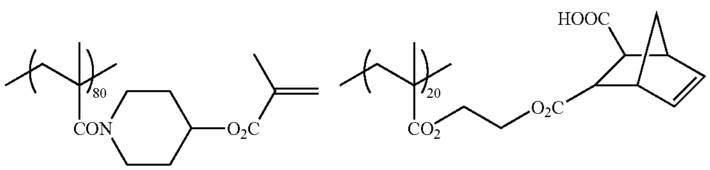
Mw 100,000
PA-12
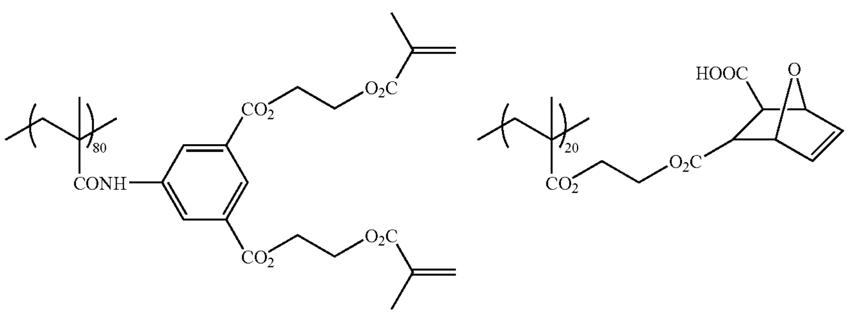
Mw 120,000
PA-13
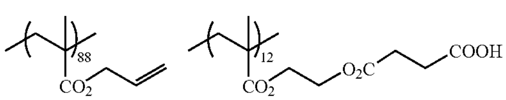
Mw 130,000
PA-14
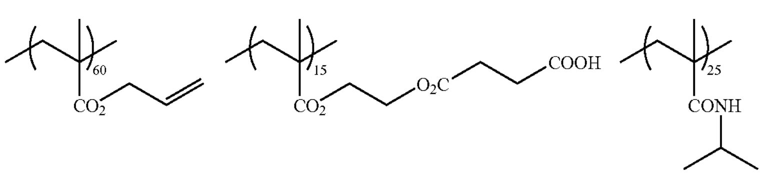
Mw 110,000
PA-15
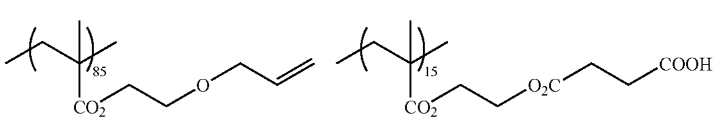
Mw 120,000

-continued
PA-16
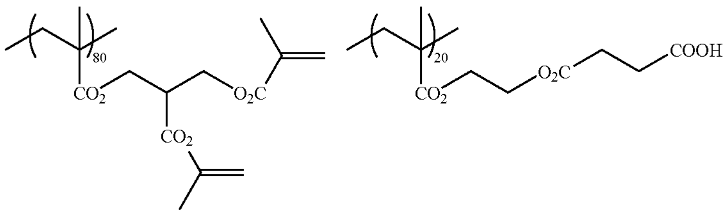
Mw 95,000
PA-17
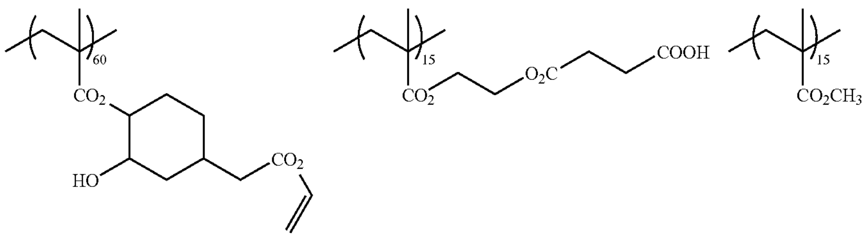
Mw 150,000
PA-18
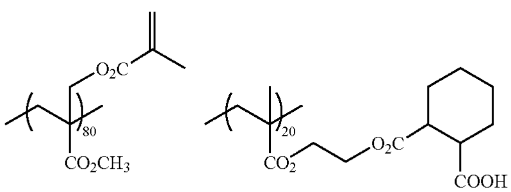
Mw 160,000
PA-19
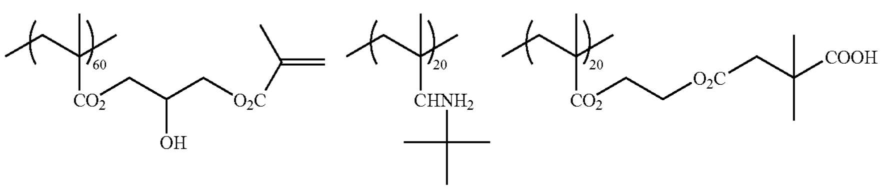
Mw 100,000
PA-20
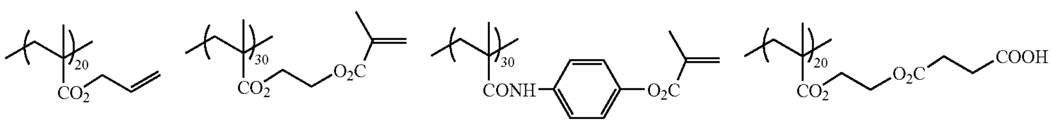
Mw 150,000
PA-21
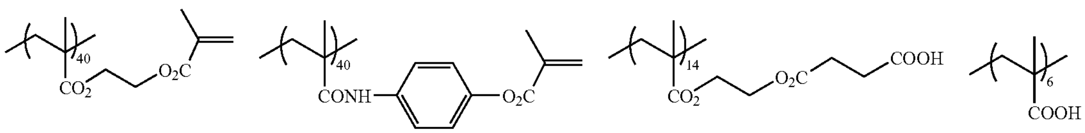
Mw 100,000
PA-22
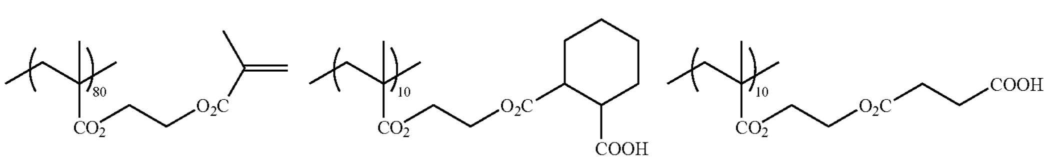
Mw 120,000

-continued
PA-23
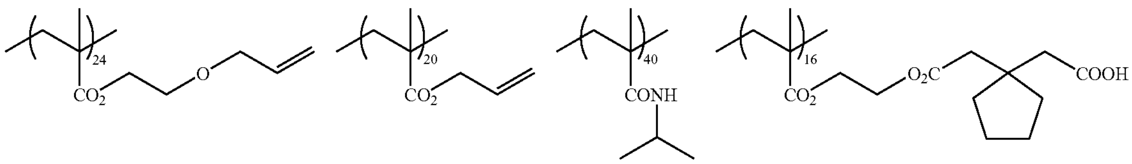
Mw 140,000
PA-24
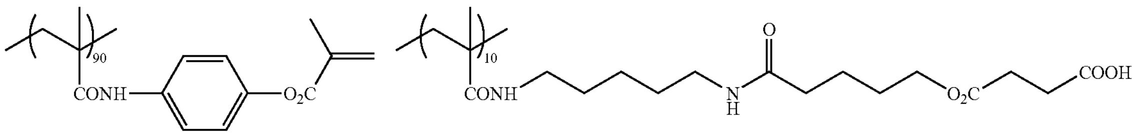
Mw 120,000
PA-25
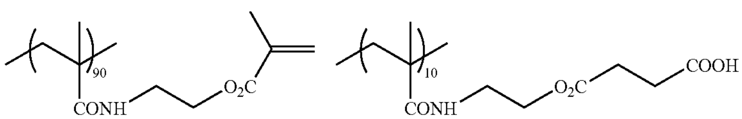
Mw 130,000
PA-26
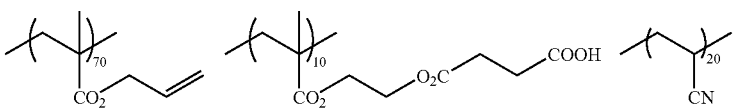
Mw 120,000
PA-27
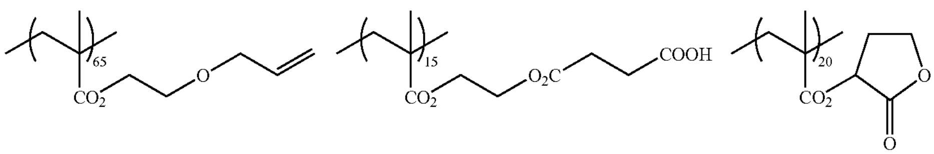
Mw 100,000
PA-28
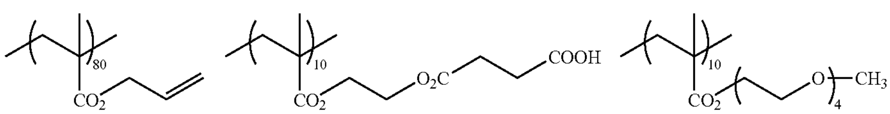
Mw 80,000
PA-29
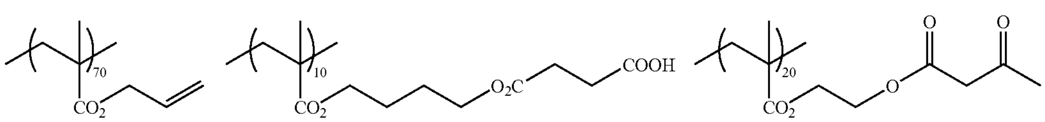
Mw 110,000
PA-30
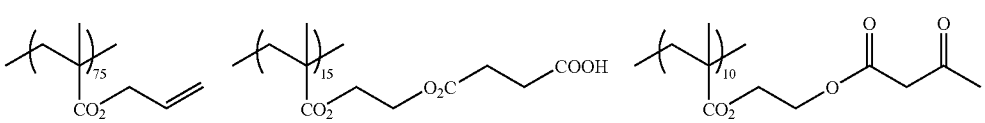
Mw 100,000
PA-31
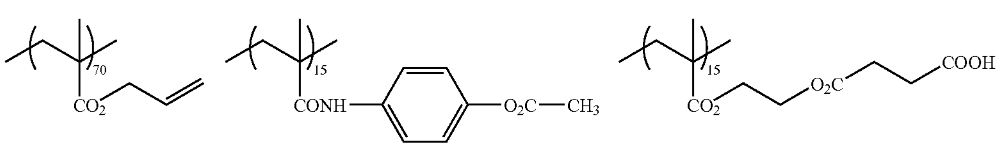
Mw 120,000

-continued
PA-32
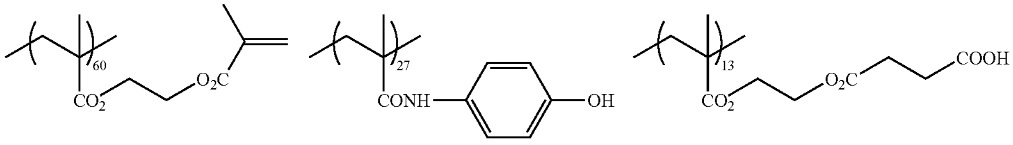
Mw 120,000
PA-33
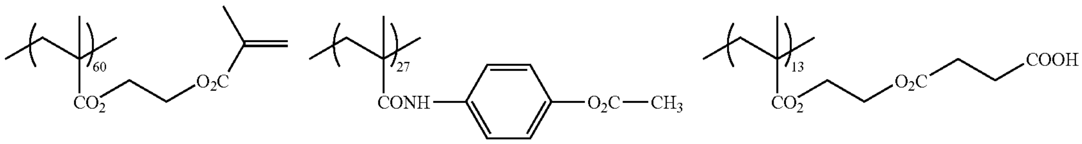
Mw 140,000
PA-34
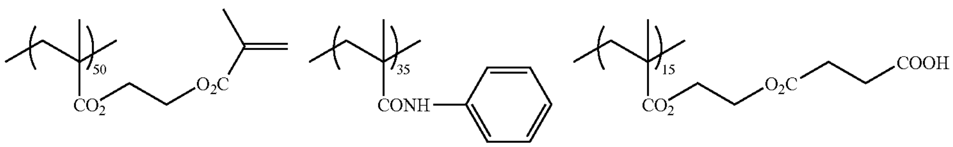
Mw 100,000
PA-35
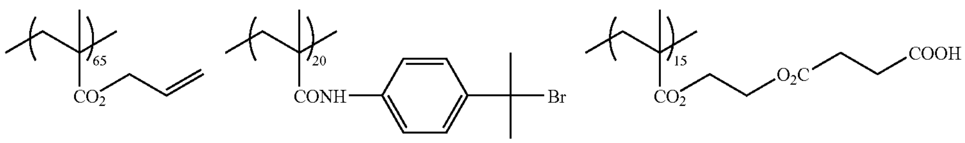
Mw 150,000
PA-36
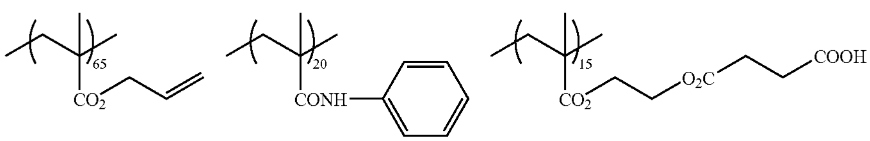
Mw 100,000
PA-37
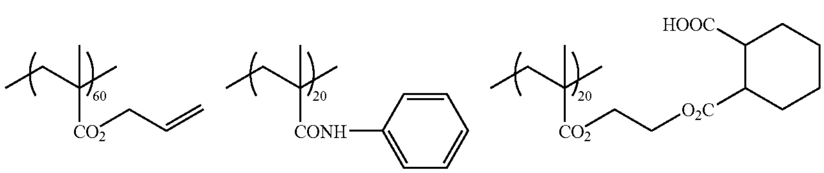
Mw 100,000
PA-38
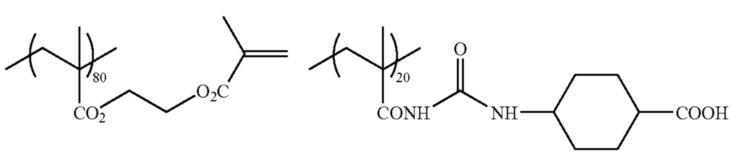
Mw 100,000
PA-39
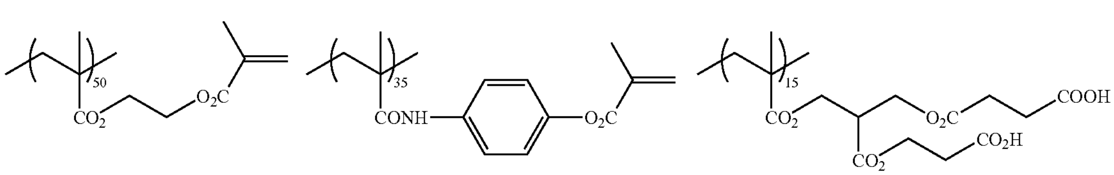
Mw 120,000

-continued
PA-40
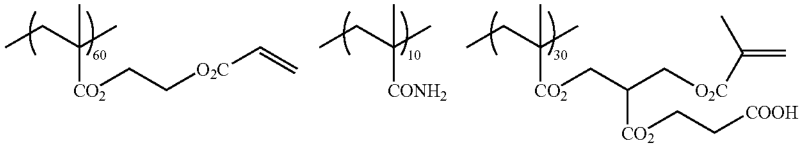
Mw 90,000
PA-41
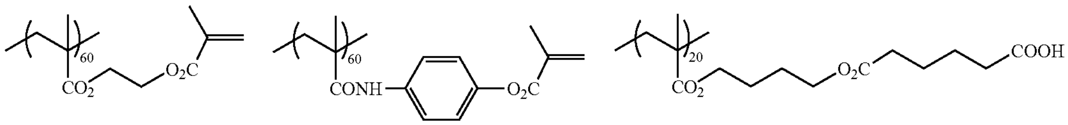
Mw 110,000
PA-42
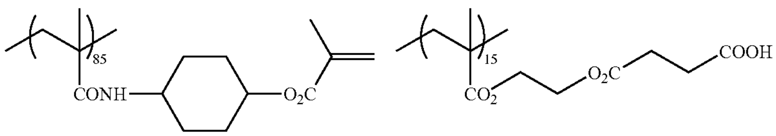
Mw 100,000
PA-43
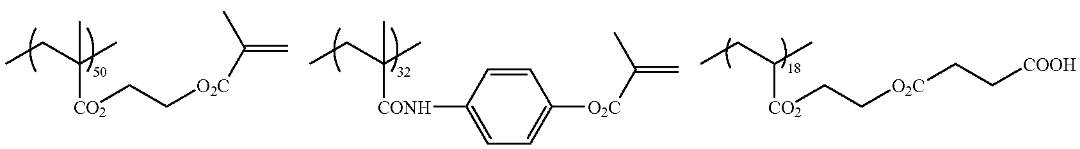
Mw 80,000
PA-44
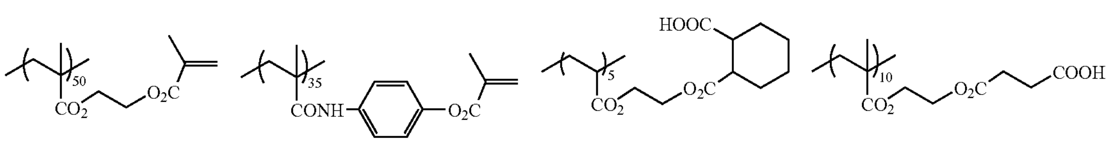
Mw 120,000
PA-45
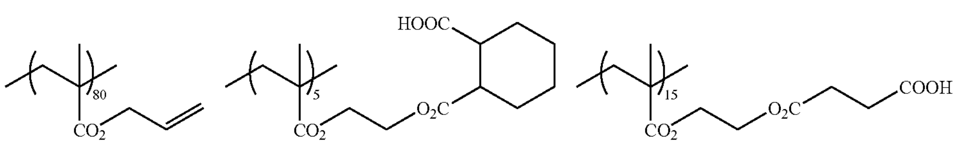
Mw 150,000
PA-46
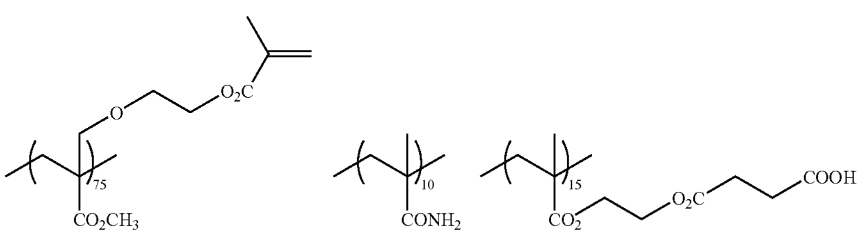
Mw 100,000
PA-47
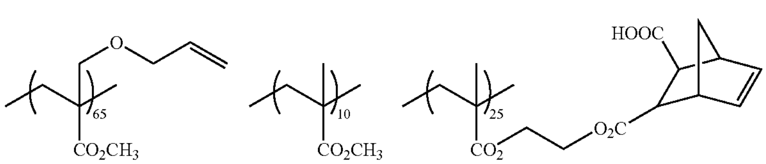
Mw 180,000

-continued
PA-48
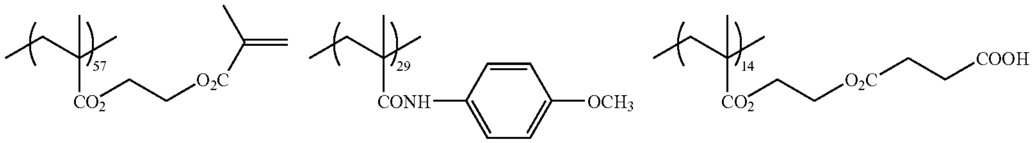
Mw 100,000
PA-49
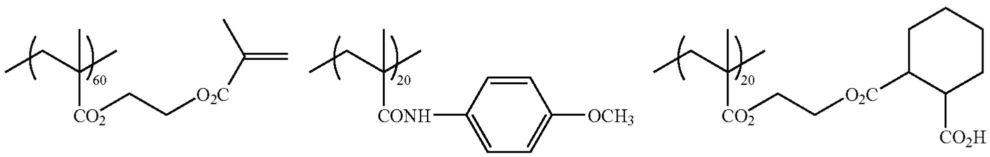
Mw 120,000
PA-50
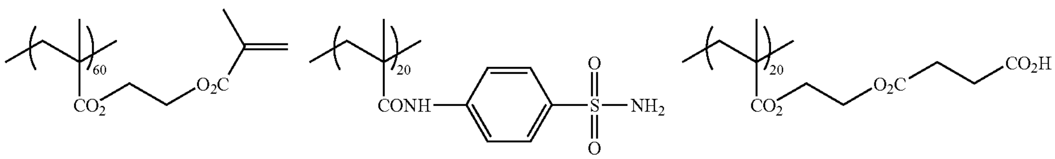
Mw 90,000
PA-51
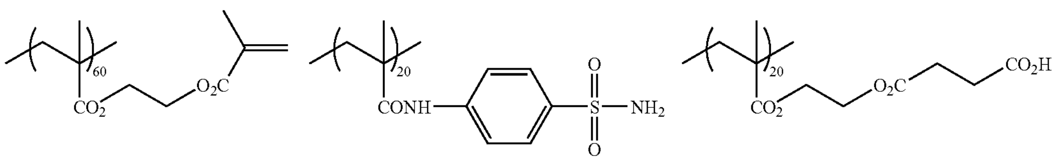
Mw 110,000
PA-52
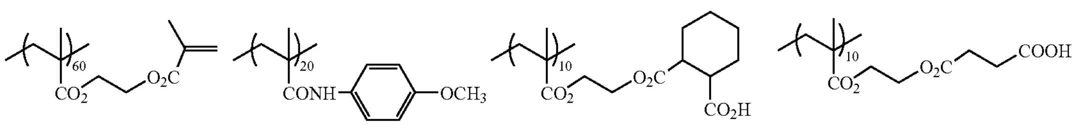
Mw 120,000
PA-53
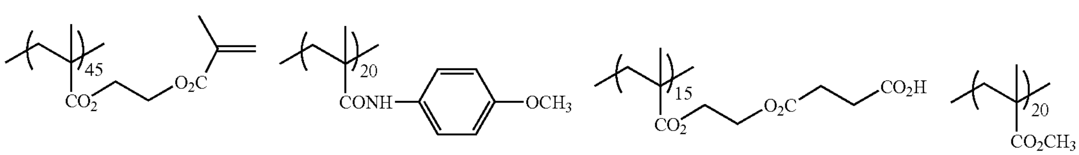
Mw 100,000
PA-54
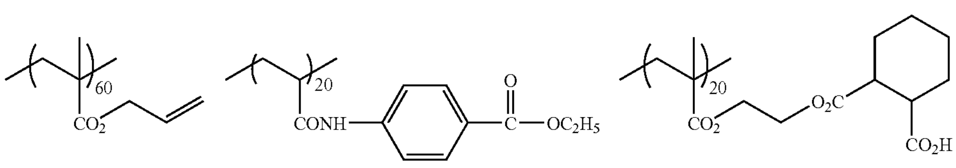
Mw 95,000
PA-55
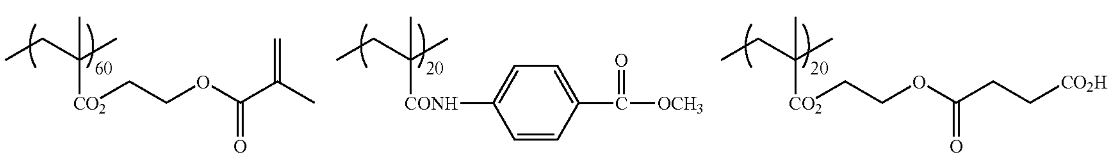
Mw 99,000

-continued
PA-56
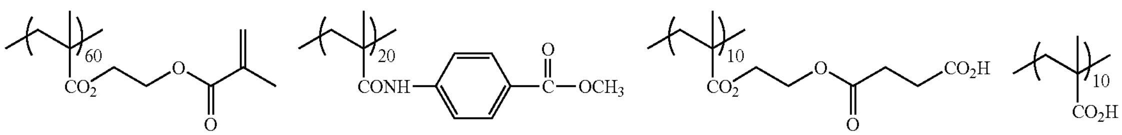
Mw 100,000
PA-57
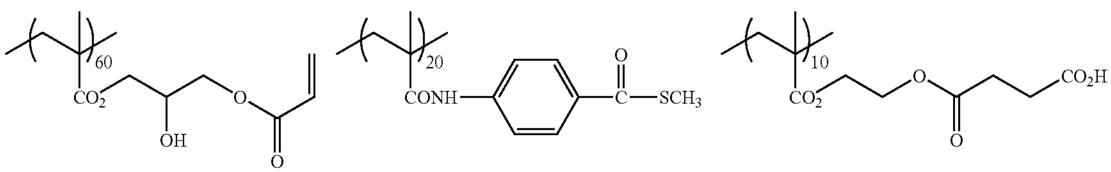
Mw 120,000
PA-58
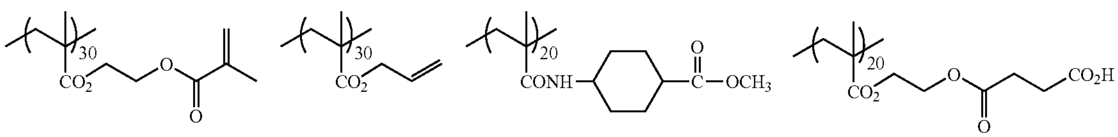
Mw 100,000
PA-59
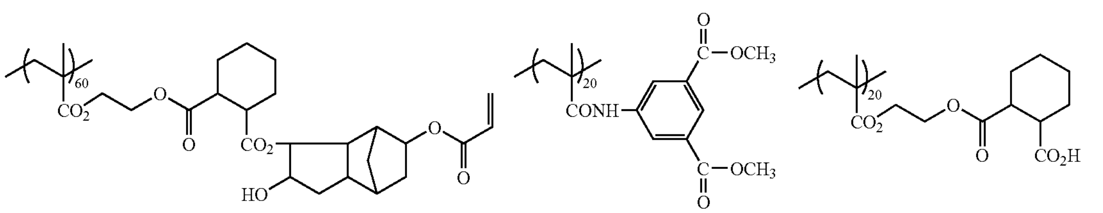
Mw 110,000
PA-60
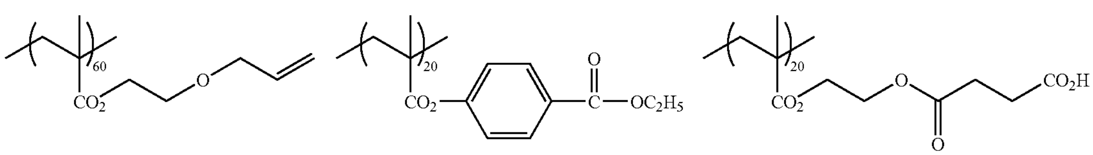
Mw 95,000
PA-61
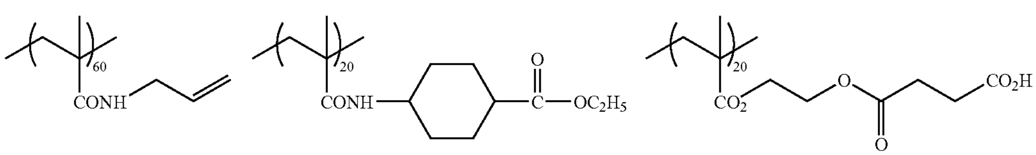
Mw 90,000
PA-62
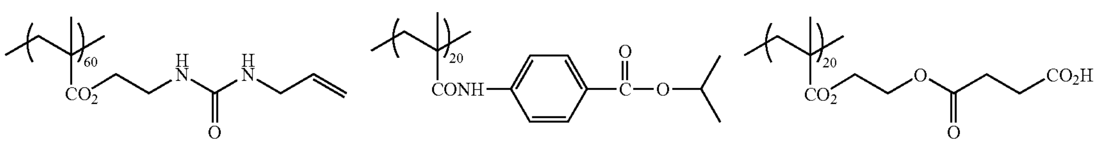
Mw 100,000

-continued
PA-63
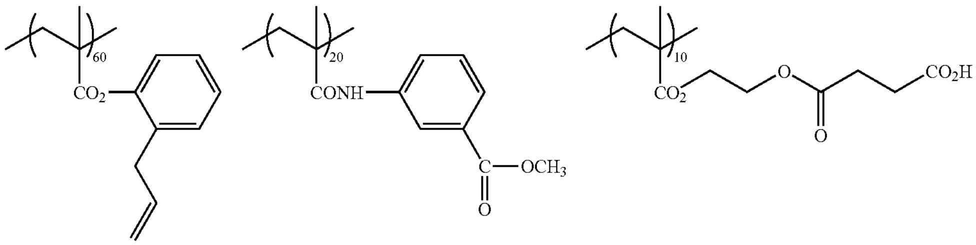
Mw 95,000
PA-64
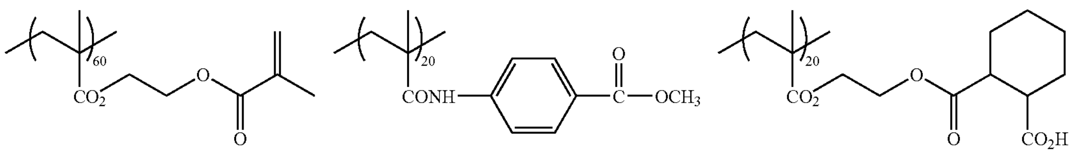
Mw 95,000
PA-65
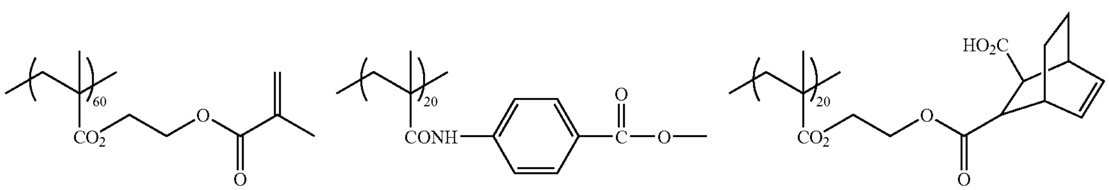
Mw 105,000
PA-66
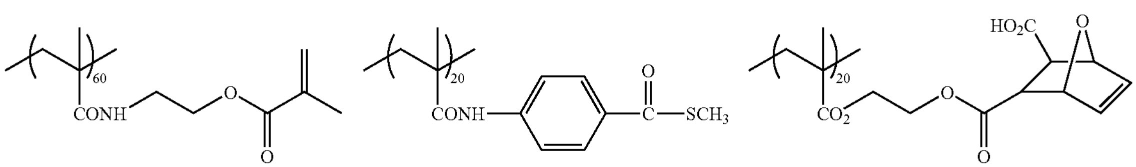
Mw 100,000
PA-67
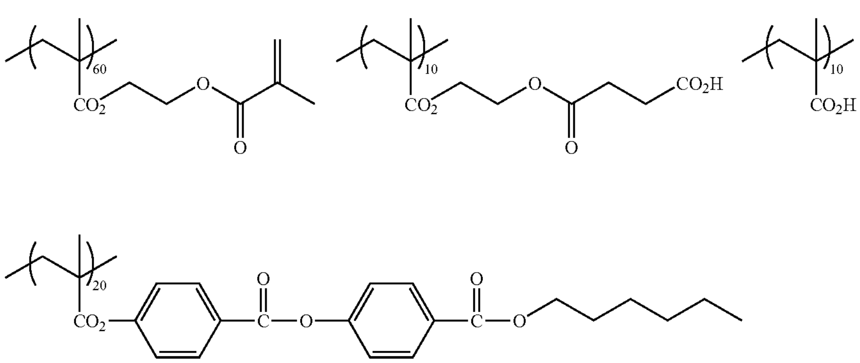
Mw 95,000

-continued
PA-68
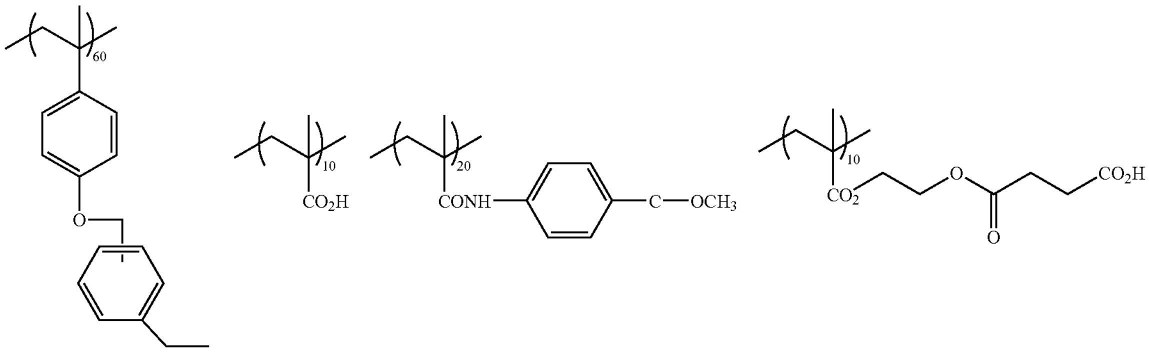
Mw 115,000
PA-69
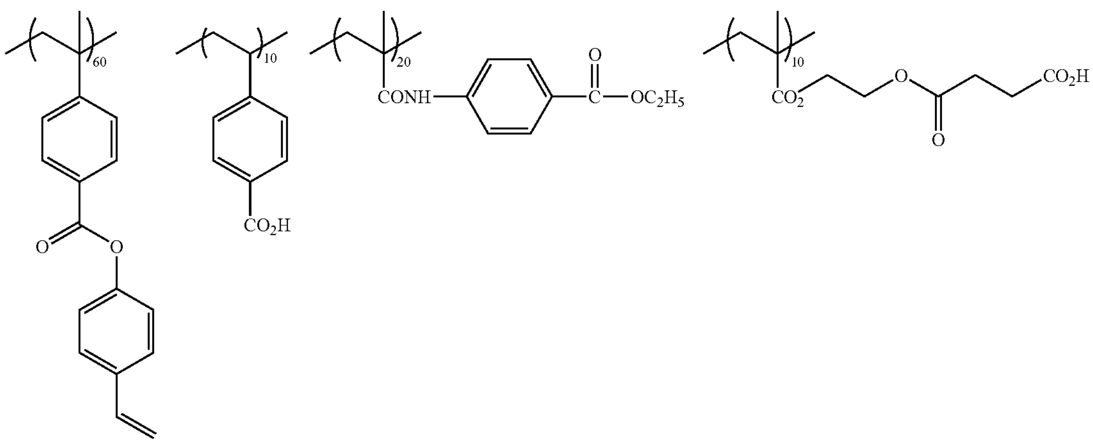
Mw 110,000
PA-70
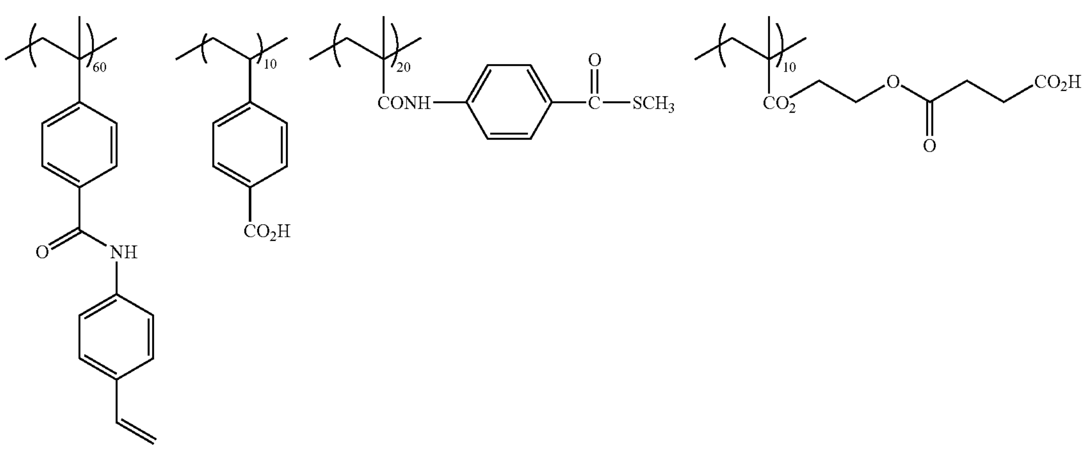
Mw 120,000

-continued
PA-71
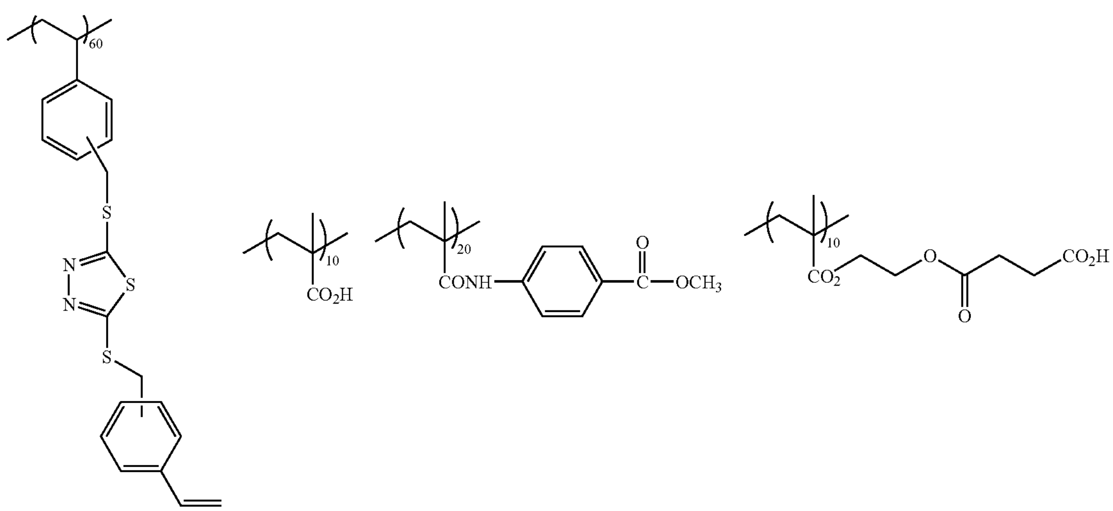
Mw 100,000
PA-72
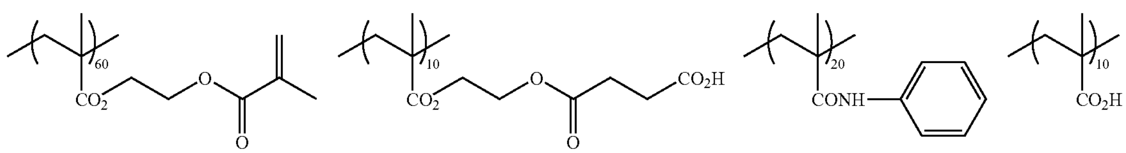
Mw 110,000
PA-73
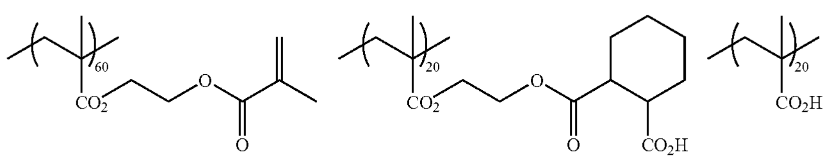
Mw 100,000
PA-74
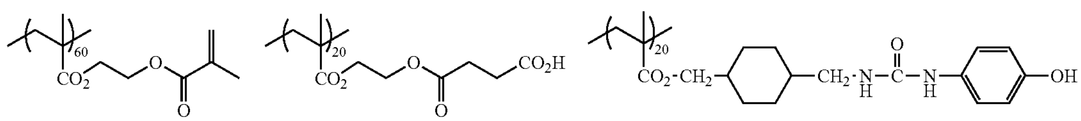
Mw 110,000
PA-75
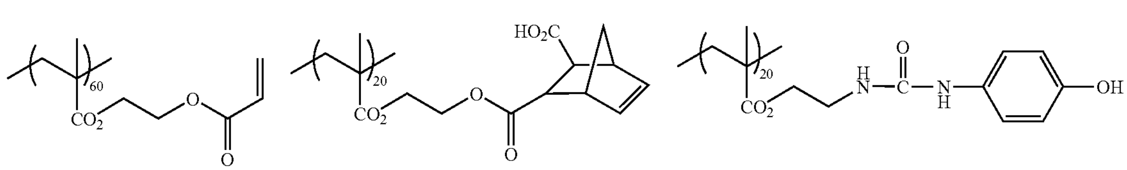
Mw 115,000
PA-76
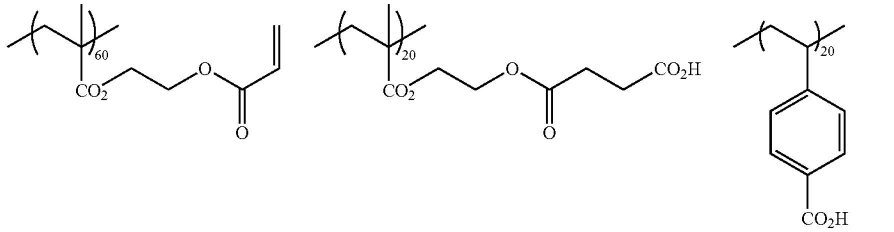
Mw 100,000

-continued
PA-77
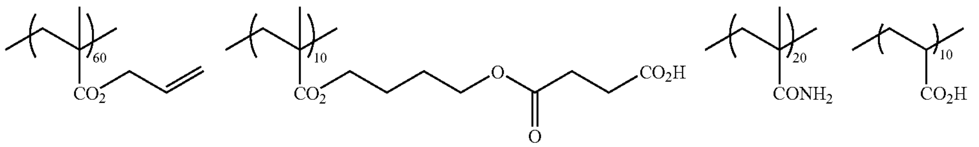
Mw 120,000
PA-78
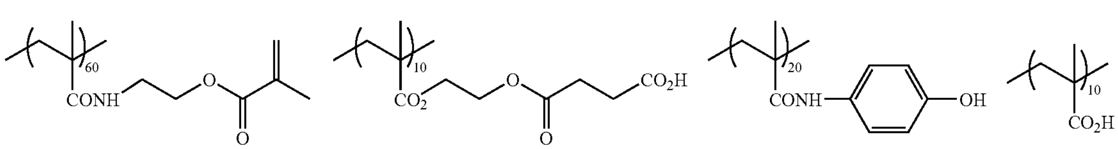
Mw 110,000
PA-79
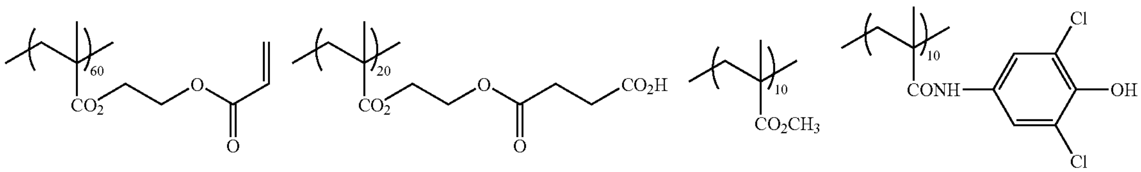
Mw 95,000
PA-80
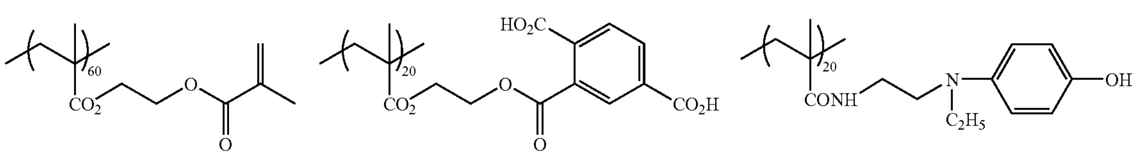
Mw 90,000
PA-81
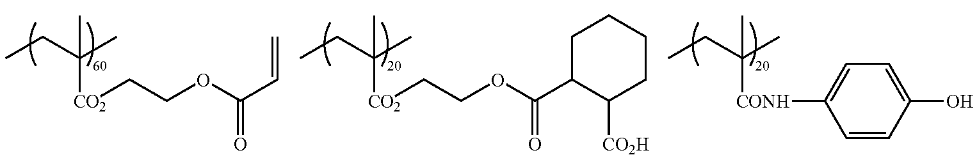
Mw 100,000
PA-82
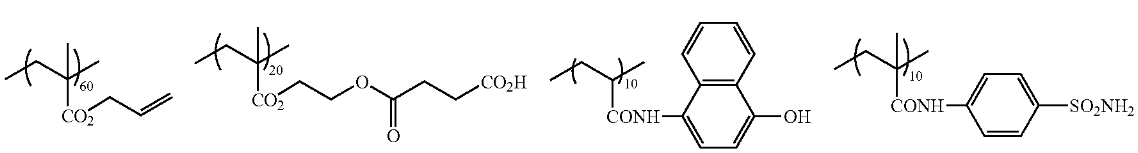
Mw 110,000
PA-83
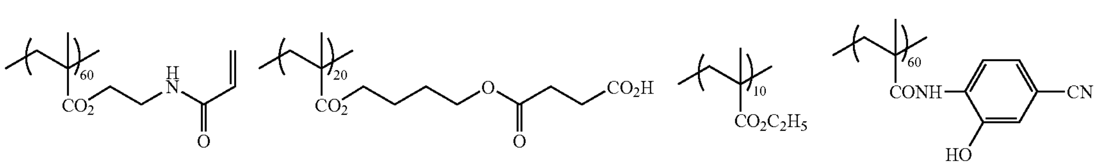
Mw 100,000

-continued
PA-84
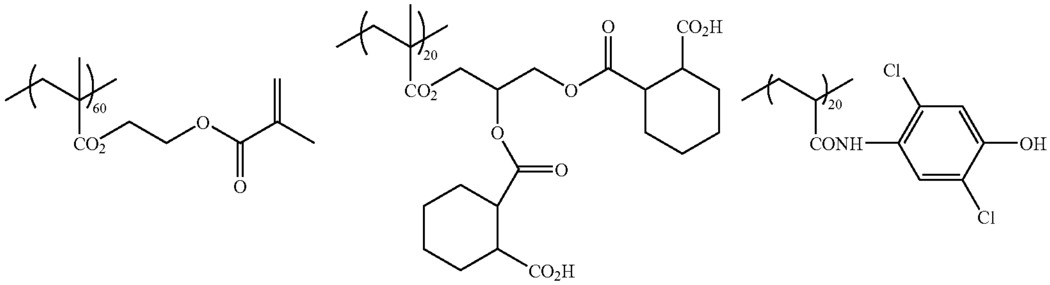
Mw 110,000
PA-85
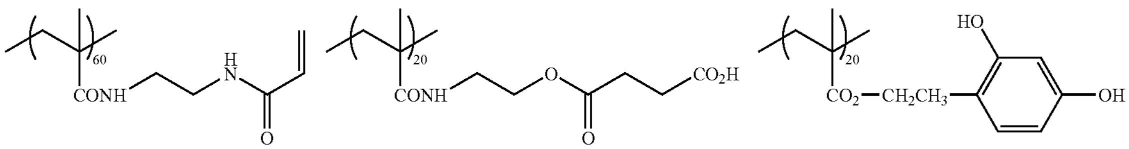
Mw 105,000
PA-86
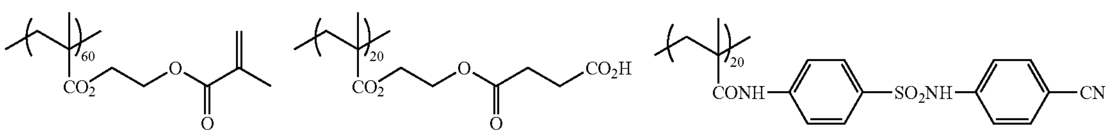
Mw 115,000
PA-87
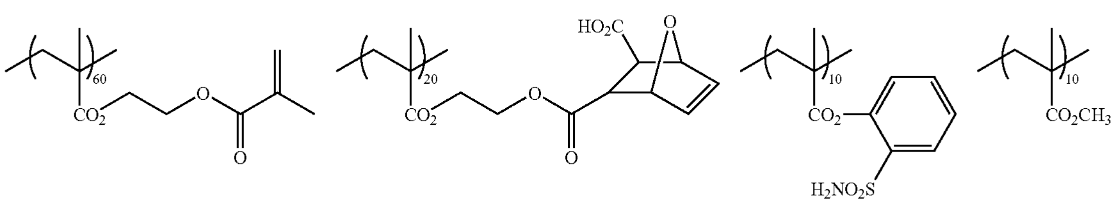
Mw 120,000
PA-88
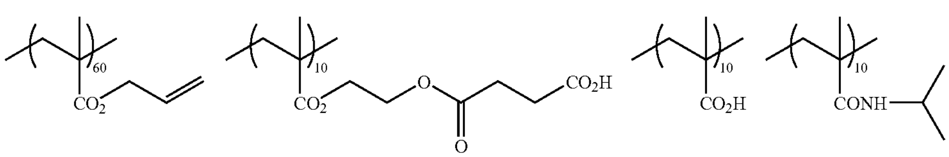
Mw 90,000
PA-89
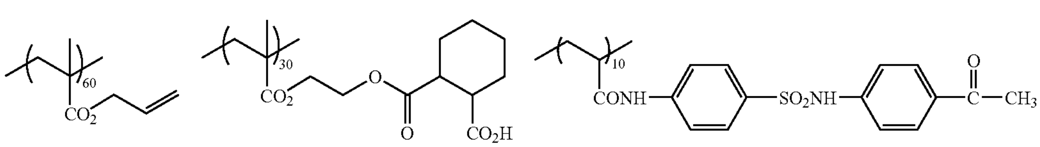
Mw 95,000

-continued
PA-90
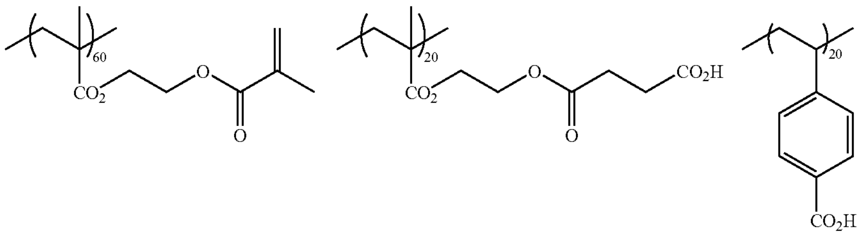
Mw 100,000
PA-91
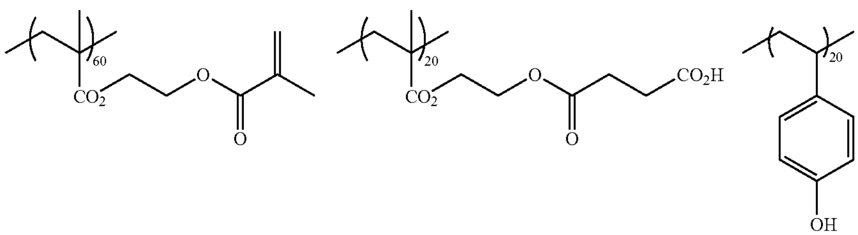
Mw 90,000
PA-92
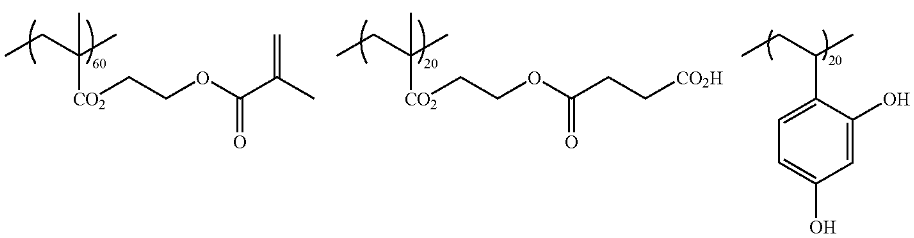
Mw 105,000
PA-93
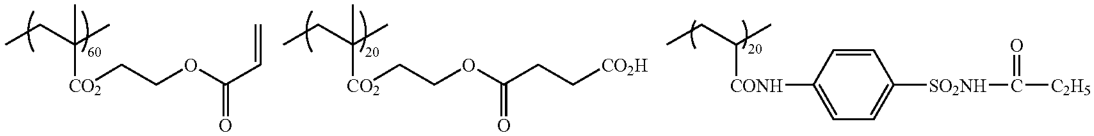
Mw 105,000
PA-94
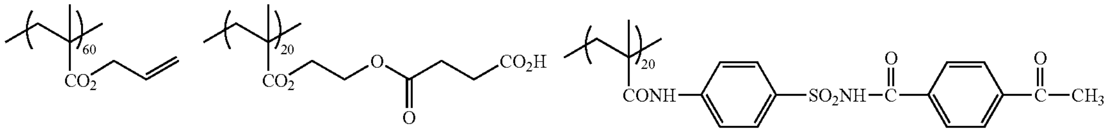
Mw 100,000

-continued
PA-95
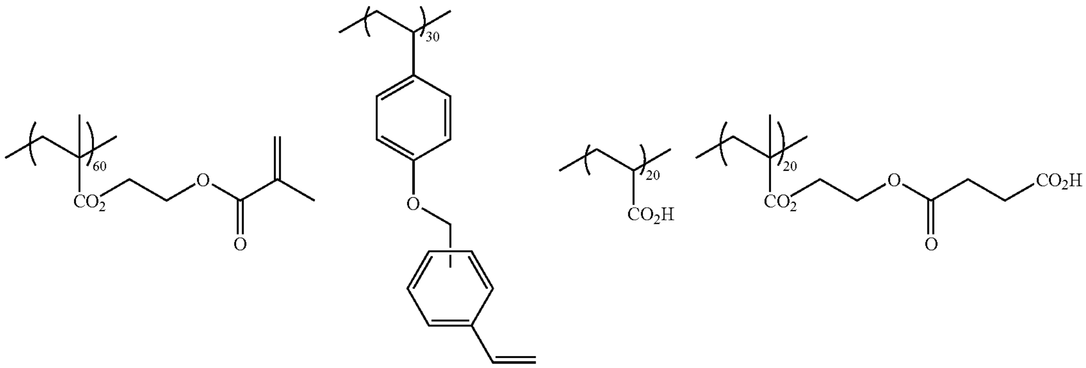
Mw 100,000
PA-96
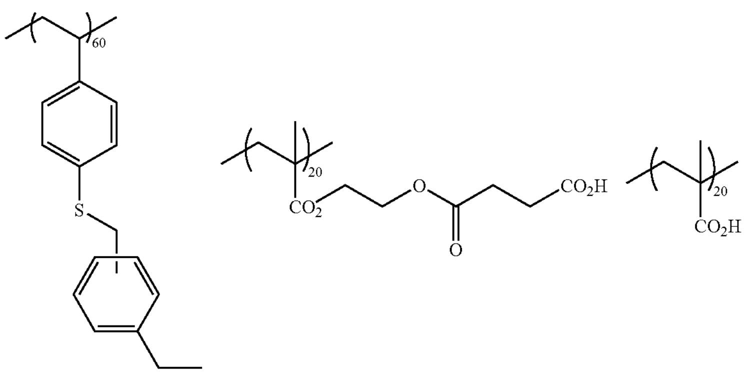
Mw 90,000
PA-97
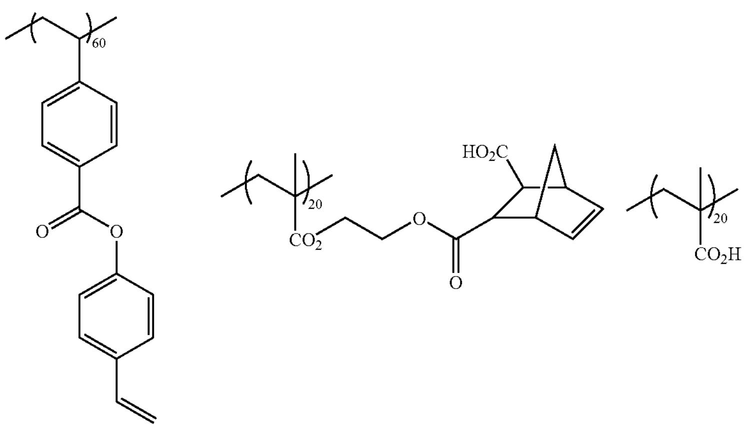
Mw 100,000
PA-98
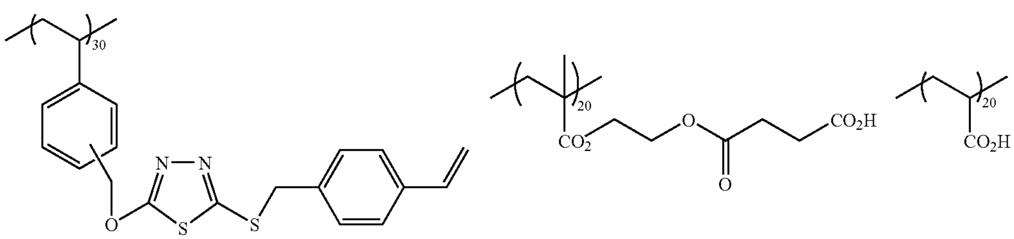
Mw 100,000

-continued
PA-99
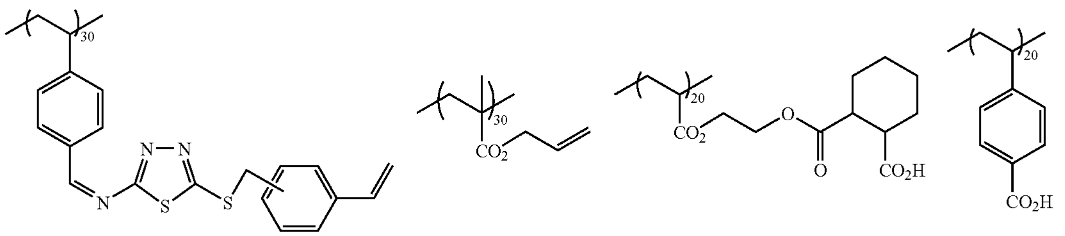
Mw 110,000
PA-100
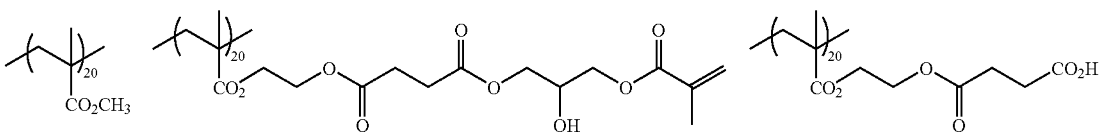
Mw 100,000
PA101
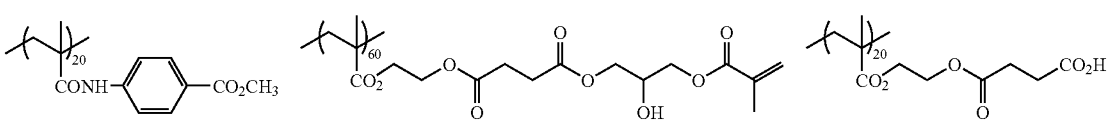
Mw 110,000
PA-102
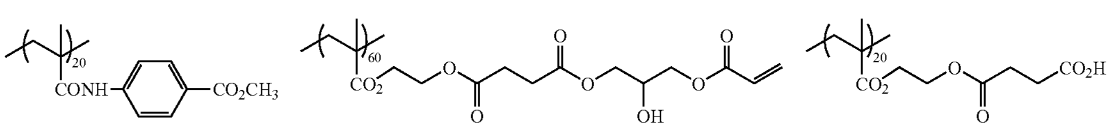
Mw 100,000
PA-103
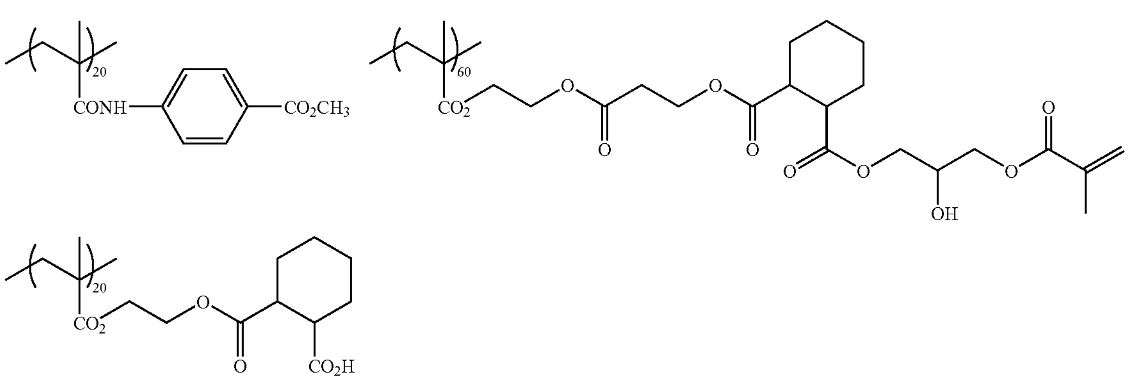
Mw 80,000

-continued
PA-104
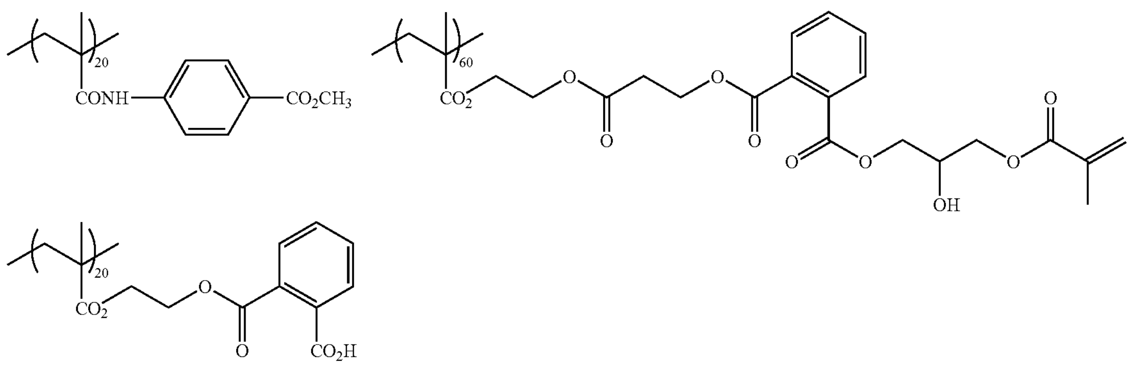
Mw 95,000
PA-105
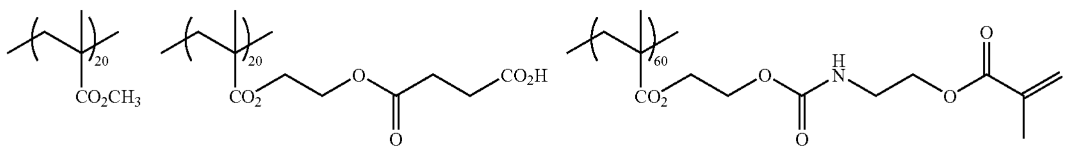
Mw 100,000
PA-106
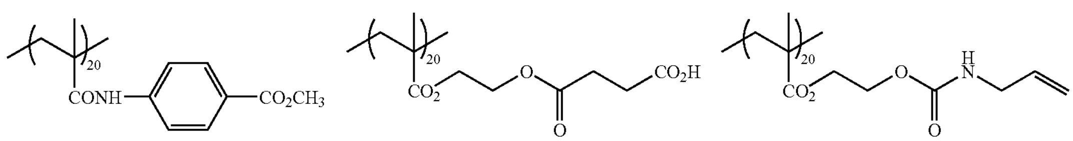
Mw 110,000
PA107
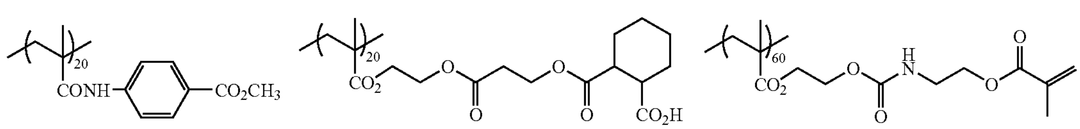
Mw 100,000
PA-108
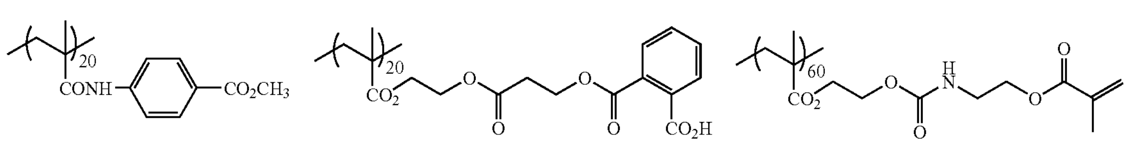
Mw 100,000
PA-109
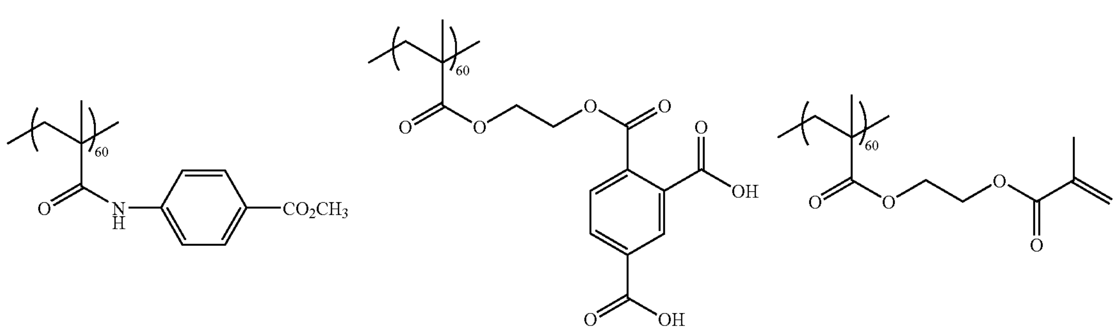
Mw 82,000

-continued
PB-1
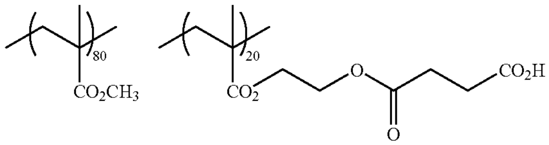
Mw 100,000
PB-2
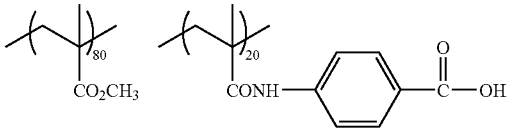
Mw 95,000
PB-3
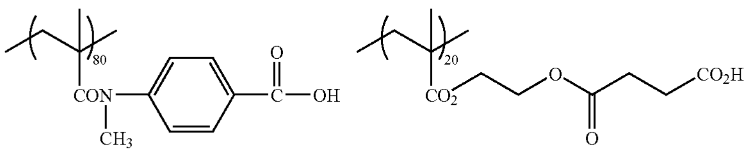
Mw 100,000
PB-4
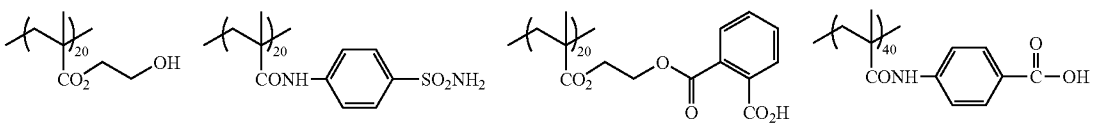
Mw 100,000
PB-5
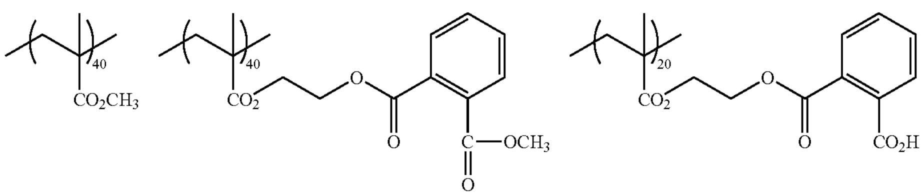
Mw 90,000
PB-6
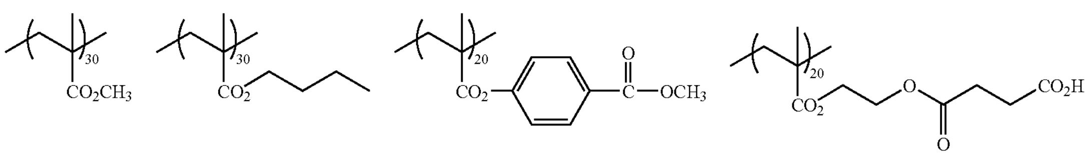
Mw 95,000
PB-7
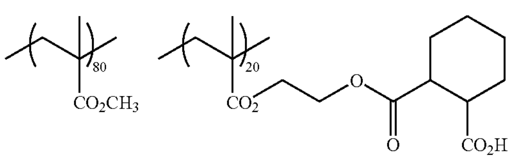
Mw 110,000
PB-8
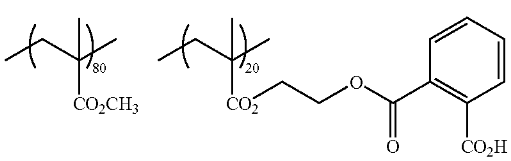
Mw 120,000

-continued

PB-9

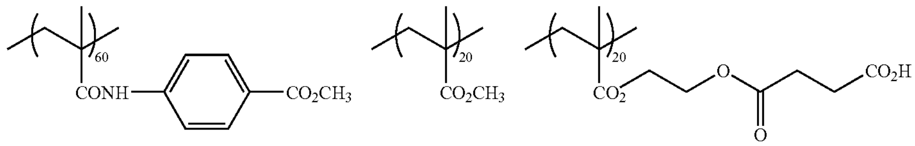

MW 100,000

PB-10

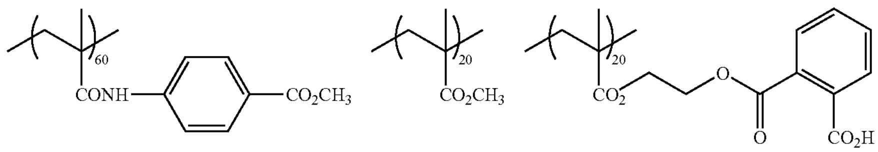

MW 85,000

PB-11

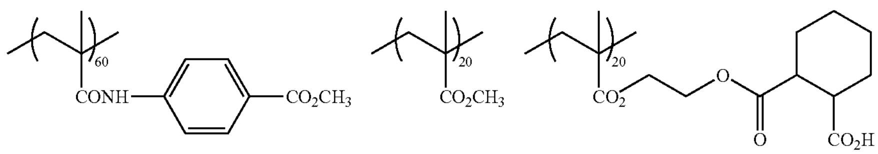

MW 100,000

PB-12

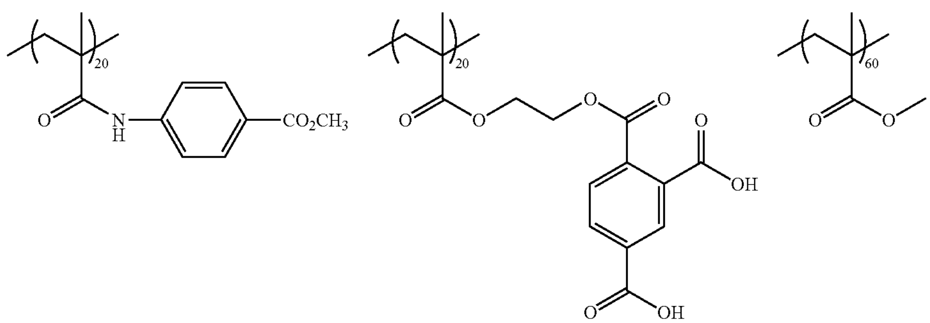

MW 79,000

As another preferable embodiment of the binder polymer according to the invention, polyurethane (hereinafter, also referred to as a specific polyurethane) is exemplified.

The specific polyurethane according to the invention is synthesized using a diol compound represented by formula (2) shown below as a starting material. Specifically, it is preferably a polymer compound obtained by reaction of diol compounds including the specific diol compound represented by formula (2) with one or more isocyanate compounds.

In the polymer compound synthesized using a diol compound represented by formula (2) as a starting material, the structure represented by —O-$L^1$-$X^1$-$L^2$-O— and the connecting group represented by $L^3$ correspond to P and L in formula (1), respectively.

The diol compound represented by formula (2) is described below.

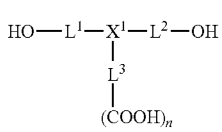

(2)

In formula (2), $X^1$ represents a trivalent or higher valent atom, $L^1$ and $L^2$ each independently represents a single bond or an alkylene group, provided that both of $L^1$ and $L^2$ are not single bonds at the same time, $L^3$ represents an (n+1) valent connecting group, and n represents an integer of 1 to 5.

The compound represented by formula (2) is described in greater detail below.

In formula (2), $X^1$ represents a trivalent or higher valent atom. The trivalent or higher valent atom includes, for example, a nitrogen atom, a carbon atom or a silicon atom. Of the atoms, a nitrogen atom and a carbon atom are preferable. The expression that the atom represented by $X^1$ has three or higher valences indicates that $X^1$ has at least three bonds of $L^1$, $L^2$ and $L^3$ connecting to the terminal —COOH group. $X^1$ may further have a hydrogen atom or a substituent.

The substituent capable of being introduced into $X^1$ includes substituents composed of atoms selected from a carbon atom, a hydrogen atom, an oxygen atom, a sulfur atom and a halogen atom. Specifically, a hydrocarbon group having from 1 to 50 carbon atoms is preferable.

$L^1$ and $L^2$ in formula (2) each independently represents a single bond or an alkylene group, provided that both of $L^1$ and $L^2$ are not single bonds at the same time. The alkylene group is preferably an alkylene group having from 1 to 20 carbon atoms, and more preferably an alkylene group having from 2 to 10 carbon atoms. The alkylene group may have a substituent and examples of the substituent capable of being introduced into the alkylene group include a halogen atom (for example, —F, —Br, —Cl or —I) and an alkyl group which may have a substituent.

$L^3$ in formula (2) represents an (n+1) valent connecting group. The connecting group preferably does not contain a cyclic structure in its structure. The connecting group represented by $L^3$ includes connecting groups composed of two or more atoms selected from a carbon atom, a hydrogen atom, an oxygen atom, a nitrogen atom and a sulfur atom. More specifically, a number of atoms constituting the main skeleton of the connecting group represented by $L^3$ is preferably from 1 to 30, more preferably from 3 to 25, still more preferably from 4 to 20, and most preferably from 5 to 10. The term "main skeleton of the connecting group" as used herein means an atom or an atomic group only used for connecting $x^1$ and COOH at the terminal in formula (2) and when plural connecting routes are present, it means an atom or an atomic group constituting the route in which the number of atoms included is smallest.

Structures of the compound represented by formula (2) are illustrated below and a number of atoms constituting the main skeleton of the connecting group represented by $L^3$ and a method for calculation thereof in each structure are also indicated.

The connecting group represented by $L^3$ in formula (2) more specifically includes an alkylene group, a substituted alkylene group, an arylene group and a substituted arylene group and may also have a structure wherein these divalent groups are plurally connected with each other through, individually or in combination, —O—, —S—, —N($R^A$)—, —C(═O)—, —OC(═O)—, —C(═O)O—, —NHC(═O)O— or —NHC(═O)NH—. $R^A$ represents a hydrogen atom or a monovalent hydrocarbon group having from 1 to 10 carbon atoms.

As the connecting group of a chain structure, an ethylene group or a propylene group is exemplified. Also, a structure wherein the alkylene groups are plurally connected with each other through an ester bond is preferably exemplified.

In formula (2), n represents an integer of 1 to 5, and preferably 1 from the standpoint, for example, of printing durability.

| | | Number of atoms constituting main skeleton of connecting group |
|---|---|---|
| (1) | 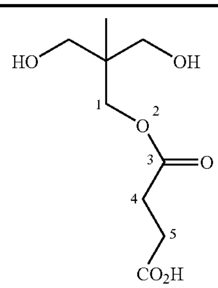 | 5 |
| (2) | 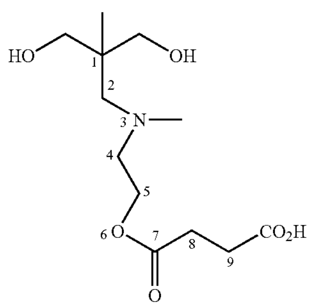 | 9 |
| (3) | 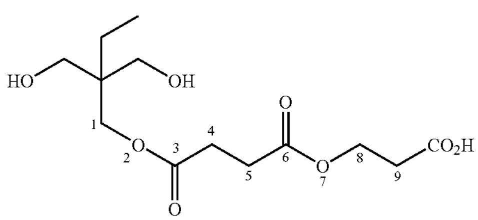 | 9 |
| (4) | 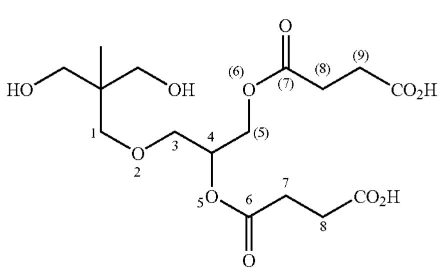 | 8 |

Of the compounds represented by formula (2), compounds represented by formula (2-a) shown below or compounds represented by formula (2-b) shown below are more preferable.

(2-a)

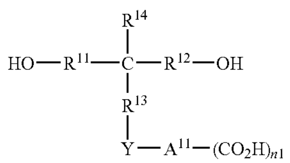

In formula (2-a), $R^{11}$, $R^{12}$ and $n^1$ have the same meanings as $L^1$, $L^2$ and n defined in formula (2), respectively. $R^{13}$ represents an alkylene group. $R^{14}$ represents a straight-chain or cyclic alkyl group. Y represents an oxygen atom, a nitrogen atom or a sulfur atom. $A^{11}$ represents a connecting group and more specifically includes an alkylene group, a substituted alkylene group, an arylene group and a substituted arylene group and may also have a structure wherein these divalent groups are plurally connected with each other through, individually or in combination, —O—, —S—, —N($R^A$)—, —C(═O)—, —OC(═O)—, —C(═O)O—, —NHC(═O)O— or —NHC(═O)NH—. $R^A$ represents a hydrogen atom or a monovalent hydrocarbon group having from 1 to 10 carbon atoms.

(2-b)

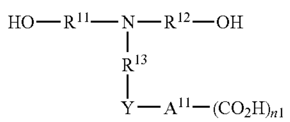

In formula (2-b), $R^{11}$, $R^{12}$ and $n^1$ have the same meanings as $L^1$, $L^2$ and n defined in formula (2), respectively. $R^{13}$ represents an alkylene group. Y represents an oxygen atom, a nitrogen atom or a sulfur atom. $A^{11}$ has the same meaning as $A^{11}$ defined in formula (2-a).

In formula (2-a) or (2-b), a number of atoms constituting the main skeleton of the straight-chain connection group represented by $A^{11}$ is preferably from 1 to 20, more preferably from 2 to 10, and still more preferably from 3 to 7.

In formula (2-a) or (2-b), the alkylene group represented by $R^{13}$ is preferably an alkylene group having from 1 to 20 carbon atoms, more preferably an alkylene group having from 1 to 10 carbon atoms, and still more preferably an alkylene group having from 1 to 5 carbon atoms. The alkylene group may have a substituent and examples of the substituent capable of being introduced include an alkyl group or an ethylene oxide group. The alkylene group is more preferably an alkylene group having no substituent.

In formula (2-a), the alkyl group represented by $R^{14}$ is preferably an alkyl group having from 1 to 50 carbon atoms, more preferably an alkyl group having from 1 to 20 carbon atoms, and still more preferably an alkyl group having from 1 to 15 carbon atoms. The alkyl group specifically includes, for example, a methyl group and an ethyl group. The alkyl group may have a substituent and examples of the substituent capable of being introduced include a halogen atom and an alkyl group.

Preferable specific examples of the compound represented by formula (2) are set forth below, but the invention should not be construed as being limited thereto.

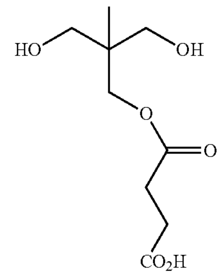

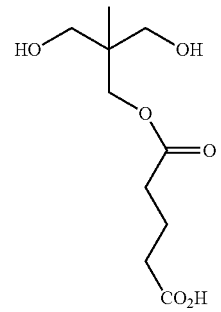

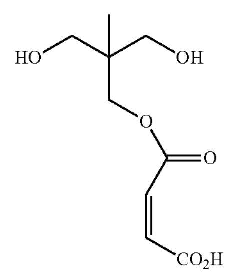

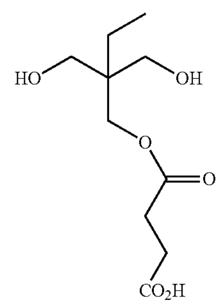

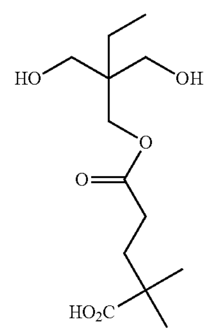

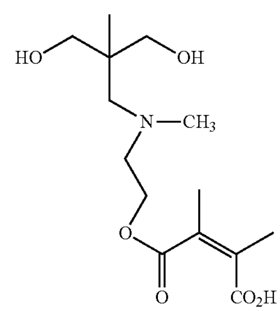

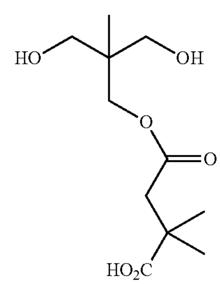

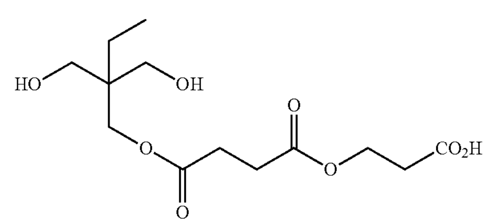

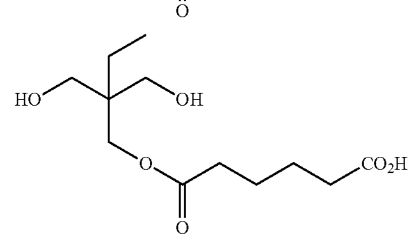

-continued
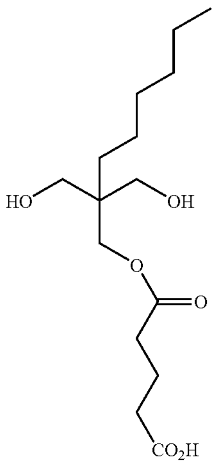
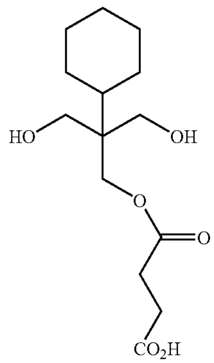
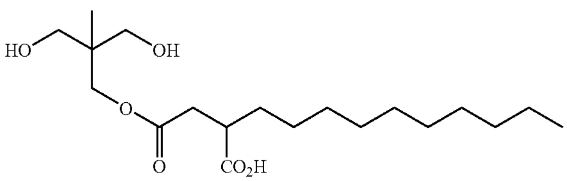
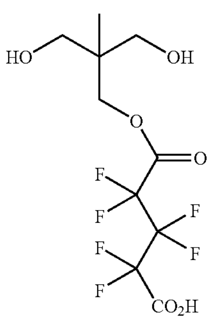
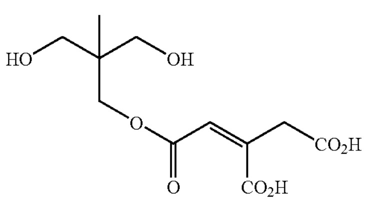
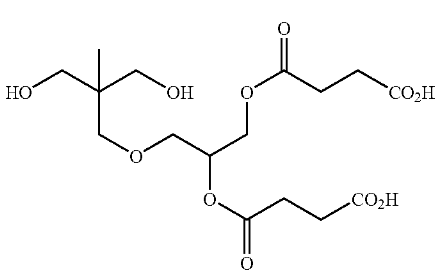
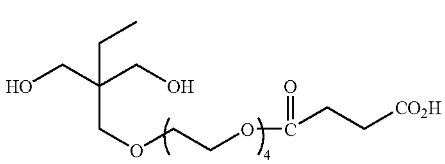
-continued
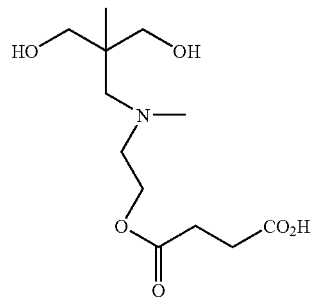
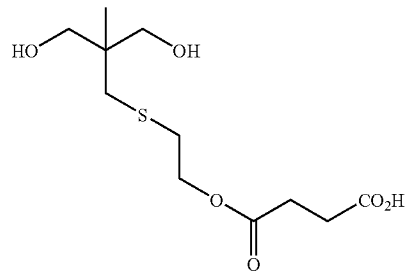
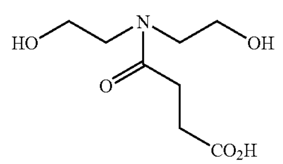
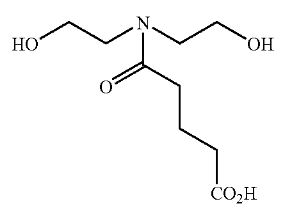
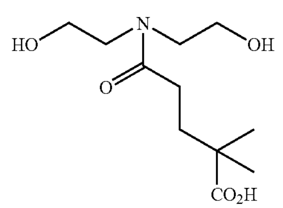
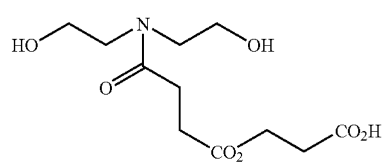
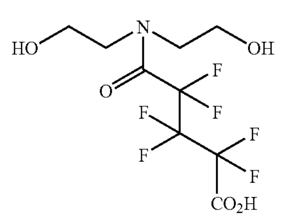
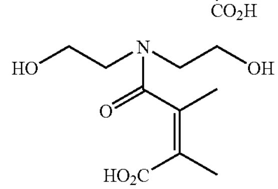

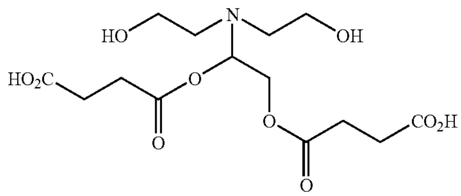
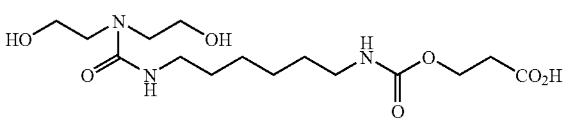
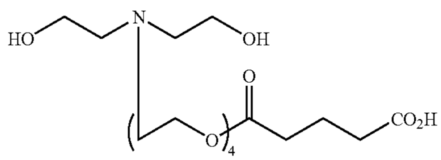
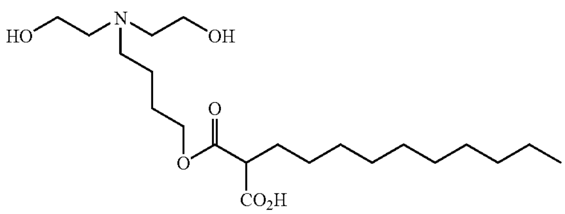
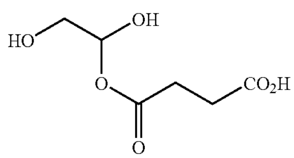
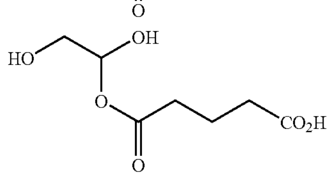
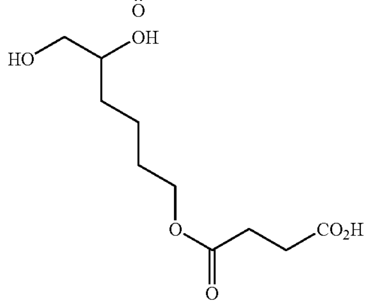
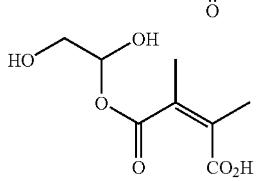
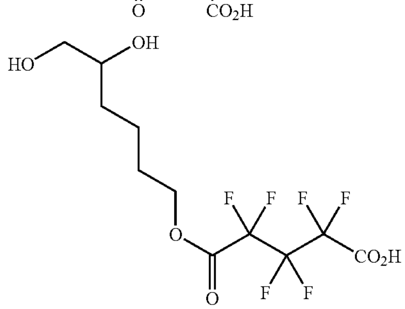
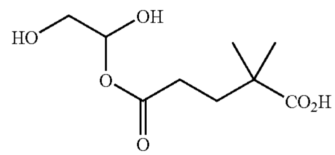
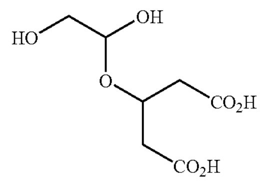
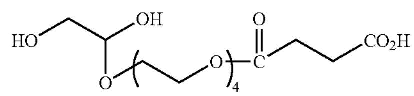
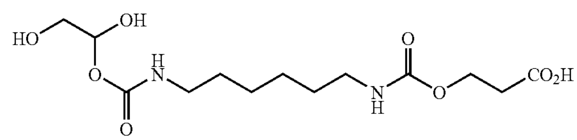
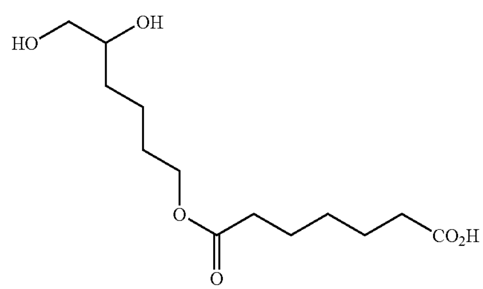
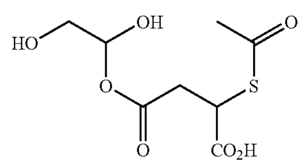
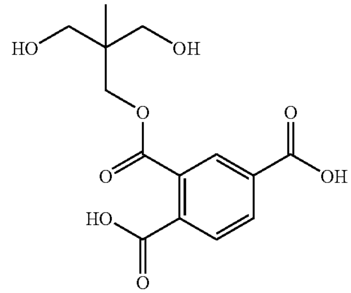
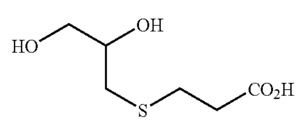
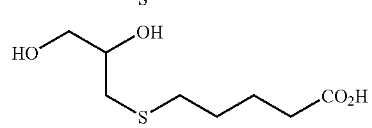
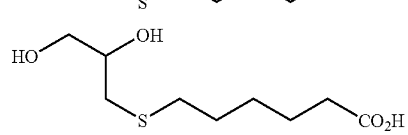

-continued

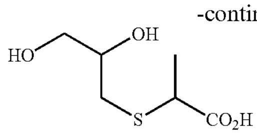

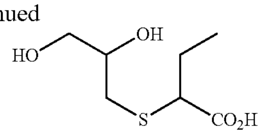

One kind or two or more kinds of structures derived from the compound represented by formula (2) may be contained in the specific polyurethane.

Since the connecting group having a structure containing an ester group has concerns about undergoing hydrolysis in the buffer solution having pH of 7.0 to 11.0, of the compounds represented by formula (2-a), a compound represented by formula (2-c) shown below is most preferable.

(2-c)

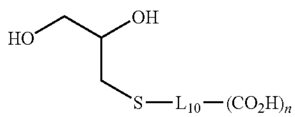

In formula (2-c), $L_{10}$ represents an (n+1) valent connecting group, and n represents an integer of 1 to 5. The connecting group represented by $L_{10}$ includes connecting groups composed of two or more atoms selected from a carbon atom, a hydrogen atom, an oxygen atom, a nitrogen atom and a sulfur atom. More specifically, a number of atoms constituting the main skeleton of the connecting group represented by $L_{10}$ is preferably from 1 to 50, more preferably from 3 to 30, still more preferably from 4 to 25, and most preferably from 5 to 20. It is more preferred that n is 1 and $L_{10}$ is an alkylene group, a substituted alkylene group, an arylene group or a substituted arylene group.

In the specific polyurethane, the total content of the repeating unit derived from the compound represented by formula (2) may be appropriately determined according to the structure thereof, the design of the photosensitive layer and it is preferably in a range from 1 to 50% by mole, more preferably from 10 to 50% by mole, still more preferably from 15 to 50% by mole, based on the total molar amount of the polymer component.

Further, for the purpose of preventing the occurrence of development scum due to the binder polymer in a developer, the specific polyurethane may contain a component derived from a compound having a functional group capable of forming an acid group by alkali hydrolysis represented by formula (4) shown below.

The compound represented by formula (4) is described below. The compound is characterized by having the functional group (hereinafter, appropriately referred to as a specific functional group) capable of forming an acid group by hydrolysis with an aqueous alkali solution.

(4)

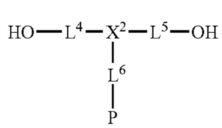

In formula (4), $X^2$ represents a trivalent or higher valent atom. The trivalent or higher valent atom includes, for example, a nitrogen atom, a carbon atom or a silicon atom. Of the atoms, a nitrogen atom and a carbon atom are preferable. The expression that the atom represented by $X^2$ has three or higher valences indicates that $X^2$ has at least three bonds of $L^4$, $L^5$ and $L^6$ connecting to a functional group P. $X^2$ may further have a hydrogen atom or a substituent.

The substituent capable of being introduced into $X^2$ includes substituents composed of atoms selected from a carbon atom, a hydrogen atom, an oxygen atom, a sulfur atom and a halogen atom. Specifically, a hydrocarbon group having from 1 to 50 carbon atoms is preferable.

$L^4$ and $L^5$ each independently represents a single bond or an alkylene group which may have a substituent, provided that both of $L^4$ and $L^5$ are not single bonds at the same time. $L^6$ represents a single bond or a connecting group. When $L^6$ represents a connecting group, a number of atoms constituting the main skeleton of the connecting group is 6 or less.

The connection group represented by $L^6$ includes connecting groups composed of two or more atoms selected from a carbon atom, a hydrogen atom, an oxygen atom, a nitrogen atom and a sulfur atom. More specifically, a number of atoms constituting the main skeleton of the connection group represented by $L^6$ is preferably from 2 to 6, more preferably from 3 to 6, and still more preferably from 4 to 6. The term "main skeleton of the connecting group" as used herein means an atom or an atomic group only used for connecting $x^2$ and P at the terminal in formula (4) and the method for calculation of number of atoms constituting the main skeleton is same as that described with respect to $L^3$ above.

P represents a functional group capable of forming an acid group by alkali hydrolysis.

A pKa of the acid group formed from P after hydrolysis is preferably 10 or less. The acid group includes, for example, a carboxyl group, a sulfo group, a phosphoric acid group and a phenolic hydroxy group. Among them, an acid having pKa of 3 to 10 is more preferable and from such a standpoint, a functional group capable of forming an acid group, for example, —COOH is preferable.

The specific functional group P is not particularly restricted as long as it is a functional group capable of forming an acid group by hydrolysis with an aqueous alkali solution. The specific functional group P includes, for example, functional groups obtained by reaction of the acid group described above with a protective group. As the protective group constituting P, for example, protective groups described in Theodora W Greene, et al., *Protective Groups in Organic Synthesis* (1999) can be utilized.

$L^6$ may be a trivalent or higher valent connecting group. In such a case, formula (4) is represented by formula (4-a) shown below, wherein n2 represents an integer of 2 to 5.

(4-a)

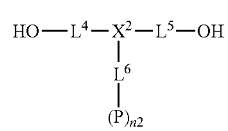

The specific functional group according to the invention is more preferably a functional group represented by formula (5) shown below.

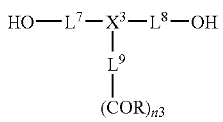

(5)

In formula (5), $X^3$ has the same meaning as $X^2$ defined in formula (4) and preferable embodiments are also same as those described for $X^2$ above. $L^7$ and $L^8$ have the same meanings as $L^4$ and $L^5$ defined in formula (4) respectively and preferable embodiments are also same as those described for $L^4$ and $L^5$ above. $L^9$ has the same meaning as $L^6$ defined in formula (4) and preferable embodiments are also same as those described for $L^6$ above.

R represents —$NR^{41}R^{42}$, —$SR^{43}$ or —$OR^{44}$. $R^{41}$ to $R^{44}$ each independently represents a substituent constituting from one or more atoms selected from a carbon atom, a hydrogen atom, an oxygen atom, a nitrogen atom, a sulfur atom and a halogen atom and includes, for example, an alkyl group which may have a substituent or an aryl group which may have a substituent.

R can be appropriately selected in order to control the hydrolysis rate and is preferably —$OR^{44}$, more preferably —$OCH_3$.

n3 represents an integer of 1 to 5.

In order to introduce the specific functional group into the polymer compound, a method of copolymerization of a monomer having the specific functional group in its molecule using a known polymerization method is exemplified. Other monomer having no specific functional group may also be copolymerized at the same time, if desired. In the invention, a structural unit derived from the monomer in the polymer compound obtained by the copolymerization is referred to as a unit in sometimes.

Preferable specific examples of the unit having the specific functional group represented by formula (4) are set forth below, but the invention should not be construed as being limited thereto.

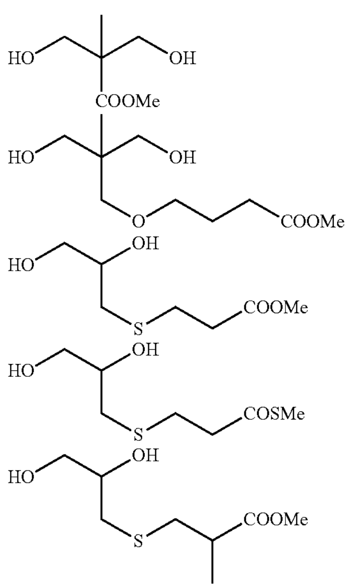

-continued

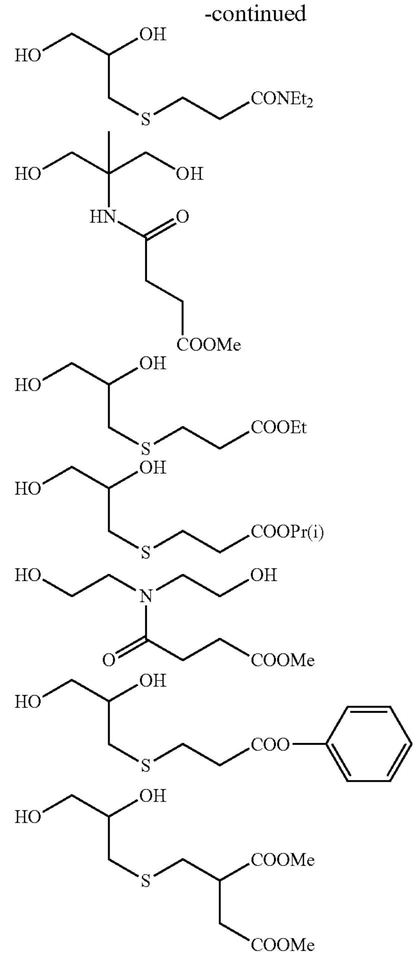

One kind or two or more kinds of units having the specific functional group may be contained in the specific polyurethane.

Although the specific polyurethane according to the invention may be a polymer composed of only a unit derived from the compound represented by formula (2) and a unit having the specific functional group as typified by the compound represented by formula (4), it is ordinarily used as a polymer also containing a unit derived from other copolymerization component described hereinafter. In the specific polyurethane, the total content of the unit having the specific functional group may be appropriately determined according to the structure thereof, the design of the photosensitive layer to which the specific polyurethane is applied and it is preferably in a range from 1 to 99% by mole, more preferably from 5 to 90% by mole, still more preferably from 10 to 70% by mole, based on the total molar amount of the polymer component.

The content of the specific functional group in the specific polyurethane according to the invention is preferably from 0.05 to 10.0 mmol, more preferably from 0.10 to 5.0 mmol, most preferably from 0.20 to 3.00 mmol, per g of the specific polyurethane.

<Basic Skeleton of Specific Polyurethane>

The specific polyurethane according to the invention is a polyurethane comprising as the basic skeleton, a structural unit represented by a reaction product of at least one diisocyanate compound represented by formula (I) shown below and at least one diol compound represented by formula (II) shown below. The specific polyurethane according to the invention is preferably synthesized using at least one of the diol compounds represented by formula (2) described above as the diol compound represented by formula (II) and more preferably synthesized using at least one of the diol compounds represented by formula (2) described above and at least one of the diol compounds having the specific functional group represented by formula (4) described above as the diol compound represented by formula (II).

$$OCN—X^0—NCO \quad (I)$$

$$HO—Y^0—OH \quad (II)$$

In formulae (I) and (II), $X^0$ and $Y^0$ each independently represents a divalent organic residue.

The specific polyurethane may be synthesized, for example, only from a diisocyanate compound and the diol compound represented by formula (2). However, it is ordinarily preferred to synthesize using plural kinds of diol compounds including as well as the diol compound represented by formula (2), other diol compound(s) in combination with the diisocyanate compound from the stand point of film properties of polyurethane affecting printing durability and developing property.

The weight average molecular weight of the specific polyurethane is preferably from 5,000 to 500,000, more preferably from 8,000 to 300,000, and most preferably from 10,000 to 150,000 in view of the image-forming property upon exposure and printing durability.

Further, the specific polyurethane according to the invention preferably contains in its side chain a functional group having an unsaturated bond. As the functional group having an unsaturated bond, groups represented by formulae (a) to (c) shown below are preferable and groups represented by formula (a) are most preferable. The groups represented by formulae (a) to (c) are described in detail below.

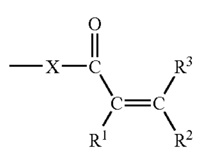

(a)

In formula (a), $R^1$ to $R^3$ each independently represents a hydrogen atom or a monovalent organic group. $R^1$ preferably includes, for example, a hydrogen atom or an alkyl group which may have a substituent. Among them, a hydrogen atom or a methyl group is preferable because of high radical reactivity. $R^2$ and $R^3$ each independently preferably includes, for example, a hydrogen atom, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferable because of high radical reactivity.

X in formula (a) represents an oxygen atom, a sulfur atom or —N($R^{12}$)—, and $R^{12}$ represents a hydrogen atom or a monovalent organic group. The monovalent organic group represented by $R^{12}$ includes, for example, an alkyl group which may have a substituent. Among them, $R^{12}$ is preferably a hydrogen atom, a methyl group, an ethyl group or an isopropyl group because of high radical reactivity.

Examples of the substituent capable of being introduced include an alkyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amino group, an alkylsulfonyl group and an arylsulfonyl group.

(b)

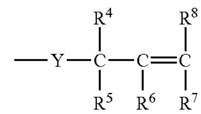

In formula (b), $R^4$ to $R^8$ each independently represents a hydrogen atom or a monovalent organic group. $R^4$ to $R^8$ each independently preferably includes, for example, a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferable.

Examples of the substituent capable of being introduced include those described in formula (a). Y represents an oxygen atom, a sulfur atom or —N($R^{12}$)—, and $R^{12}$ has the same meaning as $R^{12}$ defined in formula (a). Preferable examples for $R^{12}$ are also same as those described in formula (a).

(c)

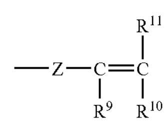

In formula (c), $R^9$ to $R^{11}$ each independently represents a hydrogen atom or a monovalent organic group. $R^9$ preferably includes a hydrogen atom or an alkyl group which may have a substituent. Among them, a hydrogen atom or a methyl group is preferable because of high radical reactivity. $R^{10}$ and $R^{11}$ each independently represents, for example, a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferable because of high radical reactivity.

Examples of the substituent introduced include those described in formula (a). Z represents an oxygen atom, a sulfur atom, —N($R^{13}$)— or a phenylene group which may have a substituent. $R^{13}$ includes an alkyl group which may have a substituent or the like. Among them, a methyl group, an ethyl group or an isopropyl group is preferable because of high radical reactivity.

In order to introduce the unsaturated bond into the side chain of the specific polyurethane, at least one of the diisocyanate compound represented by formula (I) and the diol compound represented by formula (II) has at least one of the groups represented by formulae (a) to (c). As a reaction product of the diisocyanate compound and the diol compound, the specific polyurethane having the group represented by any of formulae (a) to (c) is prepared. According to the method, the specific polyurethane can be easily produced in comparison with a method wherein the desired side chain is substituted to introduce the unsaturated bond after the preparation of polyurethane.

The diisocyanate compound used for introducing an unsaturated group into the side chain of the specific polyurethane includes, for example, a product obtained by an addition reaction between a triisocyanate compound and one equivalent of a monofunctional alcohol or monofunctional amine compound having an unsaturated bond.

The triisocyanate compound includes, for example, compounds set forth below, but the invention should not be construed as being limited thereto.

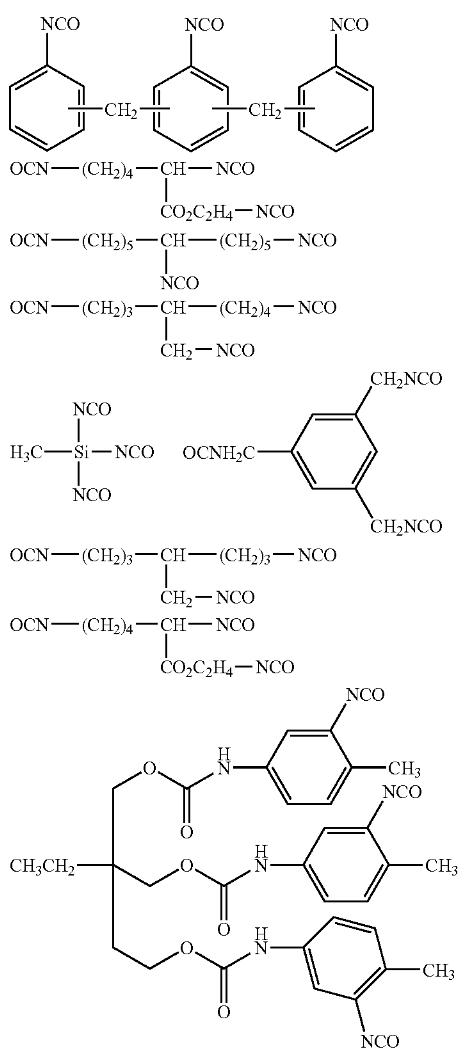

-continued

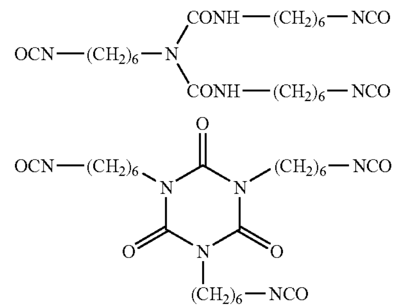

The monofunctional alcohol or monofunctional amine compound having an unsaturated group includes, for example, compounds set forth below, but the invention should not be construed as being limited thereto.

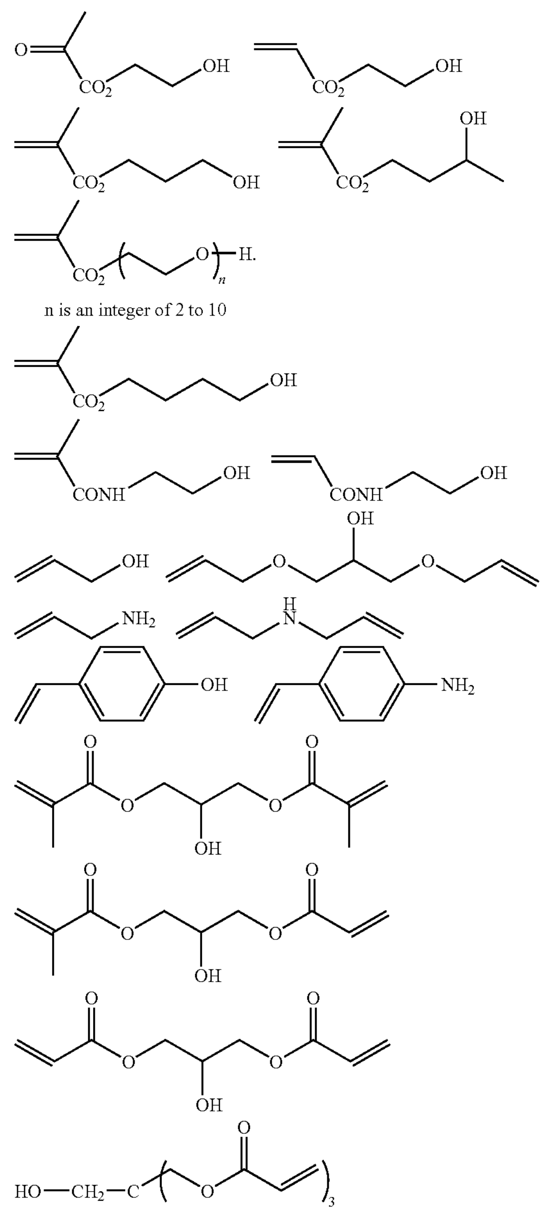

-continued

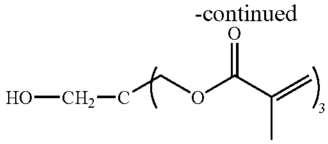

In order to introduce an unsaturated group into the side chain of the polyurethane, a method of using as a starting material for the production of polyurethane, a diisocyanate compound having an unsaturated group in its side chain is preferable. The diisocyanate compound having an unsaturated group in its side chain obtained by an addition reaction between a triisocyanate compound and one equivalent of a monofunctional alcohol or monofunctional amine compound having an unsaturated group includes, for example, compounds set forth below, but the invention should not be construed as being limited thereto.

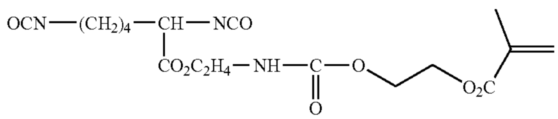

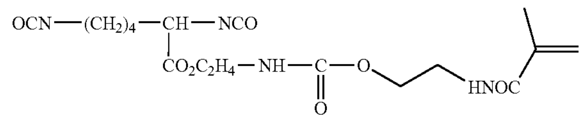

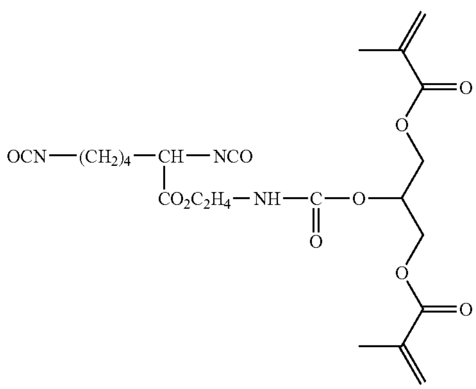

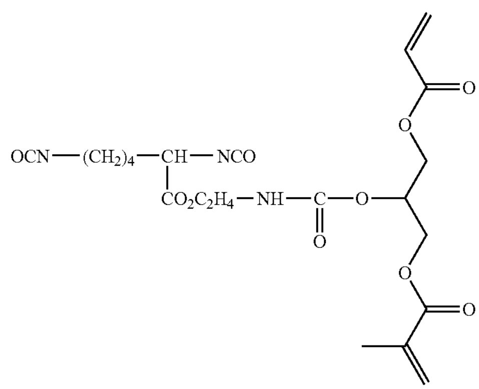

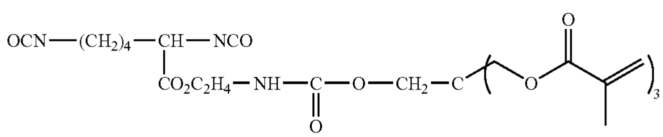

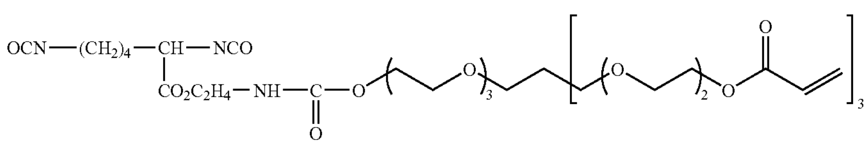

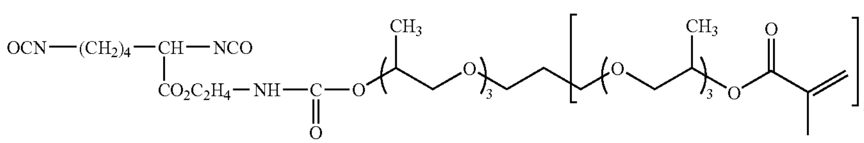

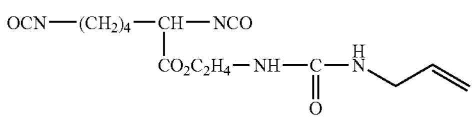

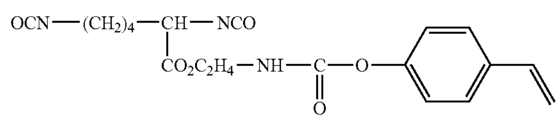

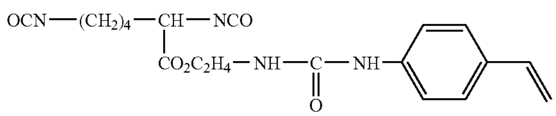

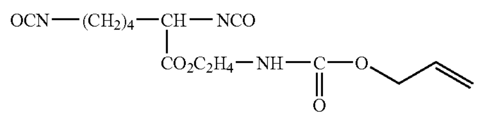

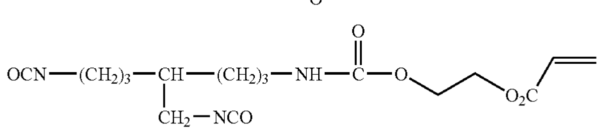

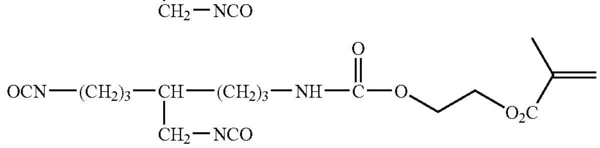

-continued
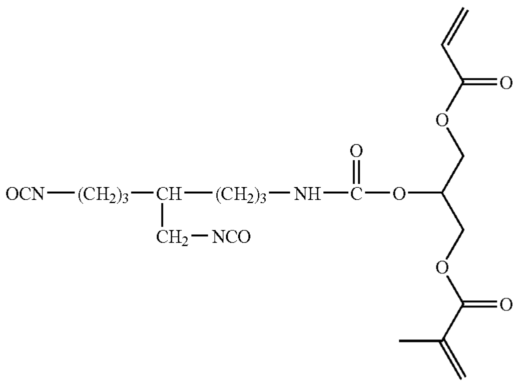
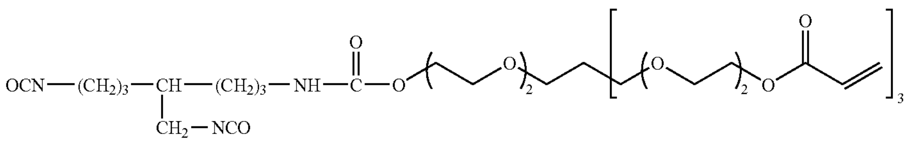
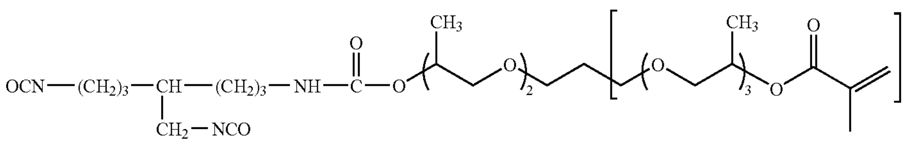
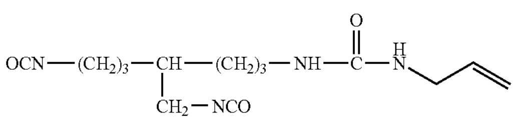
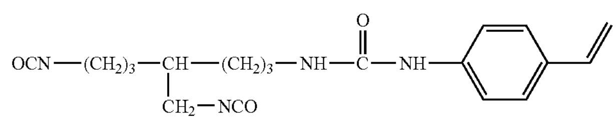
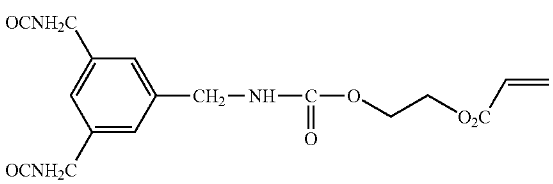
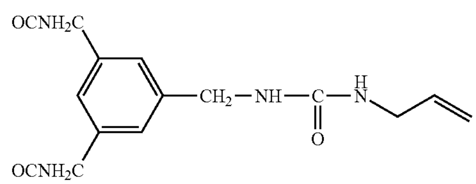
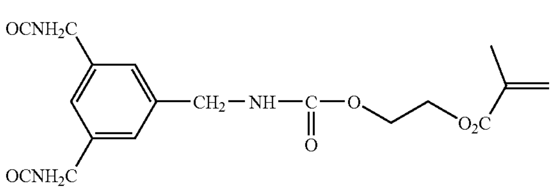
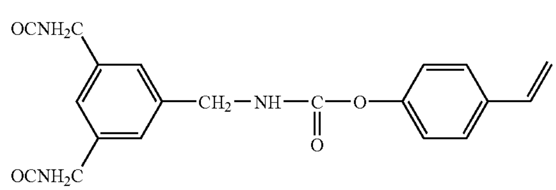
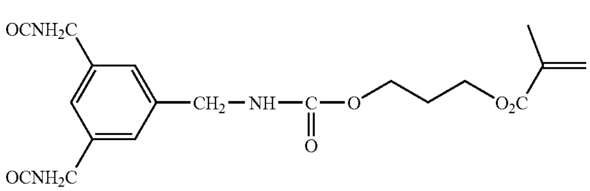
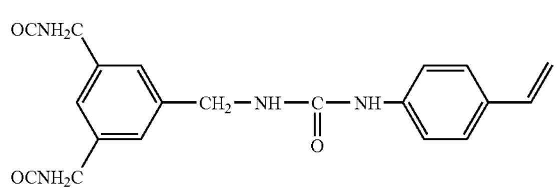
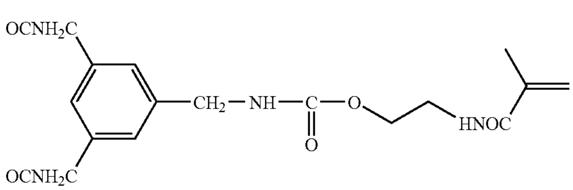

-continued
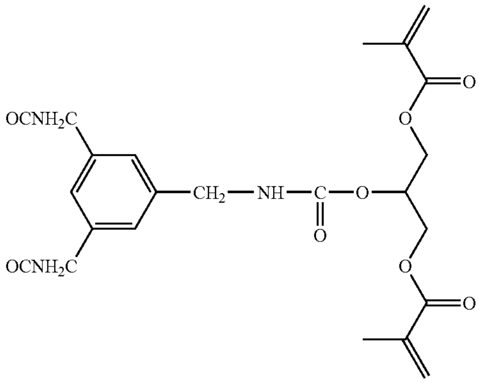
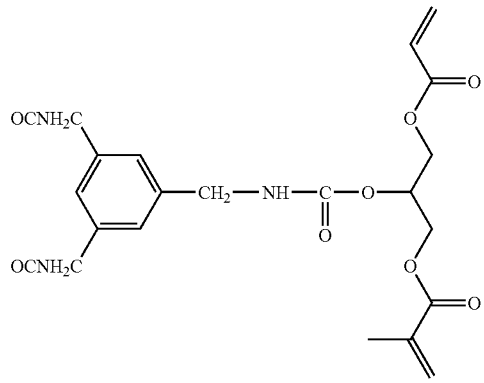
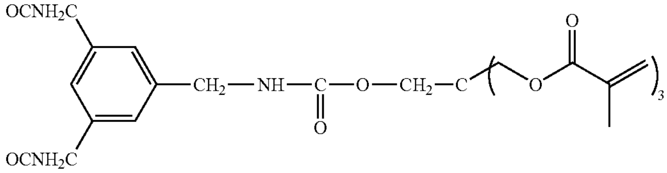
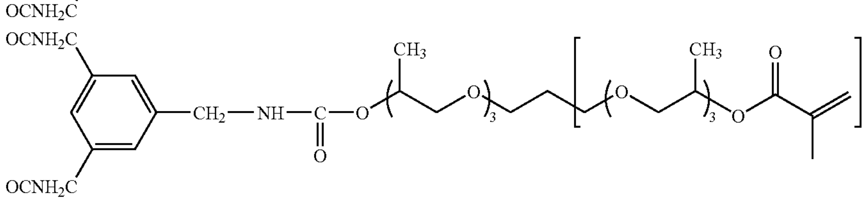
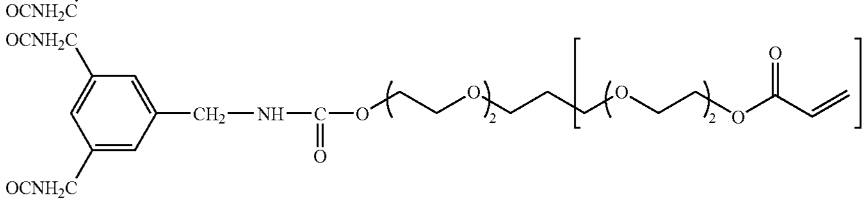
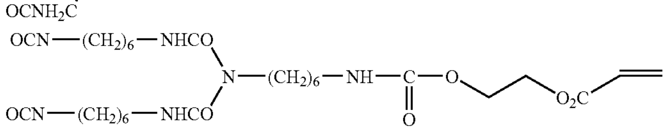
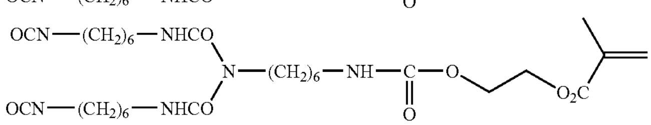
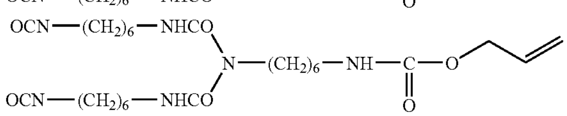
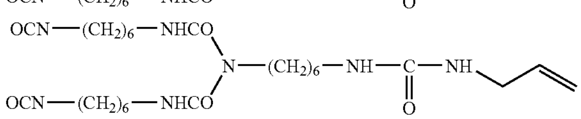
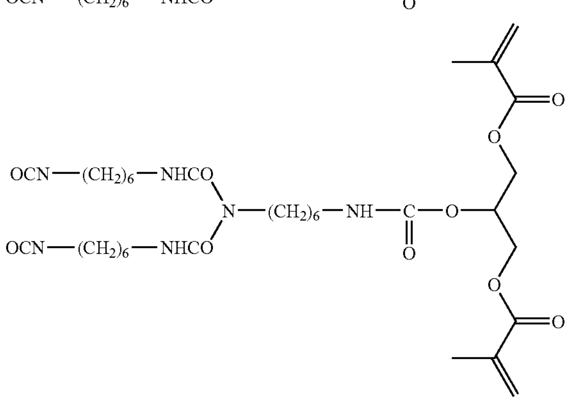

-continued

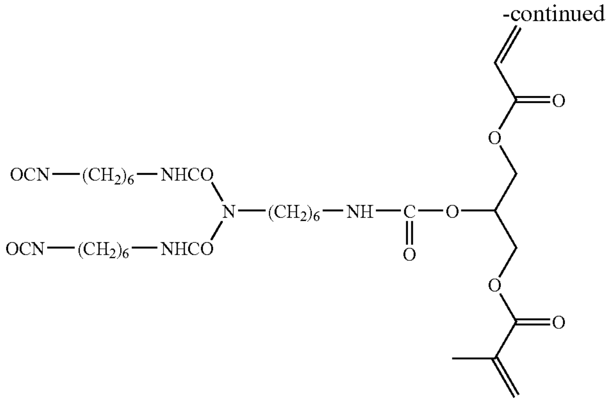

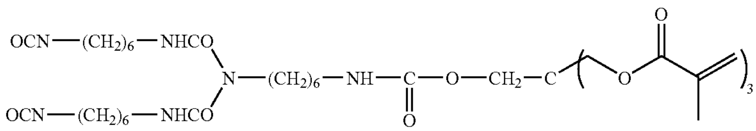

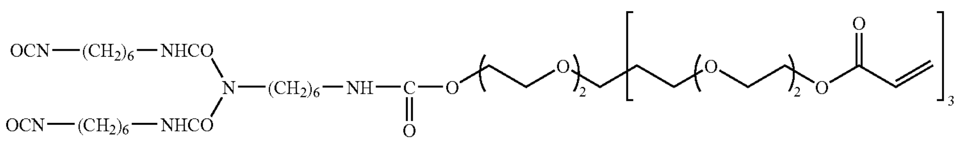

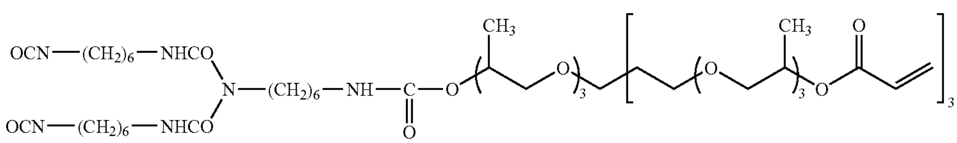

A method of using a diol compound having an unsaturated bond in its side chain as a raw material for the production of polyurethane is also preferable for introducing an unsaturated bond into the side chain of the specific polyurethane. Such a diol compound may be a commercially available compound, for example, glycerol monomethacrylate or trimethylolpropane monoallyl ether or a compound easily produced by a reaction of a halogenated diol compound, a triol compound or an aminodiol compound with a carboxylic acid, acid chloride, isocyanate, alcohol, amine, thiol or halogenated alkyl compound having an unsaturated group. Specific examples of the compounds include compounds described in Paragraph No. [0064] of JP-A-2002-251008.

In the production of the specific polyurethane, other diisocyanate compound and/or other diol compound conventionally known other than those described above can be used without limitation in the range in which the effects of the invention are not damaged in combination of the diisocyanate compound represented by formula (I) and the diol compound represented by formula (II). Specifically, compounds described in The Society of Polymer Science, Japan ed., *Kobunshi Data Handbook-Kisohen* (*Polymer Data Handbook-Fundamental Volume*), Baifukan Co., Ltd (1986) are exemplified. Such other diisocyanate compounds and other diol compounds may be used individually or in combination of two or more thereof.

Specific examples of other diisocyanate compound include an aromatic diisocyanate compound, for example, 2,4-tolylene diisocyanate, dimer of 2,4-tolylene diisocyanate, 2,6-tolylene diisocyanate, p-xylylene diisocyanate, m-xylylene diisocyanate, 4,4'-diphenylmethane diisocyanate, 1,5-naphthalene diisocyanate or 3,3'-dimethylbiphenyl-4,4'-diisocyanate; an aliphatic diisocyanate compound, for example, hexamethylene diisocyanate, trimethylhexamethylene diisocyanate, lysine diisocyanate or dimeric acid diisocyanate; an alicyclic diisocyanate compound, for example, isophorone diisocyanate, 4,4'-methylenebis(cyclohexyl isocyanate), methylcyclohexane-2,4(or 2,6)-diisocyanate or 1,3-(isocyanatomethyl)cyclohexane; and a diisocyanate compound obtained by a reaction of a diol with a diisocyanate, for example, an adduct of 1 mole of 1,3-butylene glycol with 2 moles of tolylene diisocyanate.

Specific examples of other diol compound include ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexane dimethanol, tricyclodecane dimethanol, hydrogenated bisphenol A, hydrogenated bisphenol F, ethylene oxide adduct of bisphenol A, propylene oxide adduct of bisphenol A, ethylene oxide adduct of bisphenol F, propylene oxide adduct of bisphenol F, ethylene oxide adduct of hydrogenated bisphenol A, propylene oxide adduct of hydrogenated bisphenol A, hydroquinone dihydroxy ethyl ether, p-xylylene glycol, dihydroxyethylsulfone, bis(2-hydroxyethyl)-2,4-tolylenedicarbamate, 2,4-tolylene-bis(2-hydroxyethylcarbamide), bis(2-hydroxyethyl)-m-xylylenedicarbamate, bis(2-hydroxyethyl)isophthalate, 1,3-propanediol, 1,4-butanediol, 1,5-pentanediol, 1,6-hexanediol, 1,7-heptandiol, 1,8-octanediol, 2-butene-1,4-diol, cis-2-butene-1,4-diol, trans-2-butene-1,4-diol, catechol, resorcine, hydroquinone, 4-methylcatechol, 4-tert-butylcatechol, 4-acetylcatechol, 3-methoxycatechol, 4-phenylcatechol, 4-methylresorcine, 4-ethylresorcine, 4-tert-butylresorcine, 4-hexylresorcine, 4-chlororesorcine, 4-benzylresorcine, 4-acetylresorcine, 4-carboxymethoxyresorcine, 2-methylresorcine, 5-methylresorcine, tert-butylhydroquinone, 2,5-di-tert-butylhydroquinone, 2,5-di-tert-amylhydroquinone, tetramethylhydroquinone, tetrachlorohydroquinone, methylcarboaminohydroquinone, methylureidohydroquinone, methylthiohydroquinone, benzonorbornene-3,6-diol, bisphenol A, bisphenol S, 3,3'-dichlorobisphenol S, 4,4'-dihydroxybenzophenone, 4,4'-dihydroxybiphenyl, 4,4'-thiodiphenol, 2,2'-dihydroxydiphenylmethane, 3,4-bis(p-hydroxyphenyl) hexane, 1,4-bis(2-p-hydroxyphenyl)propyl)benzene, bis(4-hydroxyphenyl)methylamine, 1,3-dihydroxynaphthalene, 1,4-dihydroxynaphthalene, 1,5-dihydroxynaphthalene, 2,6-dihydroxynaphthalene, 1,5-dihydroxyanthraquinone, 2-hydroxybezyl alcohol, 4-hydroxybezyl alcohol, 2-hydroxy-3,5-di-tert-butylbezyl alcohol, 4-hydroxy-3,5-di-tert-butylbezyl alcohol, 4-hydroxyphenethyl alcohol, 2-hydroxyethyl-4-hydroxybenzoate, 2-hydroxyethyl-4-hydroxyphenylacetate, resorcine mono-2-hydroxyethyl ether, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, 1,3-butylene glycol, di-1,3-butylene glycol, tri-1,3-butylene glycol, hexa-1,3-butylene glycol, polyethylene glycol having a weight average molecular weight of 1,000, polyethylene glycol having a weight average molecular weight of 1,500, polyethylene glycol having a weight average molecular weight of 2,000, polyethylene glycol having a weight average molecular weight of 3,000, polyethylene glycol having a weight average molecular weight of 7,500, polypropylene glycol having a weight average molecular weight of 400, polypropylene glycol having a weight average molecular weight of 700, polypropylene glycol having a weight average molecular weight of 1,000, polypropylene glycol having a weight average molecular weight of 2,000, polypropylene glycol having a weight average molecular weight of 3,000, polypropylene glycol having a weight average molecular weight of 4,000, a polyether diol compound, for example, PTMG650, PTMG1000, PTMG2000 and PTMG 3000, Newpol PE-61, Newpol PE-62, Newpol PE-64, Newpol PE-68, Newpol PE-71, Newpol PE-74, Newpol PE-75, Newpol PE-78, Newpol PE-108, Newpol PE-128, Newpol BPE-20, Newpol BPE-20F, Newpol BPE-20NK, Newpol BPE-20T, Newpol BPE-20G, Newpol BPE-40, Newpol BPE-60, Newpol BPE-100, Newpol BPE-180, Newpol BPE-2P, Newpol BPE-23P, Newpol BPE-3P, Newpol BPE-5P, Newpol 50HB-100, Newpol 50HB-260, Newpol 50HB-400, Newpol 50HB-660, Newpol 50HB-2000 and Newpol 50HB-5100, produced by Sanyo Chemical Industries, Ltd., an polyester diol compound and a polycarbonate diol compound.

Further, a diol compound having a carboxyl group, for example, 3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 2,2-bis(hydroxymethyl)butyric acid, 4,4-bis(4-hydroxyphenyl)pentanoic acid, tartaric acid, N,N-dihydroxyethylglycine or N,N-bis(2-hydroxyethyl)-3-carboxypropionamide may also be used in combination.

Moreover, an aliphatic diamine compound, for example, ethylenediamine, propylenediamine, tetramethylenediamine, pentamethylenediamine, hexamethylenediamine, heptamethylenediamine, octamethylenediamine, dodecamethylenediamine, propane-1,2-diamine, bis(3-aminopropyl) methylamine, 1,3-bis(3-aminopropyl)tetramethylsiloxane, piperazine, 2,5-dimethylpiperazine, N-(2-aminoethyl)piperazine, 4-amino-2,2,6,6-tetramethylpiperidine, N,N-dimethylethylenediamine, lysine, L-cystine or isophorondiamine; an aromatic diamine compound, for example, o-phenylenediamine, m-phenylenediamine, p-phenylenediamine, 2,4-tolylenediamine, benzidine, o-ditoluidine, o-dianisidine, 4-nitro-m-phenylenediamine, 2,5-dimethoxy-p-phenylenediamine, bis(4-aminophenyl)sulfone, 4-carboxy-o-phenylenediamine, 3-carboxy-m-phenylenediamine, 4,4'-diaminophenyl ether or 1,8-naphthalenediamine; a heterocyclic amine compound, for example, 2-aminoimidazole, 3-aminotriazole, 5-amino-1H-tetrazole, 4-aminopyrazole, 2-aminobenzimidazole, 2-amino-5-carboxytriazole, 2,4-diamono-6-methyl-S-triazine, 2,6-diaminopyridine, L-histidine, DL-tryptophan or adenine; and an aminoalcohol or aminophenol compound, for example, ethanolamine, N-methylethanolamine, N-ethylethanolamine, 1-amino-2-propanol, 1-amino-3-propanol, 2-aminoethoxyethanol, 2-aminothioethoxyethanol, 2-amino-2-methyl-1-propanol, p-aminophenol, m-aminophenol, o-aminophenol, 4-methyl-2-aminophenol, 2-chloro-4-aminophenol, 4-methoxy-3-aminophenol, 4-hydroxybenzylamine, 4-amino-1-naphthol, 4-aminosalicylic acid, 4-hydroxy-N-phenylglycine, 2-aminobenzyl alcohol, 4-aminophenethyl alcohol, 2-carboxy-5-amino-1-naphthol or L-tyrosine may also be used.

A urethane polymer obtained by terminating a reaction by capping a terminal unreacted isocyanate group with an alcohol compound containing a radical polymerizable group in the synthesis of polymer is preferable because printing durability can be further improved. Examples of the alcohol compound containing a radical polymerizable group includes 2-hydroxyethyl(meth)acrylate, 2-hydroxypropyl(meth)acrylate, 2-hydroxy-3-chloropropyl(meth)acrylate, 2-hydroxy-3-allyloxypropyl(meth)acrylate, 2-hydroxy-3-phenoxypropyl (meth)acrylate, 4-hydroxybutyl(meth)acrylate, glycerol diacrylate, glycerol acrylate methacrylate, glycerol dimethacrylate, pentaerythritol triacrylate and tris(acryloyloxyethyl)isocyanurate.

Specific examples of the polyurethane preferably used in the invention are set forth below, but the invention should not be construed as being limited thereto.

| | Diisocyanate Structure | Diol Structure |
|---|---|---|
| PU-1 | 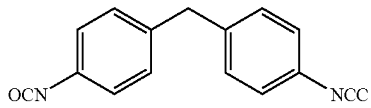 40 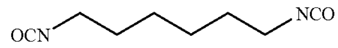 10 | PPG1000 15 |
| PU-2 | 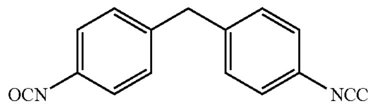 50 | 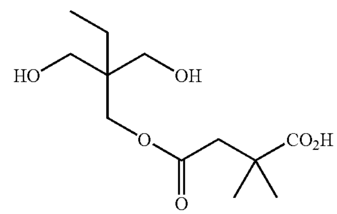 30 |
| PU-3 | 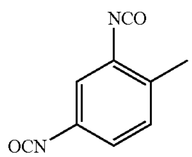 50 | PPG1000 10 |
| PU-4 | 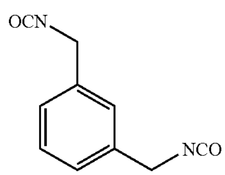 50 | PPG1000 10 |
| PU-5 | 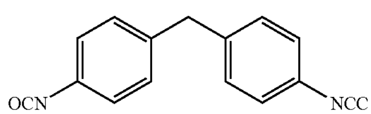 40 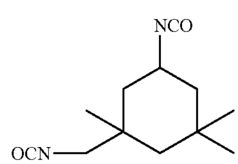 10 | PPG1000 20 |
| PU-6 | 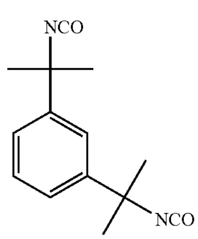 50 | PPG700 20 |
| PU-7 | 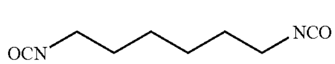 50 | 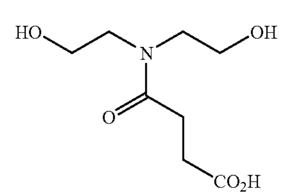 20 |

-continued
| | | | |
|---|---|---|---|
| PU-8 | 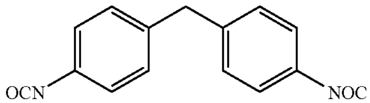<br>40 | 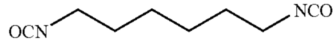<br>10 | PPG1000<br>10 |
| PU-9 | 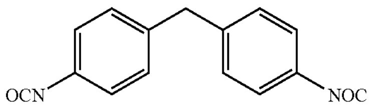<br>40 | 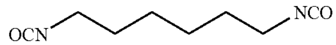<br>10 | PPG1000<br>10 |
| PU-10 | 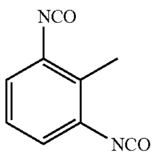<br>50 | | PPG1000<br>20 |
| PU-11 | 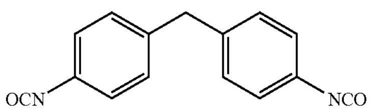<br>50 | | PPG2000<br>25 |
| PU-12 | 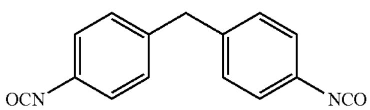<br>50 | | PPG2000<br>25 |
| PU-13 | 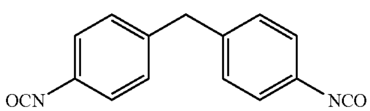<br>50 | | PPG2000<br>25 |
| PU-14 | 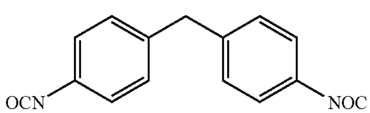<br>40 | 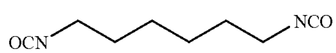<br>10 | PPG1000<br>10 |
| PU-15 | 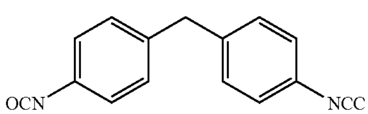<br>40 | 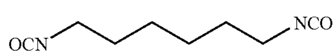<br>10 | PPG700<br>10 |
| PU-16 | 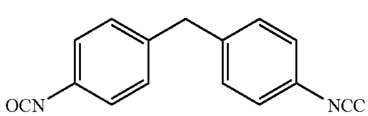<br>40 | 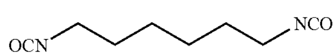<br>10 | PPG3000<br>10 |

-continued
| | | | |
|---|---|---|---|
| PU-17 | 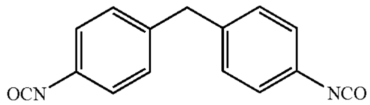 40 | 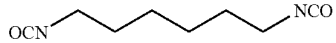 10 | PEG1000 10 |
| PU-18 | 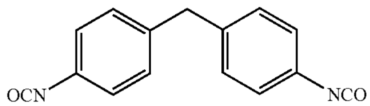 40 | 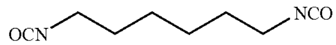 10 | PPG1000 10 |
| PU-19 | 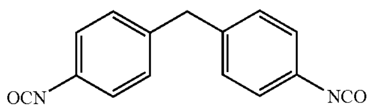 40 | 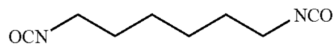 10 | PPG1000 10 |
| PU-20 | 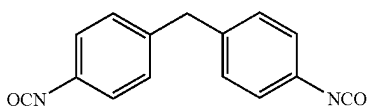 40 | 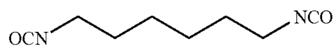 10 | PPG1000 10 |
| PU-21 | 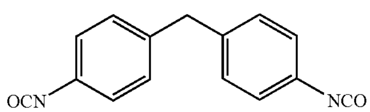 40 | 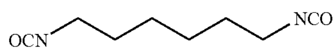 10 | PPG1000 10 |
| PU-22 | 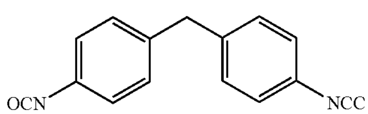 40 | 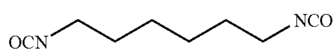 10 | PPG1000 10 |
| PU-23 | 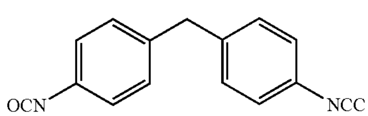 40 | 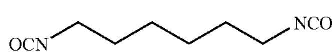 10 | PPG1000 10 |
| PU-24 | 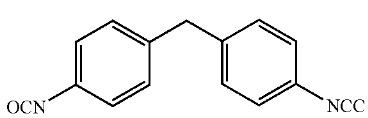 40 | 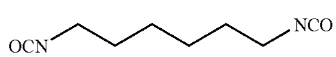 10 | PPG1000 10 |
| PU-25 | 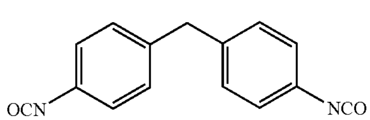 40 | 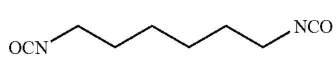 10 | PPG1000 10 |

-continued
PU-26
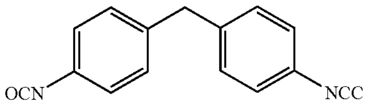
40
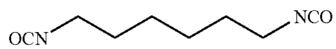
10
PPG1000
10
PU-27
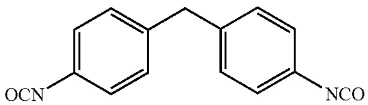
40
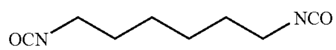
10
PPG1000
10
PU-28
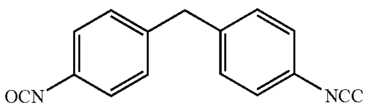
40
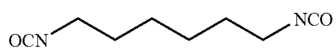
10
PPG1000
10
PU-29
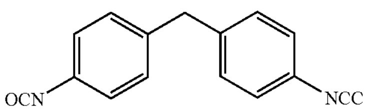
40
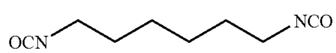
10
PPG1000
10
PU-30
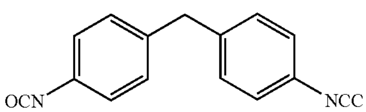
40
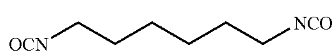
10
PPG1000
10
PU-31
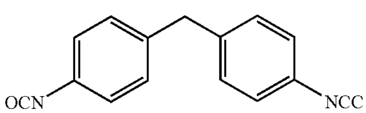
40
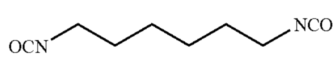
10
PPG1000
10
PU-32
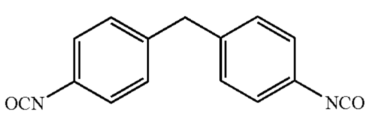
40
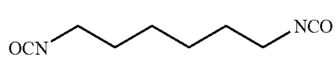
10
PPG1000
10
PU-33
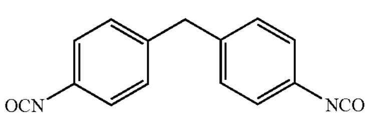
40
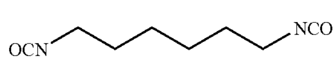
10
PPG1000
10
PU-34
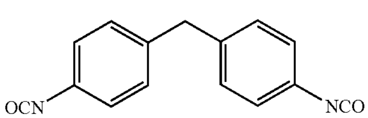
40
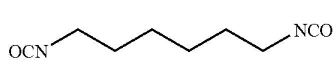
10
PPG1000
10

-continued
| | | | |
|---|---|---|---|
| PU-35 | 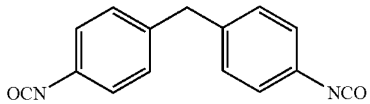 50 | 0 | PPG700 5 |
| PU-36 | 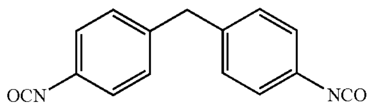 50 | 0 | PPG700 5 |
| PU-37 | 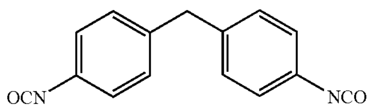 40 | 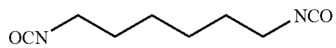 10 | PPG1000 10 |
| PU-38 | 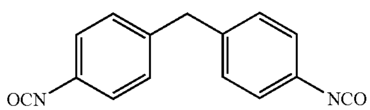 50 | | |
| | Diol Structure | | Mw |
|---|---|---|---|
| PU-1 | 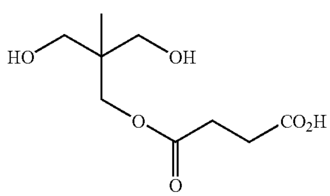 25 | 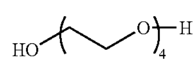 10 | 61000 |
| PU-2 | 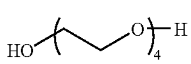 20 | | 50000 |
| PU-3 | 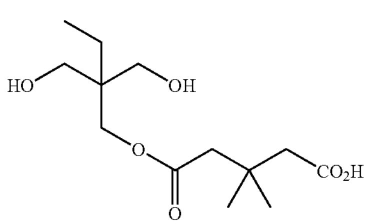 20 | 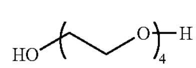 20 | 55000 |
| PU-4 | 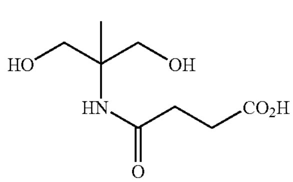 20 | 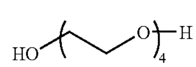 20 | 52000 |

-continued
| | | | |
|---|---|---|---|
| PU-5 | 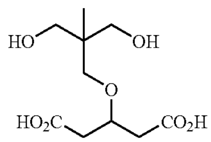 20 | 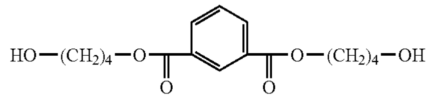 10 | 49000 |
| PU-6 | 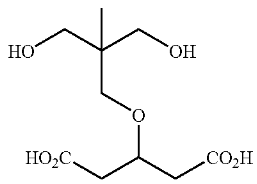 30 | 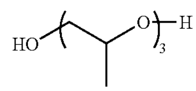 | 68000 |
| PU-7 | 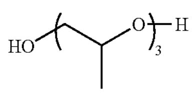 30 | | 70000 |
| PU-8 | 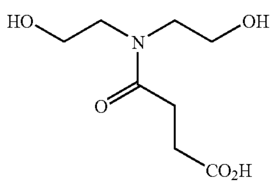 25 | 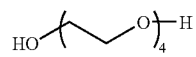 15 | 78000 |
| PU-9 | 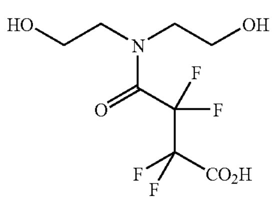 25 | 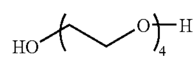 15 | 60000 |
| PU-10 | 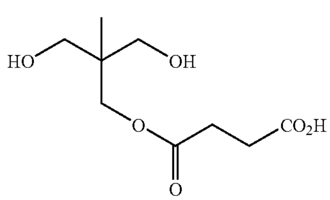 20 | 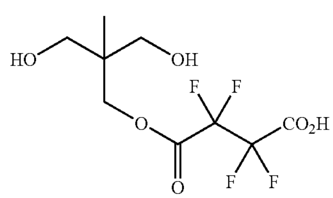 10 | 55000 |
| PU-11 | 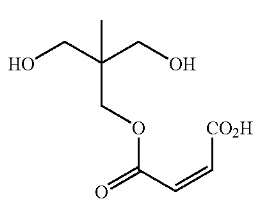 25 | | 60000 |

-continued
| | | | |
|---|---|---|---|
| PU-12 | 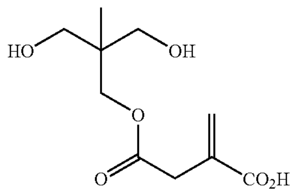<br>25 | | 50000 |
| PU-13 | 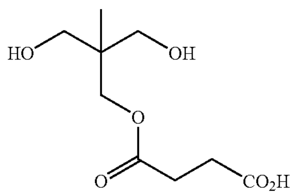<br>25 | | 55000 |
| PU-14 | 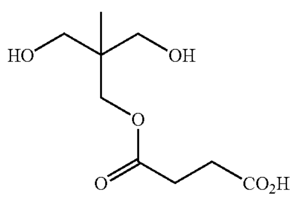<br>25 | 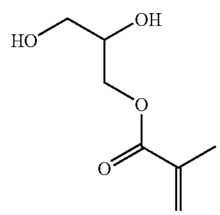<br>15 | 60000 |
| PU-15 | 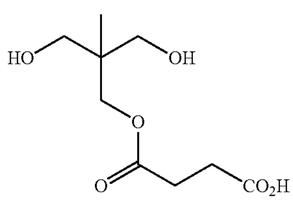<br>25 | 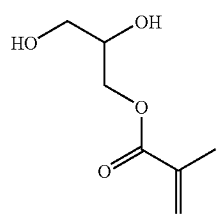<br>15 | 60000 |
| PU-16 | 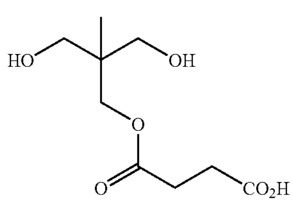<br>25 | 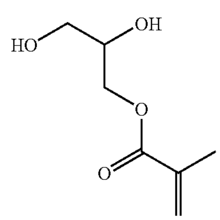<br>15 | 61000 |
| PU-17 | 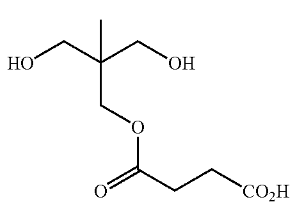<br>25 | 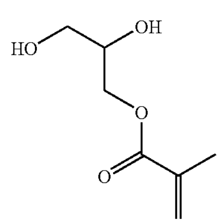<br>15 | 58000 |

-continued
| | | | |
|---|---|---|---|
| PU-18 | 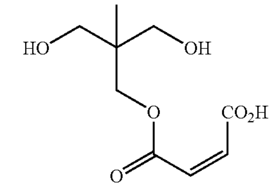<br>25 | 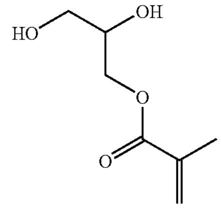<br>15 | 49000 |
| PU-19 | 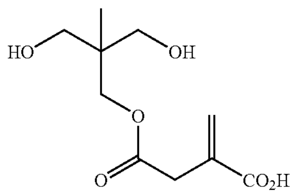<br>25 | 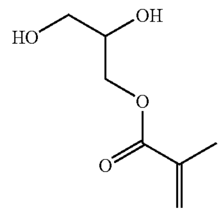<br>15 | 53000 |
| PU-20 | 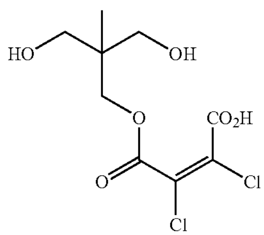<br>25 | 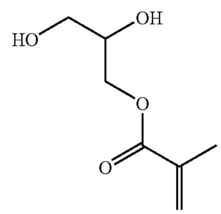<br>15 | 56000 |
| PU-21 | 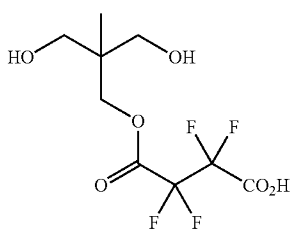<br>25 | 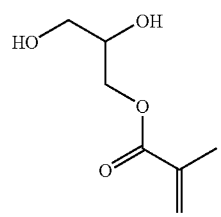<br>15 | 63000 |
| PU-22 | 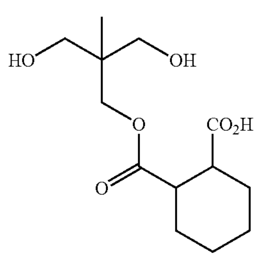<br>25 | 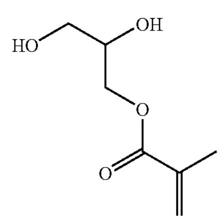<br>15 | 66000 |

-continued
| | | | |
|---|---|---|---|
| PU-23 | 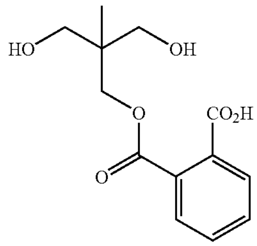 25 | 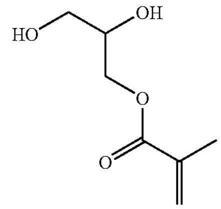 15 | 70000 |
| PU-24 | 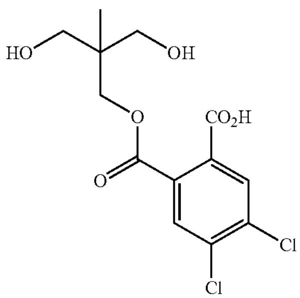 25 | 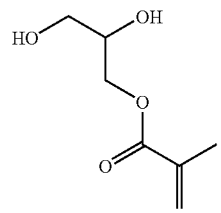 15 | 69000 |
| PU-25 | 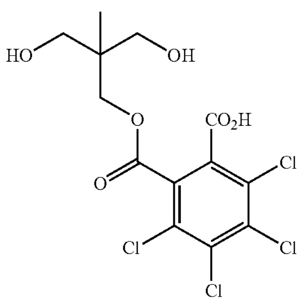 25 | 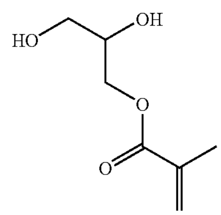 15 | 60000 |
| PU-26 | 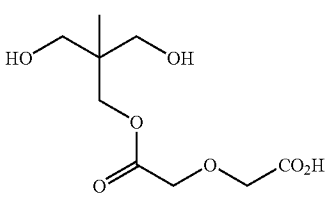 25 | 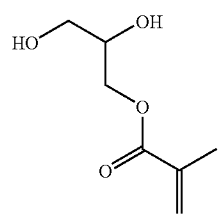 15 | 56000 |
| PU-27 | 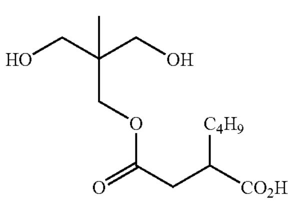 25 | 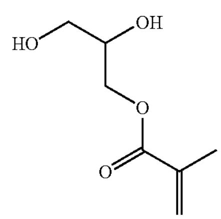 15 | 69000 |

-continued
| | | | | |
|---|---|---|---|---|
| PU-28 | 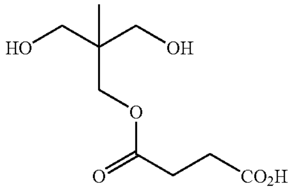<br>25 | 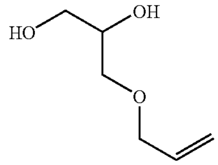<br>15 | | 77000 |
| PU-29 | 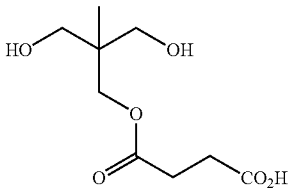<br>25 | 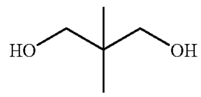<br>15 | | 60000 |
| PU-30 | 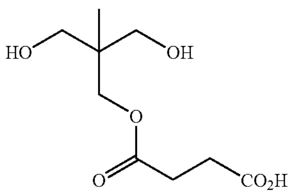<br>25 | 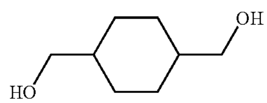<br>15 | | 65000 |
| PU-31 | 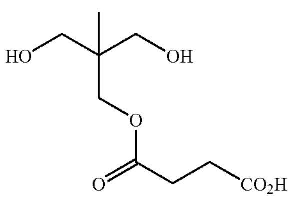<br>15 | 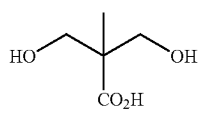<br>10 | 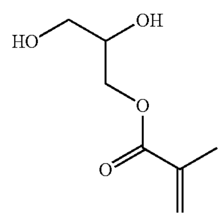<br>15 | 66000 |
| PU-32 | 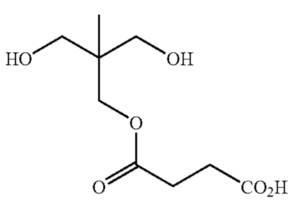<br>15 | 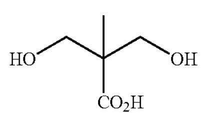<br>10 | 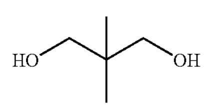<br>15 | 65000 |
| PU-33 | 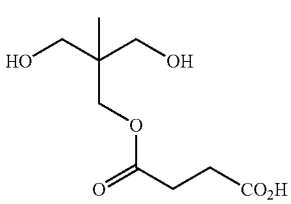<br>15 | 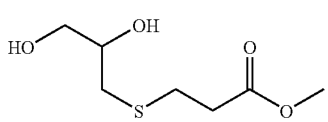<br>10 | 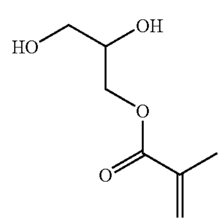<br>15 | 66000 |

-continued

| | | | | |
|---|---|---|---|---|
| PU-34 | 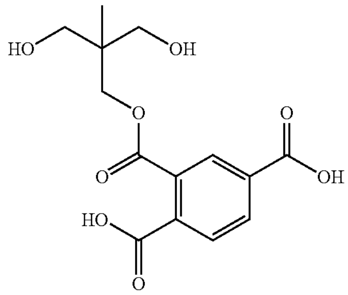 25 | 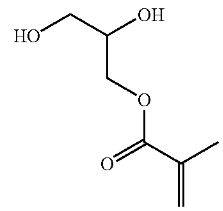 15 | | 70000 |
| PU-35 | 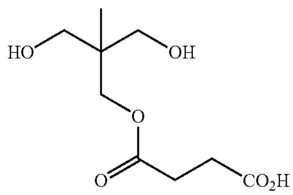 28 | 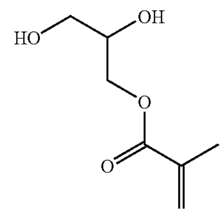 13 | 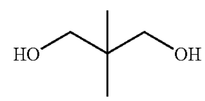 4 | 75000 |
| PU-36 | 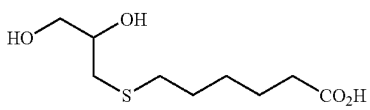 28 | 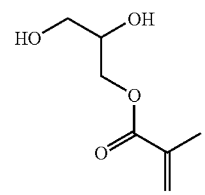 13 | 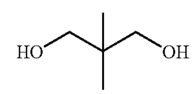 4 | 75000 |
| PU-37 | 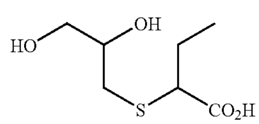 25 | 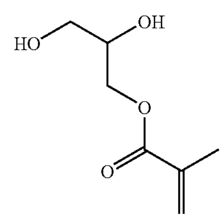 15 | | 62000 |
| PU-38 | 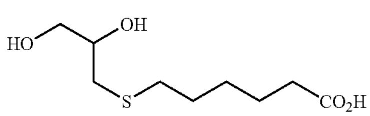 32 | 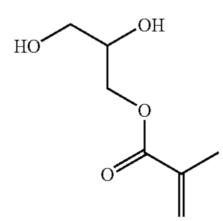 18 | | 60000 |

A molecular weight of the specific binder polymer according to the invention is appropriately determined in view of the image-forming property and printing durability. Ordinarily, as the molecular weight increases, the printing durability tends to be improved but the image-forming property tends to be deteriorated. On the contrary, as the molecular weight decreases, the image-forming property tends to be improved but the printing durability tends to be deteriorated. The molecular weight of the specific binder polymer is preferably in a range from 400 to 6,000,000, more preferably from 10,000 to 200,000, in terms of weight average molecular weight.

The specific binder polymers according to the invention may be used individually or in combination of two or more thereof.

The content of the specific binder polymer in the photosensitive layer is preferably from 5 to 90% by weight, more preferably from 10 to 70% by weight, in terms of solid content.

In the photosensitive layer according to the invention, one or more other binder polymers may be used together with the specific binder polymer as long as the effects of the invention are not damaged.

The other binder polymer used together is used in a range from 1 to 60% by weight, preferably from 1 to 40% by weight, more preferably from 1 to 20% by weight, based on the total weight of the whole binder polymer component.

As the other binder polymer used together, conventionally known binder polymers are employed without limitation. Specifically, for example, an acryl main chain binder, a urethane binder and an acetal-modified polyvinyl alcohol resin (for example, a butyral resin) broadly used in the field of art are exemplified and the acryl main chain binder and urethane binder are preferably employed.

(Ethylenically Unsaturated Compound)

The ethylenically unsaturated compound for use in the photosensitive layer according to the invention is an addition-polymerizable compound having at least one ethylenically unsaturated double bond, and it is preferably selected from compounds having at least one, more preferably two or more, terminal ethylenically unsaturated double bonds. Such compounds are widely known in the art and they can be used in the invention without any particular limitation. The compound has a chemical form, for example, a monomer, a prepolymer, specifically, a dimer, a trimer or an oligomer, or a copolymer thereof, or a mixture thereof Examples of the monomer include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with an aliphatic polyhydric alcohol compound and amides of an unsaturated carboxylic acid with an aliphatic polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy compound, or a dehydration condensation reaction product of the unsaturated carboxylic acid ester or amide with a monofunctional or polyfunctional carboxylic acid is also preferably used. Moreover, an addition reaction product of an unsaturated carboxylic acid ester or amide having an electrophilic substituent, for example, an isocyanate group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used.

Specific examples of the monomer, which is an ester of an aliphatic polyhydric alcohol compound with an unsaturated carboxylic acid, include acrylic acid esters, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, isocyanuric acid ethylene oxide (EO) modified triacrylate or polyester acrylate oligomer;

methacrylic acid esters, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane or bis[p-(methacryloxyethoxy)phenyl]dimethylmethane;

itaconic acid esters, for example, ethylene glycol diitaconate, propylene glycol diitaconate, 1,3-butanediol diitaconate, 1,4-butanediol diitaconate, tetramethylene glycol diitaconate, pentaerythritol diitaconate or sorbitol tetraitaconate;

crotonic acid esters, for example, ethylene glycol dicrotonate, tetramethylene glycol dicrotonate, pentaerythritol dicrotonate or sorbitol tetracrotonate;

isocrotonic acid esters, for example, ethylene glycol diisocrotonate, pentaerythritol diisocrotonate or sorbitol tetraisocrotonate;

and maleic acid esters, for example, ethylene glycol dimaleate, triethylene glycol dimaleate, pentaerythritol dimaleate and sorbitol tetramaleate.

Other examples of the ester, which can be preferably used, include aliphatic alcohol esters described in JP-B-51-47334 (the term "JP-B" as used herein means an "examined Japanese patent publication") and JP-A-57-196231, esters having an aromatic skeleton described in JP-A-59-5240, JP-A-59-5241 and JP-A-2-226149, and esters containing an amino group described in JP-A-1-165613.

The above-described ester monomers can also be used as a mixture.

Specific examples of the monomer, which is an amide of an aliphatic polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide. Other preferred examples of the amide monomer include amides having a cyclohexylene structure described in JP-B-54-21726.

Urethane type addition-polymerizable compounds produced using an addition reaction between an isocyanate and a hydroxy group are also preferably used, and specific examples thereof include vinylurethane compounds having two or more polymerizable vinyl groups per molecule obtained by adding a vinyl monomer containing a hydroxy group represented by formula (A) shown below to a polyisocyanate compound having two or more isocyanate groups per molecule, described in JP-B-48-41708.

$$CH_2{=}C(R_4)COOCH_2CH(R_5)OH \quad (A)$$

wherein $R_4$ and $R_5$ each independently represents H or $CH_3$.

Also, urethane acrylates described in JP-A-51-37193, JP-B-2-32293 and JP-B-2-16765, and urethane compounds having an ethylene oxide skeleton described in JP-B-58-

49860, JP-B-56-17654, JP-B-62-39417 and JP-B-62-39418 are preferably used. Further, a photosensitive composition having remarkably excellent photo-speed can be obtained by using an addition polymerizable compound having an amino structure or a sulfide structure in its molecule, described in JP-A-63-277653, JP-A-63-260909 and JP-A-1-105238.

Other examples include polyfunctional acrylates and methacrylates, for example, polyester acrylates and epoxy acrylates obtained by reacting an epoxy resin with (meth) acrylic acid, described in JP-A-48-64183, JP-B-49-43191 and JP-B-52-30490. Specific unsaturated compounds described in JP-B-46-43946, JP-B-1-40337 and JP-B-1-40336, and vinylphosphonic acid type compounds described in JP-A-2-25493 can also be exemplified. In some cases, structure containing a perfluoroalkyl group described in JP-A-61-22048 can be preferably used. Moreover, photocurable monomers or oligomers described in *Nippon Secchaku Kyokaishi* (*Journal of Japan Adhesion Society*), Vol. 20, No. 7, pages 300 to 308 (1984) can also be used.

Details of the method of using the ethylenically unsaturated compound, for example, selection of the structure, individual or combination use or an amount added, can be appropriately determined in accordance with the characteristic design of the final lithographic printing plate precursor. For instance, the compound is selected from the following standpoints.

In view of the sensitivity, a structure having a large content of unsaturated group per molecule is preferred and in many cases, a difunctional or more functional compound is preferred. Also, in order to increase the strength of the image area, that is, cured layer, a trifunctional or more functional compound is preferred. A combination use of compounds different in the functional number or in the kind of polymerizable group (for example, an acrylic acid ester, a methacrylic acid ester, a styrene compound or a vinyl ether compound) is an effective method for controlling both the sensitivity and the strength.

The selection and use method of the polymerizable compound are also important factors for the compatibility and dispersibility with other components (for example, a binder polymer, a polymerization initiator or a coloring agent) in the photosensitive layer. For instance, the compatibility may be improved in some cases by using the compound of low purity or using two or more kinds of the compounds in combination. A specific structure may be selected for the purpose of improving an adhesion property to a support, a protective layer or the like described hereinafter.

The ethylenically unsaturated compound is used preferably in a range of 5 to 80% by weight, more preferably in a range of 25 to 75% by weight, based on the total solid content of the photosensitive layer. The polymerizable compounds may be used individually or in combination of two or more thereof. In the method of using the polymerizable compound, the structure, blend and amount added can be appropriately selected by taking account of the degree of polymerization inhibition due to oxygen, resolution, fogging property, change in refractive index, surface tackiness and the like. Further, depending on the case, a layer construction, for example, an undercoat layer or an overcoat layer, and a coating method, may also be considered.

(Polymerization Initiator)

The polymerization initiator for use in the photosensitive layer according to the invention is preferably a radical polymerization initiator which generates a radical with light energy or heat energy to initiate or accelerate polymerization of a compound having a polymerizable unsaturated group. The radical polymerization initiator is appropriately selected to use, for example, from known radical polymerization initiators and compounds containing a bond having small bond dissociation energy.

The radical polymerization initiators include, for example, organic halogen compounds, carbonyl compounds, organic peroxides, azo compounds, azido compounds, metallocene compounds, hexaarylbiimidazole compounds, organic boron compounds, disulfone compounds, oxime ester compounds and onium salt compounds.

The organic halogen compounds described above specifically include, for example, compounds described in Wakabayashi et al., *Bull. Chem. Soc. Japan,* 42, 2924 (1969), U.S. Pat. No. 3,905,815, JP-B-46-4605, JP-A-48-36281, JP-A-53-133428, JP-A-55-32070, JP-A-60-239736, JP-A-61-169835, JP-A-61-169837, JP-A-62-58241, JP-A-62-212401, JP-A-63-70243, JP-A-63-298339 and M. P. Hutt, *Journal of Heterocyclic Chemistry,* 1, No. 3 (1970). Among them, oxazole compounds and s-triazine compounds each substituted with a trihalomethyl group are preferable.

More preferably, s-triazine derivatives in which at least one of mono-, di- or tri-halogen substituted methyl group is connected to the s-triazine ring and oxazole derivatives in which at least one of mono-, di- or tri-halogen substituted methyl group is connected to the oxazole ring are exemplified. Specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-(3,4-epoxyphenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl-4,6-bis(trichloromethyl)-s-triazine, 2-(p-isopropyloxystyryl-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine and compounds shown below.

(I)-1

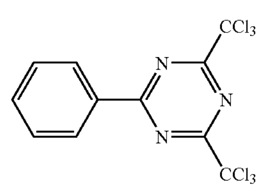

(I)-2

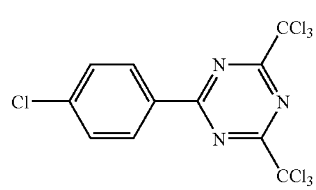

(I)-3

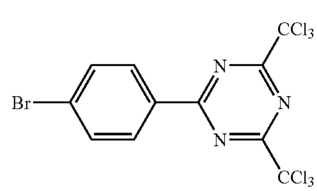

(I)-4
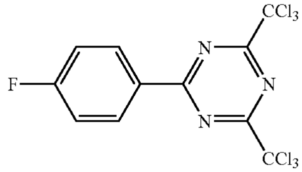
(I)-5
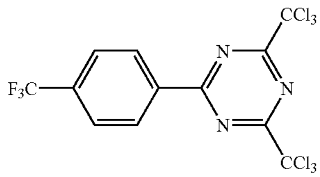
(I)-6
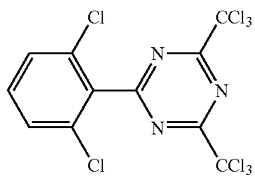
(I)-7
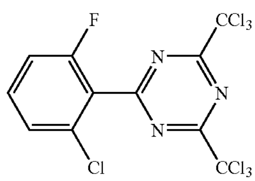
(I)-8
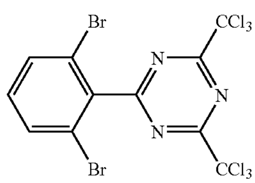
(I)-9
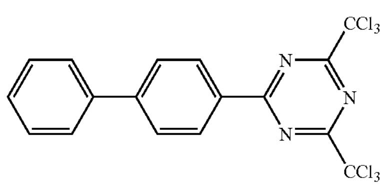
(I)-10
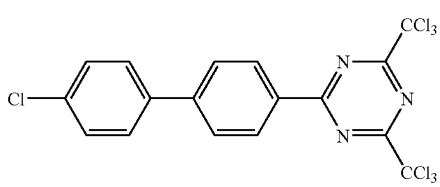
(I)-11
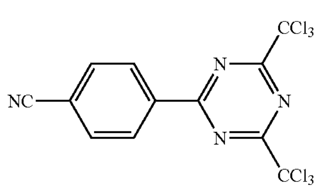
(I)-12
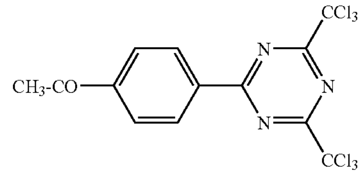
(I)-13
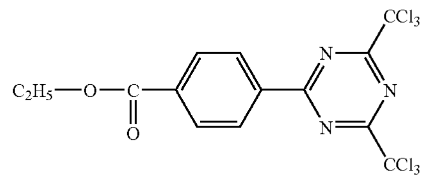
(I)-14
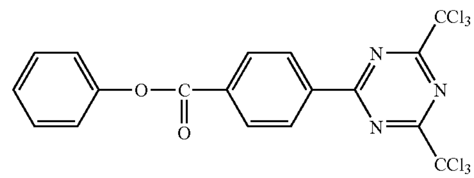
(I)-15
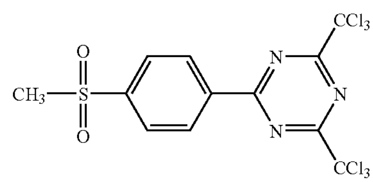
(I)-16
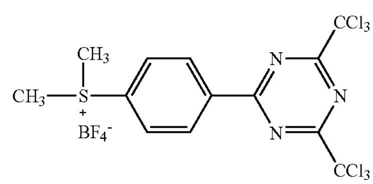
(I)-17
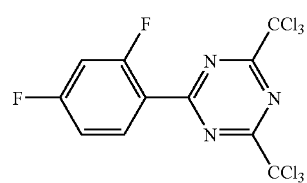
(I)-18
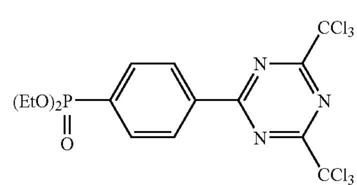
(I)-19
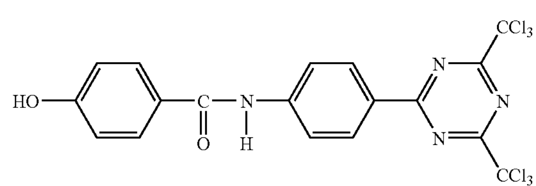

-continued (I)-20

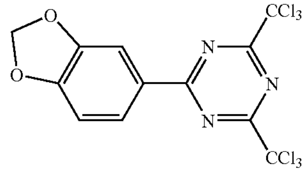

(I)-21

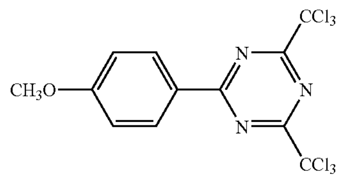

(I)-22

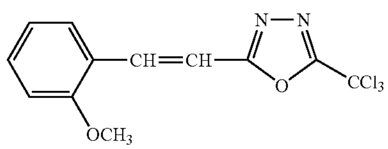

(I)-23

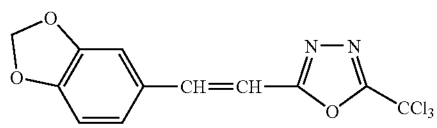

(I)-24

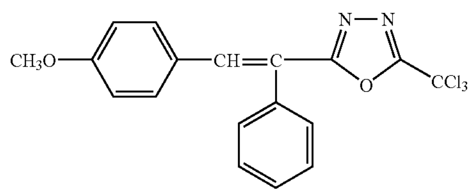

(I)-25

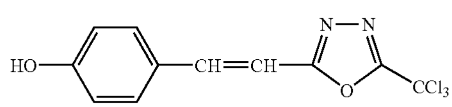

(I)-26

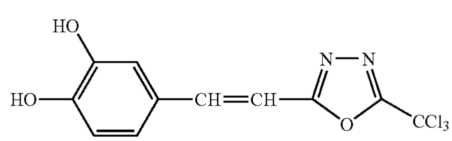

(I)-27

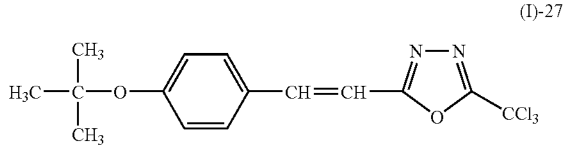

The carbonyl compounds described above include, for example, benzophenone derivatives, e.g., benzophenone, Michler's ketone, 2-methylbenzophenone, 3-methylbenzophenone, 4-methylbenzophenone, 2-chlorobenzophenone, 4-bromobenzophenone or 2-carboxybenzophenone, acetophenone derivatives, e.g., 2,2-dimethoxy-2-phenylacetophenone, 2,2-diethoxyacetophenone, 1-hydroxycyclohexylphenylketone, α-hydroxy-2-methylphenylpropane, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propane or 1,1,1,-trichloromethyl-(p-butylphenyl)ketone, thioxantone derivatives, e.g., thioxantone, 2-ethylthioxantone, 2-isopropylthioxantone, 2-chlorothioxantone, 2,4-dimetylthioxantone, 2,4-dietylthioxantone or 2,4-diisopropylthioxantone, and benzoic acid ester derivatives, e.g., ethyl p-dimethylaminobenzoate or ethyl p-diethylaminobenzoate.

The azo compounds described above include, for example, azo compounds described in JP-A-8-108621.

The organic peroxides described above include, for example, trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butylhydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, peroxy succinic acid, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy dicarbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy laurate, tersyl carbonate, 3,3',4,4'-tetra(tert-butylperoxycarbonyl)benzophenone, 3,3',4,4'-tetra(tert-hexylperoxycarbonyl)benzophenone, 3,3',4,4'-tetra(p-isopropylcumylperoxycarbonyl)benzophenone, carbonyl di(tert-butylperoxydihydrogen diphthalate) and carbonyl di(tert-hexylperoxydihydrogen diphthalate).

The metallocene compounds described above include, for example, various titanocene compounds described in JP-A-59-152396, JP-A-61-151197, JP-A-63-41484, JP-A-2-249, JP-A-2-4705 and JP-A-5-83588, for example, dicyclopentadienyl-Ti-bisphenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-triafluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-triafluorophen-1-yl, dimethylcyclopentadienyl-Ti-bis-2,3,5,6-tetrafluorophen-1-yl, dimethylcyclopentadienyl-Ti-bis-2,3,4,5,6-pentafluorophen-1-yl, or bis(cyclopentadienyl)-bis(2,6-difluoro-3-(pyr-1-yl)phenyl) titanium and iron-arene complexes described in JP-A-1-304453 and JP-A-1-152109.

The hexaarylbiimidazole compounds described above include, for example, various compounds described in JP-B-6-29285 and U.S. Pat. Nos. 3,479,185, 4,311,783 and 4,622,286, specifically, for example, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluoromethylphenyl)-4,4',5,5'-tetraphenylbiimidzole.

The organic boron compounds described above include, for example, organic boric acid salts described in JP-A-62-143044, JP-A-62-150242, JP-A-9-188685, JP-A-9-188686, JP-A-9-188710, JP-A-2000-131837, JP-A-2002-107916, Japanese Patent 2764769, JP-A-2002-116539 and Martin Kunz, *Rad Tech '98*, *Proceeding*, Apr. 19-22 (1998), Chicago, organic boron sulfonium complexes or organic boron oxosulfonium complexes described in JP-A-6-157623, JP-A-6-175564 and JP-A-6-175561, organic boron iodonium complexes described in JP-A-6-175554 and JP-A-6-175553, organic boron phosphonium complexes described in JP-A-9-188710, and organic boron transition metal coordination complexes described in JP-A-6-348011, JP-A-7-128785, JP-A-7-140589, JP-A-7-306527 and JP-A-7-292014.

The disulfone compounds described above include, for example, compounds described in JP-A-61-166544 and JP-A-2002-328465.

The oxime ester compounds described above include, for example, compounds described in *J. C. S. Perkin II,* 1653-1660 (1979), *J. C. S. Perkin II,* 156-162 (1979), *Journal of Photopolymer Science and Technology,* 202-232 (1995) and JP-A-2000-66385, and compounds described in JP-A-2000-80068. Specific examples thereof include compounds represented by the following structural formulae:

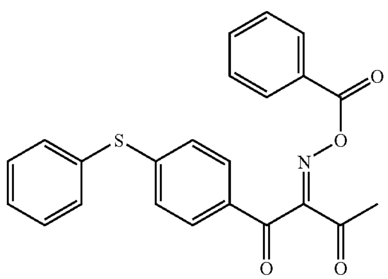

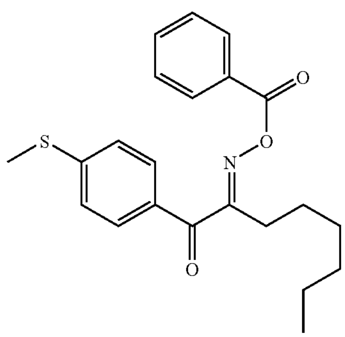

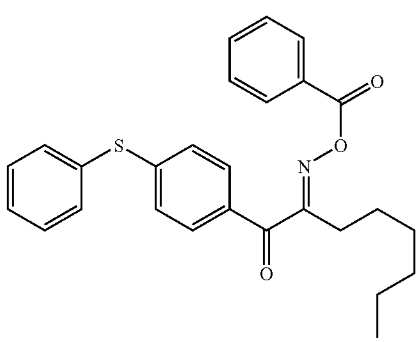

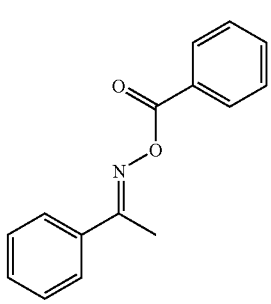

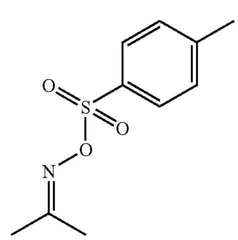

-continued

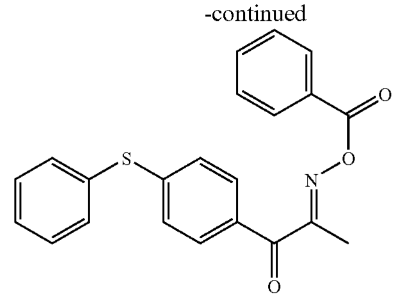

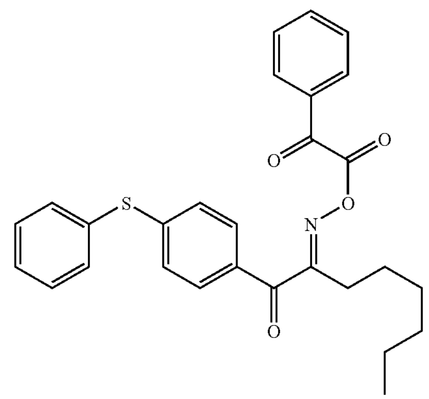

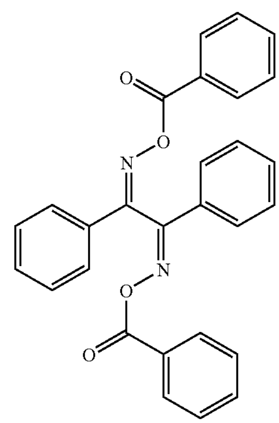

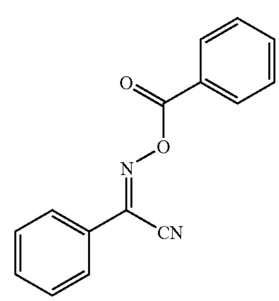

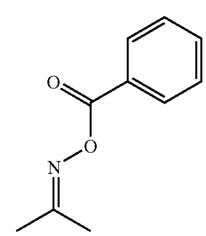

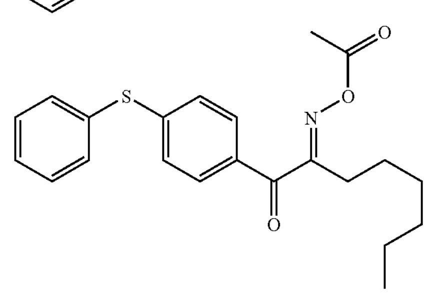

-continued

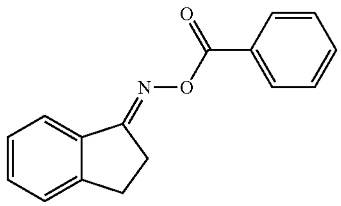

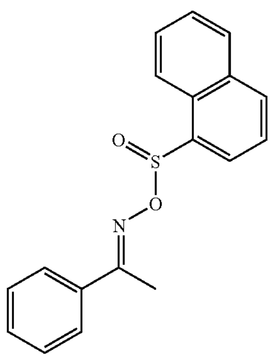

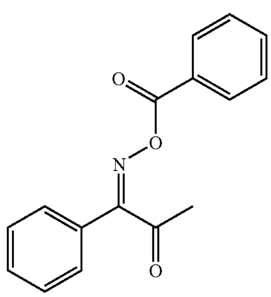

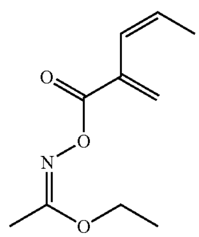

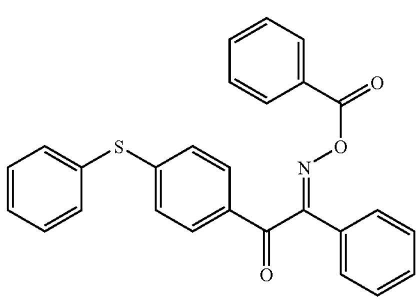

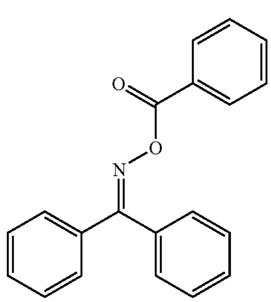

-continued

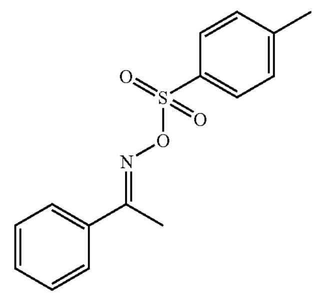

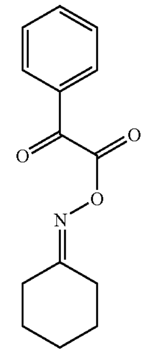

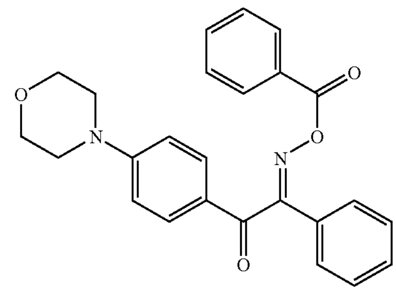

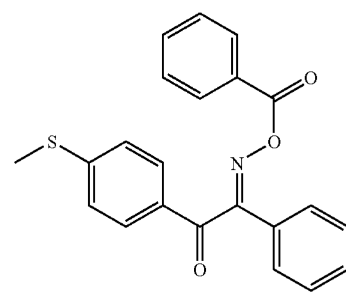

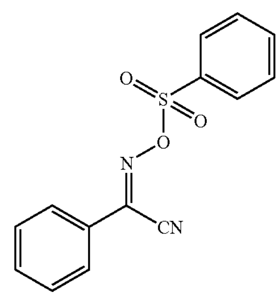

The onium salt compounds described above include onium salts, for example, diazonium salts described in S. I. Schlesinger, *Photogr. Sci. Eng.,* 18, 387 (1974) and T. S. Bal et al., *Polymer,* 21, 423 (1980), ammonium salts described in U.S. Pat. No. 4,069,055 and JP-A-4-365049, phosphonium salts described in U.S. Pat. Nos. 4,069,055 and 4,069,056, iodonium salts described in European Patent 104,143, U.S. Pat. Nos. 339,049 and 410,201, JP-A-2-150848 and JP-A-2-296514, sulfonium salts described in European Patents 370,693, 390,214, 233,567, 297,443 and 297,442, U.S. Pat. Nos. 4,933,377, 161,811, 410,201, 339,049, 4,760,013, 4,734,444 and 2,833,827 and German Patents 2,904,626, 3,604,580 and 3,604,581, selenonium salts described in J. V. Crivello et al., *Macromolecules,* 10 (6), 1307 (1977) and J. V. Crivello et al., *J. Polymer Sci., Polymer Chem. Ed.,* 17, 1047 (1979), and arsonium salts described in C. S. Wen et al., *Teh, Proc. Conf. Rad. Curing ASIA*, p. 478, Tokyo, October (1988).

In the invention, the onium salt functions not as an acid generator, but as an ionic radical polymerization initiator.

The onium salts preferably used in the invention include onium salts represented by the following formulae (RI-I) to (RI-III):

(RI-I)

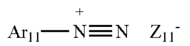

(RI-II)

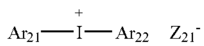

(RI-III)

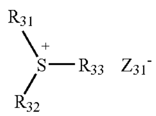

In formula (RI-I), $Ar_{11}$ represents an aryl group having 20 or less carbon atoms, which may have 1 to 6 substituents. Preferable examples of the substituent include an alkyl group having from 1 to 12 carbon atoms, an alkenyl group having from 1 to 12 carbon atoms, an alkynyl group having from 2 to 12 carbon atoms, an aryl group having from 6 to 12 carbon atoms, an alkoxy group having from 1 to 12 carbon atoms, an aryloxy group having from 6 to 12 carbon atoms, a halogen atom, an alkylamino group having from 1 to 12 carbon atoms, a dialkylimino group having from 2 to 12 carbon atoms, an alkylamido group or arylamido having from 2 to 12 carbon atoms, a carbonyl group, a carboxyl group, a cyano group, a sulfonyl group, an thioalkyl group having from 1 to 12 carbon atoms and an thioaryl group having from 6 to 12 carbon atoms. $Z_{11}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thiosulfonate ion and a sulfate ion. Among them, a perchlorate ion, a hexafluorophosphate ion, a tetrafluoroborate ion, a sulfonate ion and a sulfinate ion are preferred in view of stability.

In the formula (RI-II), $Ar_{21}$ and $Ar_{22}$ each independently represents an aryl group having 20 or less carbon atoms, which may have 1 to 6 substituents. Preferable examples of the substituent include an alkyl group having from 1 to 12 carbon atoms, an alkenyl group having from 2 to 12 carbon atoms, an alkynyl group having from 2 to 12 carbon atoms, an aryl group having from 6 to 12 carbon atoms, an alkoxy group having from 1 to 12 carbon atoms, an aryloxy group having from 6 to 12 carbon atoms, a halogen atom, an alkylamino group having from 1 to 12 carbon atoms, a dialkylimino group having from 2 to 12 carbon atoms, an alkylamido group or arylamido group having from 1 to 12 carbon atoms, a carbonyl group, a carboxyl group, a cyano group, a sulfonyl group, an thioalkyl group having from 1 to 12 carbon atoms and an thioaryl group having from 6 to 12 carbon atoms. $Z_{21}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thiosulfonate ion, a sulfate ion and a carboxylate ion. Among them, a perchlorate ion, a hexafluorophosphate ion, a tetrafluoroborate ion, a sulfonate ion, a sulfinate ion and a carboxylate ion are preferred in view of stability and reactivity.

In the formula (RI-III), $R_{31}$, $R_{32}$ and $R_{33}$ each independently represents an aryl group having 20 or less carbon atoms, which may have 1 to 6 substituents, an alkyl group, an alkenyl group or an alkynyl group. Among them, the aryl group is preferred in view of reactivity and stability. Preferable examples of the substituent include an alkyl group having from 1 to 12 carbon atoms, an alkenyl group having from 2 to 12 carbon atoms, an alkynyl group having from 2 to 12 carbon atoms, an aryl group having from 6 to 12 carbon atoms, an alkoxy group having from 1 to 12 carbon atoms, an aryloxy group having from 6 to 12 carbon atoms, a halogen atom, an alkylamino group having from 1 to 12 carbon atoms, a dialkylimino group having from 2 to 12 carbon atoms, an alkylamido group or arylamido group having from 2 to 12 carbon atoms, a carbonyl group, a carboxyl group, a cyano group, a sulfonyl group, an thioalkyl group having from 1 to 12 carbon atoms and an thioaryl group having from 6 to 12 carbon atoms. $Z_{31}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thiosulfonate ion, a sulfate ion and a carboxylate ion. Among them, a perchlorate ion, a hexafluorophosphate ion, a tetrafluoroborate ion, a sulfonate ion, a sulfinate ion and a carboxylate ion are preferred in view of stability and reactivity. Carboxylate ions described in JP-A-2001-343742 are more preferable, and carboxylate ions described in JP-A-2002-148790 are particularly preferable.

Specific examples of the onium salt are set forth below, but the invention should not be construed as being limited thereto.

Specific examples of the onium salt compound are set forth below.

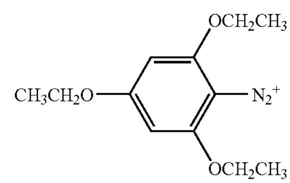

(N-1)

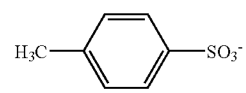

(N-2)

$PF_6^-$

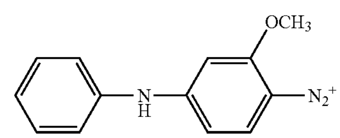

(N-3)

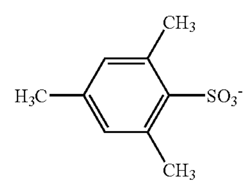

(N-4)

$ClO_4^-$ (N-5)

$PF_6^-$

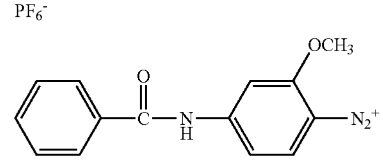

(N-6)

$CF_3SO_3^-$

-continued
(N-7)
$BF_4^-$
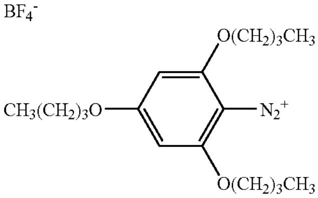
(N-8)
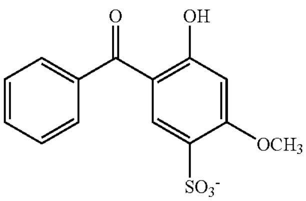
(N-9)
$ClO_4^-$
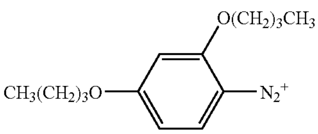
(N-10)
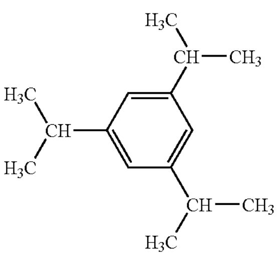
(N-11)
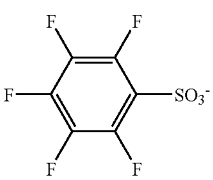
(N-12)
$PF_6^-$
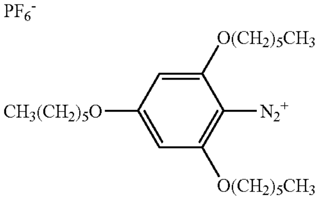
(N-13)
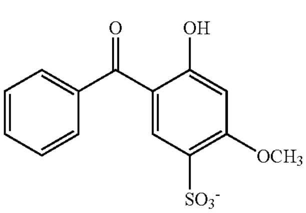
(N-14)
$ClO_4^-$
(N-15)
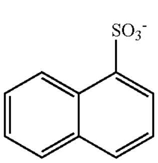
-continued
(N-16)
$PF_6^-$
(N-17)
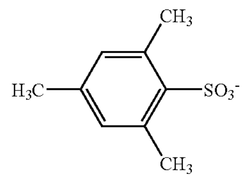
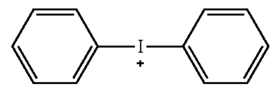
(I-1)
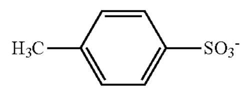
(I-2)
$PF_6^-$
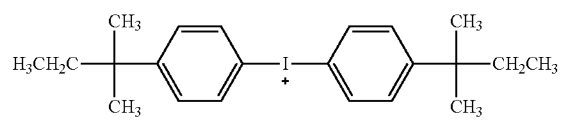
(I-3)
$PF_6^-$
(I-4)
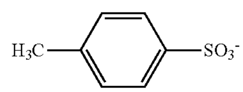
(I-5)
$ClO_4^-$
(I-6)
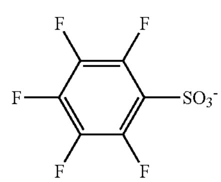
(I-7)
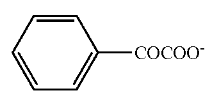
(I-8)
$CF_3SO_3^-$
(I-9)
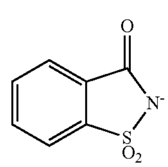
(I-10)
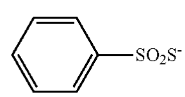
(I-11)
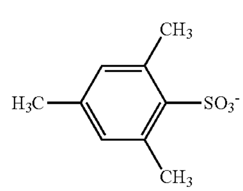

-continued
(I-12)
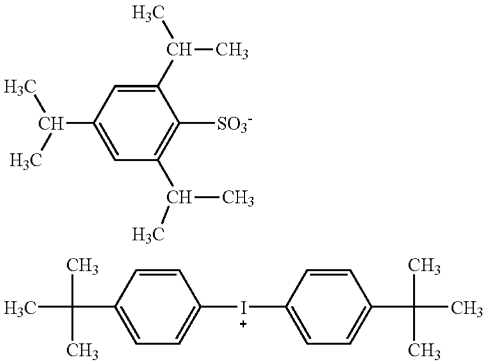
(I-13)
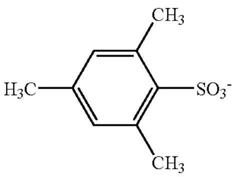
(I-14)
$ClO_4^-$
(I-15)
$PF_6^-$
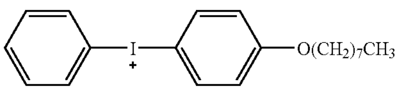
(I-16)
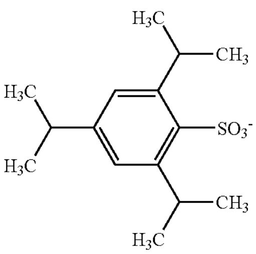
(I-17)
$CF_3COO^-$
(I-18)
$CF_3SO_3^-$
(I-19)
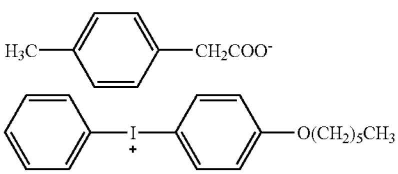
(I-20)
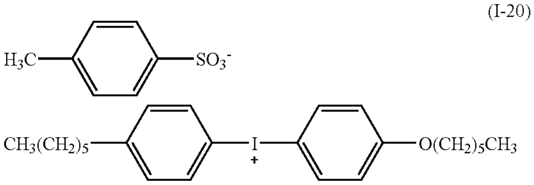
(I-21)
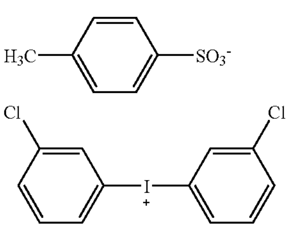
-continued
(I-22)
$BF_4^-$
(I-23)
(I-24)
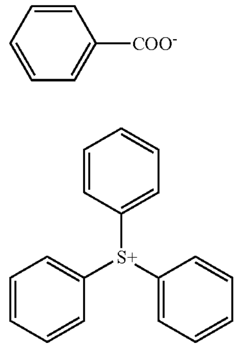
(S-1)
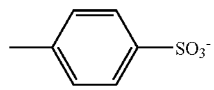
(S-2)
$PF_6^-$
(S-3)
$ClO_4^-$
(S-4)
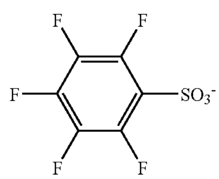
(S-5)
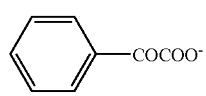
(S-6)
$CF_3SO_3^-$
(S-7)
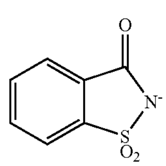
(S-8)
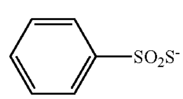

-continued (S-9)

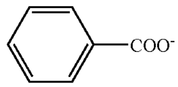

(S-10)

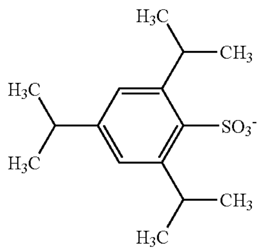

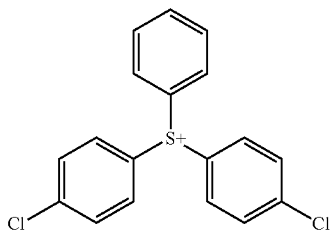

(S-11)

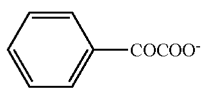

(S-12)

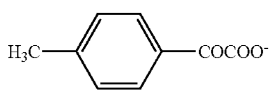

(S-13)

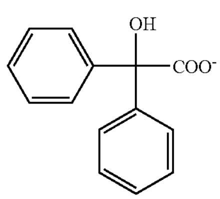

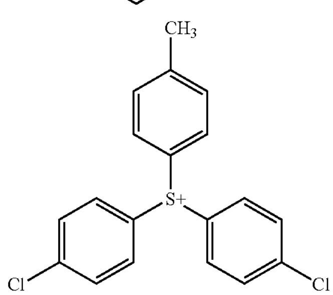

(S-14)

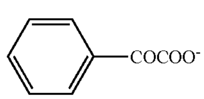

(S-15)

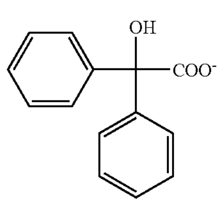

(S-16)

$BF_4^-$

-continued (S-17)

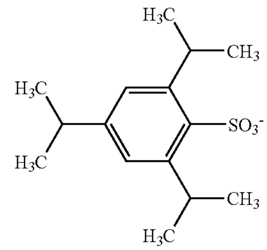

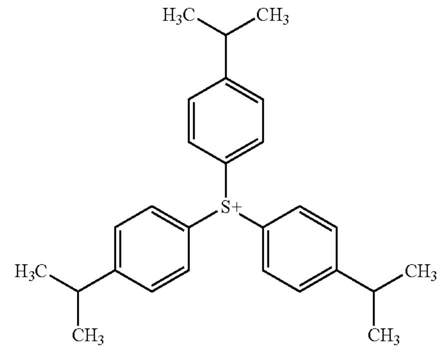

(S-18)

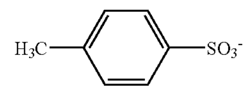

The polymerization initiator is not limited to those described above. In particular, from the standpoint of reactivity and stability, the triazine type initiators, organic halogen compounds, metallocene compounds, hexaarylbiimidazole compounds, organic boron compounds, oxime ester compounds and onium salt compounds are preferable and the triazine type initiators, organic halogen compounds, metallocene compounds, hexaarylbiimidazole compounds and onium salt compounds are more preferable.

The polymerization initiator can be added preferably in an amount from 0.1 to 50% by weight, more preferably from 0.5 to 30% by weight, particularly preferably from 0.8 to 20% by weight, based on the total solid content of the photosensitive layer.

(Other Components)

To the photosensitive layer according to the invention may further appropriately be added other components suitable for the use or production method thereof or the like. Other components are described below.

(Sensitizing Dye)

The sensitizing dye for use in the photosensitive layer according to the invention is appropriately selected depending on the use or the like and is not particularly restricted. For instance, a compound absorbing light of 350 to 450 nm and an infrared absorbing agent are exemplified.

(1) Compound Absorbing Light of 350 to 450 nm

The sensitizing dye having an absorption maximum in a wavelength range of 350 to 450 nm for use in the invention include merocyanine dyes represented by formula (V) shown below, benzopyranes or coumarins represented by formula (VI) shown below, aromatic ketones represented by formula (VII) shown below and anthracenes represented by formula (VIII) shown below.

(V)

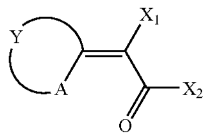

In formula (V), A represents a sulfur atom or $NR_6$, $R_6$ represents a monovalent non-metallic atomic group, Y represents a non-metallic atomic group necessary for forming a basic nucleus of the dye together with adjacent A and the adjacent carbon atom, and $X_1$ and $X_2$ each independently represents a monovalent non-metallic atomic group or $X_1$ and $X_2$ may be combined with each other to form an acidic nucleus of the dye.

(VI)

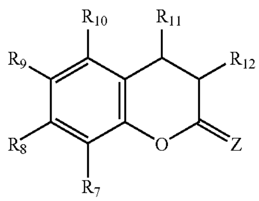

(I')

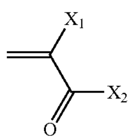

In formula (VI), =Z represents an oxo group, a thioxo group, an imino group or an alkylydene group represented by the partial structural formula (I') described above, $X_1$ and $X_2$ have the same meanings as defined in formula (V) respectively, and $R_7$ to $R_{12}$ each independently represents a monovalent non-metallic atomic group.

(VII)

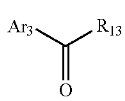

In formula (VII), $Ar_3$ represents an aromatic group which may have a substituent or a heteroaromatic group which may have a substituent, and $R_{13}$ represents a monovalent non-metallic atomic group. $R_{13}$ preferably represents an aromatic group or a heteroaromatic group. $Ar_3$ and $R_{13}$ may be combined with each other to form a ring.

(VIII)

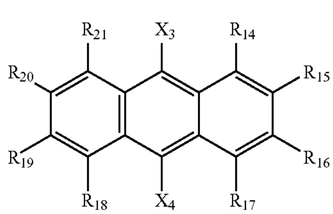

In formula (VIII), $X_3$, $X_4$ and $R_{14}$ to $R_{21}$ each independently represents a monovalent non-metallic atomic group. Preferably, $X_3$ and $X_4$ each independently represents an electron-donating group having a negative Hammett substituent constant.

In formulae (V) to (VIII), preferable examples of the monovalent non-metallic atomic group represented by any one of $X_1$ to $X_4$ and $R_6$ to $R_{21}$ include a hydrogen atom, an alkyl group (for example, a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, a 2-norbornyl group, a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylgroup, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatobutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group or a 3-butynyl group), an aryl group (for example, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group or a phosphonatophenyl group), a heteroaryl group (for example, a group derived from a heteroaryl ring, for example, thiophene, thiathrene, furan, pyran, isobenzofuran, chromene, xanthene, phenoxazine, pyrrole, pyrazole, isothiazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrine, acridine, perimidine, phenanthroline, phenarsazine or furazane), an alkenyl group (for example, a vinyl group, a 1-propenyl group, a 1-butenyl group, a cinnamyl group or a 2-chloro-1-ethenyl group), an alkynyl group (for example, an ethynyl group, a 1-propynyl group, a 1-butynyl group or a trimethylsilylethynyl group), a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, a N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group ($—SO_3H$) and its conjugated base group (hereinafter referred to as a "sulfonato group"), an alkoxysulfonyl group, an aryloxysulfonyl group, a sulfinamoyl group, an N-alkylsulfmamoyl group, an N,N-dialkylsulfinamoyl group, an N-arylsulfinamoyl group, an N,N-diarylsulfinamoyl group, an N-alkyl-N-arylsulfmamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group ($—PO_3H_2$) and its conjugated base group (hereinafter referred to as a "phosphonato group"), a dialkylphosphono group ($—PO_3$(alkyl)$_2$), a diarylphosphono group ($—PO_3$(aryl)$_2$), an alkylarylphosphono group ($—PO_3$(alkyl)(aryl)), a monoalkylphosphono group ($—PO_3H$(alkyl)) and its conjugated base group (hereinafter referred to as an "alkylphosphonato group"), a monoarylphosphono group ($—PO_3H$(aryl)) and its conjugated base group (hereinafter referred to as an "arylphosphonato group"), a phosphonooxy group ($—OPO_3H_2$) and its conjugated base group (hereinafter referred to as a "phosphonatooxy group"), a dialkylphosphonooxy group ($—OPO_3$(alkyl)$_2$), a diarylphosphonooxy group ($—OPO_3$(aryl)$_2$), an alkylarylphosphonooxy group ($—OPO_3$(alkyl)(aryl)), a monoalkylphosphonooxy group ($—OPO_3H$(alkyl)) and its conjugated base group (hereinafter referred to as an "alkylphosphonatooxy group"), a monoarylphosphonooxy group ($—OPO_3H$(aryl)) and its conjugated base group (hereinafter referred to as an "arylphosphonatooxy group"), a cyano group and a nitro group. Among the above-described monovalent non-metallic atomic group, a hydrogen atom, an alkyl group, an aryl group, a halogen atom, an alkoxy group and an acyl group are particularly preferred.

The basic nucleus of the dye formed by Y together with the adjacent A and the adjacent carbon atom in formula (V) includes, for example, a 5-membered, 6-membered or 7-membered, nitrogen-containing or sulfur-containing heterocyclic ring, and is preferably a 5-membered or 6-membered heterocyclic ring.

As the nitrogen-containing heterocyclic ring, those which are known to constitute basic nuclei in merocyanine dyes described in L. G. Brooker et al, *J. Am. Chem. Soc*., Vol. 73, pp. 5326 to 5358 (1951) and references cited therein can be preferably used. Specific examples thereof include thiazoles (for example, thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenyl)thiazole or 4-(2-thienyl)thiazole); benzothiazoles (for example, benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzothiazole, 5-hydroxybenzothiazole, 6-hydroxybenzothiazole, 6-dimethylaminobenzothiazole or 5-ethoxycarbonylbenzothiazole); naphthothiazoles (for example, naphtho[1,2]thiazole, naphtho[2,1]thiazole, 5-methoxynaphtho[2,1]thiazole, 5-ethoxynaphtho[2,1]thiazole, 8-methoxynaphtho[1,2]thiazole or 7-methoxynaphtho[1,2]thiazole); thianaphtheno-7',6',4,5-thiazoles (for example, 4'-methoxythianaphtheno-7',6',4,5-thiazole); oxazoles (for example, 4-methyloxazole, 5-methyloxazole, 4-phenyloxazole, 4,5-diphenyloxazole, 4-ethyloxazole, 4,5-dimethyloxazole or 5-phenyloxazole); benzoxazoles (for example, benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole or 6-hydroxybenzoxazole); naphthoxazoles (for example, naphth[1,2]oxazole or naphth[2,1]oxazole); selenazoles (for example, 4-methylselenazole or 4-phenylselenazole); benzoselenazoles (for example, benzoselenazole, 5-chlorobenzoselenazole, 5-methoxybenzoselenazole, 5-hydroxybenzoselenazole or tetrahydrobenzoselenazole); naphthoselenazoles (for example, naphtho[1,2]selenazole or naphtho[2,1]selenazole); thiazolines (for example, thiazoline or 4-methylthiazoline); 2-quinolines (for example, quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline or 8-hydroxyquinoline); 4-quinolines (for example, quinoline, 6-methoxyquinoline, 7-methylquinoline or 8-methylquinoline); 1-isoquinolines (for example, isoquinoline or 3,4-dihydroisoquinoline); 3-isoquinolines (for example, isoquinoline); benzimidazoles (for example, 1,3-diethylbenzimidazole or 1-ethyl-3-phenylbenzimidazole); 3,3-dialkylindolenines (for example, 3,3-dimethylindolenine, 3,3,5-trimethylindolenine or 3,3,7-trimethylindolenine); and 2-pyridines (for example, pyridine or 5-methylpyridine); and 4-pyridines (for example, pyridine).

Examples of the sulfur-containing heterocyclic ring include dithiol partial structures in dyes described in JP-A-3-296759.

Specific examples thereof include benzodithiols (for example, benzodithiol, 5-tert-butylbenzodithiol or 5-methylbenzodithiol); naphthodithiols (for example, naphtho[1,2]dithiol or naphtho[2,1]dithiol); and dithiols (for example, 4,5-dimethyldithiol, 4-phenyldithiol, 4-methoxycarbonyldithiol, 4,5-dimethoxycarbonyldithiol, 4,5-ditrifluoromethyldithiol, 4,5-dicyanodithiol, 4-methoxycarbonylmethyldithiol or 4-carboxymethyldithiol).

In the description with respect to the heterocyclic ring above, for convenience and by convention, the names of heterocyclic mother skeletons are used. In the case of constituting the basic nucleus partial structure in the sensitizing dye, the heterocyclic ring is introduced in the form of a substituent of alkylydene type where a degree of unsaturation is decreased one step. For example, a benzothiazole skeleton is introduced as a 3-substituted-2(3H)-benzothiazolilydene group.

Of the sensitizing dyes having an absorption maximum in a wavelength range of 350 to 450 nm, dyes represented by formula (IX) shown below are more preferable in view of high sensitivity.

(IX)

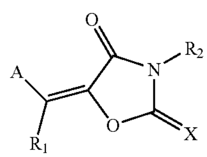

In formula (IX), A represents an aromatic cyclic group which may have a substituent or a heterocyclic group which may have a substituent, X represents an oxygen atom, a sulfur atom or =N($R_3$), and $R_1$, $R_2$ and $R_3$ each independently represents a monovalent non-metallic atomic group, or A and $R_1$ or $R_2$ and $R_3$ may be combined with each other to form an aliphatic or aromatic ring.

The formula (IX) will be described in more detail below. $R_1$, $R_2$ and $R_3$ each independently represents a monovalent non-metallic atomic group, preferably a substituted or unsubstituted alkyl group, a substituted or unsubstituted alkenyl group, a substituted or unsubstituted aryl group, a substituted or unsubstituted aromatic heterocyclic residue, a substituted or unsubstituted alkoxy group, a substituted or unsubstituted alkylthio group, a hydroxy group or a halogen atom.

Preferable examples of $R_1$, $R_2$ and $R_3$ will be specifically described below. Preferable examples of the alkyl group include a straight chain, branched or cyclic alkyl group having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among them, a straight chain alkyl group having from 1 to 12 carbon atoms, a branched alkyl group having from 3 to 12 carbon atoms and a cyclic alkyl group having from 5 to 10 carbon atoms are more preferable.

As the substituent for the substituted alkyl group, a monovalent non-metallic atomic group exclusive of a hydrogen atom is used. Preferable examples thereof include a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-acylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-aryl-sulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and its conjugated base group (hereinafter referred to as a "phosphonato group"), a dialkylphosphono group (—$PO_3$(alkyl)$_2$), a diarylphosphono group (—$PO_3$(aryl)$_2$), an alkylarylphosphono group (—$PO_3$(alkyl)(aryl)), a monoalkylphosphono group (—$PO_3H$(alkyl)) and its conjugated base group (hereinafter referred to as an "alkylphosphonato group"), a monoarylphosphono group (—$PO_3H$(aryl)) and its conjugated base group (hereinafter referred to as an "arylphosphonato group"), a phosphonooxy group (—$OPO_3H_2$) and its conjugated base group (hereinafter referred to as a "phosphonatooxy group"), a dialkylphosphonooxy group (—$OPO_3$(alkyl)$_2$), a diarylphosphonooxy group (—$OPO_3$(aryl)$_2$), an alkylarylphosphonooxy group (—$OPO_3$(alkyl)(aryl)), a monoalkylphosphonooxy group (—$OPO_3H$(alkyl)) and its conjugated base group (hereinafter referred to as an "alkylphosphonatooxy group"), a monoarylphosphonooxy group (—$OPO_3H$(aryl)) and its conjugated base group (hereinafter referred to as an "arylphosphonatooxy group"), a cyano group, a nitro group, an aryl group, a heteroaryl group, an alkenyl group and an alkynyl group.

In the substituents, specific examples of the alkyl group include those described for the alkyl group above. Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methyl thiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group and a phosphonatophenyl group.

Examples of the heteroaryl group include a monocyclic or polycyclic aromatic cyclic group containing at least one of a nitrogen atom, an oxygen atom and a sulfur atom. Examples of especially preferable heteroaryl group include a group derived from a heteroaryl ring, for example, thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrene, acridine, perimidine, phenanthroline, phenarsazine or furazane. These groups may be benzo-fused or may have a substituent.

Also, examples of the alkenyl group include a vinyl group, a 1-propenyl group, a 1-butenyl group, a cinnamyl group and a 2-chloro-1-ethenyl group. Examples of the alkynyl group include an ethynyl group, a 1-propynyl group, a 1-butynyl group and a trimethylsilylethynyl group. Examples of $G_1$ in the acyl group ($G_1$CO—) include a hydrogen atom and the above-described alkyl group and aryl group. Of the substituents, a halogen atom (for example, —F, —Br, —Cl or —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group and an alkenyl group are more preferable.

On the other hand, as an alkylene group in the substituted alkyl group, a divalent organic residue resulting from elimination of any one of hydrogen atoms on the above-described alkyl group having from 1 to 20 carbon atoms can be enumerated. Examples of preferable alkylene group include a straight chain alkylene group having from 1 to 12 carbon atoms, a branched alkylene group having from 3 to 12 carbon atoms and a cyclic alkylene group having from 5 to 10 carbon atoms.

Specific examples of the preferable substituted alkyl group represented by any one of $R_1$, $R_2$ and $R_3$, which is obtained by combining the above-described substituent with the alkylene group, include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

Preferable examples of the aryl group represented by any one of $R_1$, $R_2$ and $R_3$ include a fused ring formed from one to three benzene rings and a fused ring formed from a benzene ring and a 5-membered unsaturated ring. Specific examples thereof include a phenyl group, a naphthyl group, an anthryl group, a phenanthryl group, an indenyl group, an acenaphthenyl group and a fluorenyl group. Among them, a phenyl group and a naphthyl group are more preferable.

Specific examples of the preferable substituted aryl group represented by any one of $R_1$, $R_2$ and $R_3$ include aryl groups having a monovalent non-metallic atomic group exclusive of a hydrogen atom as a substituent on the ring-forming carbon atom of the above-described aryl group. Preferable examples of the substituent include the above-described alkyl groups and substituted alkyl groups, and the substituents described for the above-described substituted alkyl group. Specific examples of the preferable substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allylphenyl group, a 1-propenylmethylphenyl group, a 2-butenylphenyl group, a 2-methylallylphenyl group, a 2-methylpropenylphenyl group, a 2-propynylphenyl group, a 2-butynylphenyl group and a 3-butynylphenyl group.

Specific examples of the preferable substituted or unsubstituted alkenyl group and preferable substituted or unsubstituted aromatic heterocyclic residue represented by any one of $R_1$, $R_2$ and $R_3$ include those described with respect to the alkenyl group and heteroaryl group above, respectively. Also, specific examples of the alkyl group in the preferable substituted or unsubstituted alkoxy group and preferable substituted or unsubstituted alkylthio group include those described with respect to the alkyl group above. Specific examples of the substituent in these groups include those described with respect to the substituted alkyl group above.

Next, A in formula (IX) will be described below. A represents an aromatic cyclic group which may have a substituent or heterocyclic group which may have a substituent. Specific examples of the aromatic cyclic group which may have a substituent and heterocyclic group which may have a substituent include the examples for the aryl group and the heteroaryl group described for any one of $R_1$, $R_2$ and $R_3$ in formula (IX).

The sensitizing dye represented by formula (IX) is obtained by a condensation reaction of the above-described acidic nucleus or an active methyl group-containing acidic nucleus with a substituted or unsubstituted, aromatic ring or hetero ring and can be synthesized with reference to the description of JP-B-59-28329.

Preferable specific examples (D1) to (D75) of the compound represented by formula (IX) are set forth below. Further, when isomers with respect to a double bond connecting an acidic nucleus and a basic nucleus are present in each of the compounds, the invention should not be construed as being limited to any one of the isomers.

(D1)

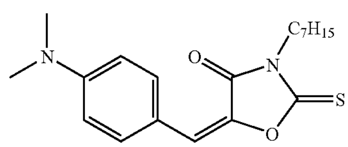

(D2)

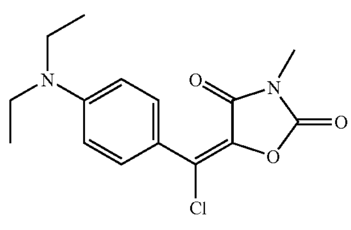

(D3)

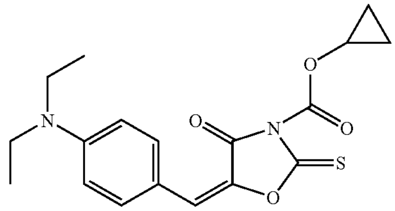

-continued (D4)

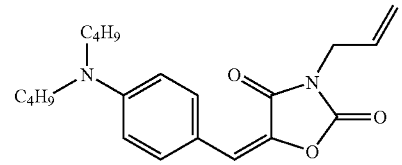

(D5)

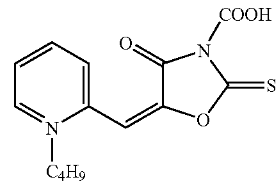

(D6)

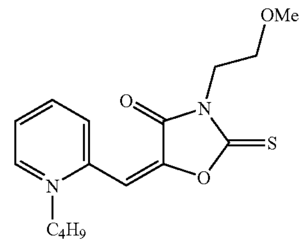

(D7)

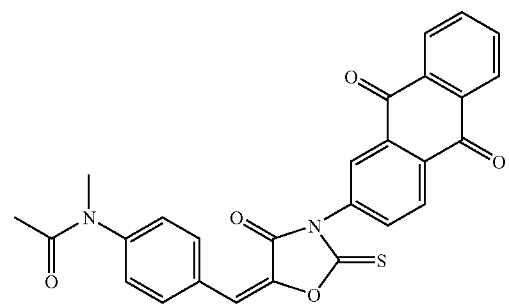

(D8)

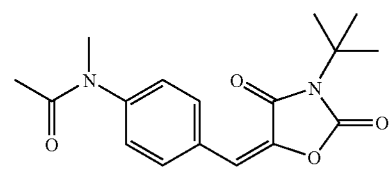

(D9)

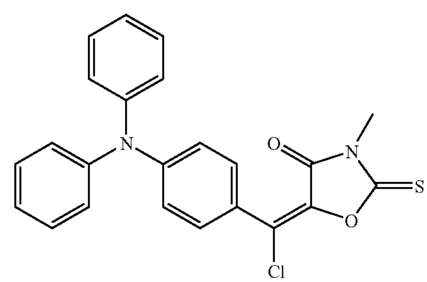

(D10)

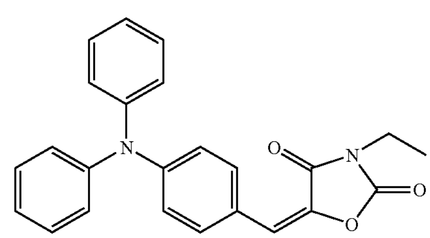

-continued
(D11)
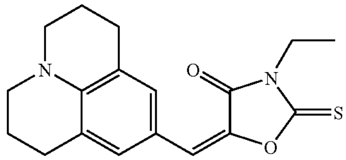
(D12)
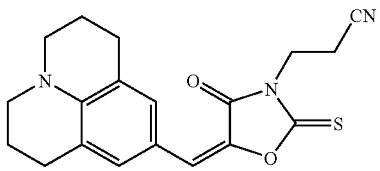
(D13)
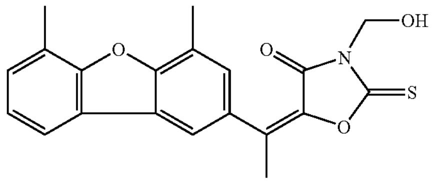
(D14)
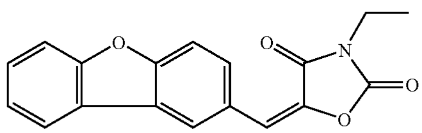
(D15)
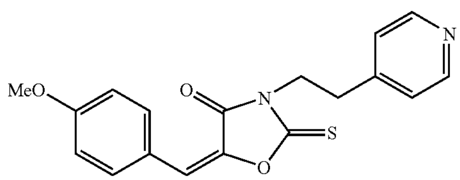
(D16)
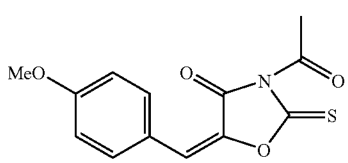
(D17)
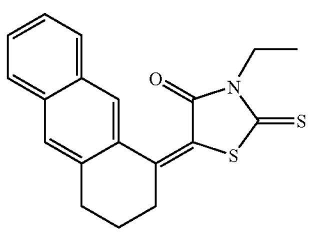
(D18)
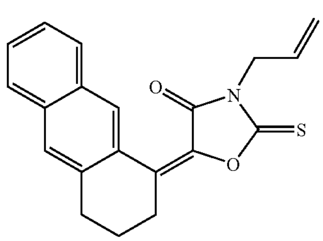
-continued
(D19)
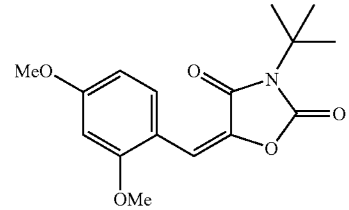
(D20)
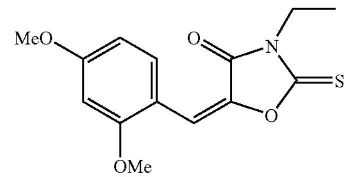
(D21)
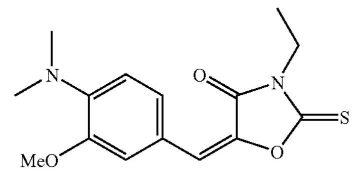
(D22)
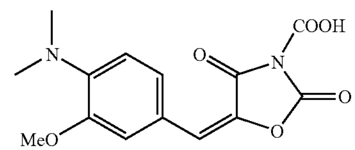
(D23)
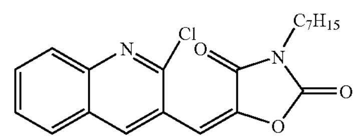
(D24)
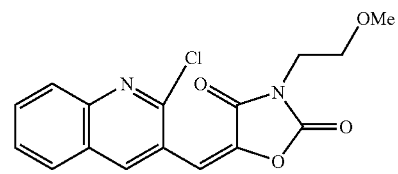
(D25)
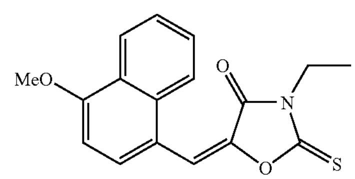
(D26)
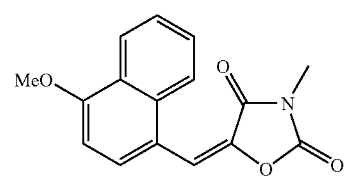
(D27)
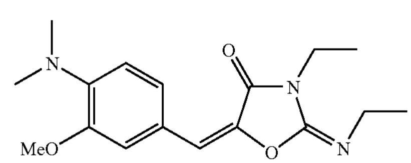

-continued
(D28)
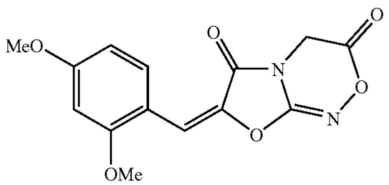
(D29)
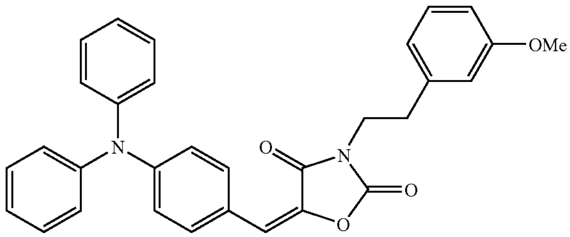
(D30)
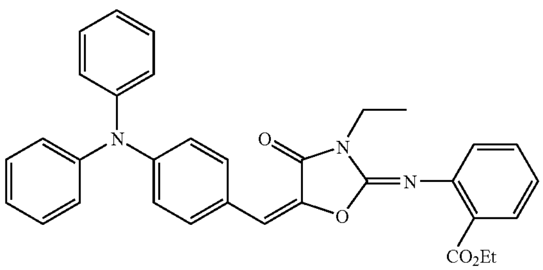
(D31)
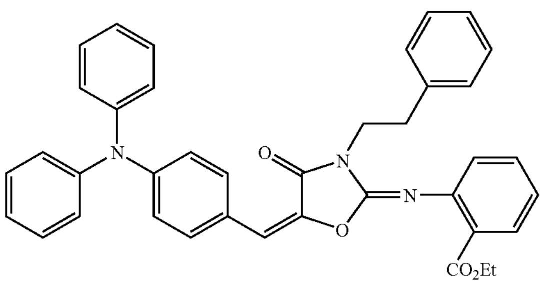
(D32)
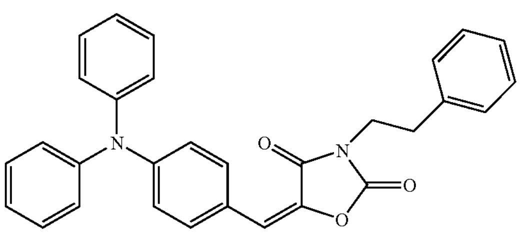
(D33)
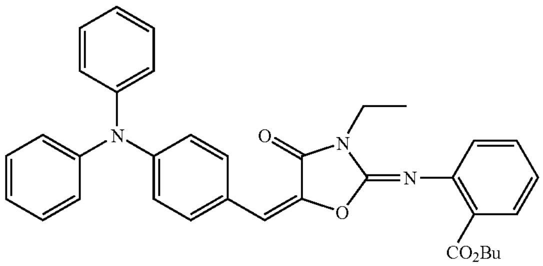
-continued
(D34)
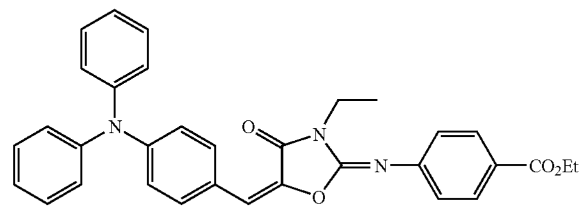
(D35)
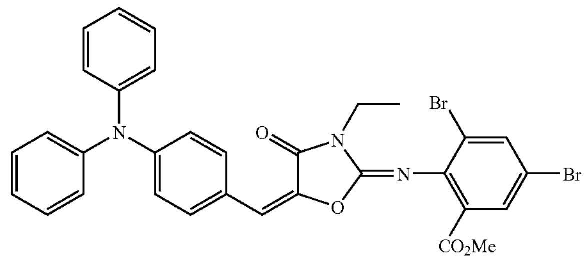
(D36)
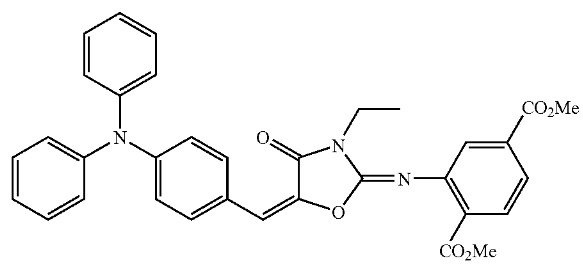
(D37)
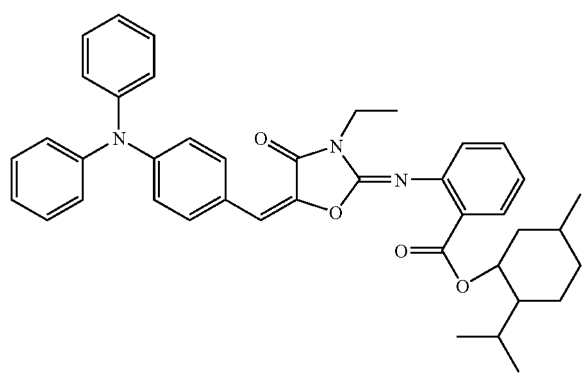
(D38)
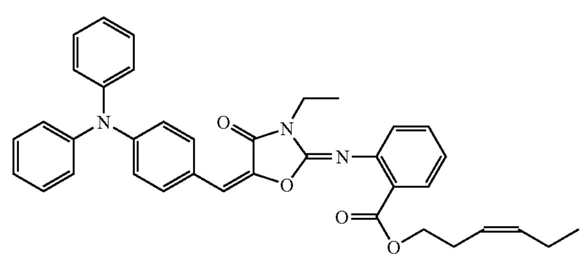
(D39)
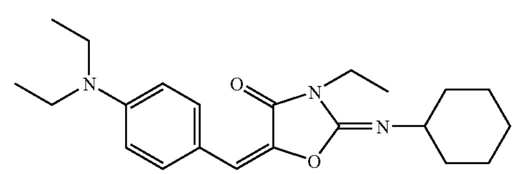

-continued
(D40)
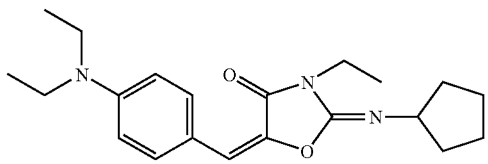
(D41)
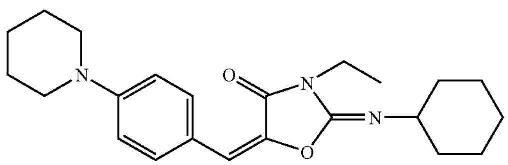
(D42)
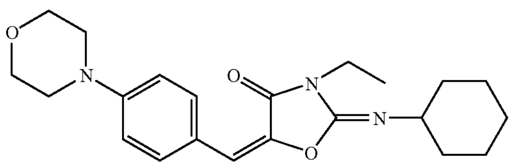
(D43)
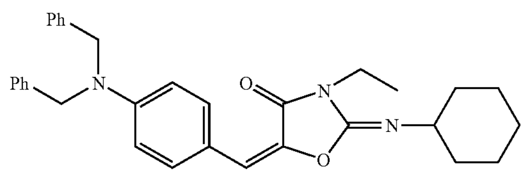
(D44)
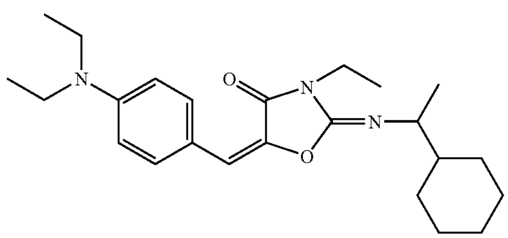
(D45)
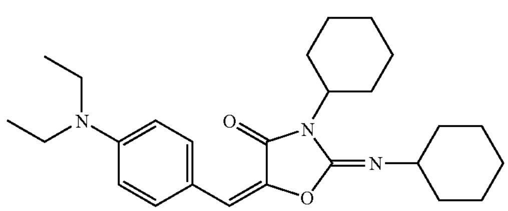
(D46)
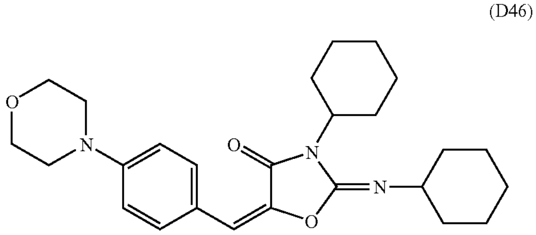
(D47)
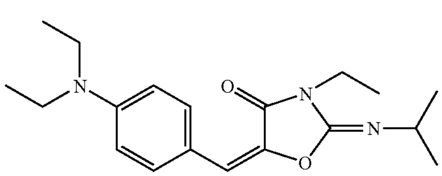
-continued
(D48)
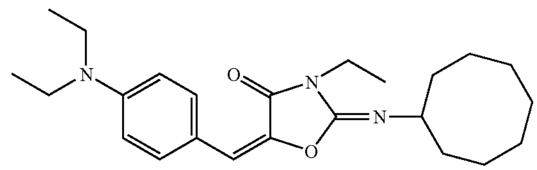
(D49)
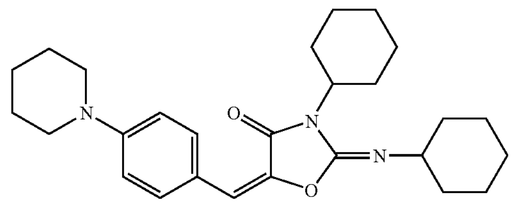
(D50)
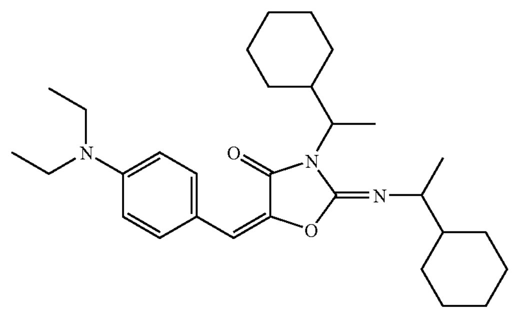
(D51)
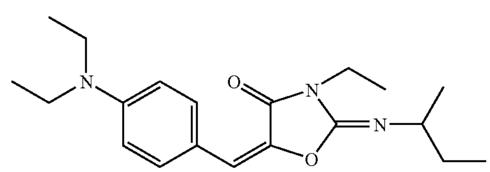
(D52)
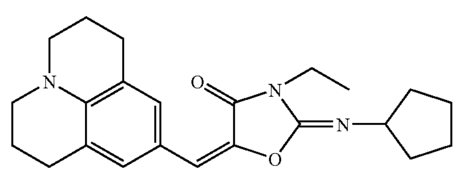
(D53)
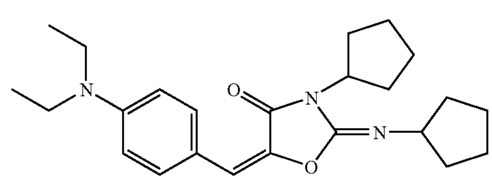
(D54)
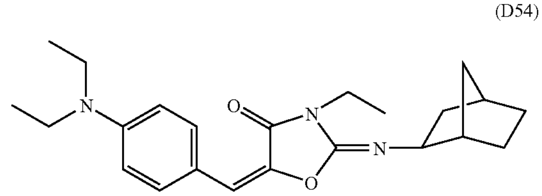

(D55)
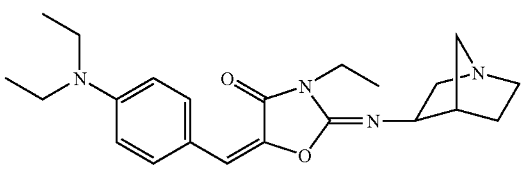
(D56)
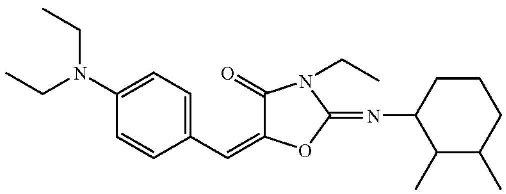
(D57)
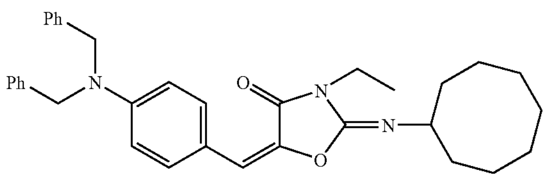
(D58)
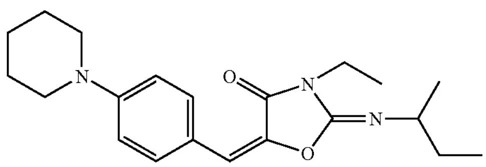
(D59)
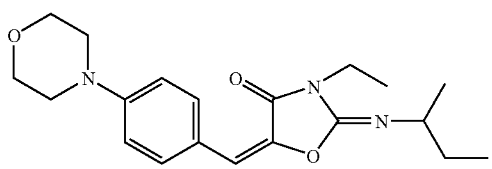
(D60)
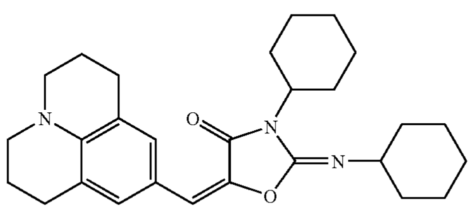
(D61)
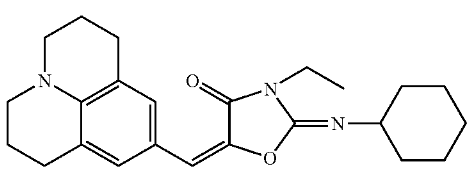
(D62)
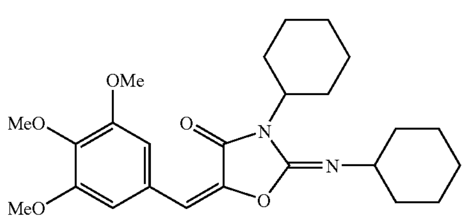
(D63)
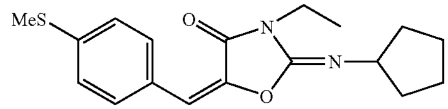
(D64)
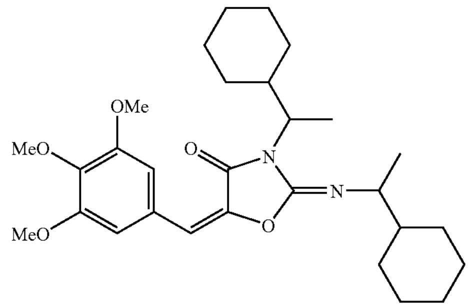
(D65)
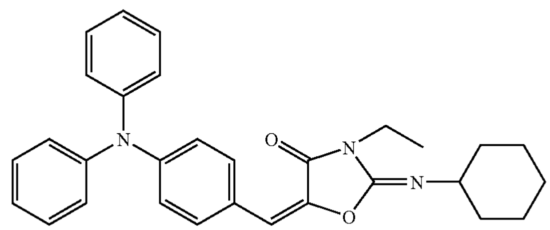
(D66)
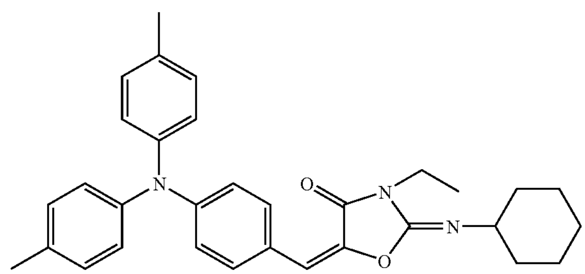
(D67)
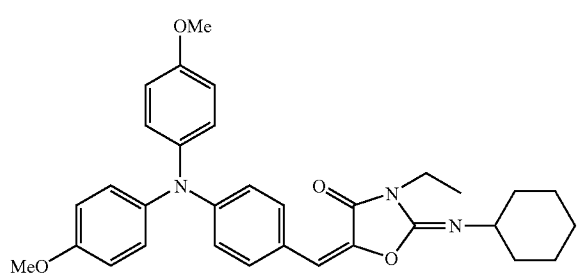
(D68)
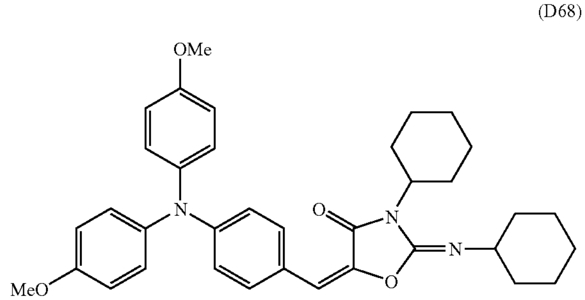

-continued (D69)

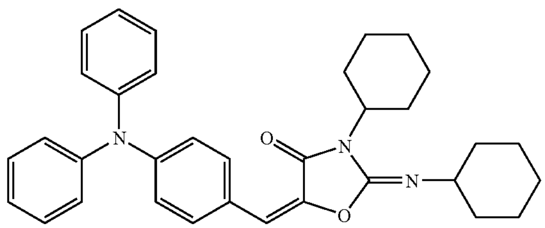

(D70)

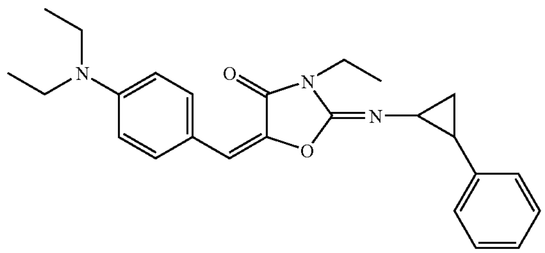

(D71)

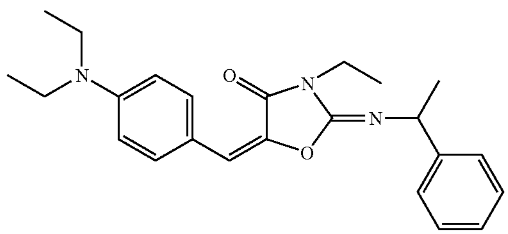

(D72)

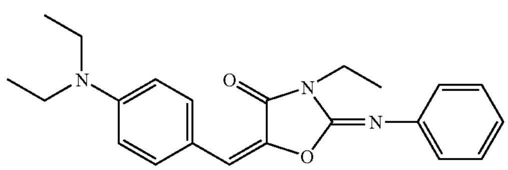

(D73)

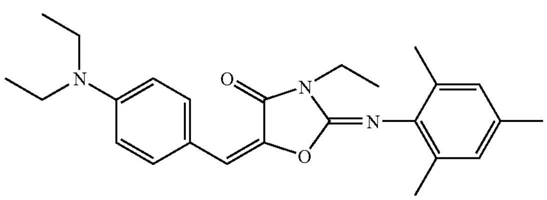

(D74)

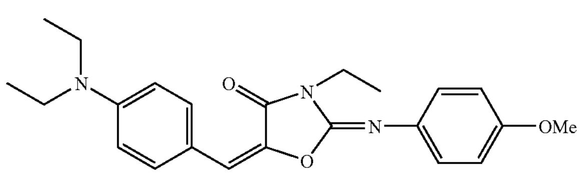

(D75)

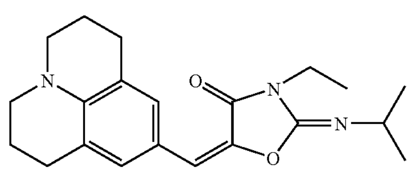

Details of the method of using the sensitizing dye, for example, selection of the structure, individual or combination use or an amount added, can be appropriately determined in accordance with the characteristic design of the final lithographic printing plate precursor.

For instance, when two or more sensitizing dyes are used in combination, the compatibility thereof in the photosensitive layer can be increased. For the selection of sensitizing dye, the molar absorption coefficient thereof at the emission wavelength of the light source used is an important factor in addition to the photosensitivity. Use of the dye having a large molar absorption coefficient is profitable, because the amount of dye added can be made relatively small. Also, in case of using in a lithographic printing plate precursor, the use of such a dye is advantageous in view of physical properties of the photosensitive layer. Since the photosensitivity and resolution of the photosensitive layer and the physical properties of the exposed area of the photosensitive layer are greatly influenced by the absorbance of sensitizing dye at the wavelength of light source, the amount of the sensitizing dye added is appropriately determined by taking account of these factors.

However, for the purpose of curing a layer having a large thickness, for example, of 5 μm or more, low absorbance is sometimes rather effective for increasing the curing degree. In the case of using in a lithographic printing plate precursor where the photosensitive layer has a relatively small thickness, the amount of the sensitizing dye added is preferably selected such that the photosensitive layer has an absorbance from 0.1 to 1.5, preferably from 0.25 to 1. Ordinarily, the amount of the sensitizing dye added is preferably from 0.05 to 30 parts by weight, more preferably from 0.1 to 20 parts by weight, most preferably from 0.2 to 10 parts by weight, per 100 parts by weight of the total solid content of the photosensitive layer.

(2) Infrared Absorbing Agent

The infrared absorbing agent is a component used for increasing sensitivity to an infrared laser. The infrared absorbing agent has a function of converting the infrared ray absorbed to heat. The infrared absorbing agent for use in the invention is preferably a dye or pigment having an absorption maximum in a wavelength range of 760 to 1,200 nm.

As the dye, commercially available dyes and known dyes described in literatures, for example, *Senryo Binran* (*Dye Handbook*) compiled by The Society of Synthetic Organic Chemistry, Japan (1970) can be used. Specifically, the dyes includes azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Examples of preferable dye include cyanine dyes described, for example, in JP-A-58-125246, JP-A-59-84356 and JP-A-60-78787, methine dyes described, for example, in JP-A-58-173696, JP-A-58-181690 and JP-A-58-194595, naphthoquinone dyes described, for example, in JP-A-58-112793, JP-A-58-224793, JP-A-59-48187, JP-A-59-73996, JP-A-60-52940 and JP-A-60-63744, squarylium dyes described, for example, in JP-A-58-112792, and cyanine dyes described, for example, in British Patent 434,875.

Also, near infrared absorbing sensitizers described in U.S. Pat. No. 5,156,938 are preferably used. Further, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, and pyrylium compounds described in JP-B-5-13514 and JP-B-5-19702 are also preferably used. Other preferred examples of the dye include near infrared absorbing dyes represented by formulae (I) and (II) in U.S. Pat. No. 4,756,993.

Other preferable examples of the infrared absorbing dye include specific indolenine cyanine dyes described in JP-A-2002-278057 as illustrated below.

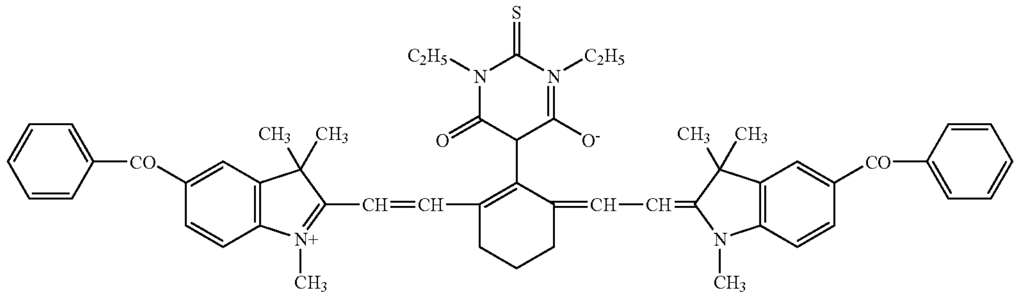

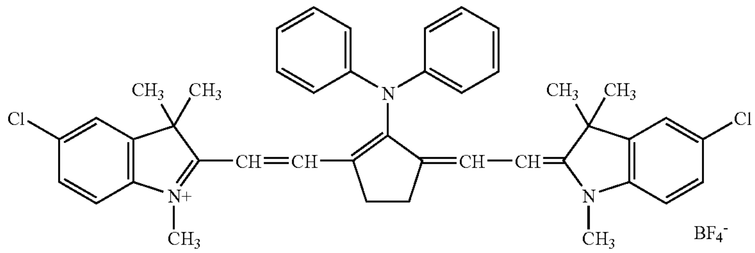

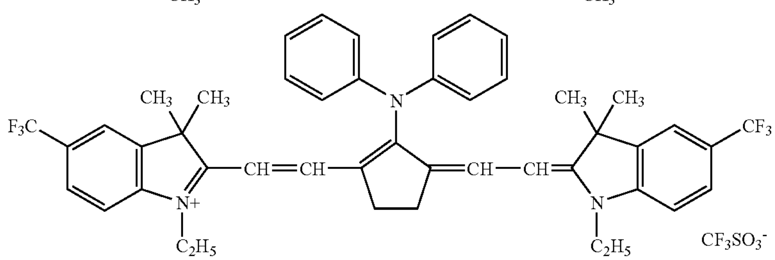

Of the dyes, cyanine dyes, squarylium dyes, pyrylium dyes, nickel thiolate complexes and indolenine cyanine dyes are particularly preferred. Further, cyanine dyes and indolenine cyanine dyes are more preferred. As a particularly preferable example of the dye, a cyanine dye represented by the following formula (I) is exemplified.

Formula (I):

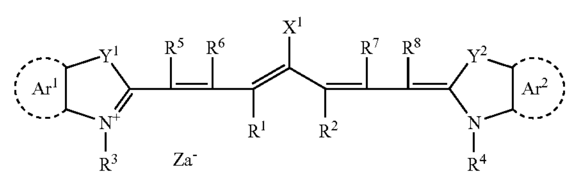

In formula (I), $X^1$ represents a hydrogen atom, a halogen atom, —$NPh_2$, $X^2$-$L^1$ or a group shown below. $X^2$ represents an oxygen atom, a nitrogen atom or a sulfur atom, $L^1$ represents a hydrocarbon group having from 1 to 12 carbon atoms, an aromatic ring containing a hetero atom or a hydrocarbon group having from 1 to 12 carbon atoms and containing a hetero atom. The hetero atom indicates here a nitrogen atom, a sulfur atom, an oxygen atom, a halogen atom or a selenium atom.

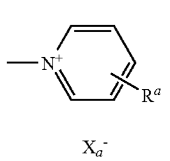

(wherein $Xa^-$ has the same meaning as $Za^-$ defined hereinafter. $R^a$ represents a substituent selected from a hydrogen atom, an alkyl group, an aryl group, a substituted or unsubstituted amino group and a halogen atom.)

$R^1$ and $R^2$ each independently represents a hydrocarbon group having from 1 to 12 carbon atoms. In view of the preservation stability of a coating solution for photosensitive layer, it is preferred that $R^1$ and $R^2$ each represents a hydrocarbon group having two or more carbon atoms, and it is particularly preferred that $R^1$ and $R^2$ are combined with each other to form a 5-membered or 6-membered ring.

$Ar^1$ and $Ar^2$, which may be the same or different, each represents an aromatic hydrocarbon group which may have a substituent. Preferable examples of the aromatic hydrocarbon group include a benzene ring and a naphthalene ring. Also, preferable examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferable examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (I) has an anionic substituent in the structure thereof and neutralization of charge is not needed. Preferable examples of the counter ion for $Za^-$ include a halogen ion, a perchlorate ion, a tetrafluoroborate ion, a hexafluorophosphate ion and a sulfonate ion, and particularly preferable examples thereof include a perchlorate ion, a hexafluorophosphate ion and an arylsulfonate ion in view of the preservation stability of a coating solution for photosensitive layer.

Specific examples of the cyanine dye represented by formula (I), which can be preferably used in the invention, include those described in Paragraph Nos. [0017] to [0019] of JP-A-2001-133969.

Further, other particularly preferable examples include specific indolenine cyanine dyes described in JP-A-2002-278057 described above.

Examples of the pigment for use in the invention include commercially available pigments and pigments described in *Colour Index* (*C.I.*), *Saishin Ganryo Binran* (*Handbook of the Newest Pigments*) compiled by Pigment Technology Society of Japan (1977), *Saishin Ganryo Oyou Gijutsu* (*Newest Application on Technologies for Pigments*), CMC Publishing Co., Ltd. (1986) and *Insatsu Ink Gijutsu* (*Printing Ink Technology*), CMC Publishing Co., Ltd. (1984).

Examples of the pigment include black pigments, yellow pigments, orange pigments, brown pigments, red pigments, purple pigments, blue pigments, green pigments, fluorescent pigments, metal powder pigments and polymer-bonded dyes. Specific examples of usable pigment include insoluble azo pigments, azo lake pigments, condensed azo pigments, chelated azo pigments, phthalocyanine pigments, anthraquinone pigments, perylene and perynone pigments, thioindigo pigments, quinacridone pigments, dioxazine pigments, isoindolinone pigments, quinophthalone pigments, dying lake pigments, azine pigments, nitroso pigments, nitro pigments, natural pigments, fluorescent pigments, inorganic pigments and carbon black. Of the pigments, carbon black is preferred.

The pigment may be used without undergoing surface treatment or may be used after the surface treatment. For the surface treatment, a method of coating a resin or wax on the surface, a method of attaching a surfactant and a method of bonding a reactive substance (for example, a silane coupling agent, an epoxy compound or polyisocyanate) to the pigment surface. The surface treatment methods are described in *Kinzoku Sekken no Seishitsu to Oyo* (*Properties and Applications of Metal Soap*), Saiwai Shobo, *Insatsu Ink Gijutsu* (*Printing Ink Technology*), CMC Publishing Co., Ltd. (1984) and *Saishin Ganryo Oyo Gijutsu* (*Newest Application on Technologies for Pigments*), CMC Publishing Co., Ltd. (1986).

The pigment has a particle size of preferably from 0.01 to 10 μm, more preferably from 0.05 to 1 μm, particularly preferably from 0.1 to 1 μm. In the range described above, good stability and good uniformity of the pigment dispersion in the photosensitive layer can be obtained.

For dispersing the pigment, known dispersion techniques for use in the production of ink or toner may be used. Examples of the dispersing machine include an ultrasonic dispersing machine, a sand mill, an attritor, a pearl mill, a super-mill, a ball mill, an impeller, a disperser, a KD mill, a colloid mill, a dynatron, a three roll mill and a pressure kneader. The dispersing machines are described in detail in *Saishin Ganryo Oyo Gijutsu* (*Newest Application on Technologies for Pigments*), CMC Publishing Co., Ltd. (1986).

The infrared absorbing agent may be added by being incorporated into a microcapsule.

With respect to the amount of the infrared absorbing agent added, the amount is so controlled that absorbance of the photosensitive layer at the maximum absorption wavelength in the wavelength region of 760 to 1,200 nm measured by reflection measurement is in a range of 0.3 to 1.3, preferably in a range of 0.4 to 1.2. In the range described above, the polymerization reaction proceeds uniformly in the thickness direction of the photosensitive layer and good film strength of the image area and good adhesion property of the image area to a support are achieved.

The absorbance of the photosensitive layer can be controlled depending on the amount of the infrared absorbing agent added to the photosensitive layer and the thickness of the photosensitive layer. The measurement of the absorbance can be carried out in a conventional manner. The method for measurement includes, for example, a method of forming a photosensitive layer having a thickness determined appropriately in the range necessary for the lithographic printing plate precursor on a reflective support, for example, an aluminum plate, and measuring reflection density of the photosensitive layer by an optical densitometer or a spectrophotometer according to a reflection method using an integrating sphere.

(Chain Transfer Agent)

The photosensitive layer according to the invention may contain a chain transfer agent. The chain transfer agent contributes to improvements in the sensitivity and preservation stability. Compounds which function as the chain transfer agents include, for example, compounds containing SH, PH, SiH or GeH in their molecules. Such a compound donates hydrogen to a radical species of low activity to generate a radical, or is oxidized and then deprotonated to generate a radical.

In the photosensitive layer according to the invention, a thiol compound (for example, a 2-mercaptobenzimidazole, a 2-mercaptobenzothiazole, a 2-mercaptobenzoxazole, a 3-mercaptotriazole or a 5-mercaptotetrazole) is preferably used as the chain transfer agent.

Among them, a thiol compound represented by formula (II) shown below is particularly preferably used. By using the thiol compound represented by formula (II) as the chain transfer agent, a problem of the odor and decrease in sensitivity due to evaporation of the compound from the photosensitive layer or diffusion thereof into other layers are avoided and a lithographic printing plate precursor which is excellent in preservation stability and exhibits high sensitivity and good printing durability is obtained.

Formula (II)

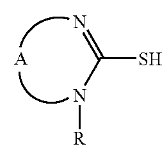

In formula (II), R represents a hydrogen atom, an alkyl group which may have a substituent or an aryl group which may have a substituent; and A represents an atomic group necessary for forming a 5-membered or 6-membered hetero ring containing a carbon atom together with the N═C—N linkage, and A may have a substituent.

Compounds represented by formulae (IIA) and (IIB) shown below are more preferably used.

Formula (IIA)

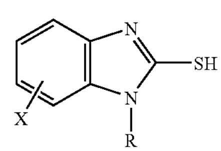

-continued

Formula (IIB)

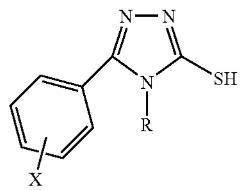

In formulae (IIA) and (IIB), R represents a hydrogen atom, an alkyl group which may have a substituent or an aryl group which may have a substituent; and X represents a hydrogen atom, a halogen atom, an alkoxy group which may have a substituent, an alkyl group which may have a substituent or an aryl group which may have a substituent.

Specific examples of the compound represented by formula (II) are set forth below, but the invention should not be construed as being limited thereto.

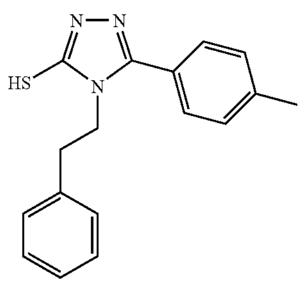

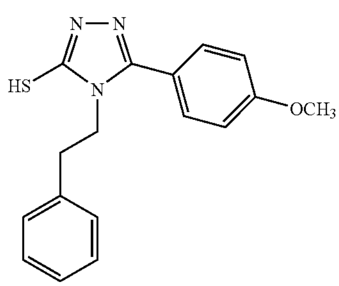

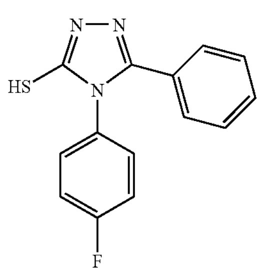

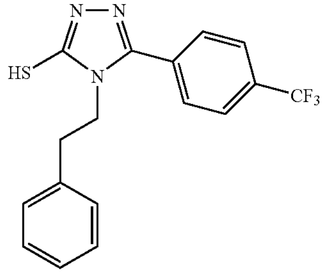

-continued

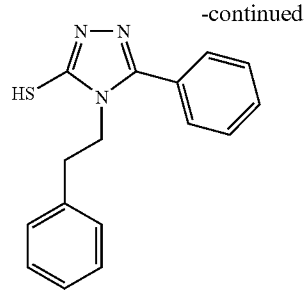

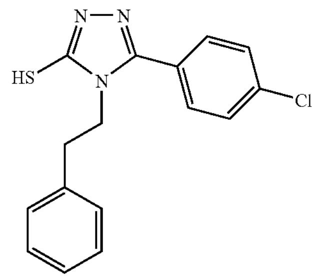

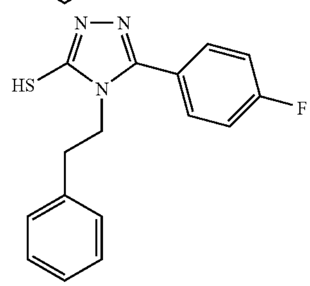

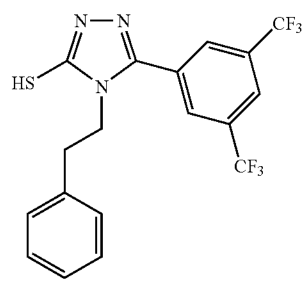

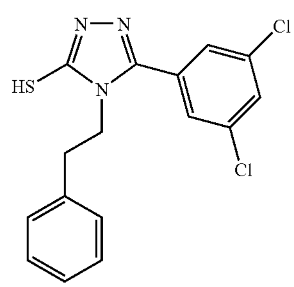

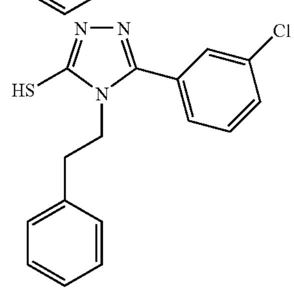

-continued
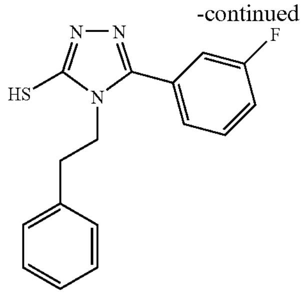
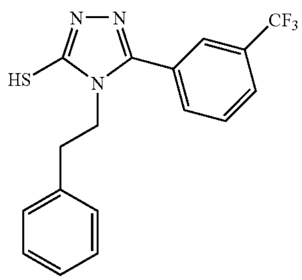
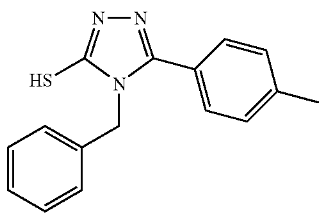
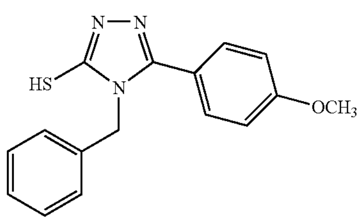
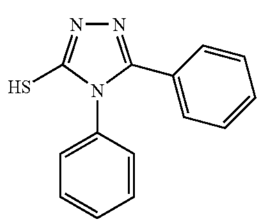
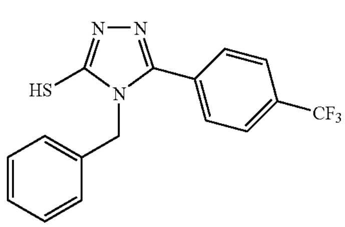
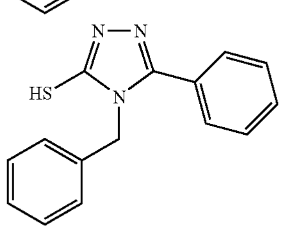
-continued
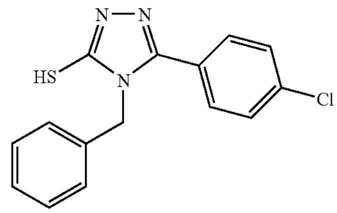
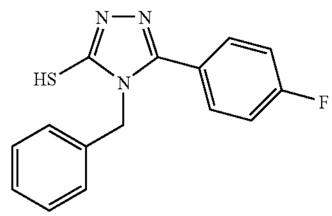
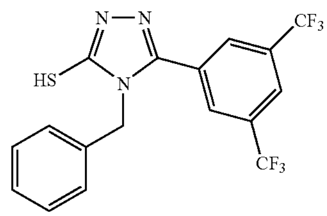
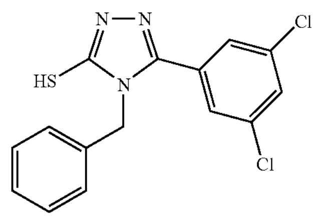
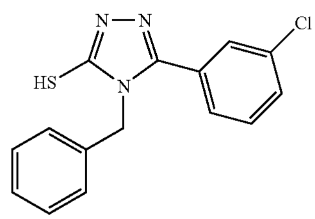
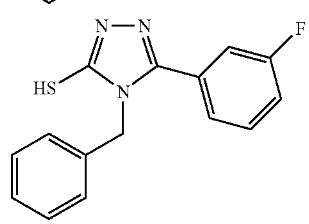
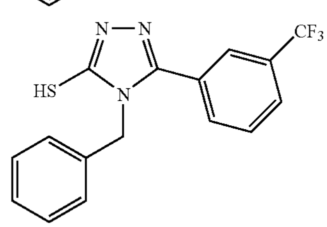
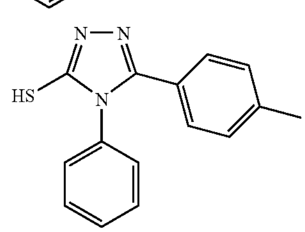

-continued
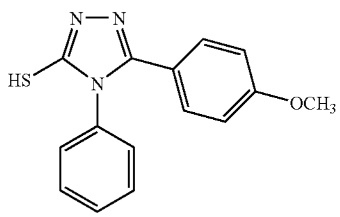
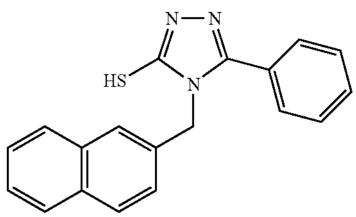
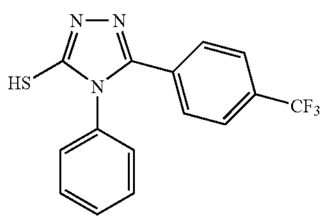
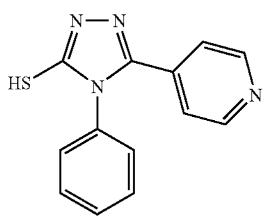
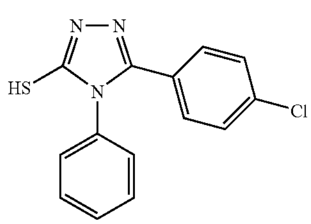
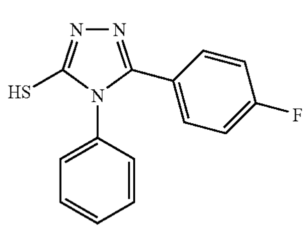
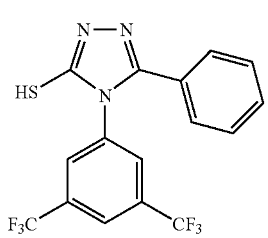
-continued
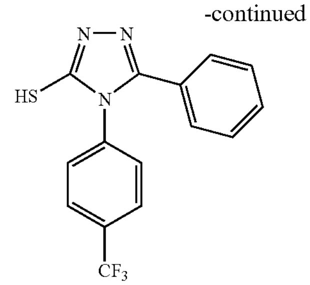
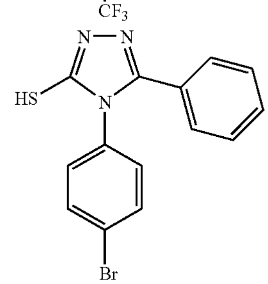
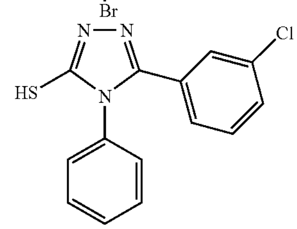
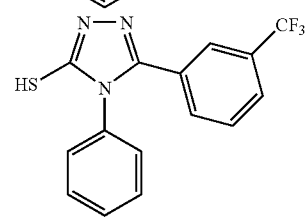
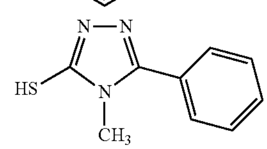
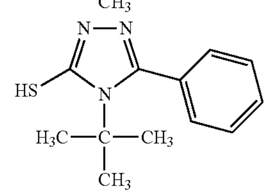
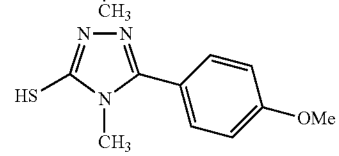
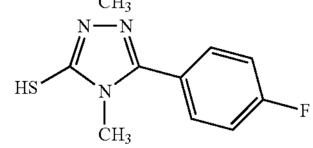
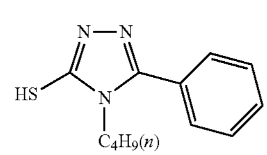
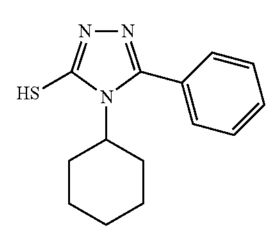

-continued

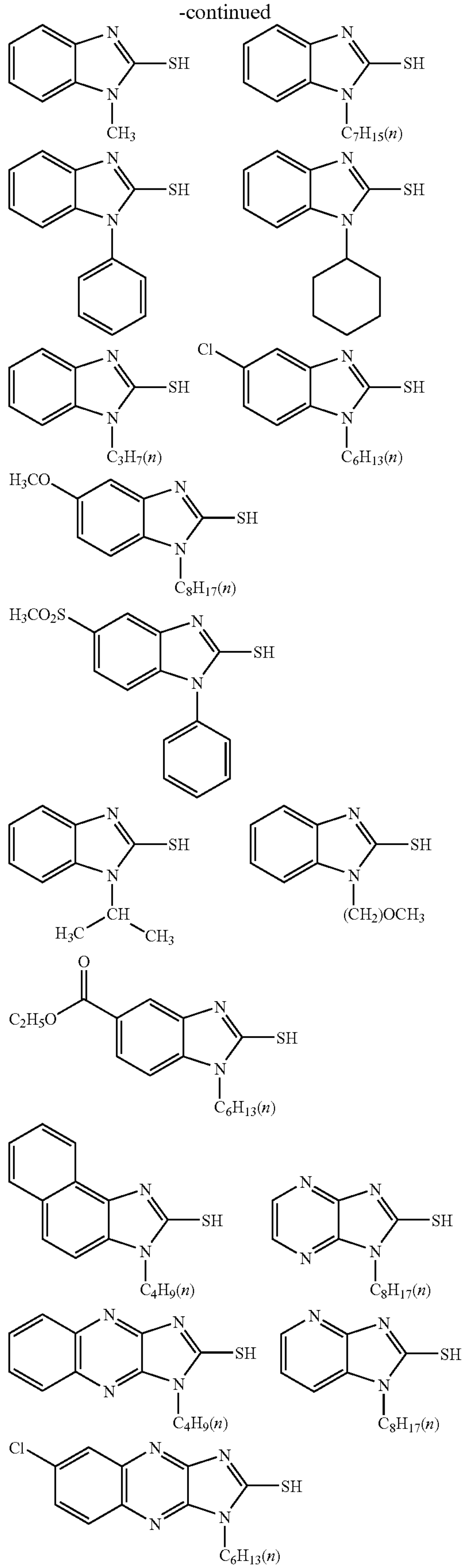

-continued

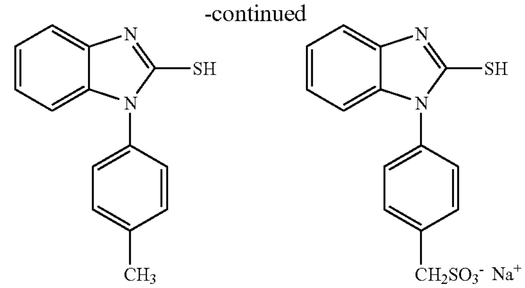

The amount of the chain transfer agent (for example, the thiol compound) used is preferably from 0.01 to 20% by weight, more preferably from 0.1 to 15% by weight, still more preferably from 1.0 to 10% by weight, based on the total solid content of the photosensitive layer.

(Microcapsule)

In the invention, in order to incorporate the above-described constituting components of the photosensitive layer and other constituting components described hereinafter into the photosensitive layer, a part or whole of the constituting components is encapsulated into microcapsules and added to the photosensitive layer as described, for example, in JP-A-2001-277740 and JP-A-2001-277742. In such a case, each constituting component may be present inside or outside the microcapsule in an appropriate ratio.

As a method of microencapsulating the constituting components of the photosensitive layer, known methods can be used. Methods for the production of microcapsules include, for example, a method of utilizing coacervation described in U.S. Pat. Nos. 2,800,457 and 2,800,458, a method of using interfacial polymerization described in U.S. Pat. No. 3,287,154, JP-B-38-19574 and JP-B-42-446, a method of using deposition of polymer described in U.S. Pat. Nos. 3,418,250 and 3,660,304, a method of using an isocyanate polyol wall material described in U.S. Pat. No. 3,796,669, a method of using an isocyanate wall material described in U.S. Pat. No. 3,914,511, a method of using a urea-formaldehyde-type or urea-formaldehyde-resorcinol-type wall-forming material described in U.S. Pat. Nos. 4,001,140, 4,087,376 and 4,089,802, a method of using a wall material, for example, a melamine-formaldehyde resin or hydroxycellulose described in U.S. Pat. No. 4,025,445, an in-situ method by polymerization of monomer described in JP-B-36-9163 and JP-B-51-9079, a spray drying method described in British Patent 930,422 and U.S. Pat. No. 3,111,407, and an electrolytic dispersion cooling method described in British Patents 952,807 and 967,074, but the invention should not be construed as being limited thereto.

A preferable microcapsule wall used in the invention has three-dimensional crosslinking and has a solvent-swellable property. From this point of view, a preferable wall material of the microcapsule includes polyurea, polyurethane, polyester, polycarbonate, polyimide and a mixture thereof, and particularly polyurea and polyurethane are preferred. Further, a compound having a crosslinkable functional group, for example, an ethylenically unsaturated bond, capable of being introduced into the binder polymer described above may be introduced into the microcapsule wall.

The average particle size of the microcapsule is preferably from 0.01 to 3.0 μm, more preferably from 0.05 to 2.0 μm, particularly preferably from 0.10 to 1.0 μm. In the range described above, preferable resolution and good preservation stability can be achieved.

(Surfactant)

In the invention, it is preferred to use a surfactant in the photosensitive layer in order to progress the developing property and to improve the state of surface coated. The surfactant includes, for example, a nonionic surfactant, an anionic surfactant, a cationic surfactant, an amphoteric surfactant and a fluorine-based surfactant. The surfactants may be used individually or in combination of two or more thereof.

The nonionic surfactant used in the invention is not particular restricted, and nonionic surfactants hitherto known can be used. Examples of the nonionic surfactant include polyoxyethylene alkyl ethers, polyoxyethylene alkyl phenyl ethers, polyoxyethylene polystyryl phenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylenated castor oils, polyoxyethylene glycerol fatty acid partial esters, fatty acid diethanolamides, N,N-bis-2-hydroxyalkylamines, polyoxyethylene alkylamines, triethanolamine fatty acid esters, trialylamine oxides, polyethylene glycols and copolymers of polyethylene glycol and polypropylene glycol.

The anionic surfactant used in the invention is not particularly restricted and anionic surfactants hitherto known can be used. Examples of the anionic surfactant include fatty acid salts, abietic acid salts, hydroxyalkanesulfonic acid salts, alkanesulfonic acid salts, dialkylsulfosuccinic ester salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-methyl-N-oleyltaurine sodium salt, N-alkylsulfosuccinic monoamide disodium salts, petroleum sulfonic acid salts, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styrylphenyl ether sulfate ester salts, alkyl phosphate ester salts, polyoxyethylene alkyl ether phosphate ester salts, polyoxyethylene alkyl phenyl ether phosphate ester salts, partial saponification products of styrene/maleic anhydride copolymer, partial saponification products of olefin/maleic anhydride copolymer and naphthalene sulfonate formalin condensates.

The cationic surfactant used in the invention is not particularly restricted and cationic surfactants hitherto known can be used. Examples of the cationic surfactant include alkylamine salts, quaternary ammonium salts, polyoxyethylene alkyl amine salts and polyethylene polyamine derivatives.

The amphoteric surfactant used in the invention is not particularly restricted and amphoteric surfactants hitherto known can be used. Examples of the amphoteric surfactant include carboxybetaines, aminocarboxylic acids, sulfobetaines, aminosulfuric esters and imidazolines.

In the surfactants described above, the term “polyoxyethylene” can be replaced with “polyoxyalkylene”, for example, polyoxymethylene, polyoxypropylene or polyoxybutylene, and such surfactants can also be used in the invention.

Further, a preferable surfactant includes a fluorine-based surfactant containing a perfluoroalkyl group in its molecule. Examples of the fluorine-based surfactant include an anionic type, for example, perfluoroalkyl carboxylates, perfluoroalkyl sulfonates or perfluoroalkylphosphates; an amphoteric type, for example, perfluoroalkyl betaines; a cationic type, for example, perfluoroalkyl trimethyl ammonium salts; and a nonionic type, for example, perfluoroalkyl amine oxides, perfluoroalkyl ethylene oxide adducts, oligomers having a perfluoroalkyl group and a hydrophilic group, oligomers having a perfluoroalkyl group and an oleophilic group, oligomers having a perfluoroalkyl group, a hydrophilic group and an oleophilic group or urethanes having a perfluoroalkyl group and an oleophilic group. Further, fluorine-based surfactants described in JP-A-62-170950, JP-A-62-226143 and JP-A-60-168144 are also preferably exemplified.

The content of the surfactant is preferably from 0.001 to 10% by weight, more preferably from 0.01 to 7% by weight, based on the total solid content of the photosensitive layer.

(Hydrophilic Polymer)

In the invention, a hydrophilic polymer may be incorporated into the photosensitive layer in order to improve the developing property and dispersion stability of microcapsule.

Preferable examples of the hydrophilic polymer include those having a hydrophilic group, for example, a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group and a phosphoric acid group.

Specific examples of the hydrophilic polymer include gum arabic, casein, gelatin, a starch derivative, carboxymethyl cellulose or a sodium salt thereof, cellulose acetate, sodium alginate, a vinyl acetate-maleic acid copolymer, a styrene-maleic acid copolymer, polyacrylic acid or a salt thereof, polymethacrylic acid or a salt thereof, a homopolymer or copolymer of hydroxyethyl methacrylate, a homopolymer or copolymer of hydroxyethyl acrylate, a homopolymer or copolymer of hydroxypropyl methacrylate, a homopolymer or copolymer of hydroxypropyl acrylate, a homopolymer or copolymer of hydroxybutyl methacrylate, a homopolymer or copolymer of hydroxybutyl acrylate, polyethylene glycol, a hydroxypropylene polymer, polyvinyl alcohol, a hydrolyzed polyvinyl acetate having a hydrolysis degree of 60% by mole or more, preferably 80% by mole or more, polyvinyl formal, polyvinyl butyral, polyvinyl pyrrolidone, a homopolymer or polymer of acrylamide, a homopolymer or copolymer of methacrylamide, a homopolymer or copolymer of N-methylolacrylamide, an alcohol-soluble nylon, and a polyether of 2,2-bis(4-hydroxyphenyl)propane with epichlorohydrin.

The hydrophilic polymer preferably has a weight average molecular weight of 5,000 or more, more preferably from 10,000 to 300,000. The hydrophilic polymer may be any of a random polymer, a block polymer, a graft polymer or the like.

The content of the hydrophilic polymer in the photosensitive layer is preferably 20% by weight or less, more preferably 10% by weight or less, based on the total solid content of the photosensitive layer.

(Coloring Agent)

In the invention, a dye having large absorption in the visible light region can be used as a coloring agent for the image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (produced by Orient Chemical Industry Co., Ltd.), Victoria Pure Blue, Crystal Violet (CI42555), Methyl Violet (CI42535), Ethyl Violet, Rhodamine B (CI45170B), Malachite Green (CI42000), Methylene Blue (CI52015), and dyes described in JP-A-62-293247. Also, a pigment, for example, phthalocyanine-based pigment, azo-based pigment, carbon black and titanium oxide can be preferably used.

It is preferable to add the coloring agent, because the image area and the non-image area after the image formation can be easily distinguished. The amount of the coloring agent added is preferably from 0.01 to 10% by weight based on the total solid content of the photosensitive layer.

(Print-Out Agent)

In the photosensitive layer according to the invention, a compound capable of undergoing discoloration by the effect of an acid or a radical can be added in order to form a print-out image. As such a compound, for example, various dyes, e.g., diphenylmethane-based, triphenylmethane-based, thiazine-based, oxazine-based, xanthene-based, anthraquinone-based, iminoquinone-based, azo-based and azomethine-based dyes are effectively used.

Specific examples thereof include dyes, for example, Brilliant Green, Ethyl Violet, Methyl Green, Crystal Violet, Basic Fuchsine, Methyl Violet 2B, Quinaldine Red, Rose Bengale, Metanil Yellow, Thymolsulfophthalein, Xylenol Blue, Methyl Orange, Paramethyl Red, Congo Red, Benzopurpurine 4B, α-Naphthyl Red, Nile Blue 2B, Nile Blue A, Methyl Violet, Malachite Green, Parafuchsin, Victoria Pure Blue BOH (produced by Hodogaya Chemical Co., Ltd.), Oil Blue #603 (produced by Orient Chemical Industry Co., Ltd.), Oil Pink #312 (produced by Orient Chemical Industry Co., Ltd.), Oil Red 5B (produced by Orient Chemical Industry Co., Ltd.), Oil Scarlet #308 (produced by Orient Chemical Industry Co., Ltd.), Oil Red OG (produced by Orient Chemical Industry Co., Ltd.), Oil Red RR (produced by Orient Chemical Industry Co., Ltd.), Oil Green #502 (produced by Orient Chemical Industry Co., Ltd.), Spiron Red BEH Special (produced by Hodogaya Chemical Co., Ltd.), m-Cresol Purple, Cresol Red, Rhodamine B, Rhodamine 6G, Sulforhodamine B, Auramine, 4-p-diethylaminophenyliminonaphthoquinone, 2-carboxyanilino-4-p-diethylaminophenyliminonaphthoquinone, 2-carboxystearylamino-4-p-N,N-bis(hydroxyethyDaminophenyliminonaphthoquinone, 1-phenyl-3-methyl-4-p-diethylaminophenylimino-5-pyrazolone and 1-β-naphthyl-4-p-diethylaminophenylimino-5-pyrazolone, and leuco dyes, for example, p,p',p"-hexamethyltriaminotriphenyl methane (leuco Crystal Violet) and Pergascript Blue SRB (produced by Ciba Geigy).

Other preferable examples include leuco dyes known as a material for heat-sensitive paper or pressure-sensitive paper. Specific examples thereof include Crystal Violet Lactone, Malachite Green Lactone, Benzoyl Leuco Methylene Blue, 2-(N-phenyl-N-methylamino)-6-(N-p-tolyl-N-ethyl)aminofluorane, 2-anilino-3-methyl-6-(N-ethyl-p-toluidino)fluorane, 3,6-dimethoxyfluorane, 3-(N,N-diethylamino)-5-methyl-7-(N,N-dibenzylamino)fluorane, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-xylidino-fluorane, 3-(N,N-diethylamino)-6-methyl-7-chlorofluorane, 3-(N,N-diethylamino)-6-methoxy-7-aminofluorane, 3-(N,N-diethylamino)-7-(4-chloroanilino)fluorane, 3-(N,N-diethylamino)-7-chlorofluorane, 3-(N,N-diethylamino)-7-benzylaminofluorane, 3-(N,N-diethylamino)-7,8-benzofluorane, 3-(N,N-dibutylamino)-6-methyl-7-anilinofluorane, 3-(N,N-dibutylamino)-6-methyl-7-xylklinofluorane, 3-piperidino-6-methyl-7-anilinofluorane, 3-pyrrolidino-6-methyl-7-anilinofluorane, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide and 3-(4-diethylaminophenyl)-3-(1-ethyl-2-methylindol-3-yl) phthalide.

The dye capable of undergoing discoloration by the effect of an acid or a radical is preferably added in an amount of 0.01 to 15% by weight based on the total solid content of the photosensitive layer.

(Polymerization Inhibitor)

It is preferred that a thermal polymerization inhibitor is added to the lithographic printing plate precursor according to the invention in order to prevent undesirable thermal polymerization of the compound having a polymerizable ethylenically unsaturated bond during the production and preservation of the lithographic printing plate precursor. In particular, in the production of the above-described polyurethane including a crosslinkable group, it is preferred to add the polymerization inhibitor also at the production of polyurethane for the purpose of restraining thermal polymerization of the crosslinkable group and improving preservation stability.

As the thermal polymerization inhibitor suitable for use in the invention, a compound selected from the group consisting of a compound containing a phenolic hydroxy group, an N-oxide compound, a piperidine-1-oxyl free radical compound, a pyrrolidine-1-oxyl free radical compound, an N-nitrosophenyl hydroxylamine, a diazonium compound and a cationic dye is preferable.

Among them, it is more preferable that the compound containing a phenolic hydroxy group is selected from the group consisting of hydroquinone, p-methoxyphenol, di-tert-butyl-p-cresol, pyrogallol, tert-butylcatechol, benzoquinone, 4,4-thiobis(3-methyl-6-tert-butylphenol), 2,2'-methylenebis (4-methyl-6-tert-butylphenol), a phenol resin and a cresol resin; the N-oxide compound is selected from the group consisting of 5,5-dimethyl-1-pyrrolin-N-oxide, 4-methylmorpholine-N-oxide, pyridine-N-oxide, 4-nitropyridine-N-oxide, 3-hydroxypyridine-N-oxide, picolinic acid-N-oxide, nicotinic acid-N-oxide and isonicotinic acid-N-oxide; the piperidine-1-oxyl free radical compound is selected from the group consisting of piperidine-1-oxyl free radical, 2,2,6,6-tetramethylpiperidine-1-oxyl free radical, 4-oxo-2,2,6,6-tetramethylpiperidine-1-oxyl free radical, 4-hydroxy-2,2,6,6-tetramethylpiperidine-1-oxyl free radical, 4-acetamido-2,2,6,6-tetramethylpiperidine-1-oxyl free radical, 4-maleimido-2,2,6,6-tetramethylpiperidine-1-oxyl free radical and 4-phophonoxy-2,2,6,6-tetramethylpiperidine-1-oxyl free radical; the pyrrolidine-1-oxyl free radical compound is 3-carboxyproxyl free radical (3-carboxy-2,2,5,5-tetramethyl pyrrolidine-1-oxyl free radical); the N-nitrosophenyl hydroxylamine is a compound selected from the group consisting of N-nitrosophenylhydroxylamine primary cerium salt and N-nitrosophenylhydroxylamine aluminum salt; the diazonium compound is a compound selected from the group consisting of hydrogen sulfate of 4-diazophenyldimethylamine, tetrafluoroborate of 4-diazophenyldimethylamine and hexafluorophsphate of 3-methoxy-4-diazophenyldimethylamine; and the cationic dye is a compound selected from the group consisting of Crystal Violet, Methyl Violet, Ethyl Violet and Victoria Pure Blue BOH.

Further, in view of preventing a side reaction caused by the thermal polymerization inhibitor at the synthesis of polyurethane, it is preferable to use benzoquinone or its derivative, more specifically, a 1,4-benzoquinine derivative having 8 or more carbon atoms. Further, 2,5-di-tert-butyl-1,4-benzoquinine, 2-tert-butyl-1,4-benzoquinine, naphthoquinone, 2,5-diphenyl-p-benzoquinone, phenyl-p-quinone, 2,3,5,6-tetramethyl-1,4-benzoquinine or 2,5-diamylbenzoquinine is more preferable.

The amount of the polymerization inhibitor included in the lithographic printing plate precursor according to the invention is preferably from 0.01 to 10,000 ppm, more preferably from 0.1 to 5,000 ppm, most preferably from 0.5 to 3,000 ppm, based on the weight of the image-forming layer.

(Higher Fatty Acid Derivative)

In the photosensitive layer according to the invention, for example, a higher fatty acid derivative, e.g., behenic acid or behenic acid amide may be added and localized on the surface of the photosensitive layer during the process of drying after coating in order to avoid polymerization inhibition due to oxygen. The amount of the higher fatty acid derivative added is preferably from about 0.1 to about 10% by weight based on the total solid content of the photosensitive layer.

(Plasticizer)

The photosensitive layer according to the invention may contain a plasticizer. Preferable examples of the plasticizer include a phthalic acid ester, for example, dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate or diallyl phthalate; a glycol ester, for example, dimethyl glycol phthalate, ethyl phthalylethyl glycolate, methyl phthalylethyl glycolate, butyl phthalylbutyl glycolate or triethylene glycol dicaprylic acid ester; a phosphoric acid ester, for example, tricresyl phosphate or triphenyl phosphate; an aliphatic dibasic acid ester, for example, diisobutyl adipate, dioctyl adipate, dimethyl sebacate, dibutyl sebacate, dioctyl azelate or dibutyl maleate; polyglycidyl methacrylate, triethyl citrate, glycerin triacetyl ester and butyl laurate. The content of the plasticizer is preferably about 30% by weight or less based on the total solid content of the photosensitive layer.

(Fine Inorganic Particle)

The photosensitive layer according to the invention may contain fine inorganic particle in order to increase strength of the cured layer in the image area. The fine inorganic particle preferably includes, for example, silica, alumina, magnesium oxide, titanium oxide, magnesium carbonate, calcium alginate and a mixture thereof. Even if the fine inorganic particle has no light to heat converting property, it can be used, for example, for strengthening the layer or enhancing interface adhesion property due to surface roughening. The fine inorganic particle preferably has an average particle size from 5 nm to 10 μm, more preferably from 0.5 to 3 μm. In the range described above, it is stably dispersed in the photosensitive layer, sufficiently maintains the film strength of the photosensitive layer and can form the non-image area excellent in hydrophilicity and preventing from the occurrence of stain at the printing.

The fine inorganic particle described above is easily available as a commercial product, for example, colloidal silica dispersion.

The content of the fine inorganic particle is preferably 20% by weight or less, more preferably 10% by weight or less, based on the total solid content of the photosensitive layer.

(Hydrophilic Low Molecular Weight Compound)

The photosensitive layer according to the invention may contain a hydrophilic low molecular weight compound in order to improve the developing property. The hydrophilic low molecular weight compound includes a water-soluble organic compound, for example, a glycol compound, e.g., ethylene glycol, diethylene glycol, triethylene glycol, propylene glycol, dipropylene glycol or tripropylene glycol, or an ether or ester derivative thereof, a polyhydroxy compound, e.g., glycerine or pentaerythritol, an organic amine, e.g., triethanol amine, diethanol amine or monoethanol amine, or a salt thereof, an organic sulfonic acid, e.g., toluene sulfonic acid or benzene sulfonic acid, or a salt thereof, an organic phosphonic acid, e.g., phenyl phosphonic acid, or a salt thereof, an organic carboxylic acid, e.g., tartaric acid, oxalic acid, citric acid, maleic acid, lactic acid, gluconic acid or an amino acid, or a salt thereof, and an organic quaternary ammonium salt, e.g., tetraethyl ammonium hydrochloride.

[Method for Preparation of Lithographic Printing Plate Precursor]

Next, a method for preparation of a lithographic printing plate precursor is described in more detail below. The lithographic printing plate precursor comprises an image-forming layer described above on a hydrophilic support and may also appropriately have a protective layer, an undercoat layer or a backcoat layer depending on the use.

(Formation of Image-Forming Layer)

The image-forming layer according to the invention is formed by dispersing or dissolving each of the necessary constituting components described above to prepare a coating solution and coating the solution. The solvent used include, for example, ethylene dichloride, cyclohexanone, methyl ethyl ketone, methanol, ethanol, propanol, ethylene glycol monomethyl ether, 1-methoxy-2-propanol, 2-methxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water, but the invention should not be construed as being limited thereto. The solvents may be used individually or as a mixture. The solid concentration of the coating solution is preferably from 1 to 50% by weight.

The photosensitive layer according to the invention may also be formed by preparing plural coating solutions by dispersing or dissolving the same or different components described above into the same or different solvents and conducting repeatedly plural coating and drying.

The coating amount (solid content) of the photosensitive layer on the support after the coating and drying may be varied depending on the use, but ordinarily, it is preferably from 0.3 to 3.0 $g/m^2$. In the range described above, the preferable sensitivity and good film property of the photosensitive layer can be obtained.

Various methods can be used for the coating. Examples of the method include bar coater coating, spin coating, spray coating, curtain coating, dip coating, air knife coating, blade coating and roll coating.

(Support)

The support for use in the lithographic printing plate precursor according to the invention is not particularly restricted as long as it is a dimensionally stable plate-like hydrophilic support. The support includes, for example, paper, paper laminated with plastic (for example, polyethylene, polypropylene or polystyrene), a metal plate (for example, aluminum, zinc or copper plate), a plastic film (for example, cellulose diacetate, cellulose triacetate, cellulose propionate, cellulose butyrate, cellulose acetatebutyrate, cellulose nitrate, polyethylene terephthalate, polyethylene, polystyrene, polypropylene, polycarbonate or polyvinyl acetal film) and paper or a plastic film laminated or deposited with the metal described above. Preferable examples of the support include a polyester film and an aluminum plate. Among them, the aluminum plate is preferred since it has good dimensional stability and is relatively inexpensive.

The aluminum plate includes a pure aluminum plate, an alloy plate comprising aluminum as a main component and containing a trace amount of hetero elements and a thin film of aluminum or aluminum alloy laminated with plastic. The hetero element contained in the aluminum alloy includes, for example, silicon, iron, manganese, copper, magnesium, chromium, zinc, bismuth, nickel and titanium. The content of the hetero element in the aluminum alloy is preferably 10% by weight or less. Although a pure aluminum plate is preferred in the invention, since completely pure aluminum is difficult to be produced in view of the refining technique, the aluminum plate may slightly contain the hetero element. The composition is not specified for the aluminum plate and those materials known and used conventionally can be appropriately utilized.

The thickness of the support is preferably from 0.1 to 0.6 mm, more preferably from 0.15 to 0.4 mm, still more preferably from 0.2 to 0.3 mm Prior to the use of aluminum plate, a surface treatment, for example, roughening treatment or anodizing treatment is preferably performed. The surface treatment facilitates improvement in the hydrophilic property and ensures adhesion between the photosensitive layer and the support. In advance of the roughening treatment of the aluminum plate, a degreasing treatment, for example, with a surfactant, an organic solvent or an aqueous alkaline solution is conducted for removing rolling oil on the surface thereof, if desired.

The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively).

As the method of the mechanical roughening treatment, a known method, for example, a ball grinding method, a brush grinding method, a blast grinding method or a buff grinding method can be used.

The electrochemical roughening treatment method includes, for example, a method of conducting it by passing alternating current or direct current in an electrolyte containing an acid, for example, hydrochloric acid or nitric acid. Also, a method of using a mixed acid described in JP-A-54-63902 can be used.

The aluminum plate after the roughening treatment is then subjected, if desired, to an alkali etching treatment using an aqueous solution, for example, of potassium hydroxide or sodium hydroxide and further subjected to a neutralizing treatment, and then subjected to an anodizing treatment in order to enhance the abrasion resistance, if desired.

As the electrolyte used for the anodizing treatment of the aluminum plate, various electrolytes capable of forming porous oxide film can be used. Ordinarily, sulfuric acid, hydrochloric acid, oxalic acid, chromic acid or a mixed acid thereof is used. The concentration of the electrolyte can be appropriately determined depending on the kind of the electrolyte.

Since the conditions of the anodizing treatment are varied depending on the electrolyte used, they cannot be defined generally. However, it is ordinarily preferred that electrolyte concentration in the solution is from 1 to 80% by weight, liquid temperature is from 5 to 70° C., current density is from 5 to 60 A/$dm^2$, voltage is from 1 to 100 V, and electrolysis time is from 10 seconds to 5 minutes. The amount of the anodized film formed is preferably from 1.0 to 5.0 g/$m^2$, more preferably from 1.5 to 4.0 g/$m^2$. In the range described above, good printing durability and favorable scratch resistance in the non-image area of lithographic printing plate can be achieved.

The aluminum plate subjected to the surface treatment and having the anodized film is used as it is as the support in the invention. However, in order to more improve an adhesion property to a layer provided thereon, hydrophilicity, resistance to stain, heat insulating property or the like, other treatment, for example, a treatment for enlarging micropores or a sealing treatment of micropores of the anodized film described in JP-A-2001-253181 and JP-A-2001-322365, or a surface hydrophilizing treatment by immersing in an aqueous solution containing a hydrophilic compound, may be appropriately conducted. Needless to say, the enlarging treatment and sealing treatment are not limited to those described in the above-described patents and any conventionally known method may be employed.

As the sealing treatment, as well as a sealing treatment with steam, a sealing treatment with an aqueous solution containing an inorganic fluorine compound, for example, fluorozirconic acid alone or sodium fluoride, a sealing treatment with steam having added thereto lithium chloride or a sealing treatment with hot water may be employed.

Among them, the sealing treatment with an aqueous solution containing an inorganic fluorine compound, the sealing treatment with water vapor and the sealing treatment with hot water are preferred.

The hydrophilizing treatment includes an alkali metal silicate method described in U.S. Pat. Nos. 2,714,066, 3,181,461, 3,280,734 and 3,902,734. In the method, the support is subjected to an immersion treatment or an electrolytic treatment in an aqueous solution, for example, of sodium silicate. In addition, the hydrophilizing treatment includes, for example, a method of treating with potassium fluorozirconate described in JP-B-36-22063 and a method of treating with polyvinylphosphonic acid described in U.S. Pat. Nos. 3,276,868, 4,153,461 and 4,689,272.

In the case of using a support having a surface of insufficient hydrophilicity, for example, a polyester film, in the invention, it is desirable to coat a hydrophilic layer thereon to make the surface sufficiently hydrophilic. Examples of the hydrophilic layer preferably includes a hydrophilic layer formed by coating a coating solution containing a colloid of oxide or hydroxide of at least one element selected from beryllium, magnesium, aluminum, silicon, titanium, boron, germanium, tin, zirconium, iron, vanadium, antimony and a transition metal described in JP-A-2001-199175, a hydrophilic layer containing an organic hydrophilic matrix obtained by crosslinking or pseudo-crosslinking of an organic hydrophilic polymer described in JP-A-2002-79772, a hydrophilic layer containing an inorganic hydrophilic matrix obtained by sol-gel conversion comprising hydrolysis and condensation reaction of polyalkoxysilane and titanate, zirconate or aluminate, and a hydrophilic layer comprising an inorganic thin layer having a surface containing metal oxide. Among them, the hydrophilic layer formed by coating a coating solution containing a colloid of oxide or hydroxide of silicon is preferred.

Further, in the case of using, for example, a polyester film as the support in the invention, it is preferred to provide an antistatic layer on the hydrophilic layer side, opposite side to the hydrophilic layer or both sides. When the antistatic layer is provided between the support and the hydrophilic layer, it also contributes to improve the adhesion property of the hydrophilic layer to the support. As the antistatic layer, a polymer layer having fine particles of metal oxide or a matting agent dispersed therein described in JP-A-2002-79772 can be used.

The support preferably has a center line average roughness of 0.10 to 1.2 μm. In the range described above, good adhesion property to the photosensitive layer, good printing durability, and good resistance to stain can be achieved.

The color density of the support is preferably from 0.15 to 0.65 in terms of the reflection density value. In the range described above, good image-forming property by preventing halation at the image exposure and good aptitude for plate inspection after development can be achieved.

(Protective Layer)

In the lithographic printing plate precursor according to the invention, a protective layer (oxygen-blocking layer) is preferably provided on the photosensitive layer in order to prevent diffusion and penetration of oxygen which inhibits the polymerization reaction at the time of exposure. The protective layer for use in the invention preferably has oxygen permeability (A) at 25° C. under one atmosphere of $1.0 \leqq (A) \leqq 20$ (ml/m$^2$·day). When the oxygen permeability (A) is extremely lower than 1.0 (ml/m$^2$·day), problems may occur in that an undesirable polymerization reaction arises during the production or preservation before image exposure and in that undesirable fog or spread of image line occurs at the image exposure. On the contrary, when the oxygen permeability (A) greatly exceeds 20 (ml/m$^2$·day), decrease in sensitivity may be incurred. The oxygen permeability (A) is more preferably in a range of $1.5 \leqq (A) \leqq 12$ (ml/m$^2$·day), still more preferably in a range of $2.0 \leqq (A) \leqq 10.0$ (ml/m$^2$·day). Besides the above described oxygen permeability, as for the characteristics required of the protective layer, it is desired that the protective layer does not substantially hinder the transmission of light for the exposure, is excellent in the adhesion property to the photosensitive layer, and can be easily removed during a development step after the exposure. Contrivances on the protective layer have been heretofore made and described in detail in U.S. Pat. No. 3,458,311 and JP-B-55-49729.

As the material of the protective layer, a water-soluble polymer compound relatively excellent in crystallizability is preferably used. Specifically, a water-soluble polymer, for example, polyvinyl alcohol, vinyl alcohol/vinyl phthalate copolymer, vinyl acetate/vinyl alcohol/vinyl phthalate copolymer, vinyl acetate/crotonic acid copolymer, polyvinyl pyrrolidone, acidic cellulose, gelatin, gum arabic, polyacrylic acid or polyacrylamide is enumerated. The water-soluble polymer compounds may be used individually or as a mixture. Of the compounds, when polyvinyl alcohol is used as a main component, the best results can be obtained in the fundamental characteristics, for example, oxygen-blocking property and removability of the protective layer by development.

Polyvinyl alcohol for use in the protective layer may be partially substituted with ester, ether or acetal as long as it contains unsubstituted vinyl alcohol units for achieving the necessary oxygen-blocking property and water solubility. Also, a part of polyvinyl alcohol may have other copolymer component. As specific examples of the polyvinyl alcohol, those having a hydrolyzing rate of 71 to 100% and a polymerization repeating unit number of 300 to 2,400 are exemplified. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 (produced by Kuraray Co., Ltd.). They can be used individually or as a mixture. According to a preferred embodiment, the content of polyvinyl alcohol in the protective layer is from 20 to 95% by weight, more preferably from 30 to 90% by weight.

Also, known modified polyvinyl alcohol can be preferably used. For instance, polyvinyl alcohols of various polymerization degrees having at random a various kind of hydrophilic modified cites, for example, an anion-modified cite modified with an anion, e.g., a carboxyl group or a sulfo group, a cation-modified cite modified with a cation, e.g., an amino group or an ammonium group, a silanol-modified cite or a thiol-modified cite, and polyvinyl alcohols of various polymerization degrees having at the terminal of the polymer a various kind of modified cites, for example, the above-described anion-modified cite, cation modified cite, silanol-modified cite or thiol-modified cite, an alkoxy-modified cite, a sulfide-modified cite, an ester modified cite of vinyl alcohol with a various kind of organic acids, an ester modified cite of the above-described anion-modified cite with an alcohol or an epoxy-modified cite are exemplified.

As a component used as a mixture with polyvinyl alcohol, polyvinyl pyrrolidone or a modified product thereof is preferable from the viewpoint of the oxygen-blocking property and removability by development. The content thereof is ordinarily from 3.5 to 80% by weight, preferably from 10 to 60% by weight, more preferably from 15 to 30% by weight, in the protective layer.

The components of the protective layer (selection of PVA and use of additives) and the coating amount are determined taking into consideration fogging property, adhesion property and scratch resistance besides the oxygen-blocking property and removability by development. In general, the higher the hydrolyzing rate of the PVA used (the higher the unsubstituted vinyl alcohol unit content in the protective layer) and the larger the layer thickness, the higher is the oxygen-blocking property, thus it is advantageous in the point of sensitivity. The molecular weight of the polymer, for example, polyvinyl alcohol (PVA) is ordinarily from 2,000 to 10,000,000, preferably from 20,000 to 3,000,000.

As other additive of the protective layer, glycerin, dipropylene glycol or the like can be added in an amount corresponding to several % by weight of the polymer to provide flexibility. Further, an anionic surfactant, for example, sodium alkylsulfate or sodium alkylsulfonate; an amphoteric surfactant, for example, alkylaminocarboxylate and alkylaminodicarboxylate; or a nonionic surfactant, for example, polyoxyethylene alkyl phenyl ether can be added in an amount corresponding to several % by weight of the polymer.

The adhesion property of the protective layer to the photosensitive layer and scratch resistance are also extremely important in view of handling of the printing plate precursor. Specifically, when a hydrophilic layer comprising a water-soluble polymer is laminated on the oleophilic photosensitive layer, layer peeling due to an insufficient adhesion property is liable to occur, and the peeled portion causes such a defect as failure in curing of the photosensitive layer due to polymerization inhibition by oxygen. Various proposals have been made for improving the adhesion property between the photosensitive layer and the protective layer. For example, it is described in U.S. patent application Ser. Nos. 292,501 and 44,563 that a sufficient adhesion property can be obtained by mixing from 20 to 60% by weight of an acryl-based emulsion or a water-insoluble vinyl pyrrolidone/vinyl acetate copolymer with a hydrophilic polymer mainly comprising polyvinyl alcohol and laminating the resulting mixture on the photosensitive layer. Any of these known techniques can be applied to the protective layer according to the invention. Coating methods of the protective layer are described in detail, for example, in U.S. Pat. No. 3,458,311 and JP-B-55-49729.

Further, it is also preferred to incorporate an inorganic stratiform compound into the protective layer of the lithographic printing plate precursor according to the invention for the purpose of improving the oxygen-blocking property and property for protecting the surface of photosensitive layer.

The inorganic stratiform compound used here is a particle having a thin tabular shape and includes, for instance, mica, for example, natural mica represented by the following formula: A $(B, C)_{2-5}D_4O_{10}(OH, F, O)_2$, (wherein A represents any one of K, Na and Ca, B and C each represents any one of Fe (II), Fe (III), Mn, Al, Mg and V, and D represents Si or Al) or synthetic mica; talc represented by the following formula: $3MgO.4SiO.H_2O$; teniolite; montmorillonite; saponite; hectolite; and zirconium phosphate.

Of the micas, examples of the natural mica include muscovite, paragonite, phlogopite, biotite and lepidolite. Examples of the synthetic mica include non-swellable mica, for example, fluorphlogopite $KMg_3(AlSi_3O_{10})F_2$ or potassium tetrasilic mica $KMg_{2.5}(Si_4O_{10})F_2$, and swellable mica, for example, Na tetrasilic mica $NaMg_{2.5}(Si_4O_{10})F_2$, Na or Li teniolite $(Na, Li)Mg_2Li(Si_4O_{10})F_2$, or montmorillonite based Na or Li hectolite $(Na, Li)_{1/8}Mg_{2/5}Li_{1/8}(Si_4O_{10})F_2$. Synthetic smectite is also useful.

Of the inorganic stratiform compounds, fluorine based swellable mica, which is a synthetic inorganic stratiform compound, is particularly useful in the invention. Specifically, the swellable synthetic mica and an swellable clay mineral, for example, montmorillonite, saponite, hectolite or bentonite have a stratiform structure comprising a unit crystal lattice layer having thickness of approximately 10 to 15 angstroms, and metallic atom substitution in the lattices thereof is remarkably large in comparison with other clay minerals. As a result, the lattice layer results in lack of positive charge and in order to compensate it, a cation, for example, $Na^+$, $Ca^{2+}$ or $Mg^{2+}$, is adsorbed between the lattice layers. The cation existing between the lattice layers is referred to as an exchangeable cation and is exchangeable with various cations. In particular, in the case where the cation between the lattice layers is Li+ or $Na^+$, because of a small ionic radius, a bond between the stratiform crystal lattices is week, and the inorganic stratiform compound greatly swells upon contact with water. When share is applied under such condition, the stratiform crystal lattices are easily cleaved to form a stable sol in water. The bentnite and swellable synthetic mica have strongly such tendency and are useful in the invention. Particularly, the swellable synthetic mica is preferably used.

With respect to the shape of the inorganic stratiform compound used in the invention, the thinner the thickness or the larger the plain size as long as smoothness of coated surface and transmission of actinic radiation are not damaged, the better from the standpoint of control of diffusion. Therefore, an aspect ratio of the inorganic stratiform compound is ordinarily 20 or more, preferably 100 or more, particularly preferably 200 or more. The aspect ratio is a ratio of thickness to major axis of particle and can be determined, for example, from a projection drawing of particle by a microphotography. The larger the aspect ratio, the greater the effect obtained.

As for the particle size of the inorganic stratiform compound used in the invention, an average major axis is ordinarily from 0.3 to 20 μm, preferably from 0.5 to 10 μm, particularly preferably from 1 to 5 μm. An average thickness of the particle is ordinarily 0.1 μm or less, preferably 0.05 μm or less, particularly preferably 0.01 μm or less. For example, in the swellable synthetic mica that is the representative compound of the inorganic stratiform compounds, thickness is approximately from 1 to 50 nm and plain size is approximately from 1 to 20 μm.

When such an inorganic stratiform compound particle having a large aspect ratio is incorporated into the protective layer, strength of coated layer increases and penetration of oxygen or moisture can be effectively inhibited so that the protective layer can be prevented from deterioration due to deformation, and even when the lithographic printing plate precursor is preserved for a long period of time under a high humidity condition, it is prevented from decrease in the image-forming property thereof due to the change of humidity and exhibits excellent preservation stability.

The content of the inorganic stratiform compound in the protective layer is preferably from 5/1 to 1/00 in terms of weight ratio to the amount of binder used in the protective layer. When a plurality of inorganic stratiform compounds is used in combination, it is also preferred that the total amount of the inorganic stratiform compounds fulfills the above-described weight ratio.

An example of common dispersing method for the inorganic stratiform compound used in the protective layer is described below. Specifically, from 5 to 10 parts by weight of a swellable stratiform compound that is exemplified as a preferred inorganic stratiform compound is added to 100 parts by weight of water to adapt the compound to water and to be swollen, followed by dispersing using a dispersing machine. The dispersing machine used include, for example, a variety of mills conducting dispersion by directly applying mechanical power, a high-speed agitation type dispersing machine providing a large shear force and a dispersion machine providing ultrasonic energy of high intensity. Specific examples thereof include a ball mill, a sand grinder mill, a visco mill, a colloid mill, a homogenizer, a dissolver, a polytron, a homomixer, a homoblender, a keddy mill, a jet agitor, a capillary type emulsifying device, a liquid siren, an electromagnetic strain type ultrasonic generator and an emulsifying device having a Polman whistle. A dispersion containing from 5 to 10% by weight of the inorganic stratiform compound thus prepared is highly viscous or gelled and exhibits extremely good preservation stability. In the formation of a coating solution for protective layer using the dispersion, it is preferred that the dispersion is diluted with water, sufficiently stirred and then mixed with a binder solution.

To the coating solution for protective layer can be added known additives, for example, a surfactant for improving coating property or a water-soluble plasticizer for improving physical property of coated layer in addition to the inorganic stratiform compound. Examples of the water-soluble plasticizer include propionamide, cyclohexanediol, glycerin or sorbitol. Also, a water-soluble (meth)acrylic polymer can be added. Further, to the coating solution may be added known additives for increasing adhesion property to the photosensitive layer or for improving preservation stability of the coating solution.

The coating solution for protective layer thus-prepared is coated on the photosensitive layer provided on the support and then dried to form a protective layer. The coating solvent may be appropriately selected in view of the binder used, and when a water-soluble polymer is used, distilled water or purified water is preferably used as the solvent. A coating method of the protective layer is not particularly limited, and known methods, for example, methods described in U.S. Pat. No. 3,458,311 and JP-B-55-49729 can be utilized. Specific examples of the coating method for the protective layer include a blade coating method, an air knife coating method, a gravure coating method, a roll coating method, a spray coating method, a dip coating method and a bar coating method.

The coating amount of the protective layer is preferably in a range of 0.05 to 10 g/m$^2$ in terms of the coating amount after drying. When the protective layer contains the inorganic stratiform compound, it is more preferably in a range of 0.1 to 0.5 $g/m^2$, and when the protective layer does not contain the inorganic stratiform compound, it is more preferably in a range of 0.5 to 5 $g/m^2$.

(Undercoat Layer)

In the lithographic printing plate precursor according to the invention, an undercoat layer comprising a compound having a polymerizable group is preferably provided on the support. When the undercoat layer is used, the photosensitive layer is provided on the undercoat layer. The undercoat layer has the effects of strengthening the adhesion property between the support and the photosensitive layer in the exposed area and facilitating separation of the photosensitive layer from the support in the unexposed area, thereby improving the developing property.

As the compound for the undercoat layer, specifically, a silane coupling agent having an addition-polymerizable ethylenic double bond reactive group described in JP-A-10-282679 and a phosphorus compound having an ethylenic double bond reactive group described in JP-A-2-304441 are preferably exemplified. A particularly preferable compound is a compound having both a polymerizable group, for example, a methacryl group or an allyl group and a support-adsorbing group, for example, a sulfonic acid group, a phosphoric acid group or a phosphoric acid ester group. Also, a compound having a hydrophilicity-imparting group, for example, an ethylene oxide group, in addition to the polymerizable group and the support-adsorbing group, can be preferably used.

The coating amount (solid content) of the undercoat layer is preferably from 0.1 to 100 $mg/m^2$, more preferably from 1 to 30 $mg/m^2$.

(Backcoat Layer)

After applying the surface treatment to the support or forming the undercoat layer on the support, a backcoat layer can be provided on the back surface of the support, if desired.

The backcoat layer preferably includes, for example, a coating layer comprising an organic polymer compound described in JP-A-5-45885 and a coating layer comprising a metal oxide obtained by hydrolysis and polycondensation of an organic metal compound or an inorganic metal compound described in JP-A-6-35174. Among them, use of an alkoxy compound of silicon, for example, $Si(OCH_3)_4$, $Si(OC_2H_5)_4$, $Si(OC_3H_7)_4$ or $Si(OC_4H_9)_4$ is preferred since the starting material is inexpensive and easily available.

[Method of Preparing Lithographic Printing Plate]

Now, the method of preparing a lithographic printing plate according to the invention is described in greater detail below. The method of preparing a lithographic printing plate according to the invention comprises after being subjected the lithographic printing plate precursor described above to image exposure (exposure step), treating the exposed lithographic printing plate precursor with an aqueous solution containing a buffering ability (development step). A step of exposing to light and/or heating the entire surface of lithographic printing plate precursor may be provided between the exposure step and the development step and/or after the development step, if desired.

The image exposure of the lithographic printing plate precursor is performed by a method of exposing through a transparent original having a line image, a halftone dot image or the like or a method of scanning of laser beam based on digital data. The desirable wavelength of the light source is from 350 to 450 nm or from 760 to 1,200 nm.

As for the available laser light source emitting light of 350 to 450 nm, the followings can be used. A gas laser, for example, Ar ion laser (364 nm, 351 nm, 10 mW to 1 W), Kr ion laser (356 nm, 351 nm, 10 mW to 1 W) and He—Cd laser (441 nm, 325 nm, 1 mW to 100 mW); a solid laser, for example, a combination of Nd:YAG ($YVO_4$) with SHG crystals×twice (355 nm, 5 mW to 1 W) and a combination of Cr:LiSAF with SHG crystal (430 nm, 10 mW); a semiconductor laser system, for example, a $KNbO_3$ ring resonator (430 nm, 30 mW), a combination of a waveguide-type wavelength conversion element with an AlGaAs or InGaAs semiconductor (380 nm to 450 nm, 5 mW to 100 mW), a combination of a waveguide-type wavelength conversion element with an AlGaInP or AlGaAs semiconductor (300 nm to 350 nm, 5 mW to 100 mW), and AlGaInN (350 nm to 450 nm, 5 mW to 30 mW); a pulse laser, for example, $N_2$ laser (337 nm, pulse 0.1 to 10 mJ) and XeF (351 nm, pulse 10 to 250 mJ) can be used. Among the light sources, the AlGaInN semiconductor laser (commercially available InGaN semiconductor laser, 400 to 410 nm, 5 to 30 mW) is particularly preferable in view of the wavelength characteristics and cost.

As for the exposure apparatus for the lithographic printing plate precursor of scanning exposure system, the exposure mechanism may be any of an internal drum system, an external drum system and a flat bed system. As the light source, among the light sources described above, those capable of conducting continuous oscillation can be preferably utilized.

Other examples of the exposure light source which can be used in the invention include an ultra-high pressure mercury lamp, a high pressure mercury lamp, a medium pressure mercury lamp, a low pressure mercury lamp, a chemical lamp, a carbon arc lamp, a xenon lamp, a metal halide lamp, various visible or ultraviolet laser lamps, a fluorescent lamp, a tungsten lamp and sunlight.

The available laser light source emitting light of 760 to 1,200 nm is not particularly restricted and a solid laser or semiconductor laser emitting an infrared ray having a wavelength of 760 to 1,200 nm is preferably exemplified. The output of the infrared laser is preferably 100 mW or more. Further, in order to shorten the exposure time, it is preferred to use a multibeam laser device. The exposure time per pixel is preferably within 20 microseconds. The irradiation energy is preferably from 10 to 300 $mJ/cm^2$.

The development step is described in detail below. In contrast to a conventional processing process using a strong alkali development, the invention is characterized in that weak alkali development becomes possible by developing the specific binder polymer using an aqueous solution having a buffering ability. Further, the conventional processing process comprises removing a protective layer in a pre-water washing step, conducting alkali development, removing the alkali in a post-water washing step, conducting gum treatment in a gumming step and drying in a drying step. On the contrary, according to the invention it is possible to conduct the development and gumming at the same time by adding a water-soluble polymer compound to the development processing solution. In the case of adding the water-soluble polymer compound to the development processing solution, the post-water washing step is not particularly necessary, and after conducting the development and gumming with one solution, the drying step is performed. Moreover, since the removal of protective layer can also be conducted simultaneously with the development and gumming, a most preferable system can be taken wherein the pre-water washing step is also unnecessary. It is preferred that after the development and gumming, the excess processing solution is removed using a squeeze roller or the like, followed by drying.

<Development>

An image can be formed by exposing imagewise the lithographic printing plate precursor according to the invention and removing the photosensitive layer in the unexposed area with a developer. The aqueous solution having a buffering ability used as a developer in the invention is described below.

The aqueous solution having a buffering ability for use in the invention is not particularly limited as long as it is an aqueous solution having a buffering ability or a buffering property. Since the developer exhibits a buffer function, even when it is used for a long period of time, fluctuation of the pH is prevented and the deterioration of developing property resulting from the fluctuation of pH, the occurrence of development scum and the like can be restrained. The pH of the developer is preferably from 7.0 to 11.0, more preferably from 7.5 to 11.0, and in view of developing property and environment, most preferably from 8.0 to 10.5.

The pH buffering agent for use in the invention is not particularly limited as long as it exhibits the buffer function. In the invention, an alkaline buffering agent is preferably used. For example, (a) a carbonate ion and a hydrogen carbonate ion, (b) a borate ion, (c) a water-soluble amine compound and an ion of the amine compound, and combinations thereof are illustrated. Using the buffering agent, the developer exhibits a pH buffer function and is prevented from fluctuation of the pH even when it is used for a long period of time. As a result, the deterioration of developing property resulting from the fluctuation of pH, the occurrence of development scum and the like are restrained. The combination of a carbonate ion and a hydrogen carbonate ion is particularly preferable.

The water-soluble amine compound is not particularly restricted and preferably a water-soluble amine compound having a group capable of facilitating water-solubility. The group capable of facilitating water-solubility includes, for example, a carboxylic acid group, a sulfonic acid group, a sulfinic acid group, a phosphonic acid group and a hydroxy group. The water-soluble amine compound may have two or more groups capable of facilitating water-solubility.

In case where the water-solubility of the water-soluble amine compound is facilitated with a carboxylic acid group, a sulfonic acid group, a sulfinic acid group or a phosphonic acid group, the water-soluble amine compound corresponds to an amino acid. The amino acid is held in equilibrium in an aqueous solution and for example, when the acid group is a carboxylic acid group, the equilibrium state is indicated as below. In the invention, the amino acid means State B shown below and an amino acid ion means State C shown below. A counter ion in State C is preferably a sodium ion or a potassium ion.

Equilibrium of amino acid (case wherein acid group is carboxylic acid group)

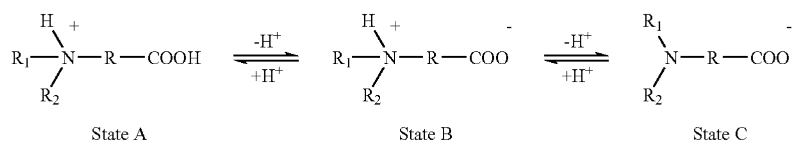

(a) In order for a carbonate ion and a hydrogen carbonate ion to be present in a developer, a carbonate and a hydrogen carbonate may be added to the developer or a carbonate ion and a hydrogen carbonate ion may be generated by adding a carbonate or a hydrogen carbonate to a developer and then adjusting the pH. The carbonate or hydrogen carbonate used is not particularly restricted and it is preferably an alkali metal salt. Examples of the alkali metal include lithium, sodium and potassium and sodium is particularly preferable. The alkali metals may be used individually or in combination of two or more thereof.

(b) In order for a borate ion to be present in a developer, a boric acid or a borate is added to a developer and then pH of the developer is adjusted using an alkali or an alkali and an acid to generate an appropriate amount of the borate ion.

The boric acid or a borate used is not particularly restricted. The boric acid includes, for example, ortho boric acid, metha boric acid or tetra boric acid, and preferably ortho boric acid and tetra boric acid. The borate includes an alkali metal salt thereof and an alkaline earth metal salt thereof, specifically, an orthoborate, a diborate, a methaborate, a tetraborate, a pentaborate and an octaborate, preferably an orthoborate and a tetraborate, and particularly preferably an alkali metal salt of tetraborate. The alkali metal salt of tetraborate includes, for example, sodium tetraborate, potassium tetraborate and lithium tetraborate, and particularly preferably sodium tetraborate. The borates may be used individually or in combination of two or more thereof As the boric acid and borate for use in the invention, ortho boric acid, tetra boric acid and sodium tetraborate are particularly preferable. The boric acid and borate may be used in combination in the developer.

(c) An ion of a water-soluble amine compound may be generated in an aqueous solution of the water-soluble amine compound. To the aqueous solution of water-soluble amine compound may be added an alkali or an acid. Alternatively, the ion of a water-soluble amine compound may be contained in an aqueous solution by adding a compound which is a salt of amine compound per se.

wherein, for example, $R_1$ and $R_2$ each independently represents a hydrogen atom, an alkyl group or an aryl group, and R represents a connecting group.

Specific examples of the water-soluble amine compound having a carboxylic acid group, a sulfonic acid group or a sulfinic acid group include an amino acid, for example, glycine, iminodiacatic acid, lysine, threonine, serine, asparaginic acid, parahydroxyphenyl glycine, dihydroxyethyl glycine, alanine, anthranilic acid or tryptophan, sulfamic acid, cyclohexylsulfamic acid, an aliphatic amine sulfonic acid, for example, taurine, and an aliphatic amine sulfinic acid, for example, aminoethanesulfinic acid. Among them, glycine and iminodiacetic acid are preferable.

Specific examples of the water-soluble amine compound having a phosphonic acid group (including a phosphinic acid group) include 2-aminoethylphosphonic acid, 1-aminoethane-1,1-diphosphonic acid, 1-amino-1-phenylmethane-1,1-diphosphonic acid, 1-dimethylaminoethane-1,1-diphosphonic acid and ethylenediaminopentamethylenephosphonic acid. Particularly, 2-aminoethylphosphonic acid is preferable.

The water-soluble amine compound having a hydroxy group as the group capable of facilitating water-solubility means an alkylamine (State B shown below) having a hydroxy group in its alkyl group and its ion means an ammonium ion (State A shown below) of the amino group.

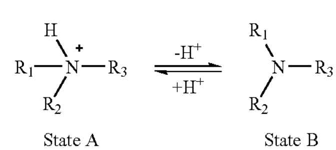

wherein, for example, $R_1$, $R_2$ and $R_3$ each independently represents a hydrogen atom, an alkyl group or an aryl group, provided that at least one of $R_1$, $R_2$ and $R_3$ represents an alkyl group having a hydroxy group.

Examples of the water-soluble amine compound having a hydroxy group include monoethanol amine, diethanol amine, trimethanol amine, triethanol amine, tripropanol amine and triisopropanol amine. Among them, triethanol amine and diethanol amine are preferable. A counter ion of the ammonium group is preferably a chloride ion.

The alkali for use in the adjustment of pH includes, for example, sodium hydroxide, potassium hydroxide, lithium hydroxide, sodium carbonate, potassium carbonate, ammonium carbonate, sodium hydrogen carbonate, potassium hydrogen carbonate, ammonium hydrogen carbonate, an organic alkali agent and combinations thereof. The acid for use in the adjustment of pH includes, for example, an inorganic acid, for example, hydrochloric acid, sulfuric acid or a nitric acid. By adding such an alkali or acid, the pH can be finely adjusted.

When the combination of (a) a carbonate ion and a hydrogen carbonate ion is adopted as the pH buffering agent, the total amount of the carbonate ion and hydrogen carbonate ion is preferably from 0.05 to 5 mole/l, more preferably from 0.1 to 2 mole/l, particularly preferably from 0.2 to 1 mole/l, based on the total weight of the aqueous solution. When the total amount is 0.05 mole/l or more, developing property and processing ability are not degraded. When the total amount is 5 mole/l or less, precipitates and crystals hardly generate and since gelation at neutralization of waste liquid of the developer hardly occur, treatment of the waste liquid can be carried out without trouble.

For the purpose of finely adjusting the alkali concentration or aiding dissolution of the photosensitive layer in the non-image area, an alkali agent, for example, an organic alkali agent may be supplementarily used together. Examples of the organic alkali agent include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine and tetramethylammonium hydroxide. The supplementary alkali agents may be used individually or in combination of two or more thereof When (b) borate ion is adopted as the pH buffering agent, the total amount of the borate ion is preferably from 0.05 to 5 mole/l, more preferably from 0.1 to 2 mole/l, particularly preferably from 0.2 to 1 mole/l, based on the total weight of the aqueous solution. When the total amount of borate ion is 0.05 mole/l or more, developing property and processing ability are not degraded. On the other hand, when the total amount of borate ion is 5 mole/l or less, precipitates and crystals hardly generate and since gelation at neutralization of the waste liquid hardly occur, treatment of the waste liquid can be carried out without trouble.

When (c) a water-soluble amine compound and an ion of the amine compound is adopted as the pH buffering agent, the total amount of the water-soluble amine compound and ion of the amine compound is preferably from 0.01 to 1 mole/l, more preferably from 0.03 to 0.7 mole/l, particularly preferably from 0.05 to 0.5 mole/l, based on the total weight of the aqueous solution. When the total amount of water-soluble amine compound and ion of the amine compound is in the range described above, developing property and processing ability are not degraded and treatment of the waste liquid can be easily carried out.

Specific examples of the aqueous solution having a buffering ability are set for the below, but the invention should not be construed as being limited thereto. Specifically, maleic acid/Tris/sodium hydroxide buffer, hydrogen disodium phosphate/dihydrogen sodium phosphate buffer, dihydrogen potassium phosphate/sodium hydroxide buffer, 2,4,6-trimethylpyridine/hydrochloric acid buffer, triethanolamine hydrochloride/sodium hydroxide buffer, sodium 5,5-diethylbarbiturate/hydrochloric acid buffer, N-ethylmorpholine/hydrochloric acid buffer, sodium pyrrophosphate/hydrochloric acid buffer, Tris/hydrochloric acid buffer, Bicine/sodium hydroxide buffer, 2-amino-2-methylpropane-1,3-diol/hydrochloric acid buffer, diethanolamine/hydrochloric acid buffer, potassium p-phenolsulfonate/sodium hydroxide buffer, boric acid/sodium hydroxide buffer, sodium borate/hydrochloric acid buffer, ammonia/ammonium chloride buffer, glycine/sodium hydroxide buffer, sodium carbonate/sodium hydrogen carbonate buffer, sodium borate/sodium hydroxide buffer, sodium hydrogen carbonate/sodium hydroxide buffer, disodium hydrogen phosphate/sodium hydroxide buffer, sodium hydroxide/potassium chloride buffer, citric acid/disodium hydrogen phosphate buffer, piperazine dihydrochloride/glycylglycine/sodium hydroxide buffer, citric acid monohydrate/potassium dihydrogen phosphate/boric acid/diethylbarbituric acid/sodium hydroxide buffer and boric acid/citric acid/sodium phosphate dodecahydrate buffer are exemplified.

From the standpoint of developing property, sodium 5,5-diethylbarbiturate/hydrochloric acid buffer, Tris/hydrochloric acid buffer, 2-amino-2-methylpropane-1,3-diol/hydrochloric acid buffer, diethanolamine/hydrochloric acid buffer, potassium p-phenolsulfonate/sodium hydroxide buffer, boric acid/sodium hydroxide buffer, sodium borate/hydrochloric acid buffer, ammonia/ammonium chloride buffer, glycine/sodium hydroxide buffer, sodium carbonate/sodium hydrogen carbonate buffer, sodium borate/sodium hydroxide buffer, sodium hydrogen carbonate/sodium hydroxide buffer, disodium hydrogen phosphate/sodium hydroxide buffer, sodium hydroxide/potassium chloride buffer, piperazine dihydrochloride/glycylglycine/sodium hydroxide buffer, citric acid monohydrate/potassium dihydrogen phosphate/boric acid/diethylbarbituric acid/sodium hydroxide buffer and boric acid/citric acid/sodium phosphate dodecahydrate buffer are preferable, and potassium p-phenolsulfonate/sodium hydroxide buffer, boric acid/sodium hydroxide buffer, ammonia/ammonium chloride buffer, glycine/sodium hydroxide buffer, sodium carbonate/sodium hydrogen carbonate buffer, sodium borate/sodium hydroxide buffer, sodium hydrogen carbonate/sodium hydroxide buffer, disodium hydrogen phosphate/sodium hydroxide buffer, sodium hydroxide/potassium chloride buffer, piperazine dihydrochloride/glycylglycine/sodium hydroxide buffer, citric acid monohydrate/potassium dihydrogen phosphate/boric acid/diethylbarbituric acid/sodium hydroxide buffer and boric acid/citric acid/sodium phosphate dodecahydrate buffer are more preferable.

The developer for use in the invention preferably contains a surfactant. As the surfactant, any of anionic, nonionic, cationic and amphoteric surfactants may be used.

The anionic surfactant is not particularly limited and conventionally known anionic surfactants can be used. Examples of the anionic surfactant include fatty acid salts, abietic acid salts, hydroxyalkanesulfonic acid salts, alkanesulfonic acid salts, dialkylsulfosuccinic acid salts, straight-chain alkylbenzenesulfonic acid salts, branched alkylbenzenesulfonic acid salts, alkylnaphthalenesulfonic acid salts, alkylphenoxy polyoxyethylene propylsulfonic acid salts, polyoxyethylene alkylsulfophenyl ether salts, N-methyl-N-oleyltaurine sodium salt, N-alkylsulfosuccinic acid monoamide disodium salts, petroleum sulfonic acid salts, sulfated castor oil, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene-maleic anhydride copolymer, partially saponified products of olefin-maleic anhydride copolymer, naphthalene sulfonate formalin condensates, aromatic sulfonic acid salts and aromatic substituted polyoxyethylene sulfonic acid salts. Of the compounds, dialkylsulfosuccinic acid salts, alkyl sulfate ester salts and alkylnaphthalenesulfonic acid salts are particularly preferably used.

The cationic surfactant is not particularly limited and conventionally known cationic surfactants can be used. Examples of the cationic surfactant include alkylamine salts, quaternary ammonium salts, polyoxyethylene alkyl amine salts and polyethylene polyamine derivatives.

The nonionic surfactant is not particularly limited and conventionally known nonionic surfactants can be used. Examples of the nonionic surfactant include polyethylene glycol type higher alcohol ethylene oxide addacts, alkylphenol ethylene oxide addacts, polyethylene glycol adducts of aromatic compound, fatty acid ethylene oxide addacts, polyhydric alcohol fatty acid ester ethylene oxide addacts, higher alkylamine ethylene oxide addacts, fatty acid amide ethylene oxide addacts, ethylene oxide addacts of fat, polypropylene glycol ethylene oxide addacts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines.

In the invention, polyethylene glycol type higher alcohol ethylene oxide addacts, polyethylene glycol adducts of aromatic compound, ethylene oxide addacts of sorbitol and/or sorbitan fatty acid esters, polypropylene glycol ethylene oxide addacts, dimethylsiloxane-ethylene oxide block copolymers, dimethylsiloxane-(propylene oxide-ethylene oxide) block copolymers and fatty acid esters of polyhydric alcohols are more preferable.

Further, from the standpoint of stable solubility in water or opacity, with respect to the nonionic surfactant, the HLB (hydrophile-lipophile balance) value thereof is preferably 6 or more, and more preferably 8 or more. Furthermore, an oxyethylene adduct of acetylene glycol type or acetylene alcohol type or a surfactant, for example, a fluorine-based surfactant or a silicon-based surfactant can also be used.

The amphoteric surfactant is a compound having an anionic site and a cationic site in its molecule as well known in the field of surfactant and includes, for example, amphoteric surfactants of amino acid type, betain type and amine oxide type. As the amphoteric surfactant used in the developer for use in the invention, a compound represented by formula <1> shown below or a compound represented by formula <2> shown below is preferable.

<1>

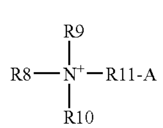

-continued

<2>

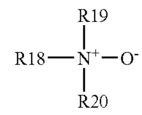

In formula <1>, R8 represents an alkyl group, R9 and R10 each represents a hydrogen atom or an alkyl group, R11 represents an alkylene group, and A represents a carboxylate ion or a sulfonate ion.

In formula <2>, R18, R19 and R20 each represents a hydrogen atom or an alkyl group, provided that all of R18, R19 and R20 are not hydrogen atoms at the same time.

In formula <1>, the alkyl group represented by R8, R9 or R10 or the alkylene group represented by R11 may be a straight chain or branched structure, may contain a connecting group in the chain thereof and may have a substituent. As the connecting group, a connecting group containing a hetero atom, for example, an ester bond, an amido bond or an ether bond is preferable. As the substituent, a hydroxy group, an ethylene oxide group, a phenyl group, an amido group or a halogen atom is preferable.

In the compound represented by formula <1>, as the total number of carbon atoms increases, the hydrophobic portion becomes large and dissolution of the compound in an aqueous developer becomes difficult. In such a case, the dissolution is improved by adding a dissolution auxiliary agent, for example, an organic solvent, e.g., an alcohol. However, when the total number of carbon atoms excessively increases, the surfactant can not be dissolved in the proper amount in some cases. Therefore, the total number of carbon atoms included in R8 to R11 in formula <1> is preferably from 8 to 25, and more preferably from 11 to 21.

In formula <2>, the alkyl group represented by R18, R19 or R20 may be a straight chain or branched structure, may contain a connecting group in the chain thereof and may have a substituent. As the connecting group, a connecting group containing a hetero atom, for example, an ester bond, an amido bond or an ether bond is preferable. As the substituent, a hydroxy group, an ethylene oxide group, a phenyl group, an amido group or a halogen atom is preferable.

In the compound represented by formula <2>, as the total number of carbon atoms increases, the hydrophobic portion becomes large and dissolution of the compound in an aqueous developer becomes difficult. In such a case, the dissolution is improved by adding a dissolution auxiliary agent, for example, an organic solvent, e.g., an alcohol. However, when the total number of carbon atoms excessively increases, the surfactant can not be dissolved in the proper amount in some cases. Therefore, the total number of carbon atoms included in R18 to R20 in formula <2> is preferably from 8 to 22, and more preferably from 10 to 20.

The total number of carbon atoms in the amphoteric surfactant may be influenced by property of a material used in the photosensitive layer, especially, a binder polymer. When the binder polymer having high hydrophilicity is used, it tends to be preferable that the total number of carbon atoms is relatively small. On the other hand, when the binder having low hydrophilicity is used, it tends to be preferable that the total number of carbon atoms is relatively large.

Preferable specific examples of the amphoteric surfactant for use in the developer are set forth below, but the invention should not be construed as being limited thereto.

W-1

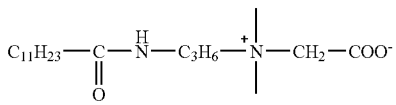

W-2

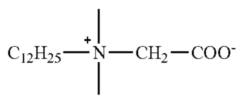

W-3

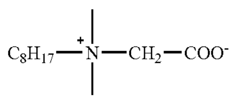

W-4

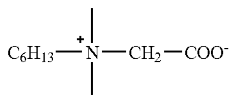

W-5

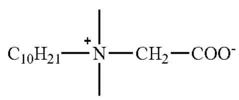

W-6

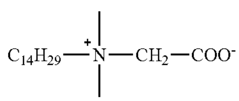

W-7

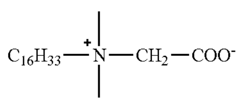

W-8

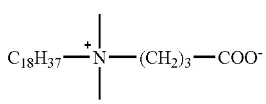

W-9

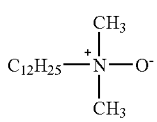

W-10

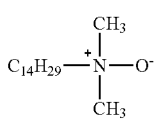

W-11

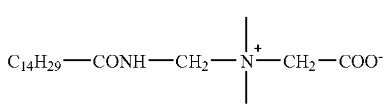

W-12

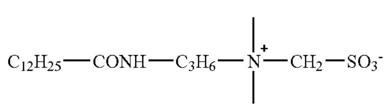

W-13

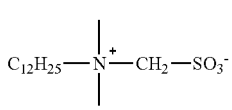

W-14

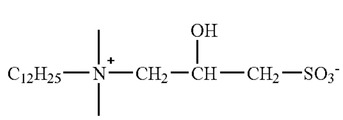

-continued

W-15

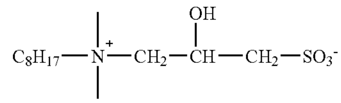

W-16

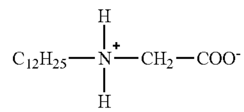

W-17

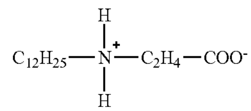

W-18

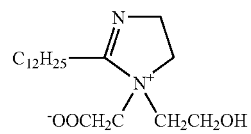

The surfactants may be used individually or in combination of two or more thereof. The content of the surfactant in the developer is preferably from 0.01 to 10% by weight, and more preferably from 0.01 to 5% by weight.

The developer for use in the invention may contain a wetting agent, an antiseptic agent, a chelating agent, a defoaming agent, an organic solvent, an inorganic acid, an inorganic salt, a water-soluble resin or the like in addition the components described above.

As the wetting agent, for example, ethylene glycol, propylene glycol, triethylene glycol, butylene glycol, hexylene glycol, diethylene glycol, dipropylene glycol, glycerin, trimethylol propane or diglycerin is preferably used. The wetting agents may be used individually or in combination of two or more thereof. The wetting agent is ordinarily used in an amount of 0.1 to 5% by weight based on the total weight of the developer.

As the antiseptic agent, for example, phenol or a derivative thereof, formalin, an imidazole derivative, sodium dehydroacetate, a 4-isothiazolin-3-one derivative, benzisotiazolin-3-one, 2-methyl-4-isothiazolin-3-one, a benzotriazole derivative, an amidine guanidine derivative, a quaternary ammonium salt, a pyridine derivative, a quinoline derivative, a guanidine derivative, diazine, a triazole derivative, oxazole, an oxazine derivative or a nitrobromoalcohol-based compound, e.g., 2-bromo-2-nitropropane-1,3-diol, 1,1-dibromo-1-nitro-2-ethanol or 1,1-dibromo-1-nitro-2-propanol is preferably used. It is preferred to use two or more kinds of the antiseptic agents so as to exert the effect to various molds and bacteria. The amount of the antiseptic agent added is an amount stably exerts the effect to bacterium, molds, yeast or the like. Although the amount of the antiseptic agent may be varied depending on the kind of the bacterium, molds, yeast or the like, it is preferably in a range of 0.01 to 4% by weight based on the developer.

As the chelating agent, for example, ethylenediaminetetraacetic acid, potassium salt thereof, sodium salt thereof; diethylenetriaminepentaacetic acid, potassium salt thereof, sodium salt thereof; triethylenetetraminehexaacetic acid, potassium salt thereof, sodium salt thereof; hydroxyethylethylenediaminetriacetic acid, potassium salt thereof, sodium salt thereof; nitrilotriacetic acid, sodium salt thereof; organic phosphonic acids, for example, 1-hydroxyethane-1,1-diphosphonic acid, potassium salt thereof, sodium salt thereof, aminotri(methylenephosphonic acid), potassium salt thereof, sodium salt thereof; and phosphonoalkanetricarboxylic acids are illustrated. A salt of an organic amine is also effectively used in place of the sodium salt or potassium salt in the chelating agent. The chelating agent is so selected that it is stably present in the developer and does not impair the printing property. The amount of the chelating agent added is preferably from 0.001 to 1.0% by weight based on the developer.

As the defoaming agent, for example, a conventional silicone-based self-emulsifying type or emulsifying type defoaming agent, or a nonionic compound having HLB of 5 or less is used. The silicone defoaming agent is preferably used. Any of emulsifying dispersing type and solubilizing type can be used. The amount of the defoaming agent added is preferably from 0.001 to 1.0% by weight based on the developer.

As the organic solvent, for example, an aliphatic hydrocarbon (e.g., hexane, heptane, Isopar E, Isopar H, Isopar G (produced by Esso Chemical Co., Ltd.), gasoline or kerosene), an aromatic hydrocarbon (e.g., toluene or xylene), a halogenated hydrocarbon (methylene dichloride, ethylene dichloride, trichlene or monochlorobenzene) or a polar solvent is exemplified.

Examples of the polar solvent include an alcohol (e.g., methanol, ethanol, propanol, isopropanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methyl phenyl carbinol, n-amyl alcohol or methylamyl alcohol), a ketone (e.g., acetone, methyl ethyl ketone, ethyl butyl ketone, methyl isobutyl ketone or cyclohexanone), an ester (e.g., ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate or butyl levulinate) and others (e.g., triethyl phosphate, tricresyl phosphate, N-phenylethanolamine or N-phenyldiethanolamine).

Further, when the organic solvent is insoluble in water, it may be employed by being solubilized in water using a surfactant or the like. In the case where the developer contains the organic solvent, the concentration of the organic solvent is desirably less than 40% by weight in view of safety and inflammability.

As the inorganic acid or inorganic salt, for example, phosphoric acid, methaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexamethaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate or nickel sulfate is illustrated. The amount of the inorganic acid or inorganic salt added is preferably from 0.01 to 0.5% by weight based on the total weight of the developer.

As the water-soluble resin, for example, soybean polysaccharide, modified starch, gum arabic, dextrin, a cellulose derivative (for example, carboxymethyl cellulose, carboxyethyl cellulose or methyl cellulose) or a modified product thereof, pllulan, polyvinyl alcohol or a derivative thereof, polyvinyl pyrrolidone, polyacrylamide, an acrylamide copolymer, a vinyl methyl ether/maleic anhydride copolymer, a vinyl acetate/maleic anhydride copolymer or a styrene/maleic anhydride copolymer is exemplified. An acid value of the water-soluble resin is preferably from 0 to 3.0 meq/g.

As the soybean polysaccharide, those conventionally known can be used. For example, as a commercial product, Soyafive (produced by Fuji Oil Co., Ltd.) is available and various grade products can be used. The soybean polysaccharide preferably used has viscosity in a range of 10 to 100 mPa/sec in a 10% by weight aqueous solution thereof.

As the modified starch, that represented by formula (III) shown below is exemplified. As a starch used for the production of the modified starch represented by formula (III), any starch, for example, of corn, potato, tapioca, rice or wheat can be used. The modification of starch can be performed by a method wherein starch is decomposed, for example, with an acid or an enzyme to an extent that the number of glucose residue per molecule is from 5 to 30 and then oxypropylene is added thereto in an alkali.

(III)

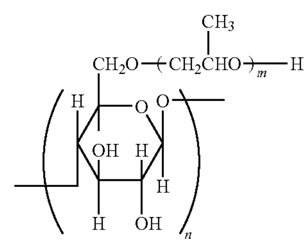

In formula (III), the etherification degree (substitution degree) is in a range of 0.05 to 1.2 per glucose unit, n represents an integer of 3 to 30, and m represents an integer of 1 to 3.

Other examples of the modified starch and the derivative thereof include roast starch, for example, British gum, an enzymatically modified dextrin, for example, enzyme dextrin or Shardinger dextrin, oxidized starch, for example, solubilized starch, alphalized starch, for example, modified alphalized starch or unmodified alphalized starch, esterified starch, for example, starch phosphate, starch of fatty acid, starch sulfate, starch nitrate, starch xanthate or starch carbamate, etherified starch, for example, carboxyalkyl starch, hydroxyalkyl starch, sulfoalkyl starch, cyanoethyl starch, allyl starch, benzyl starch, carbamylethyl starch or dialkylamino starch, cross-linked starch, for example, methylol cross-linked starch, hydroxyalkyl cross-linked starch, phosphoric acid cross-linked starch or dicarboxylic acid cross-linked starch, or starch graft copolymer, for example, starch-polyacrylamide copolymer, starch-polyacrylic acid copolymer, starch-polyvinyl acetate copolymer, starch-polyacrylonitrile copolymer, cationic starch-polyacrylate copolymer, cationic starch-vinyl polymer copolymer, starch-polystyrene-maleic acid copolymer, starch-polyethylene oxide copolymer or starch-polypropylene copolymer.

Of the water-soluble resins, for example, soybean polysaccharide, modified starch, gum arabic, dextrin, carboxymethyl cellulose or polyvinyl alcohol is preferable.

The water-soluble resins may be used in combination of two or more. The content of the water-soluble resin is preferably from 0.1 to 20% by weight, more preferably from 0.5 to 10% by weight, in the developer.

The temperature of development is ordinarily 60° C. or lower, preferably from about 15 to about 40° C. In the case of conducting the development processing using an automatic developing machine, the developer becomes fatigued in accordance with the processing amount, and hence the processing ability may be restored using a replenisher or a fresh developer.

After the development step, the developer may be naturally dried but it is preferred to provide a drying step, for example, with warm air.

In the method of preparing a lithographic printing plate according to the invention, the entire surface of the lithographic printing plate precursor may be heated between the exposure and the development, if desired. By the heating, the image-forming reaction in the image-forming layer is accelerated and advantages, for example, improvement in the sensitivity and printing durability and stabilization of the sensitivity may be achieved.

The conditions of the heating can be appropriately determined in a range for providing such effects. Examples of the heating means include a conventional convection oven, an IR irradiation apparatus, an IR laser, a microwave apparatus or a Wisconsin oven. For instance, the heat treatment can be conducted by maintaining the lithographic printing plate precursor at a plate surface temperature ranging from 70 to 150° C. for a period of one second to 5 minutes, preferably at 80 to 140° C. for 5 seconds to one minute, more preferably at 90 to 130° C. for 10 to 30 seconds. In the above-described range, the effects described above are efficiently achieved and an adverse affect, for example, change in shape of the lithographic printing plate precursor due to the heat can be preferably avoided.

It is preferable that heat treatment means used in the heat treatment step is connected with a plate setter used in the exposure step and a development apparatus used in the development processing step and the lithographic printing plate precursor is subjected to automatically continuous processing. Specifically, a plate making line wherein the plate setter and the development apparatus are connected with each other by transport means, for example, a conveyer is illustrated. Also, the heat treatment means may be placed between the plate setter and the development apparatus or the heat treatment means and the development apparatus may constitute a unit apparatus.

In case where the lithographic printing plate precursor used is apt to be influenced by surrounding light under a working environment, it is preferable that the plate making line is blinded by a filter, a cover or the like.

The entire surface of lithographic printing plate after development may be exposed to active ray, for example, ultraviolet light to accelerate curing of the image area. As a light source for the entire surface exposure, for example, a carbon arc lamp, a mercury lamp, a gallium lamp, a metal halide lamp, a xenon lamp, a tungsten lamp or various laser beams is exemplified. In order to obtain sufficient printing durability, the amount of the entire surface exposure is preferably 10 mJ/cm$^2$ or more, and more preferably 100 mJ/cm$^2$ or more.

Heating may be performed at the same time with the entire surface exposure. By performing the heating, further improvement in the printing durability is recognized. Examples of the heating means include a conventional convection oven, an IR irradiation apparatus, an IR laser, a microwave apparatus or a Wisconsin oven. The plate surface temperature at the heating is preferably from 30 to 150° C., more preferably from 35 to 130° C., and still more preferably from 40 to 120° C. Specifically, a method described in JP-A-2000-89478 can be used.

Further, for the purpose of increasing printing durability, the lithographic printing plate after development can be heated under very strong conditions. The heat temperature is ordinarily in a range of 200 to 500° C. When the temperature is too low, a sufficient effect of strengthening the image may not be obtained, whereas when it is excessively high, problems of deterioration of the support and thermal decomposition of the image area may occur sometimes.

The lithographic printing plate thus-obtained is mounted on an off-set printing machine to use for printing a large number of sheets.

EXAMPLES

The present invention will be described in more detail with reference to the following examples, but the invention should not be construed as being limited thereto.

Examples 1 to 34 and Comparative Examples 1 to 6

[Preparation of Supports 1 and 2]

An aluminum plate (JIS A1050) having a thickness of 0.3 mm was subjected to surface treatment shown below.

(a) Mechanical Surface Roughening Treatment

Mechanical surface roughening of the aluminum plate was conducted by means of rotating roller-form nylon brushes while supplying a suspension (having specific gravity of 1.12) of an abrasive (pumice) in water as an abrasion slurry solution to the surface of the aluminum plate. The average particle size of the abrasive was 30 μm and the maximum particle size was 100 μm. The material of the nylon brush was 6·10 nylon and the brush has a bristle length of 45 mm and a bristle diameter of 0.3 mm. The nylon brush was made by making holes in a stainless steel cylinder having a diameter of 300 mm and densely filling the brush bristles. Three of the rotating nylon brushes were used. Two supporting rollers (each having a diameter of 200 mm) provided under the brush rollers were spaced 300 mm. The brush rollers were pressed against the aluminum plate till the load applied to a driving motor for rotating the brush became 7 kW greater than the load before pressing the brush rollers against the aluminum plate. The rotating direction of the brushes was the same as the moving direction of the aluminum plate. The rotation number of the brushes was 200 rpm.

(b) Alkali Etching Treatment

Alkali etching treatment of the aluminum plate was conducted by spraying an aqueous solution having sodium hydroxide concentration of 26% by weight, aluminum ion concentration of 6.5% by weight and temperature of 70° C. to dissolve the aluminum plate in an amount of 10 g/m$^2$, followed by washing with water by spraying.

(c) Desmut Treatment

Desmut treatment of the aluminum plate was conducted by spraying an aqueous 1% by weight nitric acid solution (containing 0.5% by weight of aluminum ion) having temperature of 30° C., followed by washing with water by spraying. As the aqueous nitric acid solution for the desmut treatment, a waste solution from the process of electrochemical surface roughening treatment using alternating current in an aqueous nitric acid solution described below was used.

(d) Electrochemical Surface Roughening Treatment

Electrochemical surface roughening treatment of the aluminum plate was continuously conducted by applying 60 Hz alternating current voltage. The electrolytic solution used was an aqueous solution containing 10.5 g/liter of nitric acid (containing 5 g/liter of aluminum ion and 0.007% by weight of ammonium ion) and the solution temperature was 50° C. The electrochemical surface roughening treatment was conducted using a trapezoidal rectangular wave alternating current where time (TP) for reaching the current to its peak from zero was 0.8 msec and a duty ratio was 1:1, and using a carbon electrode as a counter electrode. A ferrite was used as an auxiliary anode. The electrolytic cell used was a radial cell type. The current density was 30 A/dm$^2$ at the peak current, and the electric amount was 220 C/dm$^2$ in terms of the total electric quantity during the aluminum plate functioning as an anode. To the auxiliary anode, 5% of the current from the electric source was divided. Subsequently, the plate was washed with water by spraying.

(e) Alkali Etching Treatment

Alkali etching treatment of the aluminum plate was conducted at 32° C. by spraying an aqueous solution having a sodium hydroxide concentration of 26% by weight and an aluminum ion concentration of 6.5% by weight to dissolve the aluminum plate in an amount of 0.50 g/m$^2$. Thus, the smut component mainly comprising aluminum hydroxide formed in the precedent process of electrochemical surface roughening treatment using alternating current was removed and an edge portion of the pit formed was dissolved to smoothen the edge portion. Subsequently, the plate was washed with water by spraying.

(f) Desmut Treatment

Desmut treatment of the aluminum plate was conducted by spraying an aqueous 15% by weight sulfuric acid solution (containing 4.5% by weight of aluminum ion) having temperature of 30° C., followed by washing with water by spraying.

(g) Electrochemical Surface Roughening Treatment

Electrochemical surface roughening treatment of the aluminum plate was continuously conducted by applying 60 Hz alternating current voltage. The electrolytic solution used was an aqueous solution containing 5.0 g/liter of hydrochloric acid (containing 5 g/liter of aluminum ion) and the solution temperature was 35° C. The electrochemical surface roughening treatment was conducted using a trapezoidal rectangular wave alternating current where time (TP) for reaching the current to its peak from zero was 0.8 msec and a duty ratio was 1:1, and using a carbon electrode as a counter electrode. A ferrite was used as an auxiliary anode. The electrolytic cell used was a radial cell type. The current density was 25 A/dm$^2$ at the peak current, and the electric amount was 50 C/dm$^2$ in terms of the total electric quantity during the aluminum plate functioning as an anode. Subsequently, the plate was washed with water by spraying.

(h) Anodizing Treatment

Anodizing treatment of the aluminum plate was conducted using an anodizing treatment apparatus according to a two-stage feeding electrolytic treatment method (lengths of a first electrolytic unit and a second electrolytic unit: 6 m each; lengths of a first feeding unit and a second feeding unit: 3 m each; lengths of a first feeding electrode unit and a second feeding electrode unit: 2.4 m each). The electrolytic solution supplied to the first electrolytic unit and second electrolytic unit was an aqueous solution having sulfuric acid concentration of 50 g/liter (containing 0.5% by weight of aluminum ion) and the solution temperature was 20° C. Subsequently, the plate was washed with water by spraying. The amount of the final anodic oxide film was 2.7 g/m$^2$.

The aluminum plate subjected to conducting all steps (a) to (h) was referred to as Support 1. The center line average roughness (Ra indication according to JIS B0601) of Support 1 was measured using a stylus having a diameter of 2 μm and found to be 0.52 μm.

Support 1 was immersed in an aqueous solution containing 4 g/liter of polyvinylphosphonic acid at 40° C. for 10 seconds, washed with tap water at 20° C. for 2 seconds and dried to prepare Support 2.

[Formation of Photosensitive Layer]

Coating solution 1 for photosensitive layer having the composition shown below was coated on Support 2 using a bar and dried in an oven at 90° C. for 60 seconds to form a photosensitive layer having a dry coating amount of 1.20 g/m$^2$.

(Coating Solution 1 for Photosensitive Layer)

| | |
|---|---|
| Binder Polymer (A) as shown in Table 1 below | 0.54 parts by weight |
| Compound having ethylenically unsaturated bond (M-1) shown below | 0.48 parts by weight |
| Radical Polymerization Initiator (I-1) shown below | 0.08 parts by weight |
| Sensitizing Dye (D-1) shown below | 0.06 parts by weight |
| Chain Transfer Agent (S-2) shown below | 0.07 parts by weight |
| Dispersion of ε-phthalocyanine pigment [pigment: 15 parts by weight; dispersing agent (allyl methacrylate/methacrylic acid (80/20) copolymer (Mw: 70,000)): 10 parts by weight; solvent (cyclohexanone/methoxypropyl acetate/1-methoxy-2-propanol = 15 parts by weight/20 parts by weight/40 parts by weight)] | 0.40 parts by weight |
| Thermal polymerization inhibitor N-nitrosophenylhydroxylamine aluminum salt | 0.01 part by weight |
| Fluorine-Based Surfactant (F-1) shown below (Mw: 11,000) | 0.001 part by weight |
| Polyoxyethylene-polyoxypropylene condensate (Pluronic L44, produced by ADEKA Corp.) | 0.04 parts by weight |

-continued
| | |
|---|---|
| 1-Methoxy-2-propanol | 3.5 parts by weight |
| Methyl ethyl ketone | 8.0 parts by weight |
Mixture of the following compounds:
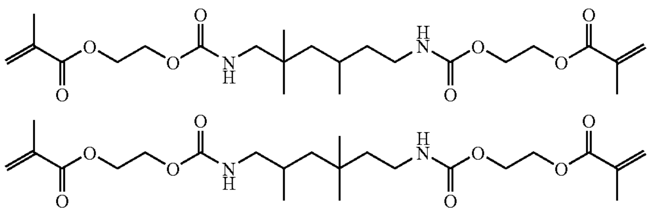
Compound having ethylenically unsaturated bond (M-1)
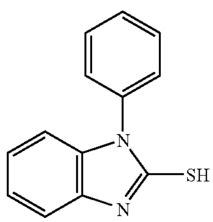
Chain Transfer Agent (S-2)
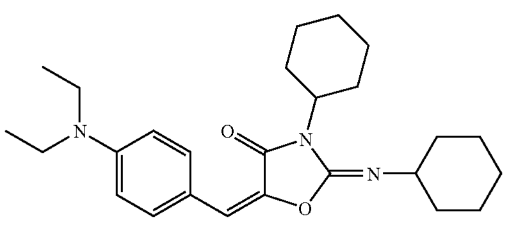
Sensitizing Dye (D-1)
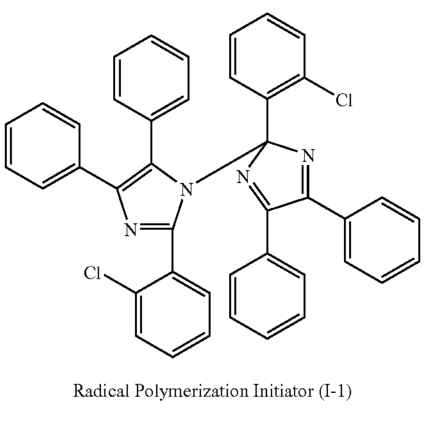
Radical Polymerization Initiator (I-1)
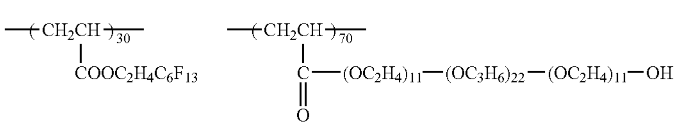
(Fluorine-Based Surfactant (F-1)

[Formation of Protective Layer]

A coating solution 1 for protective layer having the composition shown below was coated on the photosensitive layer using a bar and dried in an oven at 125° C. for 70 seconds to form a protective layer having a dry coating amount of 1.25 g/m$^2$, to obtain a lithographic printing plate precursor.

(Coating Solution 1 for Protective Layer)

| | |
|---|---|
| Dispersion of mica shown below | 0.6 g |
| Sulfonic acid-modified polyvinyl alcohol [Goseran CKS-50, produced by Nippon Synthetic Chemical Industry Co., Ltd. (saponification degree: 99% by mole; average polymerization degree: 300; modification degree: about 0.4% by mole)] | 0.8 g |
| Vinyl pyrrolidone/vinyl acetate (1/1) copolymer (molecular weight: 70,000) | 0.001 g |
| Surfactant (Emalex 710, produced by Nihon Emulsion Co., Ltd.) | 0.002 g |
| Water | 13 g |

(Preparation of Dispersion of Mica)

In 368 g of water was added 32 g of synthetic mica (SOMASIF ME-100, produced by CO-OP Chemical Co., Ltd.; aspect ratio: 1,000 or more) and the mixture was dispersed using a homogenizer until the average particle diameter (measured by a laser scattering method) became 0.5 μm to obtain Dispersion of mica.

[Exposure, Development and Printing]

Each of the lithographic printing plate precursors described above was subjected to image exposure by Violet Semiconductor Laser Plate Setter Vx9600 (equipped with InGaN semiconductor laser; emission wavelength: 405 nm±10 nm/output: 30 mW) produced by FFEI, Ltd. The image drawing was performed at resolution of 2,438 dpi using an FM screen (TAFFETA 20, produced by Fuji Film Co., Ltd.) in a plate surface exposure amount of 0.05 mJ/cm$^2$.

Then, the exposed lithographic printing plate precursor was pre-heated at 100° C. for 30 seconds and subjected to development processing in an automatic development processor having a structure as shown in FIG. 1 using each developer having the composition shown below.

The automatic development processor was comprised of a developing unit 6 for developing a lithographic printing plate precursor (hereinafter, also referred to as a "PS plate") 4 and a drying unit 10 for drying the developed PS plate 4. An insertion slot was formed in a side plate of the automatic development processor (left-side segment of FIG. 1) and the PS plate 4 inserted through the insertion slot was transported into the developing unit 6 by transport rollers (carrying-in rollers) 16 provided inside the side plate of automatic development processor. In a developing tank 20 of developing unit 6, transport rollers 22, a brush roller 24 and squeeze rollers 26 were disposed in order from the upstream side in the transporting direction and backup rollers 28 were disposed in appropriate positions therebetween. The PS plate 4 was immersed in a developer while being transported by the transport rollers 22 and the non-image area of PS plate 4 was removed by rotation of the brush roller 24 to conduct development processing. The PS plate 4 subjected to the development processing was transported into the drying unit 10 by the squeeze rollers (carrying-out rollers) 26.

In the drying unit 10, a guide roller 36 and pairs of skewer rollers 38 were disposed in order from the upstream side in the transporting direction. In the drying unit 10, drying means, for example, warm air supply means or heat generating means (not shown) was also provided. A discharge slot was provided in the drying unit 10 and the PS plate 4 dried by the drying means was discharged from the discharge slot to complete the development processing of lithographic printing plate precursor by the automatic development processor.

The automatic development processor used in the examples had one brush roller which had an outer diameter of 50 mm and being implanted with fiber of polybutylene terephthalate (bristle diameter: 200 μm, bristle length: 17 mm) and was rotated at 200 rpm in the same direction as the transporting direction (peripheral velocity at the tip of brush: 0.52 m/sec). The temperature of the developer in the developing bath 20 was 30° C. The transportation of the lithographic printing plate precursor was conducted at transporting speed of 100 cm/min. The dying temperature in the drying unit after the development was 80° C.

(Developer)

Developers 1 to 6 and Comparative Developers 1 and 2 were prepared according to the compositions shown below, respectively.

Developer 1 (pH: 9.80)

| | |
|---|---|
| 0.2 M Aqueous boric acid solution | 25.00 parts by weight |
| 0.2 M Aqueous potassium chloride solution | 25.00 parts by weight |
| 0.1 M Aqueous sodium hydroxide solution | 40.60 parts by weight |
| Water | 9.40 parts by weight |
| Newcol B13 (produced by Nippon Nyukazai Co., Ltd.) | 5.00 parts by weight |
| Gum arabic (Mw: 200,000) | 2.50 parts by weight |
| Hydroxy-alkylated starch (Penon JE66, produced by Nippon Starch Chemical Co., Ltd.) | 7.00 parts by weight |

Developer 2 (pH: 9.80)

| | |
|---|---|
| 0.2 M Aqueous glycine solution | 25.00 parts by weight |
| 0.2 M Aqueous sodium hydroxide solution | 13.60 parts by weight |
| Water | 62.40 parts by weight |
| Newcol B13 (produced by Nippon Nyukazai Co., Ltd.) | 5.00 parts by weight |
| Gum arabic (Mw: 200,000) | 2.50 parts by weight |
| Hydroxy-alkylated starch (Penon JE66, produced by Nippon Starch Chemical Co., Ltd.) | 7.00 parts by weight |

Developer 3 (pH: 9.80)

| | |
|---|---|
| 0.1 M Aqueous sodium carbonate decahydrate solution | 60.00 parts by weight |
| 0.1 M Aqueous sodium hydrogen carbonate solution | 40.00 parts by weight |
| Newcol B13, produced by Nippon Nyukazai Co., Ltd.) | 5.00 parts by weight |
| Gum arabic (Mw: 200,000) | 2.50 parts by weight |
| Hydroxy-alkylated starch (Penon JE66, produced by Nippon Starch Chemical Co., Ltd.) | 7.00 parts by weight |

Developer 4 (pH: 9.80)

| | |
|---|---|
| 0.05 M Aqueous sodium hydrogen carbonate solution | 50.00 parts by weight |
| 0.1 M Aqueous sodium hydroxide solution | 7.60 parts by weight |
| Water | 42.40 parts by weight |
| Newcol B13, produced by Nippon Nyukazai Co., Ltd.) | 5.00 parts by weight |
| Gum arabic (Mw: 200,000) | 2.50 parts by weight |
| Hydroxy-alkylated starch (Penon JE66, produced by Nippon Starch Chemical Co., Ltd.) | 7.00 parts by weight |

Developer 5 (pH: 9.80)

| | |
|---|---|
| 0.02 M Aqueous piperazine dihydrochloride solution | 50.00 parts by weight |
| 0.02 M Aqueous glycylglycine solution | 50.00 parts by weight |
| 1 M Aqueous sodium hydroxide solution | 2.59 parts by weight |
| Newcol B13, produced by Nippon Nyukazai Co., Ltd.) | 5.00 parts by weight |
| Gum arabic (Mw: 200,000) | 2.50 parts by weight |
| Hydroxy-alkylated starch (Penon JE66, produced by Nippon Starch Chemical Co., Ltd.) | 7.00 parts by weight |

Developer 6 (pH: 9.80)

| | |
|---|---|
| 0.20 M Aqueous diethanolamine solution | 25.00 parts by weight |
| 0.20 M Aqueous hydrochloric acid solution | 2.87 parts by weight |
| Water | 72.13 parts by weight |
| Newcol B13, produced by Nippon Nyukazai Co., Ltd.) | 5.00 parts by weight |
| Gum arabic (Mw: 200,000) | 2.50 parts by weight |
| Hydroxy-alkylated starch (Penon JE66, produced by Nippon Starch Chemical Co., Ltd.) | 7.00 parts by weight |

Comparative Developer 1 (pH: 11.0)

| | |
|---|---|
| Sodium carbonate monohydrate | 3.00 parts by weight |
| Water | 97.00 parts by weight |
| Newcol B13, produced by Nippon Nyukazai Co., Ltd.) | 5.00 parts by weight |
| Gum arabic (Mw: 200,000) | 2.50 parts by weight |
| Hydroxy-alkylated starch (Penon JE66, produced by Nippon Starch Chemical Co., Ltd.) | 7.00 parts by weight |

Comparative Developer 2 (pH: 12.0)

| | |
|---|---|
| Potassium hydroxide | 0.20 parts by weight |
| Water | 93.00 parts by weight |
| Newcol B13, produced by Nippon Nyukazai Co., Ltd.) | 5.00 parts by weight |
| Gum arabic (Mw: 200,000) | 2.50 parts by weight |
| Hydroxy-alkylated starch (Penon JE66, produced by Nippon Starch Chemical Co., Ltd.) | 7.00 parts by weight |

The lithographic printing plate obtained was mounted on a printing machine (SOR-M, produced by Heidelberg) and printing was performed at a printing speed of 6,000 sheets per hour using dampening water (EU-3 (etching solution, produced by Fuji Film Co., Ltd.))/water/isopropyl alcohol=1/89/10 (by volume ratio)) and TRANS-G (N) black ink (produced by Dainippon Ink & Chemicals, Inc.).

[Evaluation]

Using the lithographic printing plate precursor, the developing property, sensitivity, printing durability, stein resistance and development scum were evaluated in the manner shown below.

<Developing Property>

With the lithographic printing plate obtained by performing the development while varying the transporting speed, cyan density of the non-image area was measured by a Macbeth densitometer. The transporting speed at which the cyan density of the non-image area became equivalent to cyan density of the aluminum support was determined and regarded as the developing property. The evaluation of developing property was indicated as a relative developing property defined below using Comparative Example 1 as a criterion (1.0). The larger the value of relative developing property, the better the developing property and the more preferable the performance.

Relative developing property=(Transporting speed of subject lithographic printing plate precursor)/(Transporting speed of criterion lithographic printing plate precursor)

<Sensitivity>

In case of evaluating the sensitivity, the image exposure was performed while varying the plate surface exposure amount. After performing printing of 100 sheets under the conditions as described above and confirming that a printed material free from ink stain in the non-image area was obtained, 500 sheets were continuously printed. The exposure amount for causing no unevenness in the ink density of the image area on the 600th printed material was determined as the sensitivity. The evaluation of sensitivity was indicated as a relative sensitivity defined below using Comparative Example 1 as a criterion (1.0). The larger the value of relative sensitivity, the higher the sensitivity and the more preferable the performance.

Relative sensitivity=(Sensitivity of criterion lithographic printing plate precursor)/(Sensitivity of subject lithographic printing plate precursor)

<Printing Durability>

As increase in the number of printing sheets, the photosensitive layer was gradually abraded to cause decrease in the ink receptivity, resulting in decrease of ink density on printing paper. With respect to the lithographic printing plate obtained by the exposure in the same exposure amount, a number of printed materials obtained until the ink density (reflection density) decreased by 0.1 from that at the initiation of printing was determined to evaluate the printing durability. The evaluation of printing durability was indicated as a relative printing durability defined below using Comparative Example 1 as a criterion (1.0). The larger the value of relative printing durability, the higher the printing durability.

Relative printing durability=(Printing durability of subject lithographic printing plate precursor)/(Printing durability of criterion lithographic printing plate precursor)

<Stain Resistance>

After performing printing of 600 sheets as described above and the stain resistance was evaluated according to the following criteria:

A: Case wherein the ink satin was not observed at all in the non-image area.

B: Case wherein although the stain resistance was inferior to A, there was no problem for practical use.

C: Case wherein the ink stain was partially observed and there was a problem for practical use.

D: Case wherein the ink stain severely occurred.

<Development Scum (Model Experiment)>

The binder polymer used was weighed 0.1 g and dissolved in 10 ml of the developer (corresponding to an amount of the binder polymer dissolved in the developer when 20 $m^2$ of the lithographic printing plate precursor was subjected to the development processing per liter of the developer). The developer was preserved at 30° C. for one week and the occurrence of scum was visually observed to evaluate according to the following criteria:

A: Case wherein the developer was a uniform dispersion.

B: Case wherein although the occurrence of scum was inferior to A, there was no problem for practical use.

C: Case wherein turbid components were observed but there was not a problem for practical use.

D: Case wherein precipitates occurred.

TABLE 1

| | Binder Polymer (A) | Developer | Developing Property | Sensitivity | Printing Durability | Stain Resistance | Development Scum |
|---|---|---|---|---|---|---|---|
| Example 1 | PB-1 | Developer 1 | 2.0 | 1.0 | 1.0 | B | C |
| Example 2 | PB-1 | Developer 2 | 1.9 | 1.0 | 1.0 | B | C |
| Example 3 | PB-1 | Developer 3 | 2.3 | 1.0 | 1.0 | B | C |
| Example 4 | PB-1 | Developer 4 | 2.1 | 1.1 | 1.0 | B | C |
| Example 5 | PB-1 | Developer 5 | 1.9 | 1.0 | 1.0 | B | C |
| Example 6 | PB-1 | Developer 6 | 1.5 | 1.0 | 1.0 | B | C |
| Example 7 | PB-3 | Developer 3 | 2.0 | 0.9 | 1.1 | A | A |
| Example 8 | PB-7 | Developer 3 | 1.8 | 1.1 | 1.0 | B | C |
| Example 9 | PB-8 | Developer 3 | 1.8 | 1.1 | 1.1 | B | C |
| Example 10 | PB-9 | Developer 3 | 2.3 | 1.0 | 1.0 | A | A |
| Example 11 | PB-10 | Developer 3 | 2.0 | 1.0 | 1.1 | A | A |
| Example 12 | PB-11 | Developer 3 | 2.0 | 1.0 | 1.1 | A | A |
| Example 13 | PB-12 | Developer 3 | 2.3 | 1.1 | 1.1 | A | A |
| Example 14 | PA-13 | Developer 3 | 2.0 | 1.1 | 1.2 | B | C |
| Example 15 | PA-34 | Developer 3 | 2.0 | 1.2 | 1.4 | B | C |
| Example 16 | PA-55 | Developer 1 | 2.0 | 1.3 | 1.5 | A | A |
| Example 17 | PA-55 | Developer 3 | 2.3 | 1.3 | 1.5 | A | A |
| Example 18 | PA-55 | Developer 5 | 1.8 | 1.3 | 1.5 | A | A |
| Example 19 | PA-55 | Developer 6 | 1.6 | 1.3 | 1.5 | A | A |
| Example 20 | PA-60 | Developer 3 | 2.0 | 1.1 | 1.2 | A | A |
| Example 21 | PA-68 | Developer 3 | 1.9 | 1.1 | 1.2 | A | A |
| Example 22 | PA-71 | Developer 3 | 1.9 | 1.1 | 1.2 | A | A |
| Example 23 | PA-77 | Developer 3 | 2.0 | 1.2 | 1.4 | A | A |
| Example 24 | PA-78 | Developer 3 | 2.0 | 1.1 | 1.2 | A | A |
| Example 25 | PA-100 | Developer 3 | 2.1 | 1.3 | 1.4 | B | C |
| Example 26 | PA-101 | Developer 3 | 2.1 | 1.3 | 1.5 | A | A |
| Example 27 | PA-102 | Developer 3 | 2.1 | 1.1 | 1.2 | A | A |
| Example 28 | PA-103 | Developer 3 | 1.9 | 1.3 | 1.5 | A | A |
| Example 29 | PA-104 | Developer 3 | 1.9 | 1.3 | 1.5 | A | A |
| Example 30 | PA-105 | Developer 3 | 2.1 | 1.3 | 1.4 | B | C |
| Example 31 | PA-106 | Developer 3 | 2.1 | 1.3 | 1.5 | A | A |
| Example 32 | PA-107 | Developer 3 | 1.9 | 1.3 | 1.5 | A | A |
| Example 33 | PA-108 | Developer 3 | 1.9 | 1.3 | 1.5 | A | A |
| Example 34 | PA-109 | Developer 3 | 2.3 | 1.1 | 1.5 | A | A |
| Comparative Example 1 | PR-1 | Developer 1 | 1.0 | 1.0 | 1.0 | D | A |
| Comparative Example 2 | PR-1 | Developer 3 | 1.1 | 1.0 | 1.0 | D | A |
| Comparative Example 3 | PR-1 | Developer 5 | 0.9 | 1.0 | 1.0 | D | A |
| Comparative Example 4 | PR-1 | Comparative Developer 2 | 1.3 | 0.9 | 1.0 | A | A |
| Comparative Example 5 | PB-1 | Comparative Developer 1 | 1.1 | 1.0 | 1.0 | D | C |
| Comparative Example 6 | PB-1 | Comparative Developer 2 | 2.0 | 0.9 | 1.0 | A | C |

Binder Polymer PR-1:

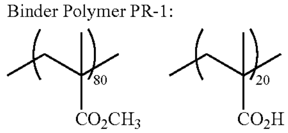

Mw = 50000

As shown in Table 1, it can be seen that by using the specific binder polymer and the developer having a buffering ability according to the invention, the developing property is greatly improved while maintaining the sensitivity and printing durability and the developing property equivalent to or better than that obtained by the strong alkali development processing as shown in Comparative Example 4 or 6 can be achieved by the environmentally friendly weak alkali development (pH=9.8). On the other hand, as is apparent from Comparative Example 5, in case of using the developer having no buffering ability is used, even when the specific binder polymer is used, the developing property is still low in spite of the relatively high pH of 11.0 of the developer. Thus, it is understood that the combination of specific binder polymer and developer having a buffering ability is important. It is also understood that the use of the binder polymer having an ethylenically unsaturated double bond in the side chain thereof is advantageous in view of the sensitivity and printing durability. Further, it is unexpected that not only the development scum but also the stain resistance are improved when a repeating unit having an ester group hydrolyzable with an aqueous alkali solution is introduced into the binder polymer.

Examples 35 to 68 and Comparative Examples 7 to 12

[Formation of Photosensitive Layer]

Coating solution 2 for photosensitive layer shown below was prepared and coated on Support 2 prepared above using a wire bar. Drying was conducted by a warm air drying apparatus at 100° C. for 60 seconds. The coverage of the photosensitive layer after drying was 1.4 g/m$^2$.

(Coating Solution 2 for Photosensitive Layer)

| | |
|---|---|
| Infrared Absorbing Agent (IR-1) shown below | 0.030 parts by weight |
| Polymerization Initiator A (S-1) shown below | 0.069 parts by weight |
| Polymerization Initiator B (I-1) shown below | 0.094 parts by weight |
| Mercapto Compound (E-1) shown below | 0.020 parts by weight |
| Ethylenically Unsaturated Compound (M-2) shown below (trade name: A-BPE-4, produced by Shin-Nakamura Chemical Co., Ltd.) | 0.425 parts by weight |
| Binder Polymer (A) as shown in Table 2 below | 0.623 parts by weight |
| Additive (T-1) shown below | 0.080 parts by weight |
| Polymerization Inhibitor (Q-1) shown below | 0.0012 parts by weight |
| Ethyl Violet (EV-1) shown below | 0.021 parts by weight |

-continued

| | |
|---|---|
| Fluorine-based surfactant (Megafac F-780-F, produced by Dainippon Ink & Chemicals Inc., 30% by weight methyl isobutyl ketone (MIBK) solution) | 0.0081 parts by weight |
| Methyl ethyl ketone | 5.886 parts by weight |
| Methanol | 2.733 parts by weight |
| 1-Methoxy-2-propanol | 5.886 parts by weight |

The structures of Infrared Absorbing Agent (IR-1), Polymerization Initiator A (S-1), Polymerization Initiator B (I-1), Mercapto Compound (E-1), Ethylenically Unsaturated Compound (M-2), Additive (T-1), Polymerization Inhibitor (Q-1) and Ethyl Violet (EV-1) are shown below, respectively.

(IR-1)

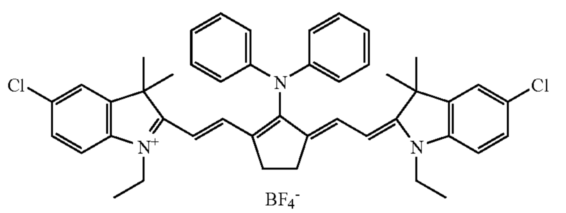

(S-1)

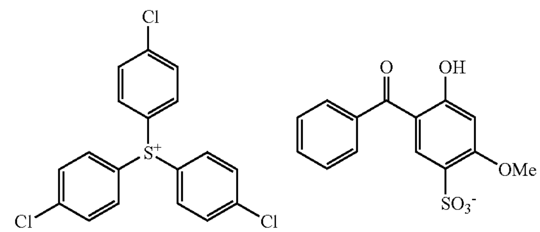

(I-1)

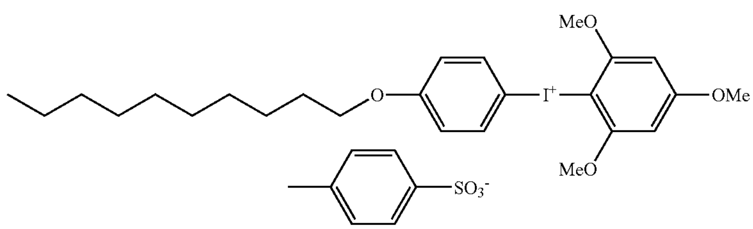

(E-1)

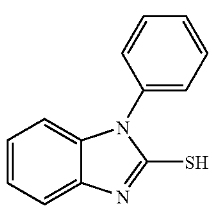

(M-2)

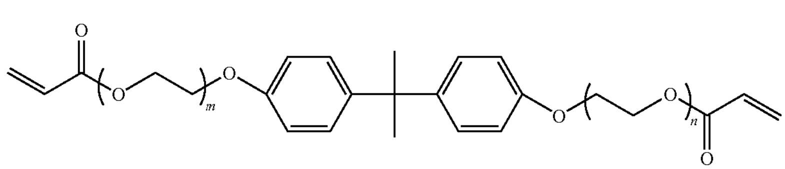

m + n = 4

-continued

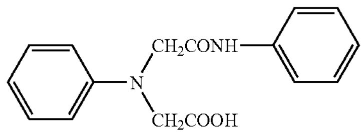

(T-1)

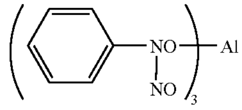

(Q-1)

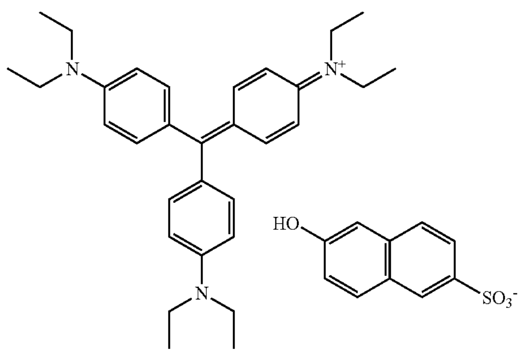

(EV-1)

[Formation of Protective Layer]

The protective layer was formed in the same manner as in Example 1.

[Exposure, Development and Printing]

Each of the lithographic printing plate precursors thus-obtained was treated according to the steps of exposure, development processing and drying as shown below.

As a light source (setter) for the exposure, an infrared semiconductor laser was used. Specifically, the lithographic printing plate precursor was imagewise exposed by Trendsetter 3244VX (produced by Creo Co.) equipped with a water-cooled 40 W infrared semiconductor laser under the conditions of output of 9 W, a rotational number of an outer surface drum of 210 rpm and resolution of 2,400 dpi. Within 30 seconds, the exposed lithographic printing plate precursor was pre-heated at 100° C. for 30 minutes and then subjected to the development processing by the automatic development processor having the structure shown in FIG. 1 using each of the developers described above in the same manner as in Example 1.

The lithographic printing plate obtained was mounted on a printing machine (SOR-M, produced by Heidelberg) and printing was performed at a printing speed of 6,000 sheets per hour using dampening water (EU-3 (etching solution, produced by Fuji Film Co., Ltd.))/water/isopropyl alcohol=1/89/10 (by volume ratio)) and TRANS-G (N) black ink (produced by Dainippon Ink & Chemicals, Inc.).

[Evaluation]

Using the lithographic printing plate precursor, the developing property, sensitivity, printing durability, stein resistance and development scum were evaluated in the same manner as in Example 1.

TABLE 2

| | Binder Polymer (A) | Developer | Developing Property | Sensitivity | Printing Durability | Stain Resistance | Development Scum |
|---|---|---|---|---|---|---|---|
| Example 35 | PB-1 | Developer 1 | 2.1 | 1.0 | 1.0 | B | C |
| Example 36 | PB-1 | Developer 2 | 1.9 | 1.0 | 1.0 | B | C |
| Example 37 | PB-1 | Developer 3 | 2.2 | 1.1 | 1.0 | B | C |
| Example 38 | PB-1 | Developer 4 | 2.1 | 1.1 | 1.0 | B | C |
| Example 39 | PB-1 | Developer 5 | 1.9 | 1.0 | 1.0 | B | C |
| Example 40 | PB-1 | Developer 6 | 1.6 | 1.1 | 1.0 | B | C |
| Example 41 | PB-3 | Developer 3 | 2.1 | 1.0 | 1.1 | A | A |
| Example 42 | PB-7 | Developer 3 | 1.8 | 1.1 | 1.0 | B | C |
| Example 43 | PB-8 | Developer 3 | 1.9 | 1.1 | 1.1 | B | C |
| Example 44 | PB-9 | Developer 3 | 2.2 | 0.9 | 1.0 | A | A |
| Example 45 | PB-10 | Developer 3 | 2.1 | 1.0 | 1.1 | A | A |
| Example 46 | PB-11 | Developer 3 | 2.0 | 1.0 | 1.1 | A | A |
| Example 47 | PB-12 | Developer 3 | 2.2 | 1.1 | 1.1 | A | A |
| Example 48 | PA-13 | Developer 3 | 2.1 | 1.1 | 1.2 | B | C |
| Example 49 | PA-34 | Developer 3 | 2.0 | 1.2 | 1.4 | B | C |
| Example 50 | PA-55 | Developer 1 | 2.0 | 1.3 | 1.4 | A | A |
| Example 51 | PA-55 | Developer 3 | 2.3 | 1.3 | 1.5 | A | A |
| Example 52 | PA-55 | Developer 5 | 1.9 | 1.3 | 1.5 | A | A |
| Example 53 | PA-55 | Developer 6 | 1.6 | 1.3 | 1.4 | A | A |
| Example 54 | PA-60 | Developer 3 | 2.0 | 1.1 | 1.2 | A | A |

TABLE 2-continued

| | Binder Polymer (A) | Developer | Developing Property | Sensitivity | Printing Durability | Stain Resistance | Development Scum |
|---|---|---|---|---|---|---|---|
| Example 55 | PA-68 | Developer 3 | 1.9 | 1.1 | 1.2 | A | A |
| Example 56 | PA-71 | Developer 3 | 1.9 | 1.1 | 1.3 | A | A |
| Example 57 | PA-77 | Developer 3 | 2.0 | 1.2 | 1.4 | A | A |
| Example 58 | PA-78 | Developer 3 | 2.0 | 1.1 | 1.2 | A | A |
| Example 59 | PA-100 | Developer 3 | 2.2 | 1.3 | 1.4 | B | C |
| Example 60 | PA-101 | Developer 3 | 2.2 | 1.3 | 1.5 | A | A |
| Example 61 | PA-102 | Developer 3 | 2.1 | 1.1 | 1.2 | A | A |
| Example 62 | PA-103 | Developer 3 | 1.8 | 1.3 | 1.5 | A | A |
| Example 63 | PA-104 | Developer 3 | 1.8 | 1.3 | 1.5 | A | A |
| Example 64 | PA-105 | Developer 3 | 2.1 | 1.3 | 1.4 | B | C |
| Example 65 | PA-106 | Developer 3 | 2.1 | 1.3 | 1.5 | A | A |
| Example 66 | PA-107 | Developer 3 | 1.8 | 1.3 | 1.5 | A | A |
| Example 67 | PA-108 | Developer 3 | 1.8 | 1.3 | 1.5 | A | A |
| Example 68 | PA-109 | Developer 3 | 2.3 | 1.3 | 1.5 | A | A |
| Comparative Example 7 | PR-1 | Developer 1 | 1.0 | 1.0 | 1.0 | D | A |
| Comparative Example 8 | PR-1 | Developer 3 | 1.1 | 1.0 | 1.0 | D | A |
| Comparative Example 9 | PR-1 | Developer 5 | 0.9 | 1.0 | 1.0 | D | A |
| Comparative Example 10 | PR-1 | Comparative Developer 2 | 1.4 | 0.9 | 1.0 | A | A |
| Comparative Example 11 | PB-1 | Comparative Developer 1 | 1.1 | 1.0 | 1.0 | D | C |
| Comparative Example 12 | PB-1 | Comparative Developer 2 | 2.1 | 0.9 | 1.0 | A | C |

Binder Polymer PR-1:

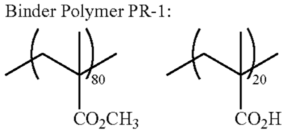

Mw = 50000

As shown in Table 2, it can be seen that by using the specific binder polymer and the developer having a buffering ability according to the invention, the developing property is greatly improved while maintaining the sensitivity and printing durability and the developing property equivalent to or better than that obtained by the strong alkali development processing as shown in Comparative Example 10 or 12 can be achieved by the environmentally friendly weak alkali development (pH=9.8). On the other hand, as is apparent from Comparative Example 11, in case of using the developer having no buffering ability is used, even when the specific binder polymer is used, the developing property is still low in spite of the relatively high pH of 11.0 of the developer. Thus, it is understood that the combination of specific binder polymer and developer having a buffering ability is important. It is also understood that the use of the binder polymer having an ethylenically unsaturated double bond in the side chain thereof is advantageous in view of the sensitivity and printing durability. Further, it is unexpected that not only the development scum but also the stain resistance are improved when a repeating unit having an ester group hydrolyzable with an aqueous alkali solution is introduced into the binder polymer.

Examples 69 to 105 and Comparative Examples 13 to 19

[Formation of Photosensitive Layer]

Coating solution 3 for photosensitive layer having the composition shown below was coated on Support 2 using a bar and dried in an oven at 70° C. for 60 seconds to form a photosensitive layer having a dry coating amount of 1.1 g/m$^2$.

(Coating Solution 3 for Photosensitive Layer)

| | |
|---|---|
| Binder Polymer (A) as shown in Table 3 below | 0.50 parts by weight |
| Compound having ethylenically unsaturated bond (M-1) | 0.50 parts by weight |
| Radical Polymerization Initiator (I-1) | 0.08 parts by weight |
| Sensitizing Dye (D-1) | 0.06 parts by weight |
| Chain Transfer Agent (S-2) | 0.07 parts by weight |
| Dispersion of ϵ-phthalocyanine pigment [pigment: 15 parts by weight; dispersing agent (allyl methacrylate/methacrylic acid (80/20) copolymer): 10 parts by weight; solvent (cyclohexanone/ methoxypropyl acetate/1-methoxy-2-propanol = 15 parts by weight/ 20 parts by weight/40 parts by weight)] | 0.40 parts by weight |
| Thermal polymerization inhibitor N-nitrosophenylhydroxylamine aluminum salt | 0.01 part by weight |
| Fluorine-Based Surfactant (F-1) | 0.001 part by weight |
| Polyoxyethylene-polyoxypropylene condensate (Pluronic L44, produced by ADEKA Corp.) | 0.04 parts by weight |
| 1-Methoxy-2-propanol | 3.5 parts by weight |
| Methyl ethyl ketone | 8.0 parts by weight |

The structures of the compounds used are same as those used in Coating solution 1 for photosensitive layer, respectively.

[Formation of Protective Layer]

A protective layer was formed in the same manner as in Example 1.

[Exposure, Development and Printing]

The exposure, development and printing were conducted in the same manner as in Example 33.

[Evaluation]

Using the lithographic printing plate precursor, the developing property, sensitivity, printing durability, stein resistance and development scum were evaluated in the same manner as in Example 1.

TABLE 3

| | Binder Polymer (A) | Developer | Developing Property | Sensitivity | Printing Durability | Stain Resistance | Development Scum |
|---|---|---|---|---|---|---|---|
| Example 69 | PU-1 | Developer 1 | 2.0 | 1.0 | 1.5 | B | C |
| Example 70 | PU-1 | Developer 2 | 2.1 | 1.0 | 1.5 | B | C |
| Example 71 | PU-1 | Developer 3 | 2.2 | 1.1 | 1.5 | B | C |
| Example 72 | PU-1 | Developer 4 | 2.1 | 1.1 | 1.5 | B | C |
| Example 73 | PU-1 | Developer 5 | 1.9 | 1.0 | 1.5 | B | C |
| Example 74 | PU-1 | Developer 6 | 1.5 | 1.1 | 1.5 | B | C |
| Example 75 | PU-3 | Developer 3 | 2.0 | 1.0 | 1.6 | B | C |
| Example 76 | PU-4 | Developer 3 | 1.8 | 1.1 | 1.0 | A | A |
| Example 77 | PU-5 | Developer 3 | 1.9 | 1.1 | 1.5 | B | C |
| Example 78 | PU-8 | Developer 3 | 2.2 | 0.9 | 1.6 | A | A |
| Example 79 | PU-14 | Developer 1 | 2.0 | 1.2 | 1.8 | B | C |
| Example 80 | PU-14 | Developer 3 | 2.2 | 1.2 | 1.9 | B | C |
| Example 81 | PU-14 | Developer 5 | 2.0 | 1.2 | 1.9 | B | C |
| Example 82 | PU-14 | Developer 6 | 1.5 | 1.2 | 1.8 | B | C |
| Example 83 | PU-15 | Developer 3 | 1.7 | 1.1 | 1.8 | B | C |
| Example 84 | PU-16 | Developer 3 | 2.5 | 1.1 | 1.7 | B | C |
| Example 85 | PU-18 | Developer 3 | 2.2 | 1.2 | 1.9 | B | C |
| Example 86 | PU-19 | Developer 3 | 2.2 | 1.2 | 1.9 | B | C |
| Example 87 | PU-20 | Developer 3 | 2.4 | 1.2 | 1.6 | B | C |
| Example 88 | PU-21 | Developer 3 | 2.4 | 1.2 | 1.6 | B | C |
| Example 89 | PU-22 | Developer 3 | 1.8 | 1.1 | 1.8 | B | C |
| Example 90 | PU-23 | Developer 3 | 1.8 | 1.2 | 1.8 | B | C |
| Example 91 | PU-24 | Developer 3 | 1.9 | 1.2 | 1.8 | B | C |
| Example 92 | PU-25 | Developer 3 | 1.9 | 1.2 | 1.8 | B | C |
| Example 93 | PU-26 | Developer 3 | 2.3 | 1.2 | 1.9 | B | C |
| Example 94 | PU-27 | Developer 3 | 2.1 | 1.2 | 1.9 | B | C |
| Example 95 | PU-28 | Developer 3 | 2.2 | 1.1 | 1.6 | B | C |
| Example 96 | PU-29 | Developer 3 | 2.2 | 1.0 | 1.5 | B | C |
| Example 97 | PU-30 | Developer 3 | 2.2 | 1.0 | 1.5 | B | C |
| Example 98 | PU-31 | Developer 3 | 2.2 | 1.2 | 1.9 | A | A |
| Example 99 | PU-32 | Developer 3 | 2.2 | 1.0 | 1.5 | A | A |
| Example 100 | PU-33 | Developer 3 | 2.2 | 1.2 | 1.9 | A | A |
| Example 101 | PU-34 | Developer 3 | 2.3 | 1.2 | 1.9 | B | C |
| Example 102 | PU-35 | Developer 3 | 2.3 | 1.2 | 2.1 | B | C |
| Example 103 | PU-36 | Developer 3 | 2.3 | 1.2 | 2.1 | A | A |
| Example 104 | PU-37 | Developer 3 | 2.3 | 1.3 | 1.9 | A | A |
| Example 105 | PU-38 | Developer 3 | 2.3 | 1.3 | 2.1 | A | A |
| Comparative Example 13 | PR-1 | Developer 3 | 1.0 | 1.0 | 1.0 | D | A |
| Comparative Example 14 | PR-2 | Developer 1 | 1.0 | 1.0 | 1.5 | D | A |
| Comparative Example 15 | PR-2 | Developer 3 | 1.1 | 1.0 | 1.5 | D | A |
| Comparative Example 16 | PR-2 | Developer 5 | 0.9 | 1.0 | 1.5 | D | A |
| Comparative Example 17 | PR-2 | Comparative Developer 2 | 1.5 | 0.9 | 1.5 | A | A |
| Comparative Example 18 | PR-2 | Comparative Developer 1 | 0.8 | 1.0 | 1.5 | D | C |
| Comparative Example 19 | PB-2 | Comparative Developer 2 | 2.1 | 0.9 | 1.0 | A | C |

Binder Polymer PR-1:

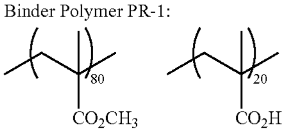

Mw = 50000

Binder Polymer PR-2:

A reaction product of the following components:

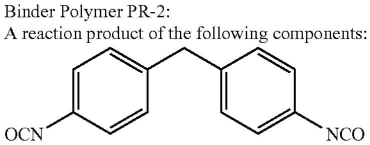

40 mol %

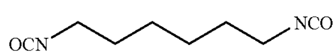

10 mol %

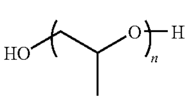

PPG1000
Mn = 1000
15 mol %

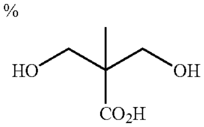

25 mol %

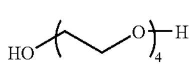

10 mol %
Mw = 60000

As shown in Table 3, it can be seen that by using the specific binder polymer and the developer having a buffering ability according to the invention, the developing property is greatly improved while maintaining the sensitivity and printing durability and the developing property equivalent to or better than that obtained by the strong alkali development processing as shown in Comparative Example 17 or 19 can be achieved by the environmentally friendly weak alkali development (pH=9.8). Further, it can be understood that the use of the polyurethane as the binder polymer as shown in the examples described above is advantageous from the standpoint of printing durability in comparison with the use of the acrylic polymer. On the other hand, as is apparent from Comparative Example 18, in case of using the developer having no buffering ability is used, even when the specific binder polymer is used, the developing property is still low in spite of the relatively high pH of 11.0 of the developer. Thus, it is understood that the combination of specific binder polymer and developer having a buffering ability is important. Similar to the results shown in Tables 1 and 2 it is also understood that the use of the binder polymer having an ethylenically unsaturated double bond in the side chain thereof is advantageous in view of the sensitivity and printing durability.

Examples 106 to 142 and Comparative Examples 20 to 26

[Formation of Photosensitive Layer]

Coating solution 4 for photosensitive layer shown below was prepared and coated on Support 2 prepared above using a wire bar. Drying was conducted by a warm air drying apparatus at 125° C. for 34 seconds. The coverage of the photosensitive layer after drying was 1.4 g/m$^2$.

(Coating Solution 4 for Photosensitive Layer)

| | |
|---|---|
| Infrared Absorbing Agent (IR-1) | 0.030 parts by weight |
| Polymerization Initiator A (S-1) | 0.069 parts by weight |
| Polymerization Initiator B (I-1) | 0.094 parts by weight |
| Mercapto Compound (E-1) | 0.020 parts by weight |
| Ethylenically Unsaturated Compound (M-2) (trade name: A-BPE-4, produced by Shin-Nakamura Chemical Co., Ltd.) | 0.425 parts by weight |
| Binder Polymer (A) as shown in Table 4 below | 0.623 parts by weight |
| Additive (T-1) | 0.080 parts by weight |
| Polymerization Inhibitor (Q-1) | 0.0012 parts by weight |
| Ethyl Violet (EV-1) | 0.021 parts by weight |
| Fluorine-based surfactant (Megafac F-780-F, produced by Dainippon Ink & Chemicals Inc., 30% by weight methyl isobutyl ketone (MIBK) solution) | 0.0081 parts by weight |
| Methyl ethyl ketone | 5.886 parts by weight |
| Methanol | 2.733 parts by weight |
| 1-Methoxy-2-propanol | 5.886 parts by weight |

The structures of the compounds used are same as those used in Coating solution 2 for photosensitive layer, respectively.

[Formation of Protective Layer]

A protective layer was formed in the same manner as in Example 1.

[Exposure, Development and Printing]

The exposure, development and printing were conducted in the same manner as in Example 35.

[Evaluation]

Using the lithographic printing plate precursor, the developing property, sensitivity, printing durability, stein resistance and development scum were evaluated in the same manner as in Example 1.

TABLE 4

| | Binder Polymer (A) | Developer | Developing Property | Sensitivity | Printing Durability | Stain Resistance | Development Scum |
|---|---|---|---|---|---|---|---|
| Example 106 | PU-1 | Developer 1 | 1.9 | 1.0 | 1.4 | B | C |
| Example 107 | PU-1 | Developer 2 | 2.0 | 1.0 | 1.4 | B | C |
| Example 108 | PU-1 | Developer 3 | 2.1 | 1.0 | 1.5 | B | C |
| Example 109 | PU-1 | Developer 4 | 2.0 | 1.1 | 1.5 | B | C |
| Example 110 | PU-1 | Developer 5 | 1.9 | 1.0 | 1.5 | B | C |
| Example 111 | PU-1 | Developer 6 | 1.5 | 1.1 | 1.4 | B | C |
| Example 112 | PU-3 | Developer 3 | 1.9 | 1.1 | 1.5 | B | C |
| Example 113 | PU-4 | Developer 3 | 1.7 | 1.0 | 1.0 | A | A |
| Example 114 | PU-5 | Developer 3 | 1.8 | 1.0 | 1.4 | B | C |
| Example 115 | PU-8 | Developer 3 | 2.1 | 1.0 | 1.5 | A | A |
| Example 116 | PU-14 | Developer 1 | 1.9 | 1.2 | 1.7 | B | C |
| Example 117 | PU-14 | Developer 3 | 2.1 | 1.2 | 1.8 | B | C |
| Example 118 | PU-14 | Developer 5 | 1.9 | 1.2 | 1.8 | B | C |
| Example 119 | PU-14 | Developer 6 | 1.4 | 1.2 | 1.9 | B | C |
| Example 120 | PU-15 | Developer 3 | 1.6 | 1.1 | 1.8 | B | C |
| Example 121 | PU-16 | Developer 3 | 2.4 | 1.1 | 1.6 | B | C |
| Example 122 | PU-18 | Developer 3 | 2.1 | 1.2 | 1.9 | B | C |
| Example 123 | PU-19 | Developer 3 | 2.1 | 1.2 | 1.9 | B | C |
| Example 124 | PU-20 | Developer 3 | 2.3 | 1.2 | 1.5 | B | C |
| Example 125 | PU-21 | Developer 3 | 2.3 | 1.2 | 1.5 | B | C |
| Example 126 | PU-22 | Developer 3 | 1.7 | 1.1 | 1.9 | B | C |
| Example 127 | PU-23 | Developer 3 | 1.7 | 1.2 | 1.8 | B | C |
| Example 128 | PU-24 | Developer 3 | 1.8 | 1.2 | 1.9 | B | C |
| Example 129 | PU-25 | Developer 3 | 1.8 | 1.2 | 1.8 | B | C |
| Example 130 | PU-26 | Developer 3 | 2.2 | 1.2 | 1.9 | B | C |
| Example 131 | PU-27 | Developer 3 | 2.1 | 1.2 | 1.9 | B | C |
| Example 132 | PU-28 | Developer 3 | 2.1 | 1.1 | 1.6 | B | C |
| Example 133 | PU-29 | Developer 3 | 2.1 | 1.0 | 1.5 | B | C |
| Example 134 | PU-30 | Developer 3 | 2.1 | 1.0 | 1.5 | B | C |
| Example 135 | PU-31 | Developer 3 | 2.2 | 1.2 | 1.8 | A | A |
| Example 136 | PU-32 | Developer 3 | 2.1 | 1.0 | 1.5 | A | A |
| Example 137 | PU-33 | Developer 3 | 2.2 | 1.2 | 1.8 | A | A |

TABLE 4-continued

| | Binder Polymer (A) | Developer | Developing Property | Sensitivity | Printing Durability | Stain Resistance | Development Scum |
|---|---|---|---|---|---|---|---|
| Example 138 | PU-34 | Developer 3 | 2.2 | 1.0 | 1.9 | B | C |
| Example 139 | PU-35 | Developer 3 | 2.3 | 1.1 | 2.0 | B | C |
| Example 140 | PU-36 | Developer 3 | 2.3 | 1.0 | 2.0 | A | A |
| Example 141 | PU-37 | Developer 3 | 2.3 | 1.1 | 1.8 | A | A |
| Example 142 | PU-38 | Developer 3 | 2.3 | 1.1 | 2.0 | A | A |
| Comparative Example 20 | PR-1 | Developer 3 | 1.0 | 1.0 | 1.0 | D | A |
| Comparative Example 21 | PR-2 | Developer 1 | 0.9 | 1.1 | 1.4 | D | A |
| Comparative Example 22 | PR-2 | Developer 3 | 1.0 | 1.0 | 1.5 | D | A |
| Comparative Example 23 | PR-2 | Developer 5 | 0.9 | 1.0 | 1.5 | D | A |
| Comparative Example 24 | PR-2 | Comparative Developer 2 | 1.4 | 1.0 | 1.5 | A | A |
| Comparative Example 25 | PR-2 | Comparative Developer 1 | 0.9 | 0.9 | 1.4 | D | C |
| Comparative Example 26 | PB-2 | Comparative Developer 2 | 2.0 | 0.9 | 1.0 | A | C |

Binder Polymer PR-1:

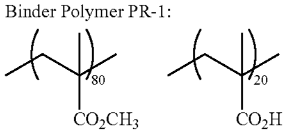

Mw = 50000

Binder Polymer PR-2:

A reaction product of the following compounds:

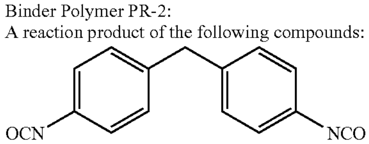

40 mol %

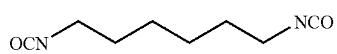

10 mol %

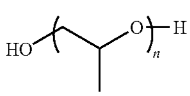

PPG1000
Mn = 1000
15 mol %

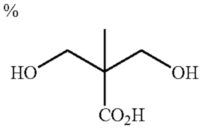

25 mol %

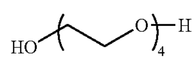

10 mol %
Mw = 60000

As shown in Table 4, it can be seen that by using the specific binder polymer and the developer having a buffering ability according to the invention, the developing property is greatly improved while maintaining the sensitivity and printing durability and the developing property equivalent to or better than that obtained by the strong alkali development processing as shown in Comparative Example 24 or 26 can be achieved by the environmentally friendly weak alkali development (pH=9.8). Further, it can be understood that the use of the polyurethane as the binder polymer as shown in the examples described above is advantageous from the standpoint of printing durability in comparison with the use of the acrylic polymer. On the other hand, as is apparent from Comparative Example 25, in case of using the developer having no buffering ability is used, even when the specific binder polymer is used, the developing property is still low in spite of the relatively high pH of 11.0 of the developer. Thus, it is understood that the combination of specific binder polymer and developer having a buffering ability is important. Similar to the results shown in Tables 1 and 2 it is also understood that the use of the binder polymer having an ethylenically unsaturated double bond in the side chain thereof is advantageous in view of the sensitivity and printing durability.

Examples 143 to 146 and Comparative Example 27

[Preparation of Support 3]

An aluminum plate (material: 1050, refining: H16) having a thickness of 0.24 mm was immersed in an aqueous 5% by weight sodium hydroxide solution maintained at 65° C. to conduct a degreasing treatment for one minute, followed by washed with water. The degreased aluminum plate was immersed in an aqueous 10% by weight hydrochloric acid solution maintained at 25° C. for one minute to neutralize, followed by washed with water. Subsequently, the aluminum plate was subjected to an electrolytic surface-roughening treatment with alternating current under condition of current density of 100 A/dm$^2$ in an aqueous 0.3% by weight hydrochloric acid solution at 25° C. for 60 seconds and then subjected to a desmut treatment in an aqueous 5% by weight sodium hydroxide solution maintained at 60° C. for 10 seconds. The aluminum plate thus-treated was subjected to an anodizing treatment under conditions of current density of 10 A/dm$^2$ and voltage of 15 V in an aqueous 15% by weight sulfuric acid solution at 25° C. for one minute and then subjected to a hydrophilizing treatment using an aqueous 1% by weight polyvinylphosphonic acid solution at 75° C. to prepare Support 3. The center line average roughness (Ra indication according to JIS B0601) of Support 3 was measured and found to be 0.44 μm.

[Formation of Photosensitive Layer]

Coating solution 5 for photosensitive layer having the composition shown below was coated on Support 3 using a bar and dried in an oven at 90° C. for 60 seconds to form a photosensitive layer having a dry coating amount of 1.3 g/m².

(Coating Solution 5 for Photosensitive Layer)

| | |
|---|---|
| Binder Polymer (A) as shown in Table 5 below | 0.04 parts by weight |
| Binder Polymer (2) shown below (weight average molecular weight: 80,000) | 0.30 parts by weight |
| Polymerizable Compound (2) shown below (PLEX 6661-O, produced by Degussa Japan) | 0.17 parts by weight |
| Compound having ethylenically unsaturated bond (M-1) shown above | 0.51 parts by weight |
| Sensitizing Dye (1) shown below | 0.03 parts by weight |
| Sensitizing Dye (2) shown below | 0.015 parts by weight |

-continued

| | |
|---|---|
| Sensitizing Dye (3) shown below | 0.015 parts by weight |
| Radical Polymerization Initiator (I-1) shown above | 0.13 parts by weight |
| Chain Transfer Agent Mercaptobenzothiazole | 0.01 part by weight |
| Dispersion of ε-phthalocyanine pigment [pigment: 15 parts by weight; dispersing agent (allyl methacrylate/methacrylic acid copolymer (weight average molecular weight: 60,000, copolymerization molar ratio: 83/17)): 10 parts by weight; cyclohexanone: 15 parts by weight] | 0.40 parts by weight |
| Thermal polymerization inhibitor N-nitrosophenylhydroxylamine aluminum salt | 0.01 part by weight |
| Fluorine-Based Surfactant (F-1) shown above | 0.001 part by weight |
| 1-Methoxy-2-propanol | 3.5 parts by weight |
| Methyl ethyl ketone | 8.0 parts by weight |

The structures of the compound (M-1), the polymerization initiator (I-1) and the fluorine-based surfactant (F-1) used are same as those used in Coating solution 1 for photosensitive layer, respectively.

Binder Polymer (2)

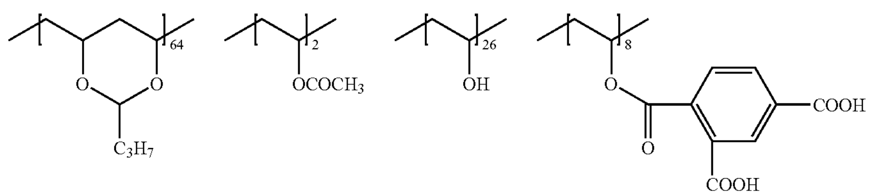

(acid value: 66 mg-KOH/g)

Poylmerizable Compound (2)

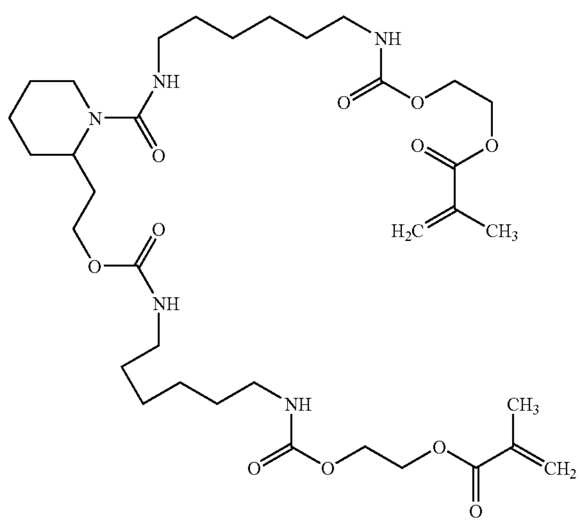

Sensitizing Dye (1)

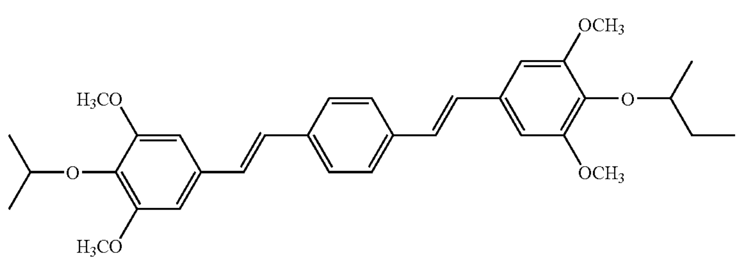

-continued

Sensitizing Dye (2)

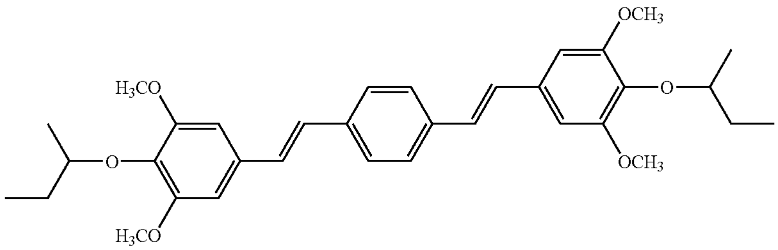

Sensitizing Dye (3)

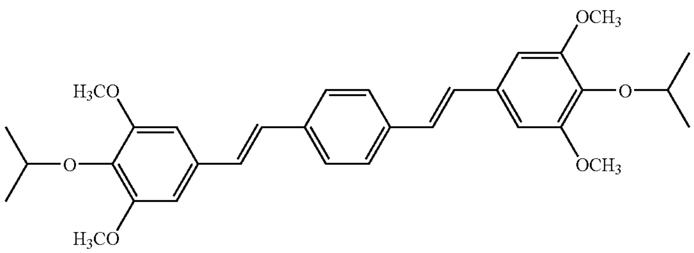

[Formation of Protective Layer]

A coating solution 2 for protective layer having the composition shown below was coated on the photosensitive layer using a bar so as to have a dry coating amount of 1.2 g/m$^2$ and dried in an oven at 125° C. for 70 seconds to form a protective layer, thereby preparing a lithographic printing plate precursor.

(Coating Solution 2 for Protective Layer)

| | |
|---|---|
| PVA-205 [partially hydrolyzed polyvinyl alcohol, produced by Kuraray Co., Ltd. (saponification degree: 86.5 to 89.5% by mole; viscosity: 4.6 to 5.4 mPa·s in a 4% by weight aqueous solution at 20° C.)] | 0.658 g |
| PVA-105 [fully hydrolyzed polyvinyl alcohol, produced by Kuraray Co., Ltd. (saponification degree: 98.0 to 99.0% by mole; viscosity: 5.2 to 6.0 mPa·s in a 4% by weight aqueous solution at 20° C.)] | 0.142 g |
| Vinyl pyrrolidone/vinyl acetate (1/1) copolymer (molecular weight: 70,000) | 0.001 g |
| Surfactant (Emalex 710, produced by Nihon Emulsion Co., Ltd.) | 0.002 g |
| Water | 13 g |

[Evaluation]

Using the lithographic printing plate precursor, the developing property, sensitivity, printing durability, stein resistance and development scum were evaluated in the manner as in Example 1.

TABLE 5

| | Binder Polymer (A) | Developer | Developing Property | Sensitivity | Printing Durability | Stain Resistance | Development Scum |
|---|---|---|---|---|---|---|---|
| Example 143 | PB-9 | Developer 3 | 1.7 | 1.2 | 1.1 | B | B |
| Example 144 | PA-106 | Developer 3 | 1.7 | 1.2 | 1.1 | B | B |
| Example 145 | PU-32 | Developer 3 | 1.7 | 1.3 | 1.3 | A | A |
| Example 146 | PU-38 | Developer 3 | 1.8 | 1.3 | 1.3 | A | A |
| Comparative Example 27 | none | Developer 3 | 1.0 | 1.0 | 1.0 | B | B |

As shown in Table 5, even when the binder polymer according to the invention is added to a butyral resin, the improvement in the developing property is recognized. It is the unexpected result that the sensitivity and printing durability are also improved.

What is claimed is:

1. A method for preparing a lithographic printing plate comprising treating a lithographic printing plate precursor comprising a hydrophilic support and an image-forming layer containing the following (i) to (iii) with an aqueous solution having a buffering ability:

(i) a binder polymer comprising a repeating unit having a structure represented by the following formula (1), (ii) an ethylenically unsaturated compound, and (iii) a polymerization initiator, $$P\text{-}L\text{-}(CO_2H)_n \quad (1)$$

wherein P represents a part constituting a main chain skeleton of the polymer, L represents an (n+1) valent connecting group, and n represents an integer of 1 or more, and wherein the aqueous solution having a buffering ability comprises as buffering agent a water-soluble amine compound and an ion of the amine compound.

2. The method for preparing a lithographic printing plate as claimed in claim 1, wherein pH of the aqueous solution having a buffering ability is from 7.0 to 11.0.

3. The method for preparing a lithographic printing plate as claimed in claim 1, wherein the binder polymer is polyurethane.

4. The method for preparing a lithographic printing plate as claimed in claim 3, wherein the polyurethane is synthesized with a compound represented by the following formula (2) as one of starting materials:

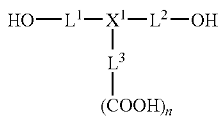

(2)

wherein $X^1$ represents a trivalent or higher valent atom, $L^1$ and $L^2$ each independently represents a single bond or an alkylene group, provided that both of $L^1$ and $L^2$ are not single bonds at the same time, $L^3$ represents an (n+1) valent connecting group, and n represents an integer of from 1 to 5.

5. The method for preparing a lithographic printing plate as claimed in claim 1, wherein the binder polymer has an ethylenically unsaturated double bond in a side chain thereof.

6. The method for preparing a lithographic printing plate as claimed in claim 1, wherein the binder polymer has a molecular weight of from 400 to 6,000,000.

7. The method for preparing a lithographic printing plate as claimed in claim 1, wherein the aqueous solution having a buffering ability comprises a nonionic surfactant.

8. The method for preparing a lithographic printing plate as claimed in claim 1, wherein a total amount of the water-soluble amine compound and ion of the amine compound is from 0.01 to 1 mole/L based on the total weight of the aqueous solution.

* * * * *